(12) United States Patent
Hongo et al.

(10) Patent No.: US 6,921,466 B2
(45) Date of Patent: Jul. 26, 2005

(54) REVOLUTION MEMBER SUPPORTING APPARATUS AND SEMICONDUCTOR SUBSTRATE PROCESSING APPARATUS

(75) Inventors: Akihisa Hongo, Tokyo (JP); Ichiro Katakabe, Tokyo (JP); Shinya Morisawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 248 days.

(21) Appl. No.: 09/842,650

(22) Filed: Apr. 27, 2001

(65) Prior Publication Data

US 2002/0006876 A1 Jan. 17, 2002

(30) Foreign Application Priority Data

Apr. 27, 2000 (JP) .................................... 2000-127365

(51) Int. Cl.$^7$ .......................... C25D 5/02; H01L 21/288
(52) U.S. Cl. .............. 204/198; 204/224 R; 204/224 M; 156/345.22; 118/719
(58) Field of Search ................................ 118/730, 729, 118/719; 156/345.22, 345.14; 204/224 R, 198

(56) References Cited

U.S. PATENT DOCUMENTS

| | | | |
|---|---|---|---|
| 4,788,994 A | 12/1988 | Shinbara | |
| 5,192,087 A | 3/1993 | Kawashima et al. | |
| 5,972,192 A | 10/1999 | Dubin et al. | |
| 6,017,437 A | 1/2000 | Ting et al. | |
| 6,080,042 A | * | 6/2000 | McGregor et al. ............ 451/41 |
| 6,176,992 B1 | 1/2001 | Talieh | |
| 6,254,760 B1 | 7/2001 | Shen et al. | |
| 6,258,220 B1 | 7/2001 | Dordi et al. | |
| 6,267,853 B1 | 7/2001 | Dordi et al. | |
| 6,395,094 B1 | * | 5/2002 | Tanaka et al. ............... 118/719 |
| 6,508,920 B1 | 1/2003 | Ritzdorf et al. | |
| 6,551,488 B1 | * | 4/2003 | Hey et al. .................... 205/157 |
| 6,558,518 B1 | 5/2003 | Sendai et al. | |
| 6,612,915 B1 | * | 9/2003 | Uzoh et al. .................. 451/285 |
| 2002/0004301 A1 | 1/2002 | Chen et al. | |
| 2002/0029961 A1 | 3/2002 | Dordi et al. | |

FOREIGN PATENT DOCUMENTS

| | | |
|---|---|---|
| JP | 63-153839 | 6/1988 |
| JP | 4-150051 | 5/1992 |
| JP | 10-508157 | 8/1998 |
| JP | 2000-124156 | 4/2000 |
| WO | 96/35227 | 11/1996 |

* cited by examiner

Primary Examiner—P. Hassanzadel
Assistant Examiner—Sylvia R. MacArthur
(74) Attorney, Agent, or Firm—Wenderoth, Lind & Ponack, L.L.P.

(57) ABSTRACT

A revolution member supporting apparatus holds and rotates a disc-shaped object (object to be rotated) such as a semiconductor wafer. The revolution member supporting apparatus includes a rotatable member which rotates about an axis of roation, and a plurality of holding members which are disposed along a circle having a center corresponding to the axis of rotation of the rotatable member, and which revolve around the axis of rotation when the rotatable member rotates, wherein the holding members are allowed to swing about their own central axes.

3 Claims, 69 Drawing Sheets

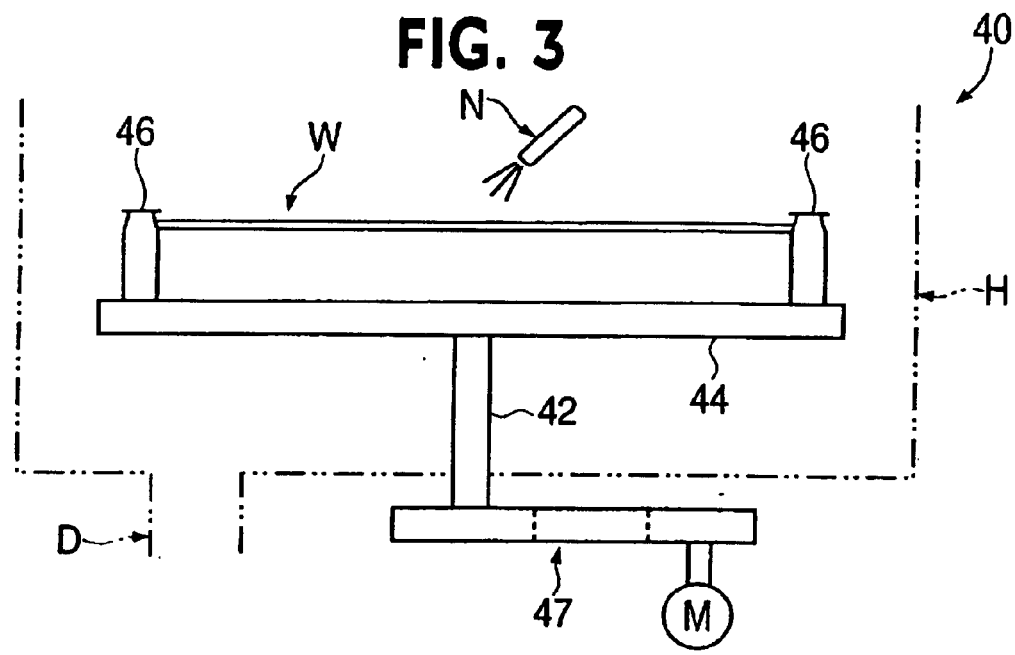
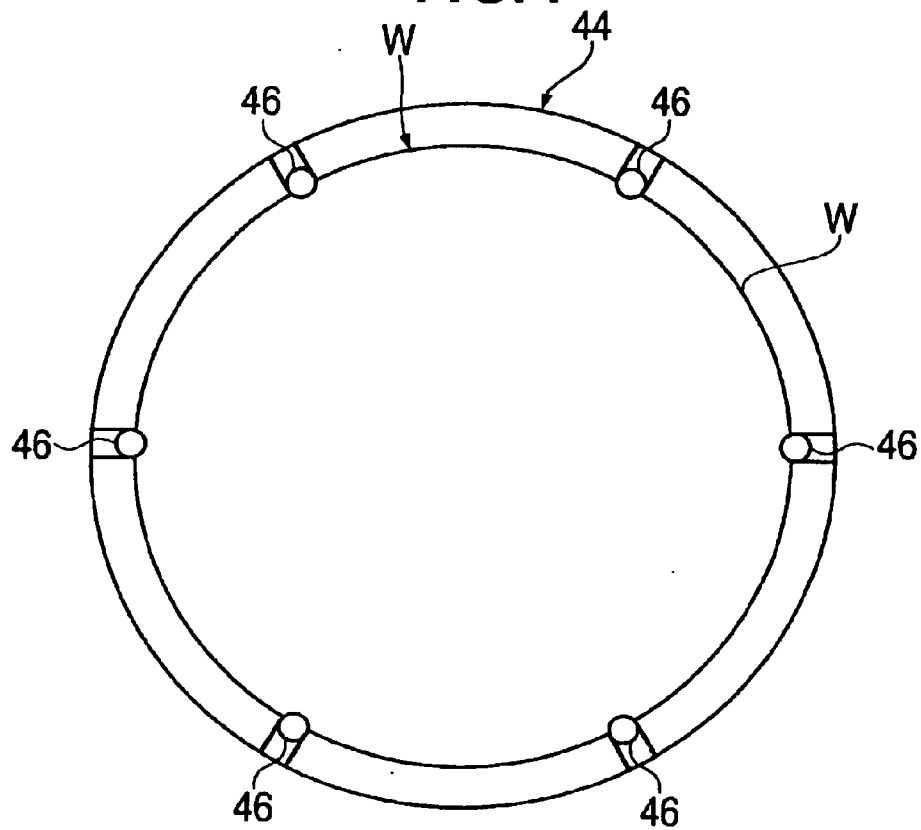

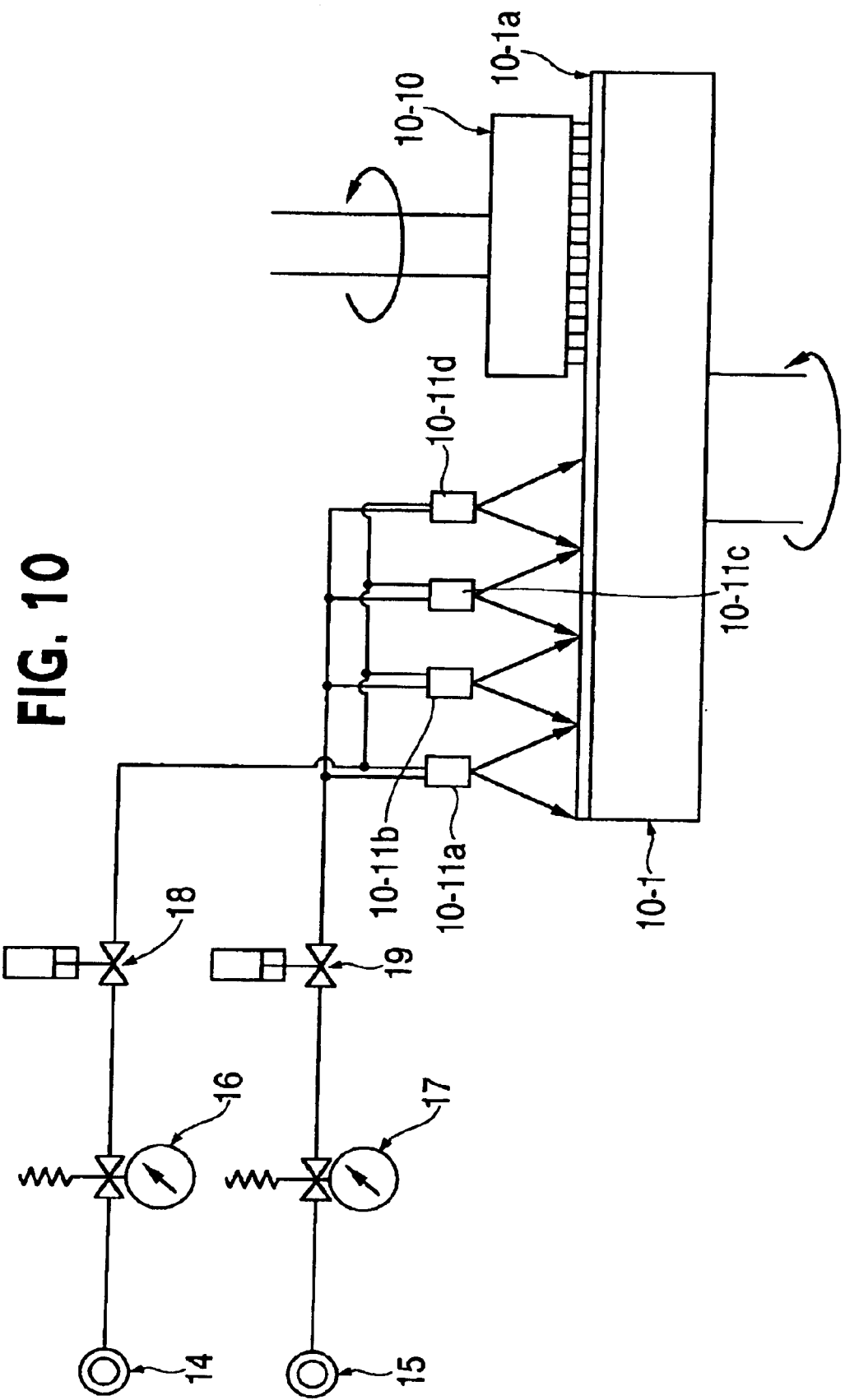

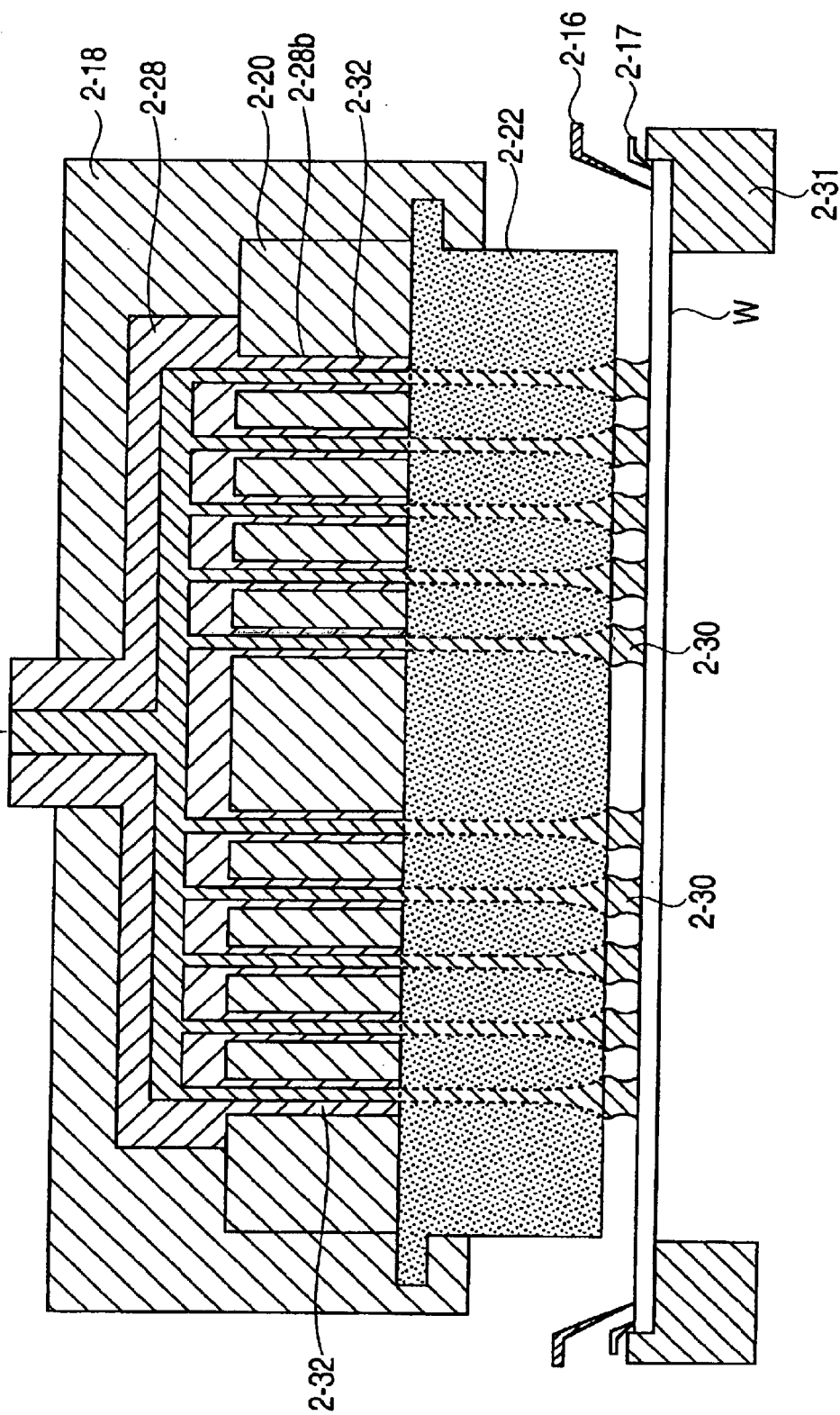

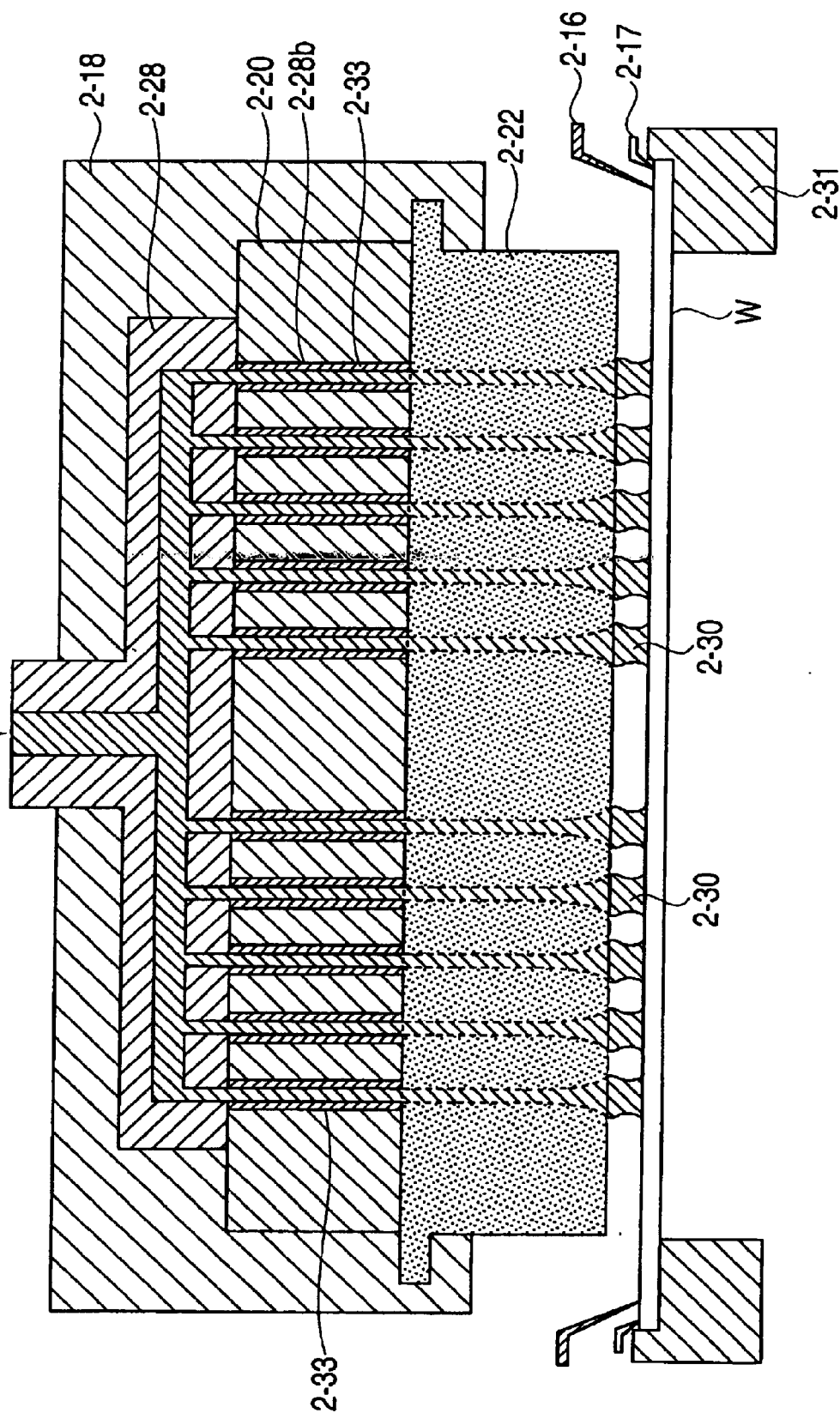

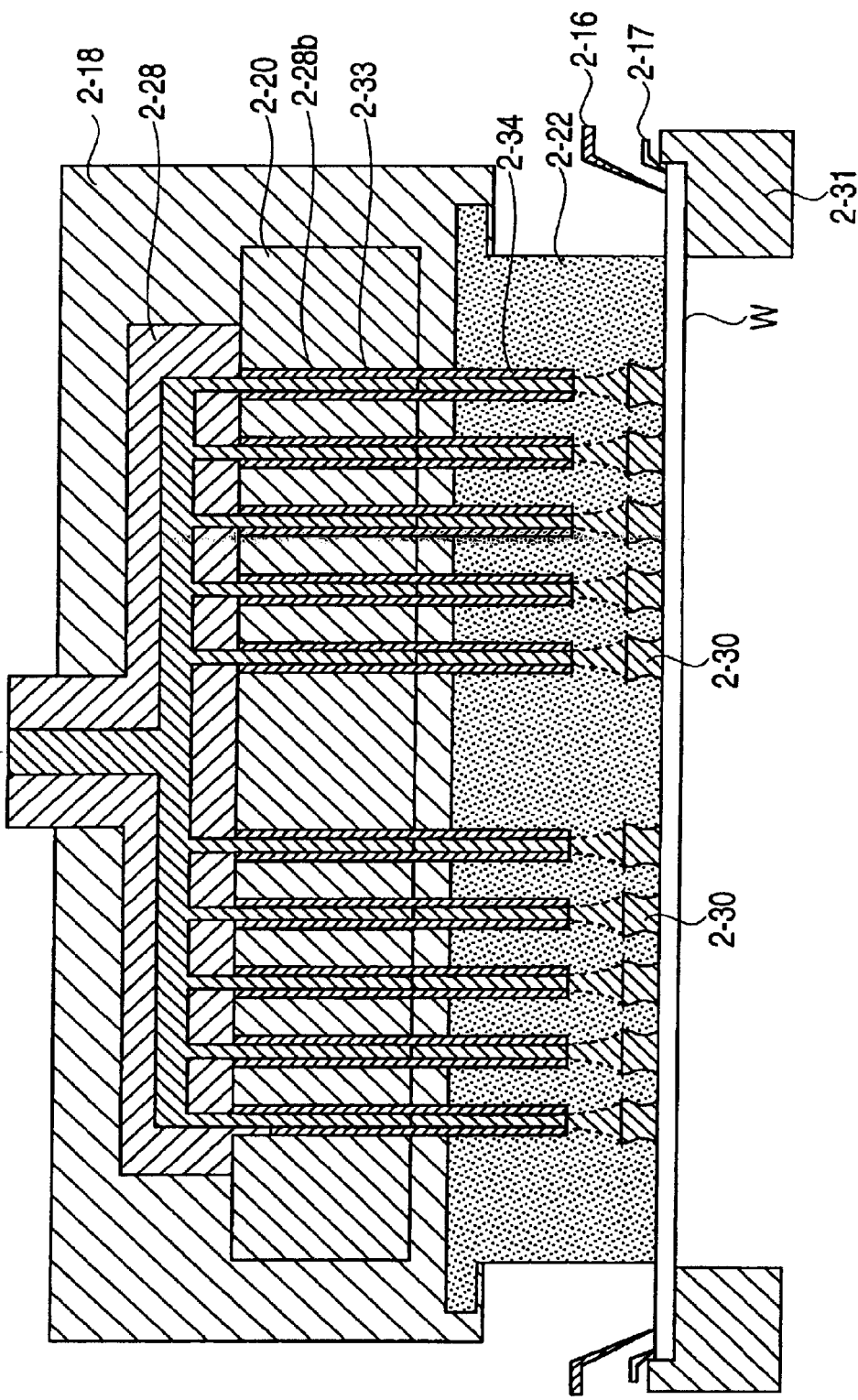

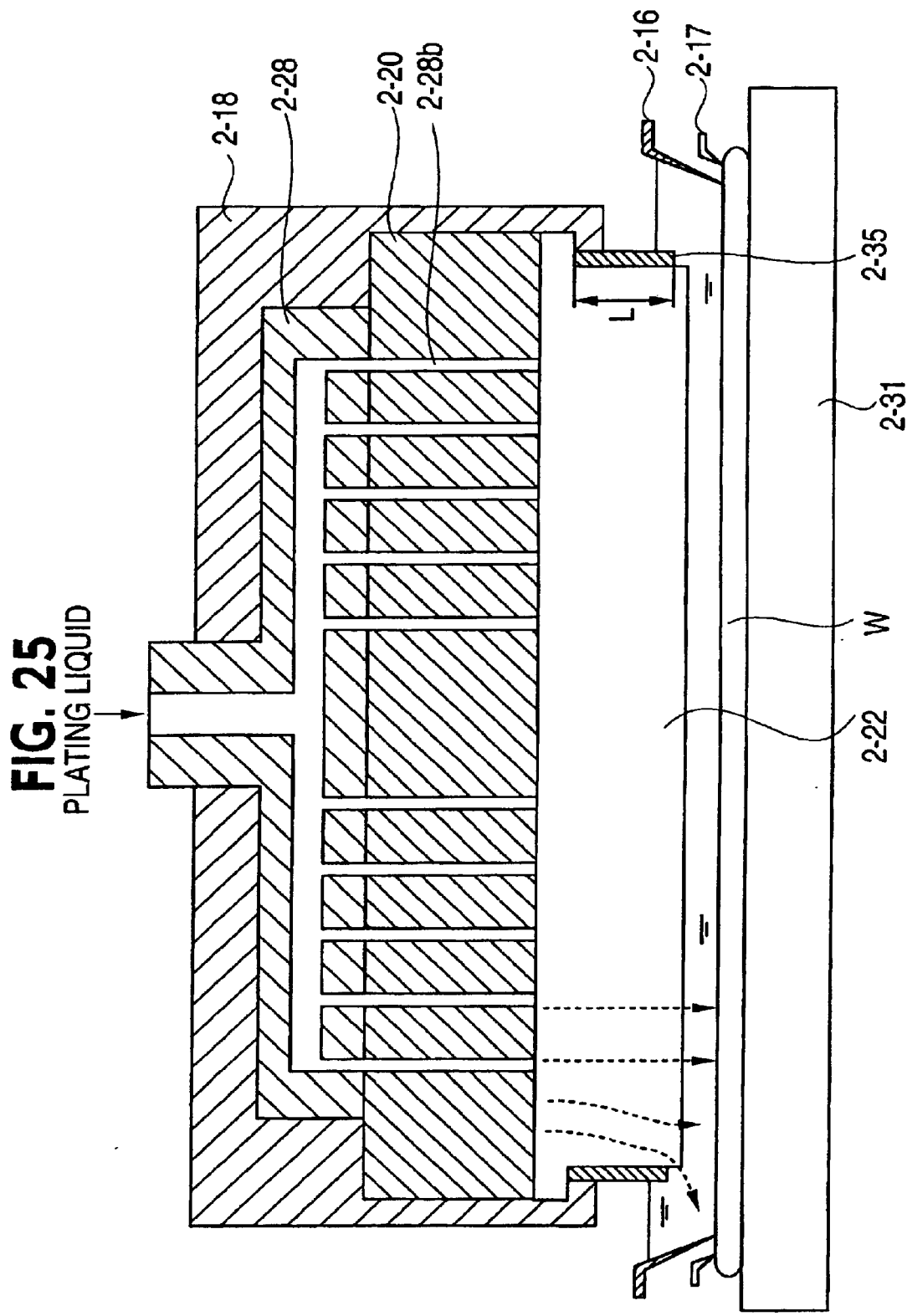

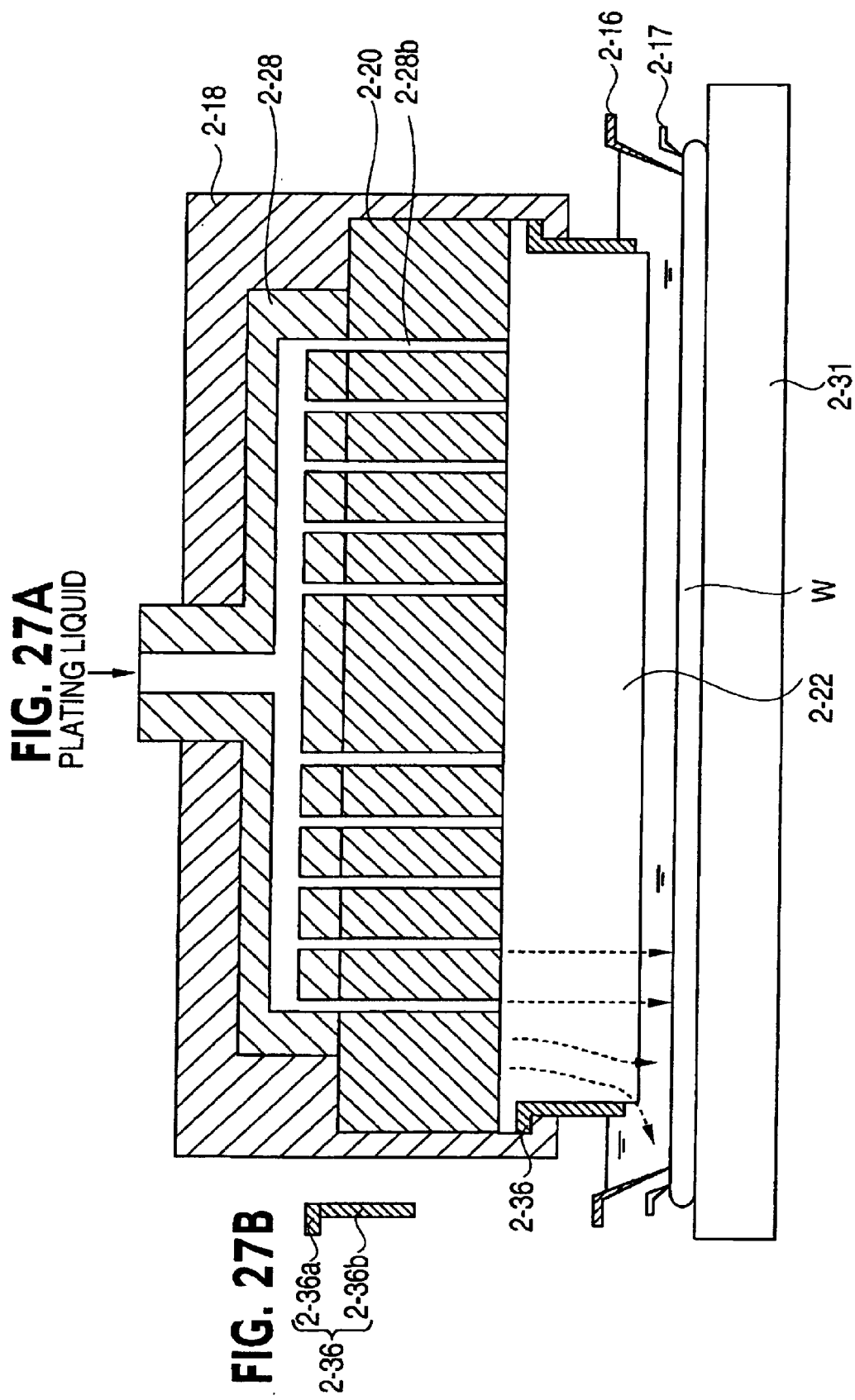

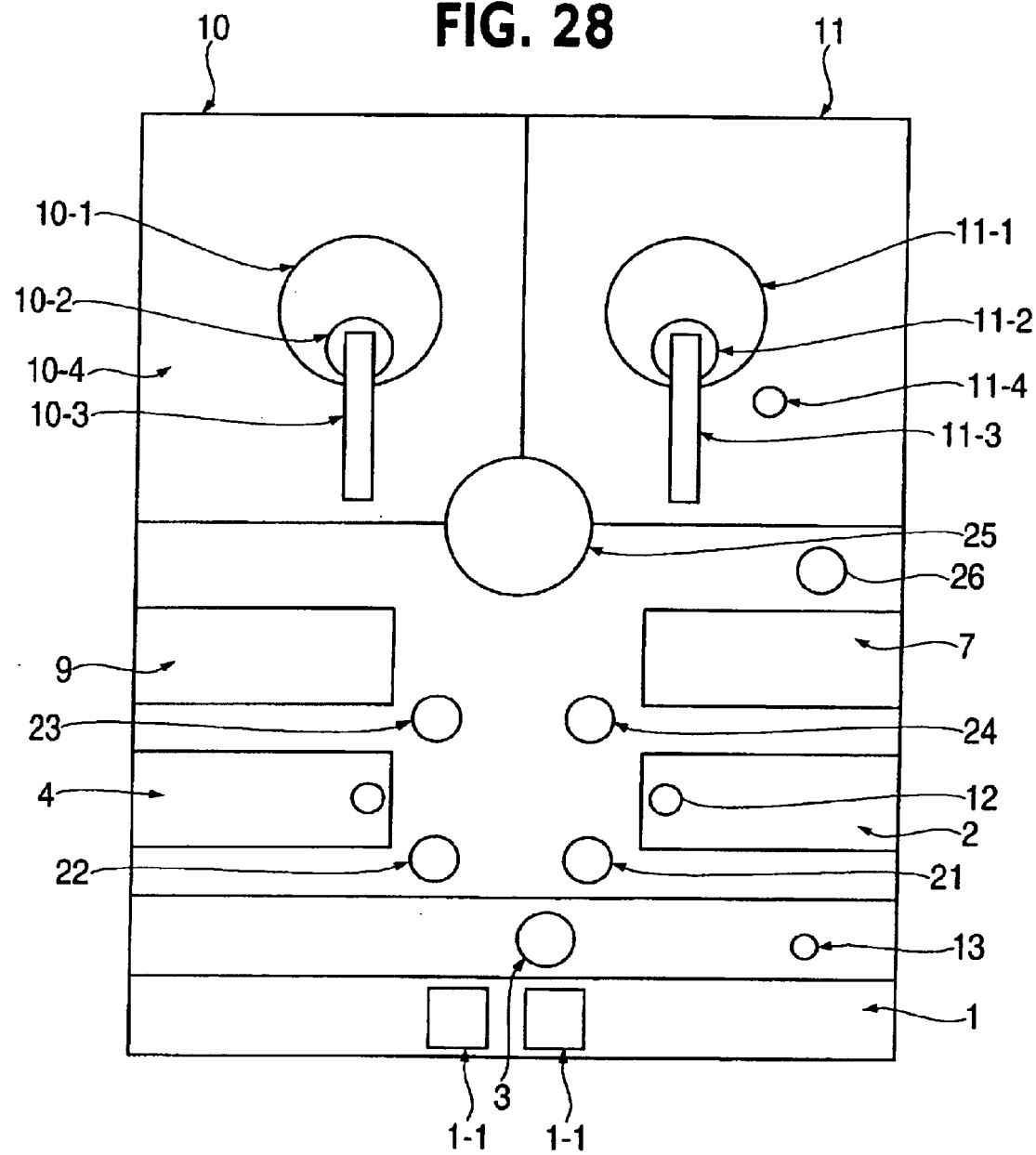

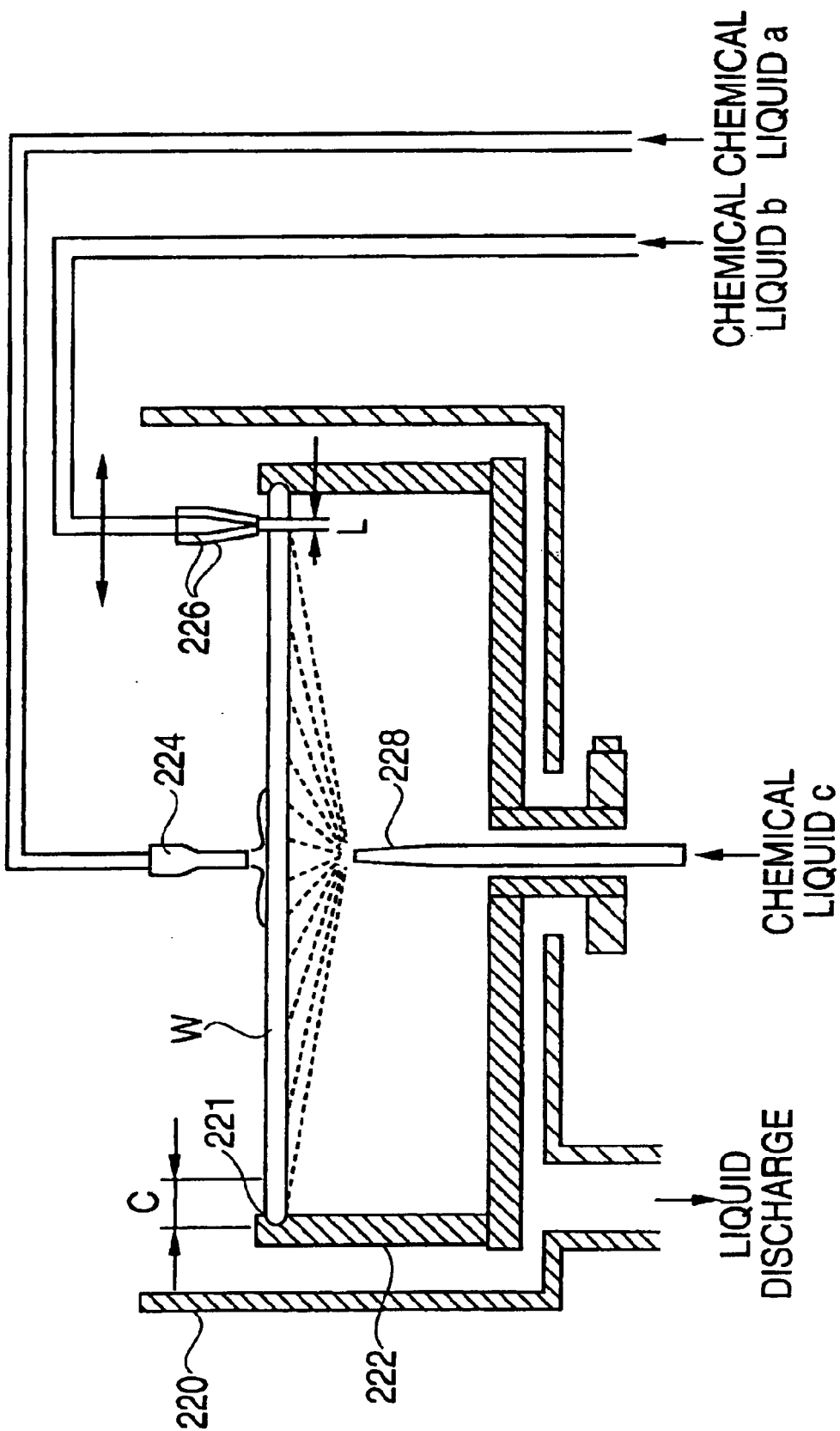

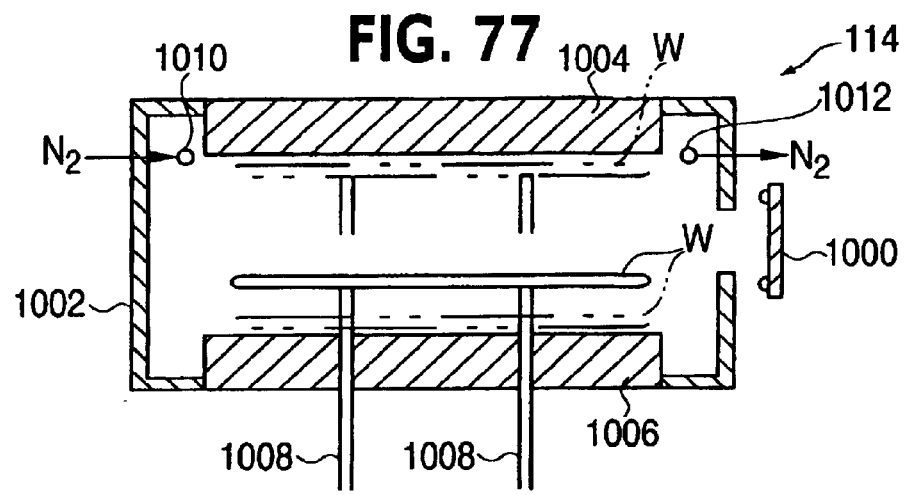
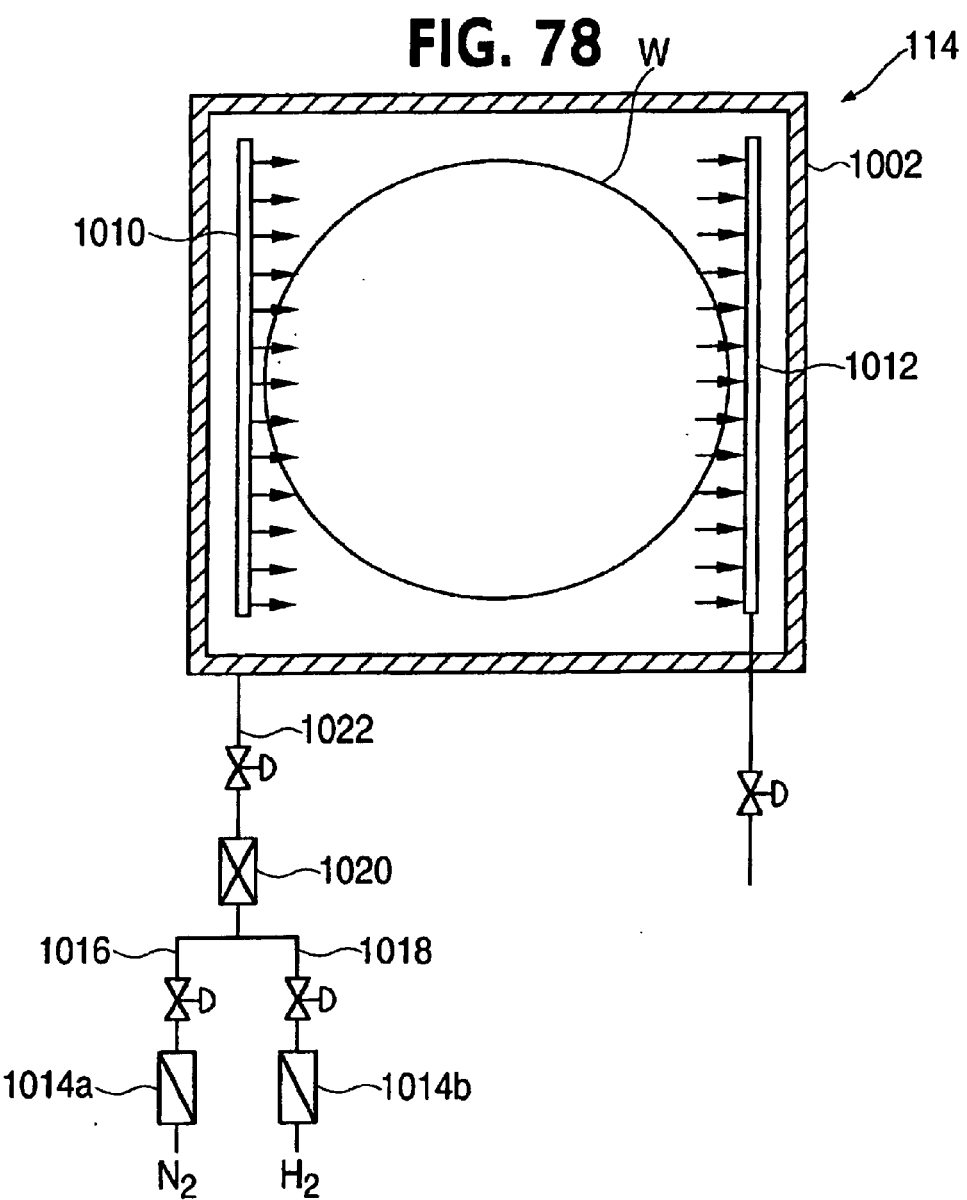

REVOLUTION MEMBER SUPPORTING APPARATUS AND SEMICONDUCTOR SUBSTRATE PROCESSING APPARATUS

BACKGROUND OF THE INVENTION

1. Field of the Invention

The present invention relates to a revolution member supporting apparatus for holding and rotating a disc-shaped object (object to be rotated) such as a semiconductor wafer. The present invention also relates to a semiconductor substrate processing apparatus for forming circuit interconnects by filling a circuit pattern trench and/or hole formed in a semiconductor substrate with a plated metal film, and removing the plated metal film while leaving the metal film at the filled portion.

2. Description of the Related Art

For example, a semiconductor wafer, which has undergone a copper-plating treatment or a CMP (chemical mechanical polishing) treatment, is generally subjected to a cleaning treatment. The cleaning treatment is usually performed by supplying a cleaning liquid onto the upper surface of a semiconductor wafer around its center, while the wafer is being held horizontally and rotated by a revolution member supporting apparatus, and allowing the cleaning liquid to diffuse radially over the upper surface of the wafer by the action of centrifugal force.

It is usual with such a revolution member supporting apparatus to hold a semiconductor wafer by engaging the periphery of the wafer with a plurality of holding members.

In conventional revolution member supporting apparatuses, such holding members always engage certain fixed portions in the periphery of a semiconductor wafer when the wafer is held and rotated. Accordingly, there has been the problem that a cleaning liquid cannot reach adequately into the engaging portions, and therefore a satisfactory cleaning treatment cannot be carried out.

An attempt has been made to solve this problem by making a change of holding members during a cleaning treatment. According to this approach, for example, two pairs of holding members, each pair consisting of three members, are provided, and a semiconductor wafer is allowed to be held by each of the two pairs separately by exchanging one pair for the other according to the rotating speed of the apparatus. This approach, however, has the problem that since the number of holding members in engagement with a semiconductor wafer is relatively small, the wafer cannot be held sufficiently firmly, whereby slipping of the wafer at the engaging portions is likely to occur. This may wear the holding members and produce particles that contaminate the semiconductor wafer.

Generally, aluminum or aluminum alloys have been used as a material for forming interconnection circuits on a semiconductor substrate. The higher integrated density of semiconductor devices requires that a material having a higher electric conductivity should be used for interconnection circuits. Thus, there has been proposed a method which comprises plating a surface of a semiconductor substrate having a circuit pattern trench and/or hole formed therein to fill Cu (copper) or copper alloy into the circuit pattern trench and/or hole, and removing the Cu or copper alloy with the exception of the filled portion, thereby forming circuit interconnects.

The above method of forming circuit interconnects will be described with reference to FIGS. 1A through 1C. As shown in FIG. 1A, a conductive layer 101a is formed on a semiconductor substrate 101 on which semiconductor devices are formed, and an oxide film 102 of $SiO_2$ is deposited on the conductive layer 101a. Then, a via hole 103 and a trench 104 for an interconnect are formed in the oxide film 2 by lithography and etching technology. Thereafter, a barrier layer 105 of TiN or the like is formed thereon, and then a seed layer 107 as an electric supply layer for electroplating is formed on the barrier layer 105.

Then, as shown in FIG. 1B, the surface of the semiconductor substrate W is coated with copper by electroplating to deposit a plated copper film 106 on the oxide film 102, thus filling the via hole 103 and the trench 104 with copper. Thereafter, the plated copper film 106 and the barrier layer 105 on the oxide film 102 are removed by chemical mechanical polishing (CMP), thus making the plated copper film 106 in the via hole 103 and the trench 104 lie flush with the oxide film 102. In this manner, an interconnect composed of the plated copper film 106 is produced as shown in FIG. 1C.

In this case, the barrier layer 105 is formed so as to cover a substantially entire surface of the oxide film 102, and the seed layer 107 is also formed so as to cover a substantially entire surface of the barrier layer 105. Thus, in some cases, as shown in FIG. 2, a copper film which is the seed layer 107 resides in a bevel (outer peripheral portion) of the semiconductor substrate W, or copper is deposited on an edge (outer peripheral portion) inwardly of the bevel of the semiconductor substrate W and remains unpolished (not shown in the drawing).

Copper can easily be diffused into the oxide film 102 in a semiconductor fabrication process such as annealing, for example, thus deteriorating the electric insulation of the oxide film and impairing the adhesiveness of the oxide film with a film to be subsequently deposited to possibly cause separation of the deposited film. It is therefore necessary to remove the remaining unnecessary copper completely from the substrate before at least film deposition. Furthermore, copper deposited on the outer peripheral portion of the substrate other than the circuit formation area is not only unnecessary, but may cause cross contamination in subsequent processes of delivering, storing and processing the semiconductor substrate. For these reasons, it is necessary that the remaining deposited copper on the peripheral portion of the substrate should be completely removed immediately after the copper film deposition process orthe CMP process. Here, the outer peripheral portion of the substrate is defined as an area including an edge and a bevel of the semiconductor substrate W, or either the edge or the bevel. The edge of the substrate means areas of the front and back surfaces of the semiconductor substrate W within about 5 mm from the outer peripheral end of the substrate, and the bevel of the substrate means an area of the outer peripheral end surface and a curved portion in a cross section of the semiconductor substrate W within 0.5 mm from the outer peripheral end of the substrate.

Recently, a so-called dry-in dry-out configuration in which a substrate is introduced in a dry state and removed in a dry state is employed in a plating apparatus for performing Cu plating of copper interconnection, and a polishing apparatus for performing chemical mechanical polishing. The apparatuses have such structure that after respective processing steps such as plating or polishing are performed, particles are removed and dried by a cleaning unit and a spin-drying unit, and the semiconductor substrate is taken out in a dry state from the respective apparatuses. In this manner, the plating apparatus and the polishing apparatus perform many common processes, which are essentially successive processes. Thus, there have been problems that the initial cost and the running cost for the apparatuses are high, installation spaces for installation of both apparatuses need to be wide, and a long processing time is required.

Currently, the driving force for semiconductor devices is changing from work stations and personal computers to digital information household electric appliances (game machines, cellular phones, digital still cameras, DVD, car navigation instruments, digital video cameras, and the like). Under these circumstances, LSI production also needs to respond to changes from general purpose LSIs used in personal computers, and the like, to system LSIs required for digital information household electric appliances.

These system LSIs are characterized by a wide variety of products, low volume production, great fluctuations in the number of products made, and a short life of product, as compared with general purpose LSIs. In order to reduce the instrument costs of digital information household electrical appliances, it is indispensable to reduce the manufacturing cost for LSIs. In semiconductor production plants as well, it is demanded to shift from the concept of large scale lines to the possession of many types of small scale lines, and minimize the production time rather than the amount of production. In order to cope with these demands, it is demanded for future semiconductor device production to respond quickly to the needs of instrument manufacturers and place semiconductor devices on the production lines as promptly as possible. Besides, since changes in demand are drastic, it is necessary that functional changes can be made flexibly, or the apparatus can be renewed.

SUMMARY OF THE INVENTION

The present invention has been made in view of the above drawbacks. It is therefore a first object of the present invention to provide a revolution member supporting apparatus which, when used in a cleaning treatment of an object to be rotated such as a semiconductor wafer, for example, can allow such as a cleaning liquid, supplied during the cleaning treatment, to reach the entire peripheral area of the object to be rotated and, in addition, can securely hold the object to be rotated and prevent the generation of particles.

A second object of the invention is to provide a semiconductor substrate processing apparatus which can lower the initial cost and the running cost of the apparatus, do not need a wide installation space, can form circuit interconnects by copper or copper alloy in a short processing time, and are free from remaining copper film at an edge and bevel portion which will cause cross contamination.

Another object of the present invention is to provide a semiconductor substrate processing apparatus suitable for production lines which produce products in many different varieties, in a low volume, in greatly fluctuated numbers, and with a short product life, such as system LSIs used in digital information household electric appliances, are on a small scale, and can flexibly make functional changes or can renew the apparatus.

In order to achieve the first object, a first aspect of the present invention comprising: a rotatable member which rotates about an axis of rotation; and a plurality of holding members which are disposed along a circle having a center corresponding to the axis of rotation of the rotatable member, and which revolve around the axis of rotation when the rotatable member rotates; wherein the holding members are allowed to swing about their own central axes.

When an object to be rotated, such as a semiconductor wafer, is held and rotated by the revolution member supporting apparatus in carrying out an intended treatment such as cleaning, the peripheral portions of the object in engagement with the holding members can be shifted, during the treatment, by allowing the holding members to swing to a desired degree of angle about their central axes.

Preferably, each of the holding members has a free end with an arc-like recess for engaging a peripheral portion of an object to be rotated. Further, the holding members are allowed to swing to a predetermined degree of angle about their own central axes.

It is preferred that each of the holding members has a center of gravity deviated from the central axis of the holding member, for example, by attaching thereto a weight which has its center of gravity at a distance from the central axis of the holding member. This enables the holding member to swing about its central axis according to the rotating speed of the rotatable member.

It is also preferred that each of the holding members can move between an engaging/holding position where the holding member engages a peripheral portion of an object to be rotated, and a release position where the holding member is detached from the object to be rotated along a radial direction of the rotatable member. The loading and unloading of an object to be rotated into and from the revolution member supporting apparatus may be made when the holding member is in the release position.

The revolution member supporting apparatus is preferably provided with an elastic body that causes the holding member located in the engaging/holding position to engage elastically with the peripheral portion of the object to be rotated. Such an elastic body may be a spring.

In order to achieve the second object, a second aspect of the present invention, comprising: a carry-in and carry-out section for carrying in and carrying out a semiconductor substrate having a surface on which a circuit is formed, in a dry state; a plated metal film forming unit for forming a plated metal film on the semiconductor substrate which has been carried in; a polishing unit for polishing at least part of the plated metal film on the semiconductor substrate; a cleaning unit for cleaning the semiconductor substrate held by a revolution member supporting apparatus; and a transfer mechanism for transferring the semiconductor substrate between the units; wherein the revolution member supporting apparatus comprises: a rotatable member which rotates about an axis of rotation; and a plurality of holding members which are disposed along a circle having a center corresponding to the axis of rotation of the rotatable member, and which revolve around the axis of rotation when the rotatable member rotates; wherein the holding members are allowed to swing about their own central axes.

By constituting the semiconductor substrate processing apparatus as described above, processing in which a power supply seed layer and a plated metal film are applied onto a semiconductor substrate having a trench and/or a hole for an interconenction pattern formed on a surface thereof, and having a barrier layer formed thereon, the power supply seed layer and the plated metal film are polished and removed, and the substrate is cleaned and dried to form interconnects, can be performed continuously by one apparatus. Thus, compared with a case in which respective treatment steps are performed by separate apparatuses, the entire apparatus can be compact, a wide installation space is not needed, the initial cost and running cost for the apparatus can be decreased, and interconnects can be formed in a short processing time.

The present invention comprising: a carry-in and carry-out section for carrying in and carrying out a semiconductor substrate having a surface on which a circuit is formed, in a dry state; an annealing unit for annealing the semiconductor substrate; a polishing unit for polishing at least part of the plated metal film on the semiconductor substrate; a cleaning unit for cleaning the semiconductor substrate held by a revolution member supporting apparatus; and a transfer mechanism for transferring the semiconductor substrate between the units; wherein the revolution member supporting apparatus comprises: a rotatable member which rotates about an axis of rotation; and a plurality of holding members which are disposed along a circle having a center corresponding to the axis of rotation of the rotatable member, and which revolve around the axis of rotation when the rotatable member rotates; wherein the holding members are allowed to swing about their own central axes.

Since the annealing unit is provided, as described above, the adhesive force of the plated metal film is stable, there is no fear that the plated metal film may peel during polishing, and electrical characteristics of the plated metal film are improved.

According to the present invention, there is provided a reinforcing seed layer forming unit for forming a reinforcing seed layer on the semiconductor substrate.

According to the present invention, there is provided a seed layer forming unit for forming a seed layer on the semiconductor substrate.

According to the present invention, there is provided a barrier layer forming unit for forming a barrier layer on the semiconductor substrate.

According to the present invention, there is provided a cap plating unit for forming a plated cap layer on the semiconductor substrate.

By providing the cap plating unit as described above, a cap plating for preventing oxidation or degradation of a plated metal film can be applied onto the upper surface of the plated metal film, so that oxidation and degradation of the upper surface of the plated metal film can be prevented.

According to the present invention, there is provided a bevel etching unit for etching and removing at least one of the plated metal film, a seed layer and a barrier layer formed at a peripheral edge portion of the semiconductor substrate.

According to the present invention, the steps of removing a plated metal film edge portion and a bevel portion after formation of the plated film, and polishing the plated film on the semiconductor substrate can be performed continuously by one apparatus.

According to the present invention, there is provided a film thickness measuring instrument for measuring the film thicknes of the film formed on the semiconductor substrate.

By measuring the film thickness as described above, the plating time for obtaining the desired plated film thickness, the polishing time, and the annealing time can be adjusted. By providing the detection sensor, the substrate surface state such as the metal film thickness of the substrate can be detected without stopping or interrupting the substrate treatment process, and the substrate surface state can also be detected, while high throughput is actualized.

According to the present invention, each of said units is interchangeable.

Since the respective units are adapted to be interchangeable, as described above, renewal of the function of the entire substrate processing apparatus can be achieved at a low cost in a short time.

According to the present invention, in the plated metal film forming unit, plating treatment and cleaning treatment are performed in such a state that the semiconductor substrate is held by a substrate holding portion.

By performing plating treatment and cleaning treatment in such a state that the semiconductor substrate is held by a substrate holding portion, as described above, plating treatment and cleaning treatment can be performed without moving the semiconductor substrate and no contaminants are brought into a next process.

The present invention provides a semiconductor substrate processing apparatus comprising: a carry-in and carry-out section for carrying in and carrying out a semiconductor substrate having a surface on which a circuit formed, in a dry state; a plated metal film forming unit for forming a plated metal film on the semiconductor substrate which has been carried in; an annealing unit for annealing the semiconductor substrate; a bevel etching unit for etching and removing at least one of a plated metal film, a seed layer and a barrier layer formed at a peripheral edge portion of the semiconductor substrate held by a revolution member supporting apparatus; and a transfer mechanism for transferring the semiconductor substrate between the units; wherein the revolution member supporting apparatus comprises: a rotatable member which rotates about an axis of rotation; and a plurality of holding members which are disposed along a circle having a center corresponding to the axis of rotation of the rotatable member, and which revolve around the axis of rotation when the rotatable member rotates; wherein the holding members are allowed to swing about their own central axes.

The present invention further provides an interior of facilities are divided into a loading and unloading area and a treatment unit area, a first robot is provided in the loading and unloading area for transferring a substrate between a loading and unloading section that accommodates a cassette and a temporary storage section disposed in the treatment unit area, and a second robot is provided in the treatment unit area for transferring the substrate between the temporary storage section and various treatment units disposed in the treatment unit area.

BRIEF DESCRIPTION OF THE DRAWINGS

FIG. 3 is a schematic side view of a revolution member supporting apparatus accordance to the present invention;

FIG. 4 is a plan view of FIG. 3;

FIG. 10 is a view showing a schematic constitution example of a cleaning machine of the polishing table in the semiconductor substrate processing apparatus according to the present invention;

FIG. 11A is a view showing an appearance, FIG. 11B is a plan view of a robot hand, and FIG. 11C is a cross-sectional view of the robot hand;

FIG. 22 is a view showing a schematic constitution of an electroplating apparatus according to the present invention;

FIG. 23 is a view showing a schematic constitution of an electroplating apparatus according to the present invention;

FIG. 24 is a view showing a schematic constitution of an electroplating apparatus according to the present invention;

FIG. 25 is a view showing a schematic constitution of an electroplating apparatus applied to the present invention;

FIGS. 27A and 27B are views showing other embodiments of the present invention;

FIG. 28 is a view showing a plan constitution example of the semiconductor substrate processing apparatus according to the present invention;

FIG. 37 is a view showing a schematic constitution example of a bevel and backside cleaning unit in the semiconductor substrate processing apparatus according to the present invention;

FIG. 51A is a plan view and FIG. 51B is a side sectional view;

FIG. 52A is a schematic plan view and FIG. 52B is a schematic side view;

FIG. 53A is a schematic plan view and FIG. 53B is a schematic side view;

FIG. 77 is a vertical sectional view of an annealing unit; and

FIG. 78 is a transverse sectional view of the annealing unit.

DETAILED DESCRIPTION OF THE PREFERRED EMBODIMENTS

Figure 1A:
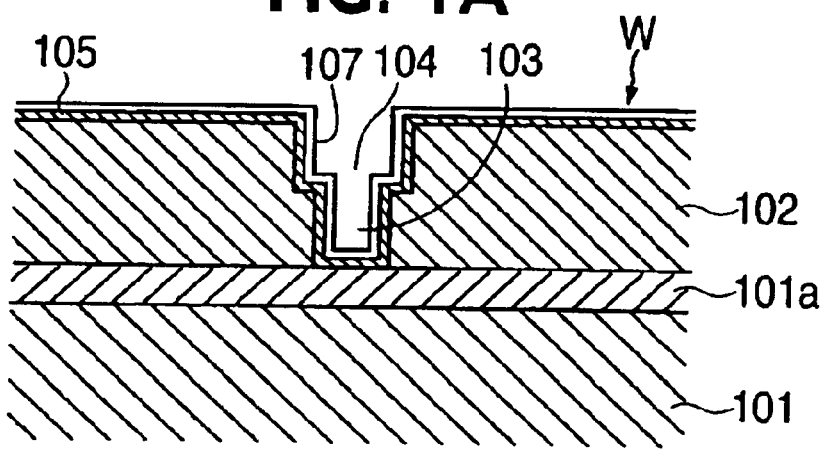
FIGS. 1A through 1C are schematic views for forming interconnects on a semiconductor substrate.
Figure 1B:
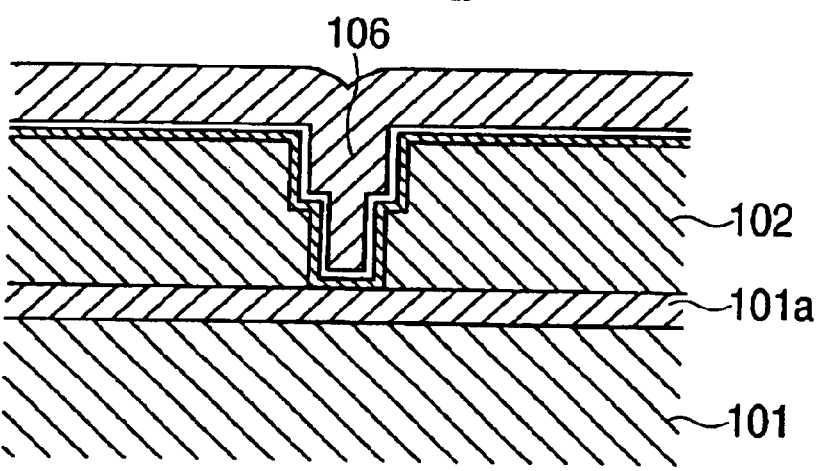
Figure 1C:
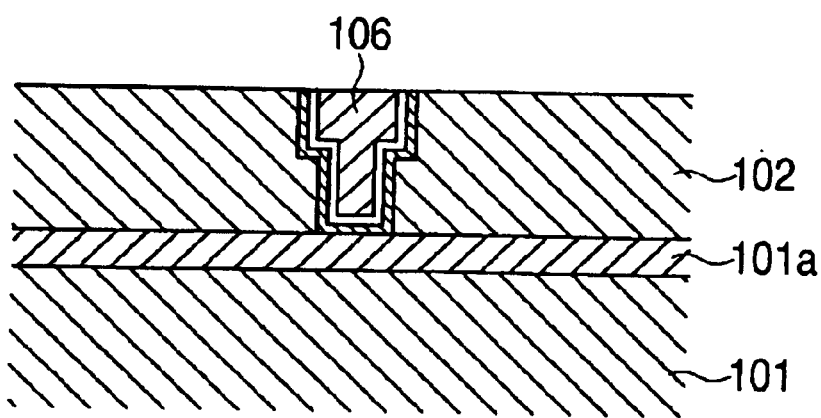

Embodiments of the present invention will now be described with reference to the drawings. FIGS. 3 through 6 show an embodiment of a revolution member supporting apparatus in accordance with the present invention. The revolution member supporting apparatus 40 is for holding a substrate (object to be rotated) W such as a semiconductor wafer, and has a disc-shaped rotatable member 44 that is set horizontally and rotated by a rotatable drive shaft 42, and a plurality of holding members 46 for holding the substrate W above the rotatable member 44. The holding members 46 are mounted on the peripheral portion of the rotatable member 44 and arranged along a circle with the rotatable drive shaft 42 as a center, with each two adjacent members being spaced at a predetermined distance (60° in the embodiment of FIG. 4). The holding members 46 engage the periphery W' of the substrate W, thereby holding the substrate W horizontally. In FIG. 3, reference numeral 47 denotes a belt driving device for connecting the rotatable drive shaft 42 to a motor M for driving, and H denotes a housing for accommodating the revolution member supporting apparatus 40, that is adapted to prevent a cleaning liquid or the like supplied from a nozzle N to the substrate W from scattering all around and correct the scattered liquid which is then discharged through a discharge pipe D.

Figure 5:
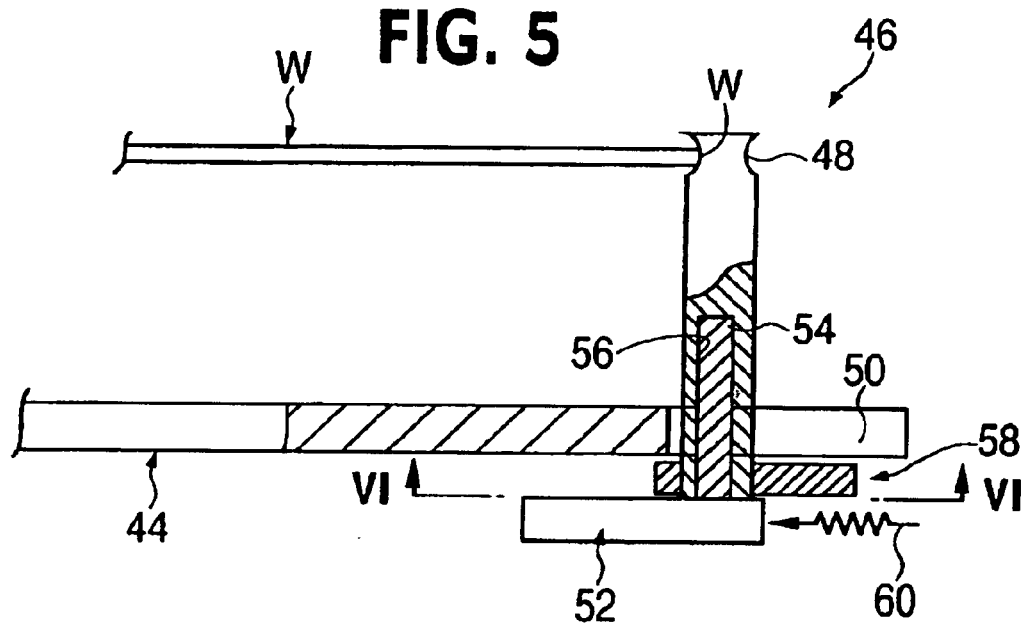
FIG. 5 is a fragmentary side view showing the details of a holding member of the revolution member supporting apparatus for supporting a disc-shaped object.

FIG. 5 shows the details of each holding member 46. The holding member 46 is substantially columnar and has near its top an engaging surface 48 in an annular groove form. The engaging surface 48 is adapted to make a friction engagement with the periphery W of the substrate W. The holding member 46 vertically penetrates a slot 50, which is formed in the peripheral portion of the rotatable member 44 and extends in the radial direction thereof, and is rotatably supported at its bottom by a holding plate 52. The holding plate 52 is located below the rotatable member 44 and is so constructed that it is allowed to rotate together with the rotatable member 44. The holding member 46 is held on the holding plate 52 in such a manner that it is allowed to swing about its own central axis. That is, the holding plate 52 has, mounted thereon, a small-diameter shaft 54 extending vertically upward, whereas in the inside of the holding member 46, a hole 56 is formed that extends upward from the bottom of the holding member 46. The hole 56 is adapted to make a clearance fit with the small-diameter shaft 54, so that the holding member 46 can swing about the small-diameter shaft 54 as a center.

Figure 6:
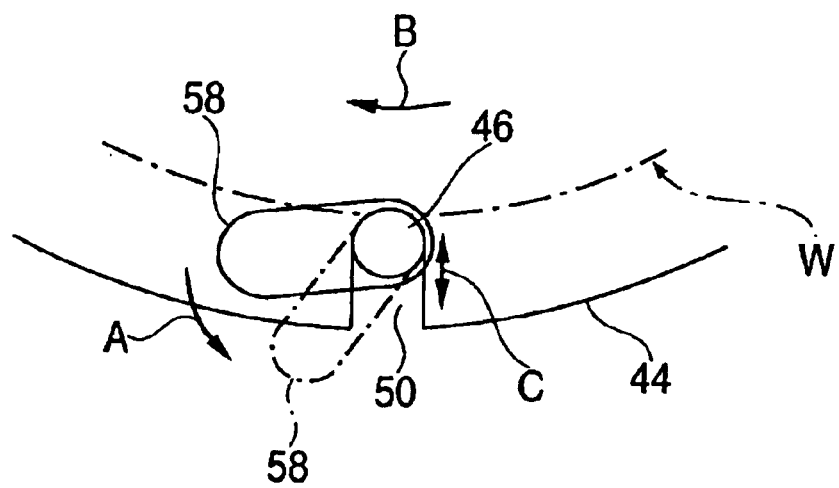
FIG. 6 is a cross-sectional view taken along the line VI—VI of FIG. 5.

Further, a weight 58, extending horizontally, is mounted on lower end of the holding member 46. When the rotatable member 44 rotates about its axis of rotation, i.e. the rotatable drive shaft 42, and the holding member 46 revolves around the shaft 42, the weight 58 is forced to move (swing) by the action of centrifugal force whereby the holding member 46 swings (rotates) about its own axis (i.e. the shaft 54). The position of the weight 58 shown by the solid line in FIG. 6 represents a home position, where the weight 58 is forced by pressure through an elastic means, not shown. When a certain centrifugal force is applied, the weight 58 is forced to move in the direction of arrow A towards the position shown by the chain line, whereby the substrate W is made to move in the direction of arrow B.

The holding plate 52 is supported, in such a manner that it can move horizontally in the direction of arrow C, i.e. the radial direction of the rotatable member 44 by a link mechanism or the like, not shown, so that the holding member 46 can move along the slot 50 between an engaging/ holding position (the position shown in FIG. 5) where the holding member 46 engages the periphery W of the substrate W and a release position which is spaced radially outwardly from the engaging/holding position and in which the holding member 46 detaches from the periphery W of the substrate W. Further, the holding plate 52 is pressed inwardly in the radial direction of the rotatable member 44 by a spring 60 so that the engaging surface 48 of the holding member 46 in the engaging/holding position elastically engages the periphery W' of the substrate W through the spring 60.

The operation of the revolution member supporting apparatus 40 for holding and rotating the substrate will now be described. First, each holding member 46 is moved, against the pressure by the spring 60, outwardly in the radial direction of the rotatable member 44 to the release position. Thereafter, the substrate W is set horizontally above the rotatable member 44, and the holding member 46 is returned to the engaging/holding position to bring the engaging surface 48 into engagement with the periphery W' of the substrate W, thereby allowing the holding member 48 to elastically hold the substrate W.

When the rotatable member 44 is driven to rotate and the holding member 46 revolves, a centrifugal force comes to act on the weight 58. The centrifugal force acting on the weight 58 is weak when the rotational speed of the rotatable member 44 is low, and so the weight 58 is kept motionless due to the pressure by the spring which forces the weight 58 in the home position. When the rotational speed of the rotational member 44 is higher than a particular value, the centrifugal force acting on the weight 58 exceeds the counter pressure by the spring and causes the weight 58 to swing, whereby the holding member 46 swings (rotates) about its central axis. Since the holding member 46 is in friction engagement with the periphery W' of the substrate W as described above, the swinging of the holding member 46 makes the substrate W move in the direction of arrow B shown in FIG. 6, thus shifting the engaging portion in the periphery W' of the substrate W.

According to the embodiment shown in FIGS. 5 and 6, the weight 58, whose center of gravity is eccentric to the central axis of the holding member 46, is mounted on the holding member 46. The use of such an eccentric weight, as described above, enables the holding member 46 to swing (rotate) about its central axis as the rotatable member 44 rotates. However, the mechanism for the swinging (rotation) of the holding member 46 is not limited thereto. Thus, for example, a link mechanism may be connected to the holding member 46, and the holding member 46 may be allowed to swing (rotate) through the action of the link mechanism.

The revolution member supporting apparatus of the present invention, which has the above structural features and technical effects, can advantageously be utilized in a cleaning treatment of a substrate (object to be rotated) such as a semiconductor wafer. When cleaning is performed to the substrate while it is held and rotated by the revolution member supporting apparatus, the peripheral portions of the substrate in engagement with the holding members can be shifted during the cleaning treatment, whereby a cleaning liquid can reach to the entire peripheral area of the substrate, thus enabling a satisfactory cleaning treatment.

Though the revolution member supporting apparatus can be applied to any cleaning device, it is most suitably employed in a bevel-etching device for performing bevel-etching (etching of edge and bevel portions) to a semiconductor wafer. The use of the revolution member supporting apparatus in the bevel-etching device, while ensuring the holding of a semiconductor wafer, can shift the edge portions (the periphery W') of the semiconductor wafer in engagement with the holding members, whereby etching can be effected to every edge or bevel portion of the semiconductor wafer.

Further, since an object to be rotated such as a semiconductor wafer is held by all of the holding members that are provided in the revolution member supporting apparatus, the object to be rotated can be held firmly and, therefore, the above described problem of generation of particles can be prevented.

Figure 7:
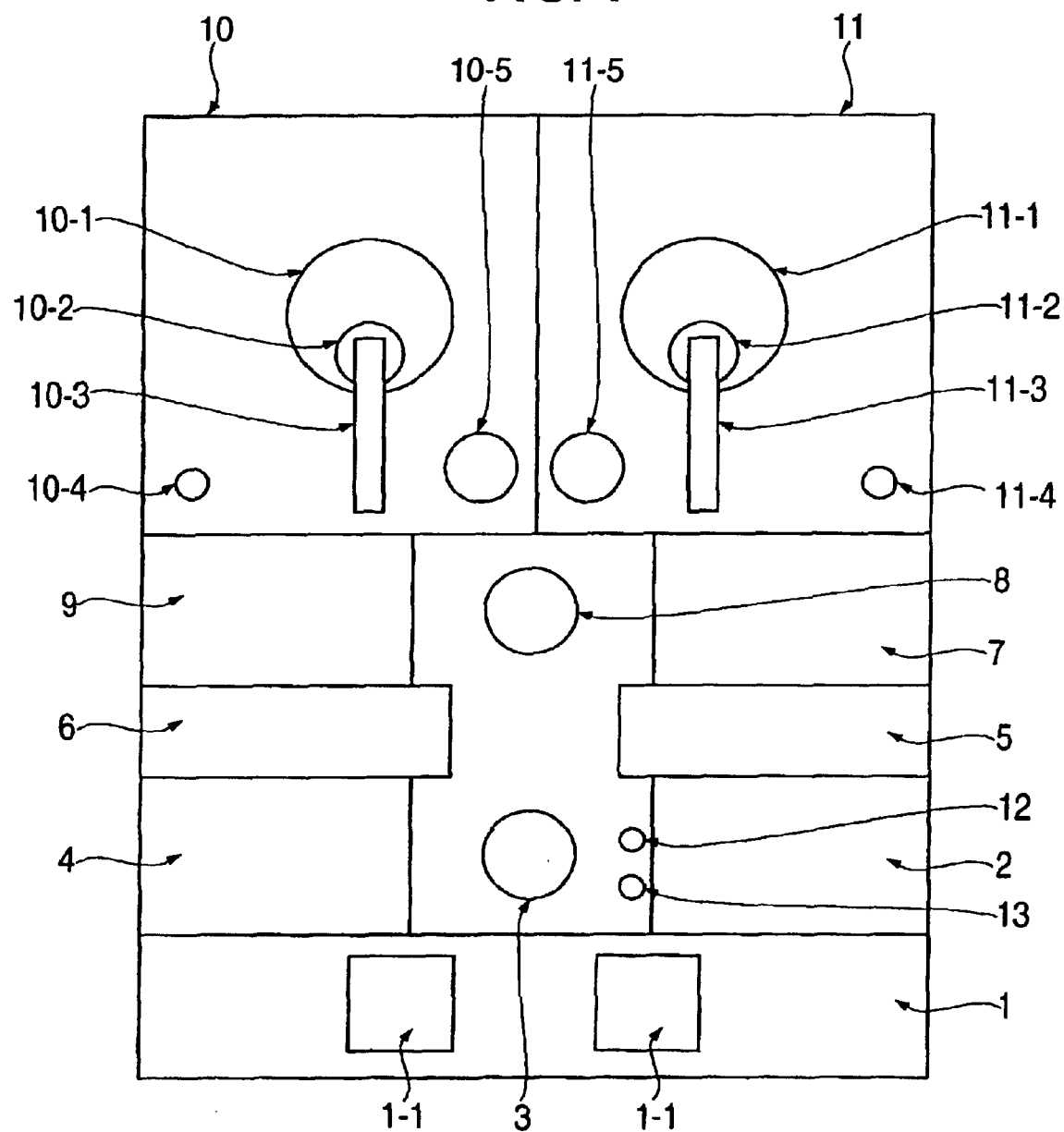
FIG. 7 is a view showing a plan constitution example of a semiconductor substrate processing apparatus according to the present invention.

FIG. 7 is a view showing the plan constitution of a semiconductor substrate processing apparatus according to the first aspect of the present invention. The semiconductor substrate processing apparatus of the present invention is of a constitution in which there are provided a loading and unloading section 1, a plated Cu film forming unit 2, a first robot 3, a third cleaning unit 4, a reversing machine 5, a reversing machine 6, a second cleaning unit 7, a second robot 8, a first cleaning unit 9, a first polishing apparatus 10, and a second polishing apparatus 11. A before-plating and after-plating film thickness measuring instrument 12 for measuring the film thicknesses before and after plating, and a dry state film thickness measuring instrument 13 for measuring the film thickness of a semiconductor substrate W in a dry state after polishing are placed near the first robot 3.

The before-plating and after-plating film thickness measuring instrument 12, and the dry state film thickness measuring instrument 13, especially the dry state film thickness measuring instrument 13, may be provided on a hand of the first robot 3, as will be described later on. The before-plating and after-plating film thickness measuring instrument 12 may be provided at a semiconductor substrate carry-in and carry-out opening of the plated Cu film forming unit 2, although this is not shown, so as to measure the film thickness of the semiconductor substrate W carried in, and the film thickness of the semiconductor substrate W carried out.

The first polishing apparatus (polishing unit) 10 has a polishing table 10-1, a top ring 10-2, a top ring head 10-3, a film thickness measuring instrument 10-4, and a pusher 10-5. The second polishing apparatus (polishing unit) 11 has a polishing table 11-1, a top ring 11-2, a top ring head 11-3, a film thickness measuring instrument 11-4, and a pusher 11-5.

A cassette 1-1 accommodating the semiconductor substrates W, in which a via hole 103 and a trench 104 for interconnect are formed, and a seed layer 107 is formed thereon as shown in FIG. 1A, is placed on a loading port of the loading and unloading section 1. The first robot 3 takes out the semiconductor substrate W from the cassette 1-1, and carries the semiconductor substrate W into the plated Cu film forming unit 2 where a plated Cu film 106 is formed. At this time, the film thickness of the seed layer 107 is measured with the before-plating and after-plating film thickness measuring instrument 12. The plated Cu film 106 is formed by carrying out hydrophilic treatment of the face of the semiconductor substrate W, and then Cu plating. After formation of the plated Cu film 106, rinsing or cleaning of the semiconductor substrate W is carried out in the plated Cu film forming unit 2. If there is time to spare, drying of the semiconductor substrate W may be performed. Constitution examples and operations of the plated Cu film forming unit 2 will be described in detail later on.

When the semiconductor substrate W is taken out from the plated Cu film forming unit 2 by the first robot 3, the film thickness of the plated Cu film 106 is measured with the before-plating and after-plating film thickness measuring instrument 12. The method of measurement is the same as for the seed layer 107. The results of its measurement are recorded into a recording device (not shown) as record data on the semiconductor substrate, and are used for judgment of an abnormality of the plated Cu film forming unit 2. After measurement of the film thickness, the first robot 3 transfers the semiconductor substrate W to the reversing machine 5, and the reversing machine 5 reverses the semiconductor substrate W (the surface on which the plated Cu film 106 has been formed faces downward). The first polishing apparatus 10 and the second polishing apparatus 11 perform polishing in a serial mode and a parallel mode. Next, polishing in the serial mode and the parallel mode will be described.

[Serial Mode Polishing]

In the serial mode polishing, a primary polishing is performed by the polishing apparatus 10, and a secondary polishing is performed by the polishing apparatus 11. The second robot 8 picks up the semiconductor substrate W on the reversing machine 5, and places the semiconductor substrate W on the pusher 10-5 of the polishing apparatus 10. The top ring 10-2 attracts the semiconductor substrate W on the pusher 10-5 by suction, and brings the surface of the plated Cu film 106 of the semiconductor substrate W into contact with a polishing surface 10-1a of the polishing table 10-1 under pressure to perform a primary polishing, shown in FIG. 8. With the primary polishing, the plated Cu film 106 is basically polished. The polishing surface 10-1a of the polishing table 10-1 is composed of foamed polyurethane such as IC1000, or a material having abrasive grains fixed thereto or impregnated therein. Upon relative movements of the polishing surface 10-1a and the semiconductor substrate W, the plated Cu film 106 is polished.

Silica, alumina, ceria, or the like is used as abrasive grains for performing polishing of the plated Cu film 106, or as a slurry ejected from a slurry nozzle 10-6. A mainly acidic material for oxidizing Cu, such as hydrogen peroxide, is used as an oxidizing agent. A temperature controlled fluid piping 28 for passing a liquid whose temperature is adjusted to a predetermined value is connected to the interior of the polishing table 10-1 in order to maintain the temperature of the polishing table 10-1 at a predetermined value. A temperature regulator 10-7 is provided on the slurry nozzle 10-6 in order to maintain the temperature of the slurry at a predetermined value. Water or the like used for dressing is also controlled in temperature, although this is not shown. In this manner, temperature of the polishing table 101, the temperature of the slurry, and the temperature of water or the like used for dressing are maintained at predetermined values, whereby the chemical reaction rate is kept constant. Particularly for the polishing table 10-1, ceramics with high thermal conductivity, such as alumina or SiC, are used.

An eddy current film thickness measuring instrument 10-8 or an optical film thickness measuring instrument 10-9 provided in the polishing table 10-1 is used for detection of an end point of the primary polishing. Film thickness measurement of the plated Cu film 106, or surface detection of the barrier layer 5 is performed, and when the film thickness of the plated Cu film 106 reaches zero or when the surface of the barrier layer 5 is detected, polishing is judged to have reached its end point.

After completion of polishing of the plated Cu film 106, the semiconductor substrate W is returned onto the pusher 10-5 by the top ring 10-2. The second robot 8 picks up the semiconductor substrate W, and introduces it into the first cleaning unit 9. At this time, a chemical liquid may be ejected toward the face and backside of the semiconductor substrate W on the pusher 10-5 to remove particles therefrom or cause particles to be difficult to adhere thereto.

Figure 9:
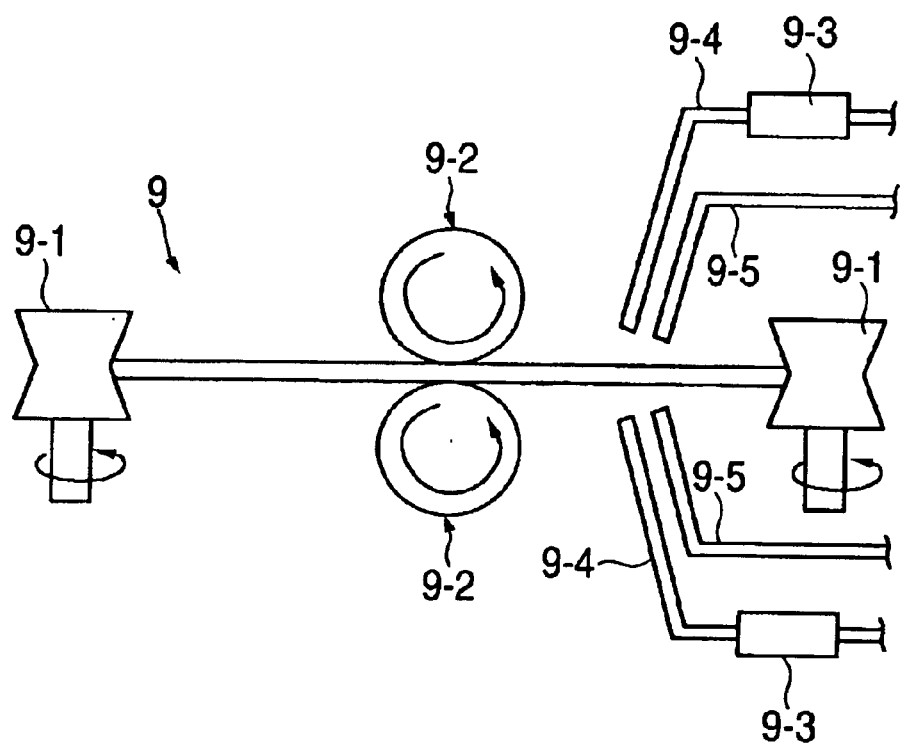
FIG. 9 is a view showing a schematic constitution example of a cleaning unit in the semiconductor substrate processing apparatus according to the present invention.

FIG. 9 is a schematic view showing the first cleaning unit. In the first cleaning unit 9, the face and the backside of the semiconductor substrate W are scrubbed with PVA sponge rolls 9-2, 9-2. As cleaning water ejected from nozzles 9-4, pure water is mainly used, but there may be used a surface active agent, or a chelating agent, or a mixture of both which has been adjusted in pH and conformed to the zeta potential of copper oxide. The nozzle 9-4 may also be provided with an ultrasonic vibration element 9-3 for applying ultrasonic vibrations to the cleaning water to be ejected. The reference numeral 9-1 is a rotating roller for rotating the semiconductor substrate W in a horizontal plane.

After completion of cleaning in the first cleaning unit 9, the second robot 8 picks up the semiconductor substrate W, and places the semiconductor substrate W on the pusher 11-5 of the second polishing apparatus 11. The top ring 11-2 attracts the semiconductor substrate W on the pusher 11-5 by suction, and brings the surface of the semiconductor substrate W, which has the barrier layer 105 formed thereon, into contact with a polishing surface of the polishing table 11-1 under pressure to perform the secondary polishing. The constitution of the polishing table 11-1 and the top ring 11-2 are the same as the constitution shown in FIG. 8. With this secondary polishing, the barrier layer 105 is polished. However, there may be a case in which a Cu film and an oxide film left after the primary polishing are also polished.

A polishing surface 11-1a of the polishing table 11-1 is composed of foamed polyurethane such as IC1000, or a material having abrasive grains fixed thereto or impregnated therein. Upon relative movements of the polishing surface 11-1a and the semiconductor substrate W, polishing is carried out. At this time, silica, alumina, ceria, or the like is used as abrasive grains or a slurry. A chemical liquid is adjusted depending on the type of the film to be polished.

Figure 8:
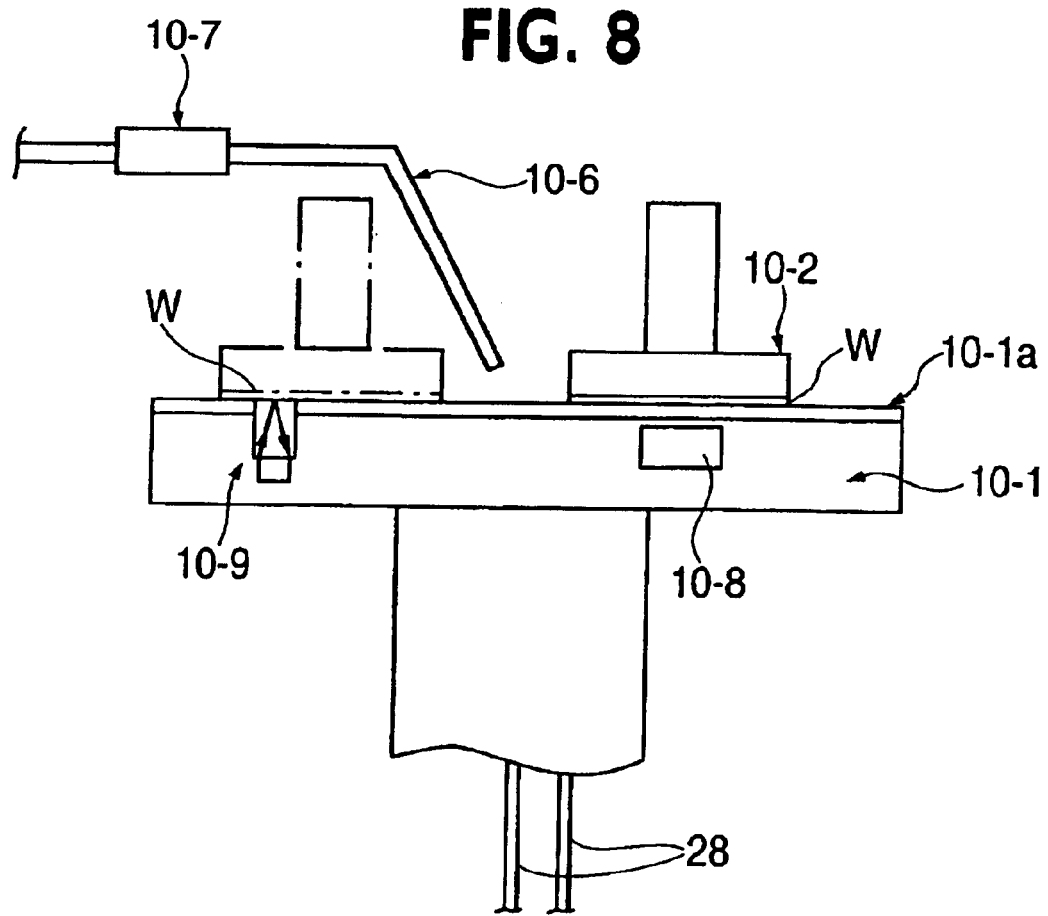
FIG. 8 is a view showing a schematic constitution example of a polishing table and a top ring in the semiconductor substrate processing apparatus according to the present invention.

Detection of an end point of the secondary polishing is performed by measuring the film thickness of the barrier layer 105 mainly with the use of the optical film thickness measuring instrument 10-9 shown in FIG. 8, and detecting the film thickness which has become zero, or detecting the surface of an insulating film 102 comprising $SiO_2$. Furthermore, a film thickness measuring instrument with an image processing function is used as the film thickness measuring instrument 11-4 provided near the polishing table 11-1. By use of this measuring instrument, measurement of the oxide film is made, the results are stored as processing records of the semiconductor substrate W, and used for judging whether the semiconductor substrate W in which secondary polishing has been finished can be transferred to a subsequent step or not. If the end point of the secondary polishing is not reached, repolishing is performed. If overpolishing has been performed beyond a prescribed value due to any abnormality, then the semiconductor substrate processing apparatus is stopped to avoid next polishing so that defective products will not increase.

After completion of the secondary polishing, the semiconductor substrate W is moved to the pusher 11-5 by the top ring 11-2. The second robot 8 picks up the semiconductor substrate W on the pusher 11-5. At this time, a chemical liquid may be ejected toward the face and backside of the semiconductor substrate W on the pusher 11-5 to remove particles therefrom or cause particles to be difficult to adhere thereto.

The second robot 8 carries the semiconductor substrate W into the second cleaning unit 7 where cleaning of the semiconductor substrate W is performed. The constitution of the second cleaning machine 7 is also the same as the constitution of the first cleaning machine 9 shown in FIG. 9. The face of the semiconductor substrate W is scrubbed with the PVA sponge rolls 9-2 using a cleaning liquid to which pure water, a surface active agent, a chelating agent, or a pH regulating agent is added so as to remove particles mainly. A strong chemical liquid such as DHF is ejected from a nozzle 9-5 toward the backside of the semiconductor substrate W to perform etching of the diffused Cu thereon. If there is no problem of diffusion, scrubbing cleaning is performed with the PVA sponge rolls 9-2 using the same chemical liquid as that used for the face.

After completion of the above cleaning, the second robot 8 picks up the semiconductor substrate W and transfers it to the reversing machine 6, and the reversing machine 6 reverses the semiconductor substrate W. The semiconductor substrate W which has been reversed is picked up by the first robot 3, and transferred to the third cleaning unit 4. In the third cleaning unit 4, megasonic water excited by ultrasonic vibrations is ejected toward the face of the semiconductor substrate W to clean the semiconductor substrate W. At this time, the face of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by spin-drying. The third cleaning unit 4 is provided with a rotatable holding apparatus shown in FIGS. 3 through 6.

As described above, if the film thickness has been measured with the film thickness measuring instrument 11-4 provided near the polishing table 11-1, then the semiconductor substrate W is not subjected to further process and is accommodated into the cassette placed on the unloading port of the loading and unloading section 1.

When multilayer film measurement is to be made, measurement in a dry state needs to be performed. Thus, the semiconductor substrate W is once introduced into the film thickness measuring instrument 13 for measurement of each film thickness. In the film thickness measuring instrument 13, the results are stored as processing records of the semiconductor substrate W, or a judgment as to whether the semiconductor substrate W can be brought to a next step or not is made. If the end point of polishing is not reached, feedback is given for the semiconductor substrate W to be processed subsequently. If over-polishing has been performed beyond a prescribed value due to any abnormality, the apparatus is stopped to avoid next polishing so that defective products will not increase.

[Parallel Mode Polishing]

In the parallel mode polishing, the semiconductor substrates W having the plated Cu film 106 formed by the plated Cu film forming unit 2 are polished in parallel by the polishing apparatuses 10, 11. The second robot 8 picks up the semiconductor substrate W which has been reversed by the reversing machine 5 as stated above, and places the semiconductor substrate W on the pusher 10-5 or 11-5. The top ring 10-2 or 11-2 attracts the semiconductor substrate W by suction, and brings the surface of the plated Cu film 106 of the semiconductor substrate W into contact with the polishing surface of the polishing table 10-1 or 11-1 under pressure to perform a primary polishing. The polishing surface 10-1a or 11-1a of the polishing table 10-1 or 11-1 is composed of foamed polyurethane such as IC1000, or a material having abrasive grains fixed thereto or impregnated therein, as stated above. Upon relative movements of the polishing surface and the semiconductor substrate W, polishing is performed.

Silica, alumina, ceria, or the like is used as abrasive grains or a slurry. A mainly acidic material for oxidizing Cu, such as hydrogen peroxide, is used as an oxidizing agent. The polishing tables 10-1 and 11-1, and the slurry or water or the like used for dressing are controlled in temperature as stated above to keep the chemical reaction rate constant. Particularly for the polishing tables 10-1 and 11-1, ceramics with high thermal conductivity, such as alumina or SiC, are used.

Polishing in the polishing table 10-1 or 11-1 is performed by a plurality of steps. In the first step, the plated Cu film 106 is polished. A main purpose of this polishing is the removal of the difference in level on the surface of the plated Cu film 106, and a slurry having excellent level difference characteristics is used. For example, a slurry capable of reducing an initial level difference of 700 nm in a 100 $\mu$m line to 20 nm or less is used. At this time, as the second step, the pressing load for pressing the semiconductor substrate W is made a half or less of that in the first step, and the polishing conditions for improving the level difference characteristics are added. For detection of the end point in the second step, the eddy current type measuring machine 10-8 shown in FIG. 8 is used when 500 nm of the plated Cu film 106 is to be left. In the case where 500 nm or less is to be left or polishing is to be performed up to the surface of the barrier layer 105, an optical film thickness measuring instrument 10-9 is used.

After polishing of the Cu layers, i.e. the plated Cu film 106 and the seed layer 107, is completed, polishing of the barrier layer 105 is performed. If the barrier layer 105 cannot be polished usually with the initially used slurry, its composition needs to be changed. Thus, when the second step is completed, the slurry, which has remained on the polishing surface of the polishing table 10-1 or 11-1 and has been used in the first and second steps, is removed by a water polish, a water jet, an atomizer having a mixture of pure water and a gas, or a dresser. Then, the procedure goes to the next step.

FIG. 10 is a view showing the constitution of a cleaning mechanism for cleaning the polishing surface 10-1a of the polishing table 10-1. As illustrated, a plurality of (four in the drawing) mixing nozzles 10-11a to 10-11d for mixing pure water and a nitrogen gas and ejecting the mixture are disposed above the polishing table 10-1. Each of the mixing nozzles 10-11a to 10-11d is supplied with a nitrogen gas whose pressure has been controlled by a regulator 16 from a nitrogen gas supply source 14 through an air operator valve 18, and is also supplied with pure water whose pressure has been controlled by a regulator 17 from a pure water supply source 15 through an air operator valve 19.

The mixed gas and liquid undergo changes in parameters, such as the pressure and temperature of the liquid and/or gas and the nozzle shape, by the nozzles. The liquid to be supplied is transformed by nozzle jetting as follows: ① formation of liquid fine particles, ② formation of solid fine particles upon solidification of the liquid, ③ gasification of the liquid upon evaporation (hereinafter,①, ②, ③ are called atomization). A mixture of a liquid-based component and a gas component is jetted, with predetermined directional properties, toward the polishing surface of the polishing table 10-1.

When the polishing surface 10-1a is to be regenerated (dressed) upon relative movements of the polishing surface 10-1a and the dresser 10-10, a mixed fluid of pure water and a nitrogen gas is ejected from the mixing nozzles 10-11a to 11-11d toward the polishing surface 10-1a to clean it. The pressure of the nitrogen gas and the pressure of pure water can be set independently. In the present embodiment, manually driven regulators are used along with a pure water line and a nitrogen line, but regulators whose setting pressures can be changed based on external signals may be used. As a result of cleaning of the polishing surface 10-1a using the above-described cleaning mechanism, the slurry remaining on the polishing surface in the first polishing step and the second polishing step could be removed by performing cleaning for 5 to 20 seconds. A cleaning mechanism of the same constitution as that shown in FIG. 10 is provided for cleaning the polishing surface 11-1a of the polishing table 11-1, although this is not shown.

As the abrasive grains used in the slurry for polishing of the barrier layer 105 in the third step, it is desirable to use the same abrasive grains as those for polishing of the plated Cu film 106. Moreover, the pH value of the chemical liquid is either on the acid side or on the alkali side, and the preferable conditions are to prevent formation of a mixture on the polishing surface. In both cases, the same particles of silica were used, and both of the chemical liquid with alkalinity and the chemical liquid with acidity, as the pH value of the chemical liquid, obtained good results.

For detection of the end point in the third step, the optical film thickness measuring instrument 10-9 shown in FIG. 8 is used to detect mainly the film thickness of the $SiO_2$ oxide film and the remainder of the barrier layer 105 and send signals. Furthermore, a film thickness measuring instrument with an image processing function is used as the film thickness measuring instrument 10-4 or 11-4 which is provided near the polishing tables 10-1 and 11-1. By using of this measuring instrument, measurement of the oxide film is made, the results are stored as processing records of the semiconductor substrates W, and used for judging whether the semiconductor substrate W can be transferred to a subsequent step or not. If the end point of polishing in the third step is not reached, repolishing is performed. If overpolishing has been performed beyond a prescribed value owing to any abnormality, the semiconductor substrate processing apparatus is stopped to avoid next polishing so that defective products will not increase.

After completion of the third step, the semiconductor substrate W is moved to the pusher 10-5 or 11-5 by the top ring 10-2 or 11-2, and placed on the pusher 10-5 or 11-5. The second robot 8 picks up the semiconductor substrate W on the pusher 10-5 or 11-5. At this time, a chemical liquid may be ejected toward the face and backside of the semiconductor substrate W on the pusher 10-5 or 11-5 to remove particles therefrom or cause particles to be difficult to adhere thereto.

The second robot 8 carries the semiconductor substrate W into the second cleaning unit 7 or the first cleaning unit 9 where cleaning of the semiconductor substrate W is performed. The face of the semiconductor substrate W is scrubbed with PVA sponge rolls using a cleaning liquid to which pure water, a surface active agent, a chelating agent, or a pH regulating agent is added so as to remove particles mainly. A strong chemical liquid such as DHF is ejected from a nozzle 3-5 toward the backside of the semiconductor substrate W to perform etching of the diffused Cu thereon. If there is no problem of diffusion, scrubbing cleaning is performed with PVA sponge rolls using the same chemical liquid as that for the face.

After completion of the above cleaning, the second robot 8 picks up the semiconductor substrate W and transfers it to the reversing machine 6, and the reversing machine 6 reverses the semiconductor substrate W. The semiconductor substrate W which has been reversed is picked up by the first robot 3, and transferred to the third cleaning unit 4. In the third cleaning unit 4, megasonic water excited by ultrasonic vibrations is ejected toward the face of the semiconductor substrate W to perform cleaning. At this time, the face may be cleaned with a known pencil type sponge using a cleaning liquid to which pure water, a surface active agent, a chelating agent, or a pH regulating agent is added. After cleaning, the semiconductor substrate W is dried by spin-drying, and then the semiconductor substrate W is picked up by the first robot 3.

If the film thickness has been measured with the film thickness measuring instrument 10-4 or 11-4 provided near the polishing table 10-1 or 11-1 as described above, then the semiconductor substrate w is not subjected to no further process and is accommodated into the cassette 1-1 placed on the unloading port of the loading and unloading section 1.

When multilayer film measurement is to be made, measurement in a dry state needs to be performed. Thus, the semiconductor substrate W is once introduced into the film thickness measuring instrument 13 for measurement of each film thickness. In the film thickness measuring instrument 13, the results are stored as processing records of the semiconductor substrate W, or a judgment as to whether the semiconductor substrate W can be transferred to a next step or not is made. If the end point of polishing is not reached, feedback is given for the semiconductor substrate W to be processed subsequently. If over-polishing has been performed beyond a prescribed value owing to any abnormality, the apparatus is stopped to avoid next polishing so that defective products will not increase.

Figure 11A:
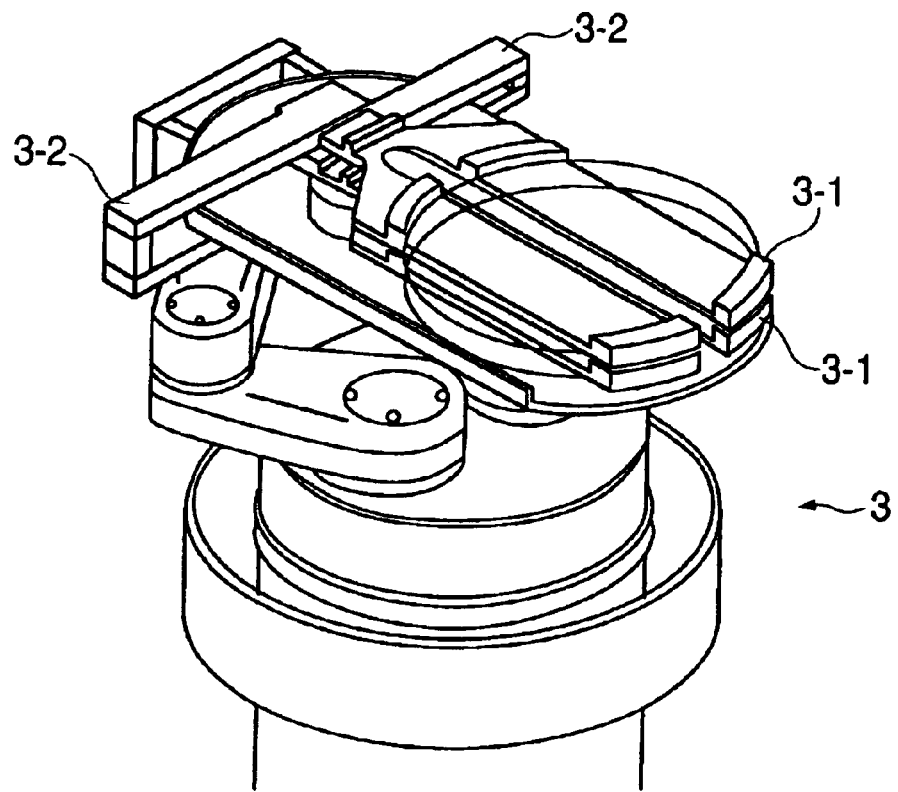
FIGS. 11A through 11C are views showing a robot in the semiconductor substrate processing apparatus according to the present invention.
Figure 11B:
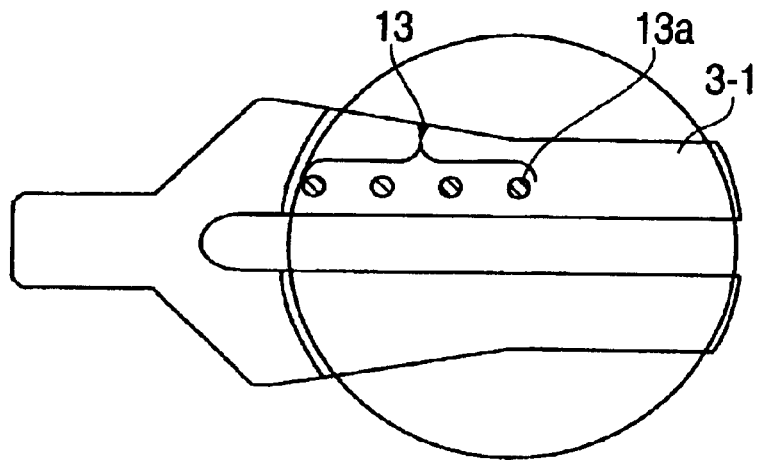
Figure 11C:
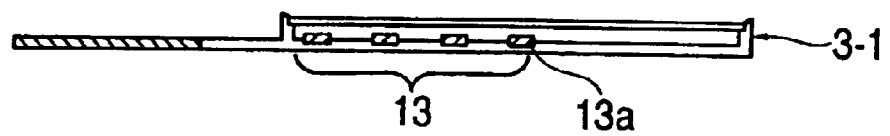

FIGS. 11A through 11C are views showing a constitution example of the first robot 3 and the dry state film thickness measuring instrument 13 provided on the hand of the robot. FIG. 11A is a view showing the appearance of the first robot, and FIGS. 11B and 11C are a plan view and a sectional view of the robot hand, respectively. As illustrated, the first robot 3 has two hands 3-1, 3-1 at upper and lower sides, and the hands 3-1, 3-1 are attached to front ends of arms 3-2, 3-2, respectively, so as to be swingably movable. The hands 3-1, 3-1 can scoop up the semiconductor substrate W (drop the semiconductor substrate W into the recesse) and transfer it to a predetermined location.

A plurality of (four in the drawing) eddy current sensors 13a constituting the dry state film thickness measuring instrument 13 are provided in a recessed surface of the hand 3-1 for the semiconductor substrate W, and can measure the film thickness of the semiconductor substrate W placed thereon.

Figure 12:
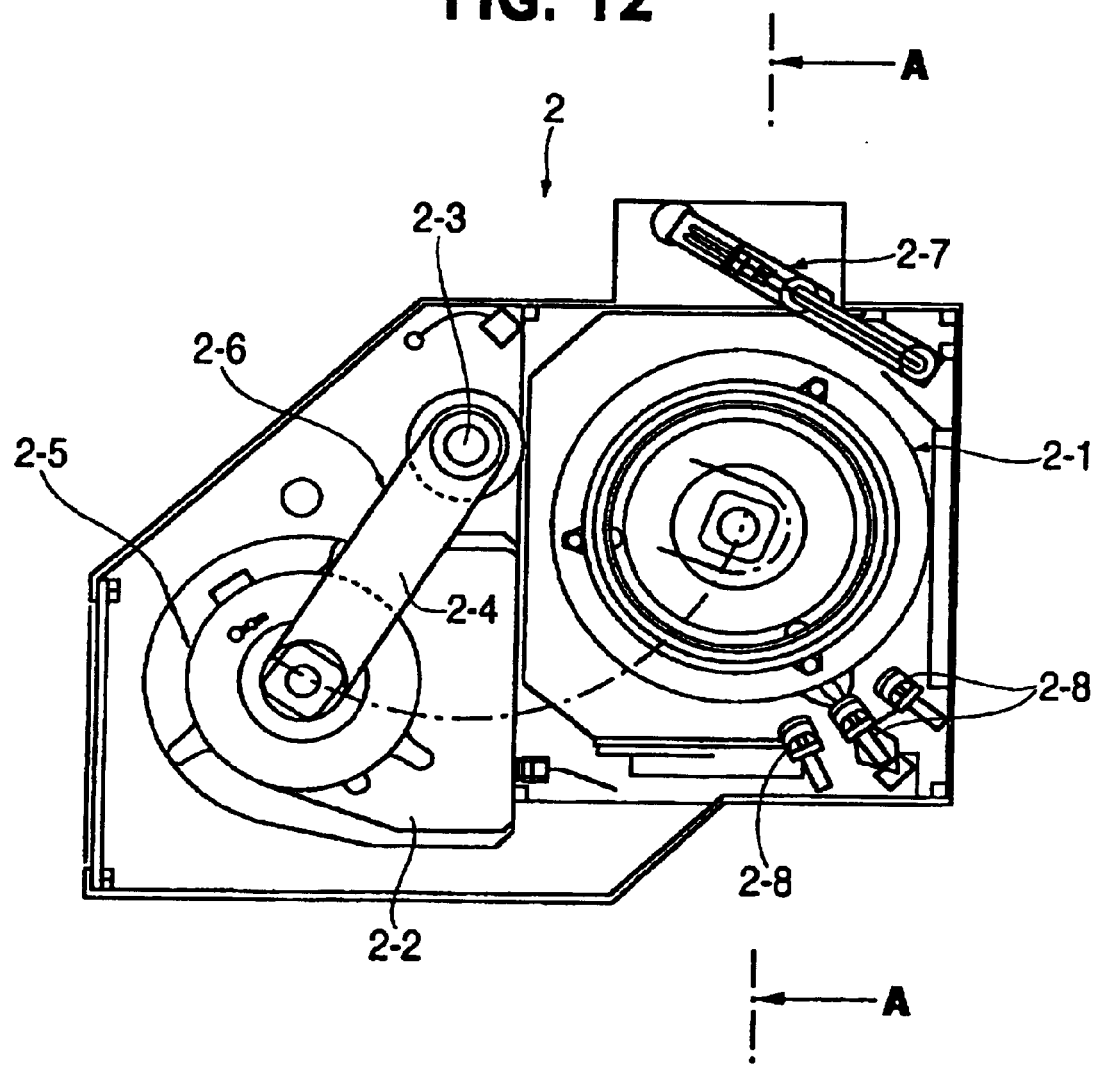
FIG. 12 is a view showing a plan constitution of a plated Cu film forming unit in the semiconductor substrate processing apparatus according to the present invention.
Figure 13:
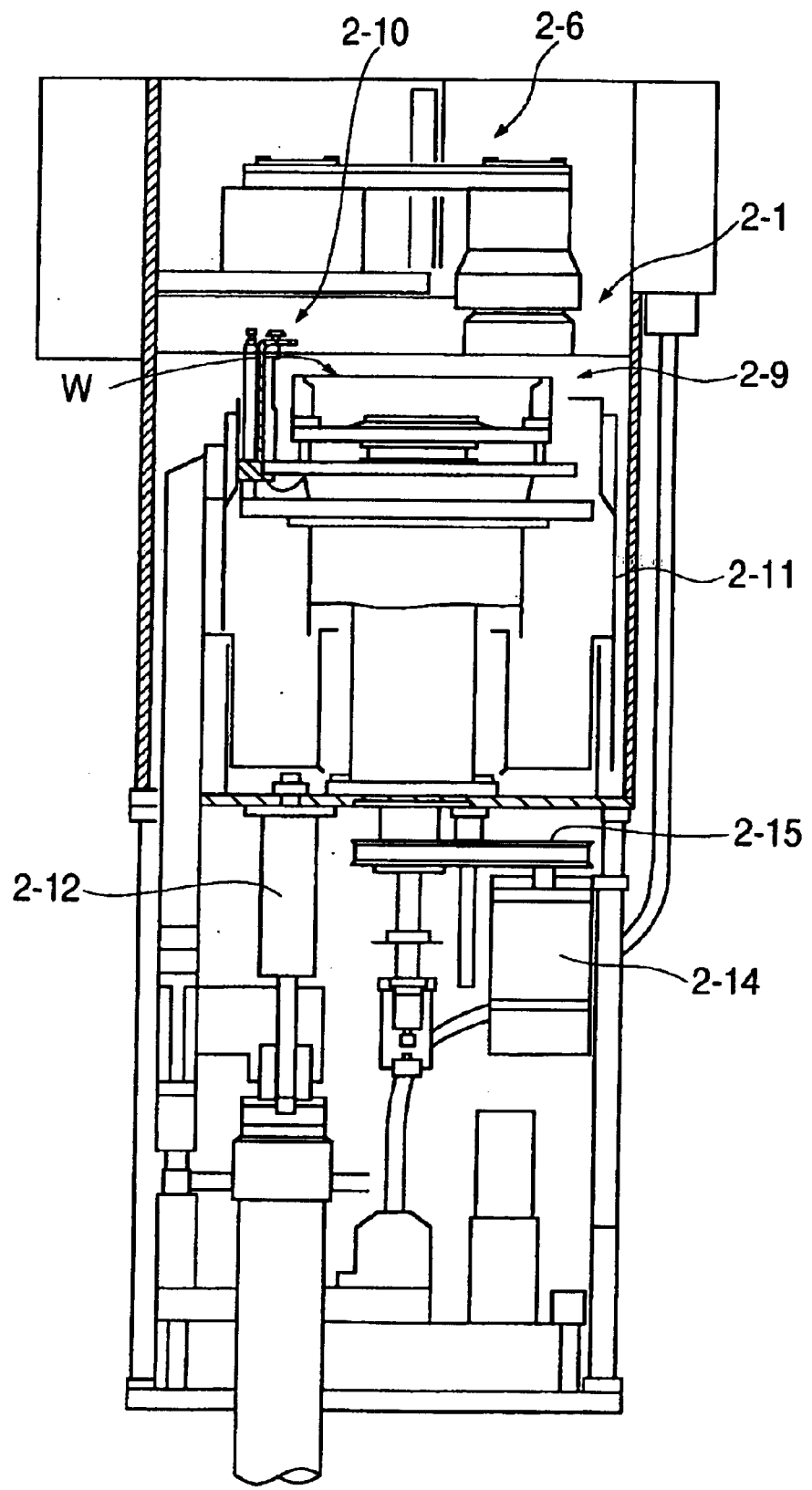
FIG. 13 is a cross-sectional view taken along line A—A of FIG. 12.
Figure 14:
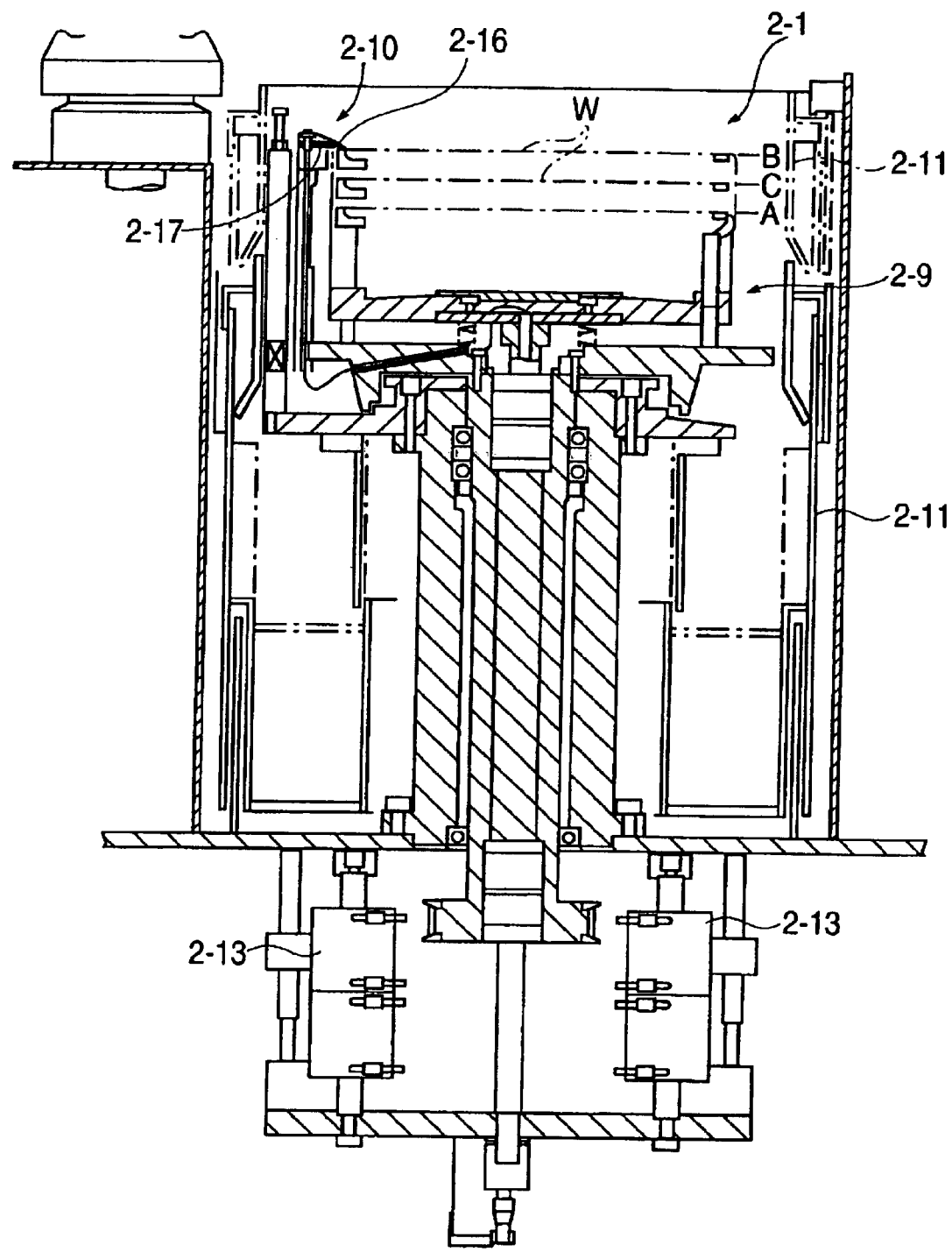
FIG. 14 is a view showing a sectional constitution of a substrate holding portion and a cathode portion of the plated Cu film forming unit in the semiconductor substrate processing apparatus according to the present invention.
Figure 15:
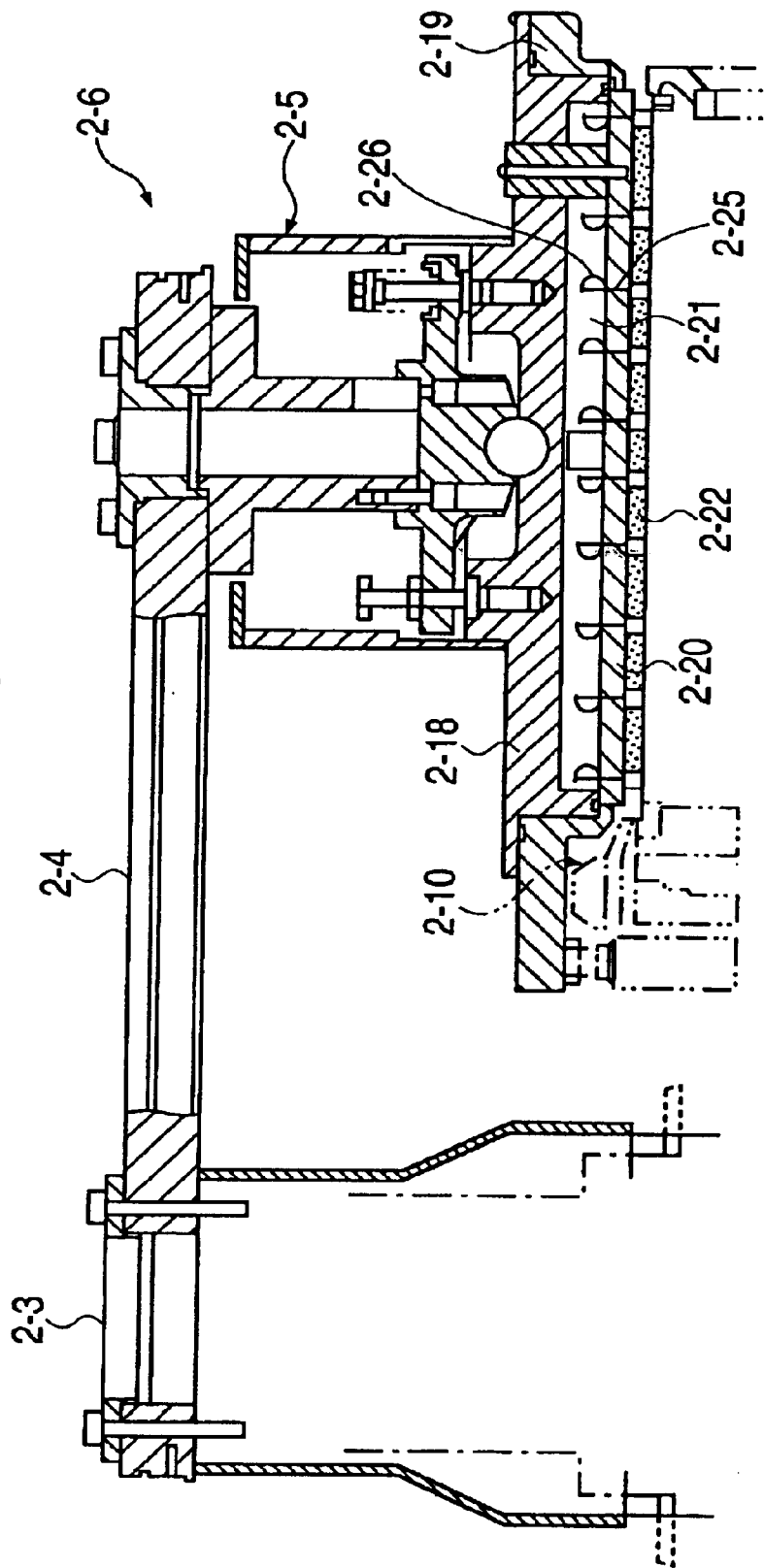
FIG. 15 is a view showing a sectional constitution of an electrode arm portion of the plated Cu film forming unit in the semiconductor substrate processing apparatus according to the present invention.
Figure 16:
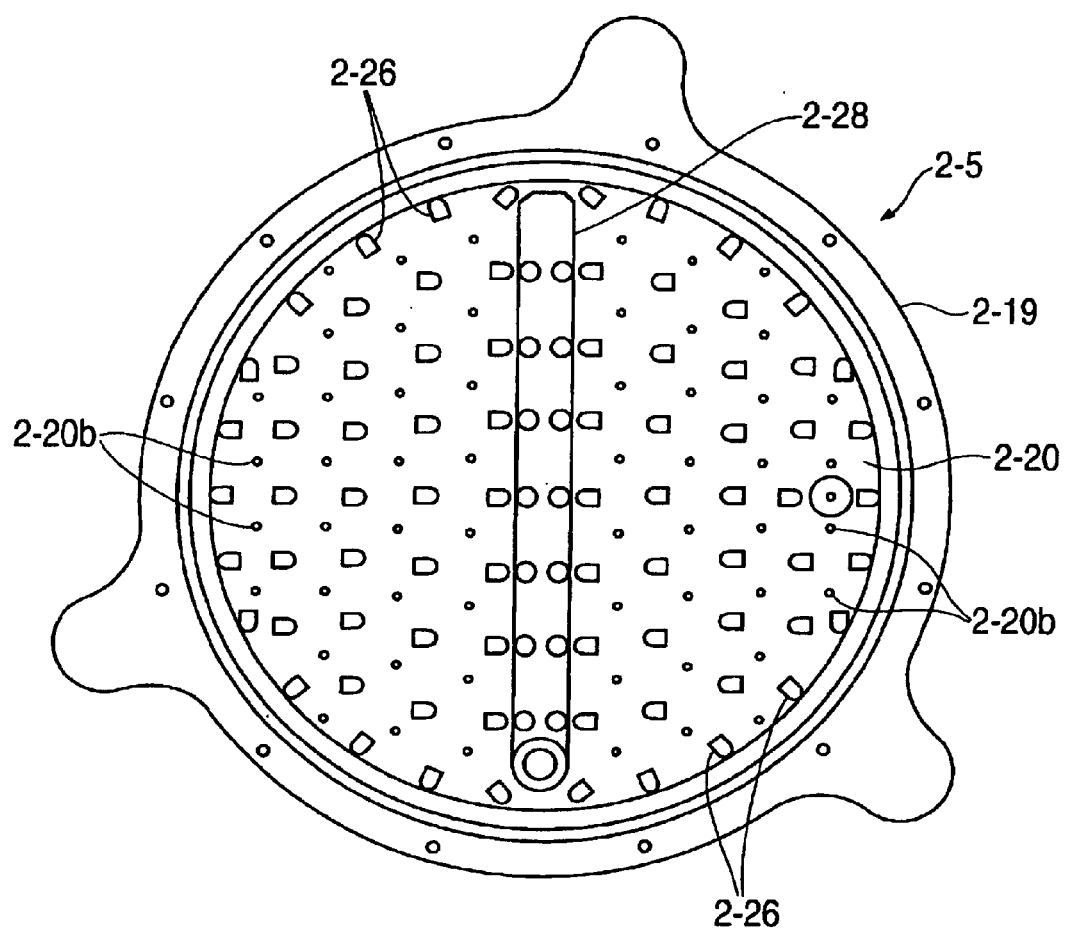
FIG. 16 is a plan view of a state in which a housing has been removed from an electrode portion of the electrode arm shown in FIG. 15.

FIGS. 12 through 16 are views showing a constitution example of the plated Cu film forming unit 2. FIG. 12 is a view showing a plan constitution of the plated Cu film forming unit, FIG. 13 is a sectional view taken along line A—A of FIG. 12, FIG. 14 is an enlarged sectional view of a substrate holding portion and a cathode portion, FIG. 15 is a sectional view of an electrode arm portion, and FIG. 16 is a plan view of a state in which a housing has been removed from the electrode arm portion shown in FIG. 15. The plated Cu film forming unit 2, as shown in FIG. 12, is provided with a substrate treatment section 2-1 for performing plating treatment and its attendant treatment, and a plating liquid tray 2-2 for storing a plating liquid is disposed adjacent to the substrate treatment section 2-1. There is also provided an electrode arm portion 2-6 having an electrode portion 2-5 which is held at the front end of an arm 2-4 swingable about a rotating shaft 2-3 and which is swung between the substrate treatment section 2-1 and the plating liquid tray 2-2.

Furthermore, a precoating and recovery arm 2-7, and fixed nozzles 2-8 for ejecting pure water or a chemical liquid such as ion water, and further a gas or the like toward a semiconductor substrate are disposed laterally of the substrate treatment section 2-1. In this case, three of the fixed nozzles 2-8 are disposed, and one of them is used for supplying pure water. The substrate treatment section 2-1, as shown in FIGS. 13 and 14, has a substrate holding portion 2-9 for holding a semiconductor substrate W with its surface to be plated facing upward, and a cathode portion 2-10 located above the substrate holding portion 2-9 so as to surround a peripheral portion of the substrate holding portion 2-9. Further, a substantially cylindrical bottomed cup 2-11 surrounding the periphery of the substrate holding portion 2-9 for preventing scatter of various chemical liquids used during treatment is provided so as to be vertically movable by an air cylinder 2-12.

The substrate holding portion 2-9 is adapted to be raised and lowered by the air cylinder 2-12 between a lower substrate transfer position A, an upper plating position B, and a pretreatment and cleaning position C intermediate between these positions. The substrate holding portion 2-9 is also adapted to rotate at an arbitrary acceleration and an arbitrary velocity integrally with the cathode portion 2-10 by a rotating motor 2-14 and a belt 2-15. A substrate carry-in and carry-out opening (not shown) is provided in confrontation with the substrate transfer position A in a frame side surface of the plated Cu film forming unit 2 facing the first robot 3. When the substrate holding portion 2-9 is raised to the plating position B, a seal member 2-16 of the cathode portion 2-10 and a cathode electrodes 2-17 (to be described below) are brought into contact with the peripheral edge portion of the semiconductor substrate W held by the substrate holding portion 2-9. On the other hand, the cup 2-11 has an upper end located below the substrate carry-in and carry-out opening, and when the cup 2-11 ascends, the upper end of the cup 2-11 reaches a position above the cathode portion 2-10, as shown by imaginary lines in FIG. 14.

When the substrate holding portion 2-9 has ascended to the plating position B, the cathode electrodes 2-17 are pressed against the peripheral edge portion of the semiconductor substrate W held by the substrate holding portion 2-9 for thereby allowing electric current to pass through the semiconductor substrate W. At the same time, an inner peripheral end portion of the seal member 2-16 is brought into contact with an upper surface of the peripheral edge of the semiconductor substrate W under pressure to seal its contact portion in a watertight manner. As a result, the plating liquid supplied onto the upper surface of the semiconductor substrate W is prevented from seeping from the end portion of the semiconductor substrate W, and the plating liquid is prevented from contaminating the cathode electrode 2-17.

As shown in FIGS. 15 and 16, an electrode portion 2-5 of the electrode arm portion 2-6 has a housing 2-18 at a free end of a swing arm 2-4, a hollow support frame 2-19 surrounding the housing 2-18, and an anode 2-20 fixed by holding the peripheral edge portion of the anode 2-20 between the housing 2-18 and the support frame 2-19. The anode 2-20 covers an opening portion of the housing 2-18, and a suction chamber 2-21 is formed inside the housing 2-18. A plating liquid introduction pipe 2-28 and a plating liquid discharge pipe (not shown) for introducing and discharging the plating liquid are connected to the suction chamber 2-21. Further, many passage holes 2-20b communicating with regions above and below the anode 2-20 are provided over the entire surface of the anode 2-20.

In this embodiment, a plating liquid impregnated material 2-22 comprising a water retaining material and covering the entire surface of the anode 2-20 is attached to the lower surface of the anode 2-20. The plating liquid impregnated material 2-22 is impregnated with the plating liquid to wet the surface of the anode 2-20, thereby preventing a black film from falling onto the plated surface of the substrate, and simultaneously facilitating escape of air to the outside when the plating liquid is poured between the surface, to be plated, of the substrate and the anode 2-20. The plating liquid impregnated material 2-22 comprises, for example, a woven fabric, nonwoven fabric, or sponge-like structure comprising at least one material of polyethylene, polypropylene, polyester, polyvinyl chloride, Teflon, polyvinyl alcohol, polyurethane, and derivatives of these materials, or comprises a porous ceramics.

Attachment of the plating liquid impregnated material 2-22 to the anode 2-20 is performed in the following manner: That is, many fixing pins 2-25 each having a head portion at the lower end are arranged such that the head portion is provided in the plating liquid impregnated material 2-22 so as not to be releasable upward and a shaft portion of the fixing pin pierces the interior of the anode 2-20, and the fixing pins 2-25 are urged upward by U-shaped plate springs 2-26, whereby the plating liquid impregnated material 2-22 is brought in close contact with the lower surface of the anode 2-20 by the resilient force of the plate springs 2-26 and is attached to the anode 2-20. With this arrangement, even when the thickness of the anode 2-20 gradually decreases with the progress of plating, the plating liquid impregnated material 2-22 can be reliably brought in close contact with the lower surface of the anode 2-20. Thus, it can be prevented that air enters between the lower surface of the anode 2-20 and the plating liquid impregnated material 2-22 to cause poor plating.

Incidentally, columnar pins made of PVC (polyvinyl chloride) or PET (polyethylene terephthalate) and having a diameter of, for example, about 2 mm may be arranged from the upper surface side of the anode so as to pierce the anode, and an adhesive may be applied to the front end surface of each of the pins projecting from the lower surface of the anode to fix the anode to the plating liquid impregnated material.

The anode 2-20 and the plating liquid impregnated material 2-22 may be used in contact with each other, but it is also possible to provide a gap between the anode 2-20 and the plating liquid impregnated material 2-22, and perform plating treatment while holding the plating liquid in the gap. This gap is selected from a range of 20 mm or less, but is selected from a range of preferably 0.1 to 10 mm, and more preferably 1 to 7 mm. Particularly, when a soluble anode is used as the anode 2-20, the anode 2-20 is dissolved from its lower portion. Thus, as time passes, the gap between the anode 2-20 and the plating liquid impregnated material 2-22 enlarges and forms a gap in the range of 0 to about 20 mm.

The electrode portion 2-5 descends to such a degree that when the substrate holding portion 2-9 is located at the plating position B (see FIG. 14), the gap between the substrate W held by the substrate holding portion 2-9 and the plating liquid impregnated material 2-22 reaches about 0.1 to 10 mm, preferably 0.3 to 3 mm, and more preferably about 0.5 to 1 mm. In this state, the plating liquid is supplied from a plating liquid supply pipe to be filled between the upper surface (surface to be plated) of the substrate W and the anode 2-20 while the plating liquid impregnated material 2-22 is impregnated with the plating liquid. Thus, the surface of the substrate W is plated.

The semiconductor substrate W to be plated is carried into the substrate holding portion 2-9 located at the substrate transfer position A by the hand 3-1 of the first robot 3 (see FIG. 11A), and placed on the substrate holding portion 2-9. Then, the cup 2-11 is raised, and the substrate holding portion 2-9 is simultaneously raised to thepretreatment and cleaning position C. In this state, the precoating and recovery arm 2-7 located at a retreat position is moved to a position opposite to the semiconductor substrate W, and a precoating liquid comprising, for example, a surface active agent is supplied intermittently toward the surface, to be plated, of the semiconductor substrate W from a precoating nozzle provided at the front end of the precoating and recovery arm 2-7. At this time, the substrate holding portion 2-9 is rotating, and hence the precoating liquid spreads over the entire surface of the semiconductor substrate W. Then, the precoating and recovery arm 2-7 is returned to the retreat position, and the rotational speed of the substrate holding portion 2-9 is increased to remove the precoating liquid on the surface, to be plated, of the semiconductor substrate W by the centrifugal force for thereby drying the surface.

Then, the electrode arm portion 2-6 is swung in a horizontal direction to bring the electrode portion 2-5 from a position above the plating liquid tray 2-2 to a position above a plating position. At this position, the electrode portion 2-5 is lowered toward the cathode portion 2-10. When lowering of the electrode portion 2-5 is completed, a plating voltage is applied to the anode 2-20 and the cathode portion 2-10, and the plating liquid is supplied to the interior of the electrode portion 2-5 to supply the plating liquid to the plating liquid impregnated material 2-22 through the plating liquid supply ports piercing the anode 2-20. At this time, the plating liquid impregnated material 2-22 does not contact the surface, to be plated, of the semiconductor substrate W, but approaches it at a distance of about 0.1 to 10 mm, preferably 0.3 to 3 mm, and more preferably about 0.5 to 1 mm.

When the supply of the plating liquid continues, the plating liquid containing Cu ions, which has seeped out of the plating liquid impregnated material 2-22, is filled into the gap between the plating liquid impregnated material 2-22 and the surface, to be plated, of the semiconductor substrate W to apply Cu plating to the surface of the semiconductor substrate W. At this time, the substrate holding portion 2-9 may be rotated at a low speed.

When the plating treatment is completed, the electrode arm portion 2-6 is raised and then swung to return the electrode portion 2-5 to the position above the plating liquid tray 2-2 and to lower the electrode portion 2-5 to the ordinary position. Then, the precoating and recovery arm 2-7 is moved from the retreat position to the position opposite to the semiconductor substrate W, and lowered to recover the remainder of the plating liquid on the semiconductor substrate W by a plating liquid recovery nozzle (not shown). After recovery of the remainder of the plating liquid is completed, the precoating and recovery arm 2-7 is returned to the retreat position, and pure water is supplied toward the central portion of the semiconductor substrate W. At the same time, the substrate holding portion 2-9 is rotated at an increased speed to replace the plating liquid on the face of the semiconductor substrate W with pure water.

After completion of the above rinsing, the substrate holding portion 2-9 is lowered from the plating position B to the treatment and cleaning position C. Then, while pure water is supplied from the fixed nozzle 2-8, the substrate holding portion 2-9 and the cathode portion 2-10 are rotated to perform washing with water. At this time, the seal member 2-16 and the cathode electrodes 2-17 can also be cleaned, simultaneously with the semiconductor substrate W, by means of pure water directly supplied to the cathode 2-10, or pure water scattered from the surface of the semiconductor substrate W.

After washing with water is completed, supply of pure water from the fixed nozzle 2-8 is stopped, and the rotational speed of the substrate holding portion 2-9 and the cathode portion 2-10 is further increased to remove pure water on the face of the semiconductor substrate W by centrifugal force and to dry the face of the semiconductor substrate W. The seal member 2-16 and the cathode electrode 2-17 are also dried at the same time. Upon completion of the drying, the rotation of the substrate holding portion 2-9 and the cathode portion 2-10 is stopped, and the substrate holding portion 2-9 is lowered to the substrate transfer position A.

Figure 17:
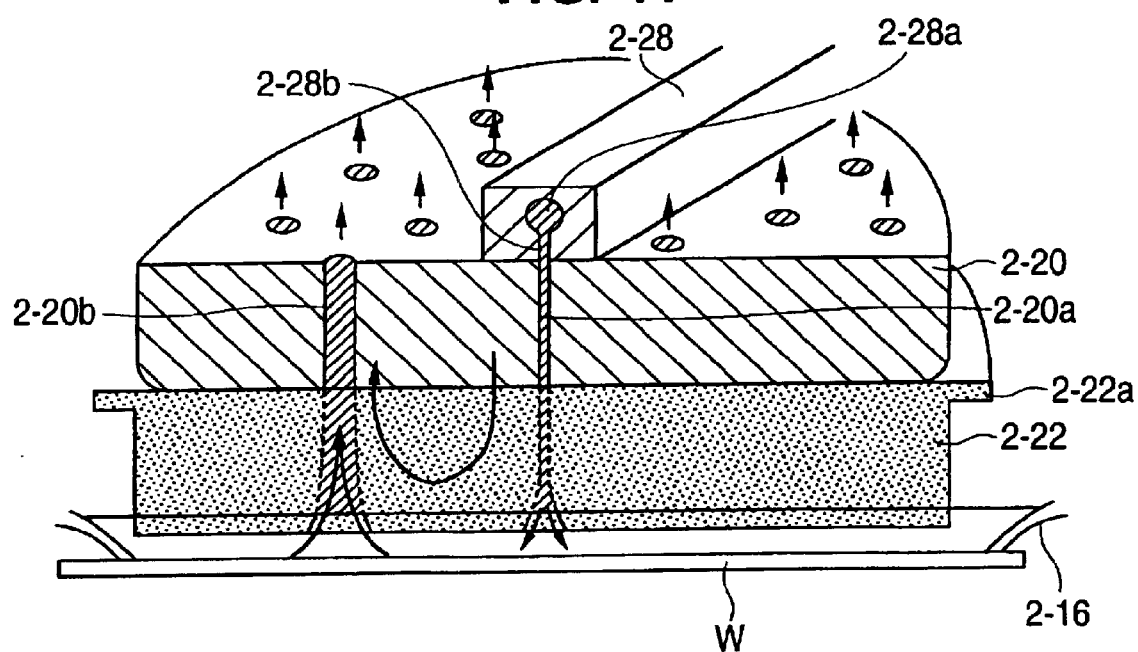
FIG. 17 is a schematic view showing an anode and a plating liquid impregnated material according to another embodiment of the present invention.
Figure 18:
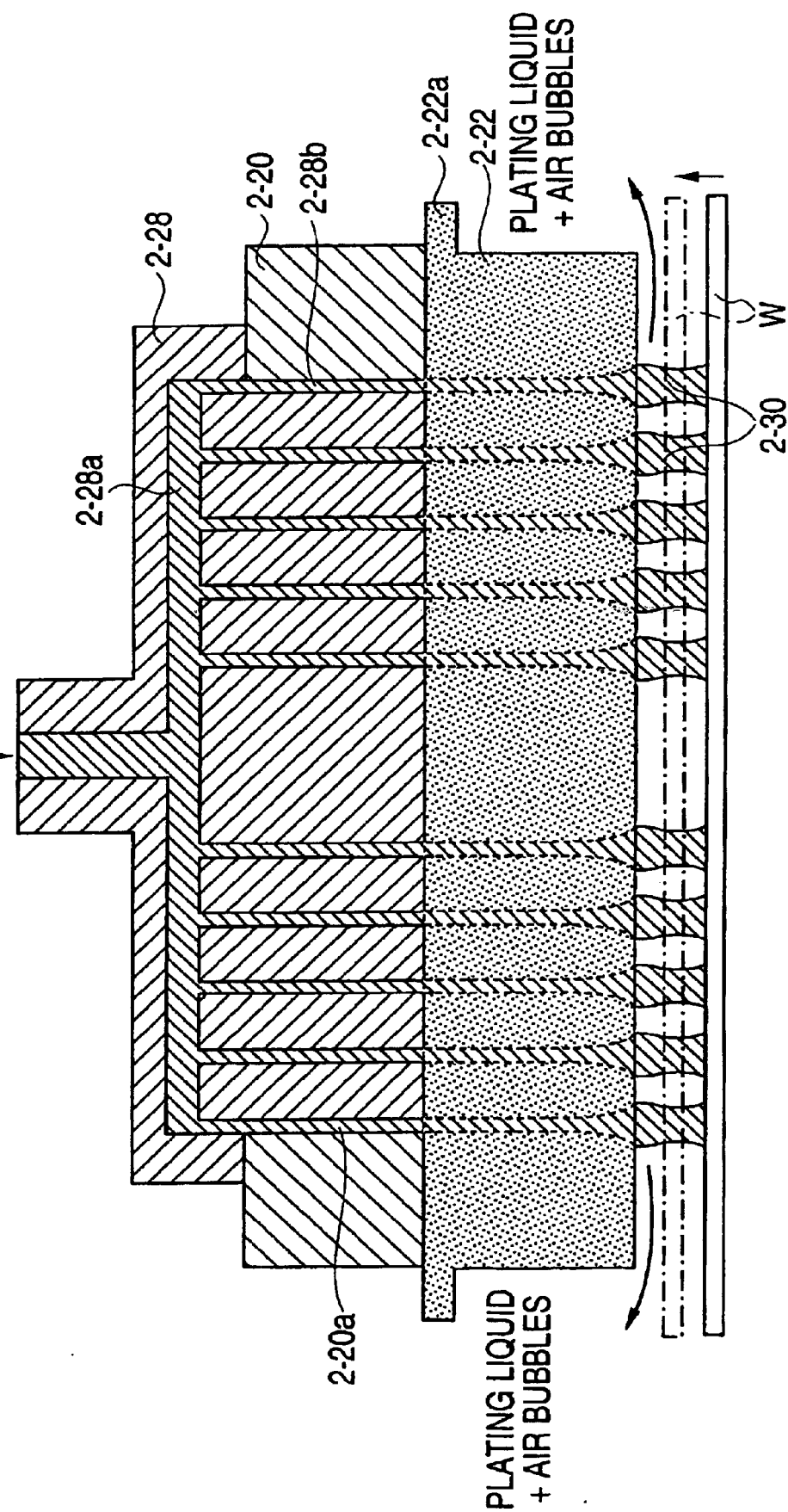
FIG. 18 is a schematic view showing an anode and a plating liquid impregnated material according to another embodiment of the present invention.

FIGS. 17 and 18 show another embodiment of an anode 2-20 and a plating liquid impregnated material 2-22. That is, in this example, the plating liquid impregnated material 2-22 is composed of porous ceramics such as alumina, SiC, mullite, zirconia, titania or cordierite, or a hard porous material such as a sintered compact of polypropylene or polyethylene, or a composite material comprising these materials. In case of the alumina-based ceramics, for example, the ceramics with a pore diameter of 30 to 200 $\mu$m, a porosity of 20 to 95%, and a thickness of about 5 to 20 mm, preferably 8 to 15 mm, are used.

The plating liquid impregnated material 2-22 has a flange portion 2-22a provided at the upper portion thereof, and is fixed by holding this flange portion 2-22a between the housing 2-18 and the support frame 2-19 (see FIG. 15). The anode 2-20 is placed and held on the upper surface of the plating liquid impregnated material 2-22. In this embodiment, the anodes 2-20 of various shapes, such as porous ones or mesh-like ones may be placed.

As described above, in the case where the plating liquid impregnated material 2-22 is composed of a porous material, the electrical resistance of the interior of the plating liquid impregnated material 2-22 can be increased by the plating liquid which has complicatedly entered the plating liquid impregnated material 2-22. Thus, the thickness of the plated film can be uniformized, and the generation of particles can be prevented. That is, the plating liquid impregnated material 2-22 is a kind of high-resistance member comprising porous ceramics, and is thus preferable for achieving uniformity of the plated film thickness. Furthermore, the anode 2-20 is placed and held on the plating liquid impregnated material 2-22. Thus, even when the side of the lower surface of the anode 2-20 which is in contact with the plating liquid impregnated material 2-22 is dissolved with the progress of plating, the distance between the lower surface of the anode 2-20 and the substrate W can be kept constant by the own weight of the anode 2-20 without the use of a jig for fixing the anode 2-20, and air accumulation caused by air entering therein can be prevented.

Incidentally, a gap may be provided between the anode 2-20 and the plating liquid impregnated material 2-22, and plating treatment may be performed with the plating liquid being held in this gap. This gap is selected from the range of 20 mm or less, preferably 0.1 to 10 mm, and more preferably 1 to 7 mm.

Figure 19:
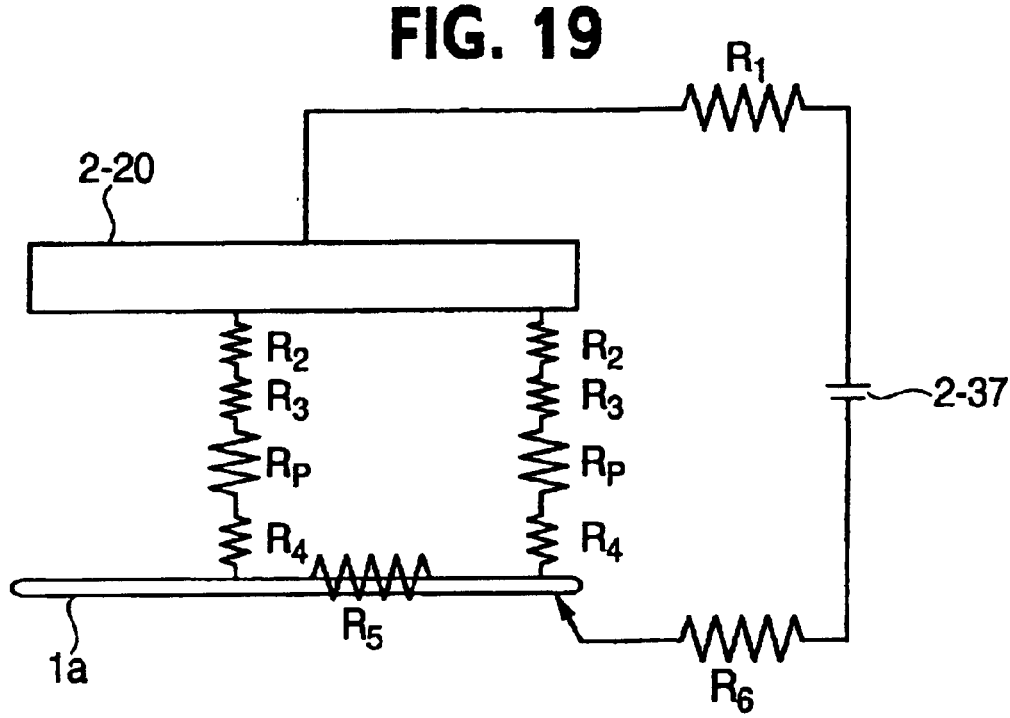
FIG. 19 is an electrical equivalent circuit of an electrolytic treatment apparatus shown in FIGS. 17 and 18.

FIG. 19 is an electrical equivalent circuit diagram of the apparatus shown in FIGS. 17 and 18.

When a predetermined voltage is applied by a plating power source 2-37 between the anode 2-20 (anodic electrode) submerged in the plating liquid and the conductive layer 1a (cathodic electrode) of the substrate W to form a plated film on the surface of the conductive layer 1a, the following resistance components exist in this circuit:

R1: Power source wire resistance between power source and anode, and various contact resistances
R2: Polarization resistance at anode
R3: Plating liquid resistance
R4: Polarization resistance at cathode (plated surface)
Rp: Resistance value of high resistance structure
R5: Resistance of conductive layer
R6: Power source wire resistance between cathode potential lead-in contact and power source, and various contact resistances The resistance value Rp of a high resistance structure, which is the plating liquid impregnated material 2-22, is 0.01 Ω or more, preferably 0.01 to 2 Ω, more preferably 0.03 to 1 Ω, and even more preferably 0.05 to 0.5 Ω, for example, in the case of a 200 mm wafer. The resistance value of this high resistance structure is measured by the following procedure: First, in the plating apparatus, a direct current (I) of a predetermined value is flowed between both electrodes comprising the anode 2-20 and the substrate W spaced by a predetermined distance to perform plating, and the voltage (V1) of the direct current power source at this time is measured. Then, in the same plating apparatus, the high resistance structure of a predetermined thickness is placed between both electrodes, and a direct current (I) of the same value is flowed to perform plating. At this time, the voltage (V2) of the direct current power source is measured. With this method, the resistance value Rp of the high resistance structure can be calculated from $$Rp=(V2-V1)/I.$$

In this case, the purity of copper constituting the anode 2-20 is preferably 99.99% or more. The distance between the two electrode plates comprising the anode 2-20 and the semiconductor substrate W is preferably in the range of 5 to 25 mm in the case of the substrate having a diameter of 200 mm, and is preferably in the range of 15 to 75 mm in the case of the substrate having a diameter of 300 mm. The resistance R5 of the conductive layer 1a on the substrate W can be determined by measuring the resistance value between the outer periphery and the center of the substrate with the use of a tester, or calculated from the specific resistance of the material of the conductive layer 1a and the thickness of the conductive layer 1a.

In the embodiment shown in FIGS. 17 and 18, a plating liquid introduction pipe 2-28 of a straight-line shape, which has a plating liquid introduction passage 2-28a therein and extends in a diametrical direction, is installed on the upper surface of the anode 2-20. In the anode 2-20, plating liquid pouring holes 2-20a are provided at positions aligned with plating liquid introduction holes 2-28b provided in the plating liquid introduction pipe 2-28. Many passage holes 2-20b are also provided in the anode 2-20.

Figure 20:
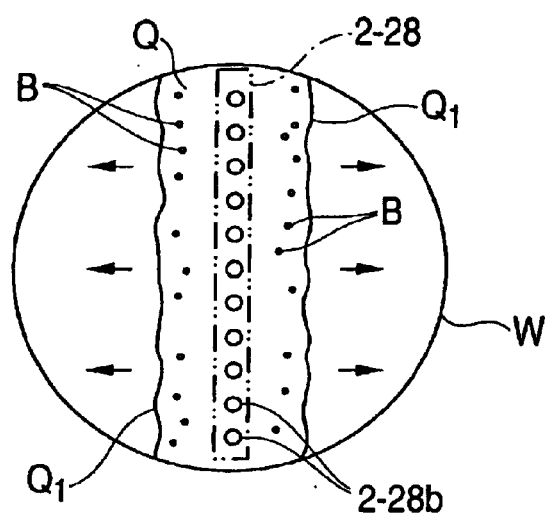
FIG. 20 is a plan view schematically showing a state in which a plating liquid is spreading throughout the surface, to be plated, of a substrate when plating is performed using the plated Cu film forming unit illustrated in FIG. 15.

At positions approximately corresponding to the plating liquid pouring holes 2-20a of the anode 2-20, the plating liquid reaches the upper surface (surface to be plated) of the substrate W from the lower surface of the plating liquid impregnated material 2-22, thereby forming plating liquid columns 2-30 which bridge the plating liquid impregnated material 2-22 and the surface, to be plated, of the substrate W. By continuing the supply of the plating liquid, the plating liquid columns 2-30 are gradually grown, or connected to each other. Then, a flow of the plating liquid Q, which advances in a direction perpendicular to the plating liquid introduction pipe 2-28 and spreads over the entire surface of the surface, to be plated, of the substrate W, occurs as shown in FIG. 20.

As a result, air bubbles B entrained by this flow of the plating liquid Q are pushed outward, and a front line Q1 of the flow of the plating liquid Q is a nearly straight line, so that the plating liquid Q does not enclose air. Thus, the air bubbles are prevented from remaining in the plating liquid filled between the plating liquid impregnated material 2-22 and the surface, to be plated, of the substrate W.

Figure 21A:
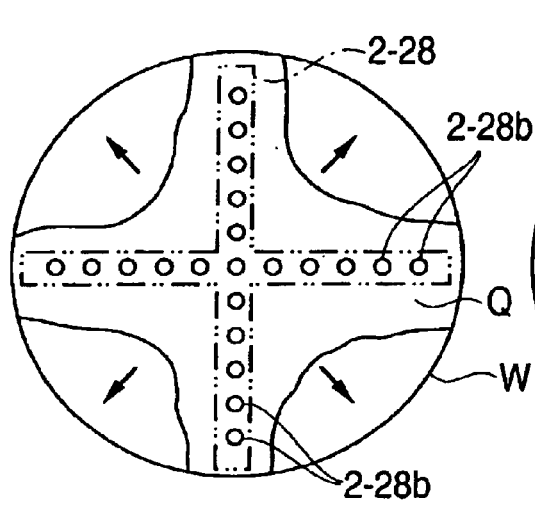
FIGS. 21A and 21B are views of different modifications of FIG. 20, each schematically showing a state in which a plating liquid is spreading throughout the surface, to be plated, of the substrate.

Here, as shown in FIG. 21A, the plating liquid introduction pipe 2-28 which has blade portions extending cruciformly in directions perpendicular to each other and which has plating liquid introduction holes 2-28b at predetermined positions along the longitudinal direction of each blade portion may be used, and the anode (not shown) which has plating liquid pouring holes 2-20a at positions corresponding to the plating liquid introduction holes 2-28b may be used. In this case, in the same manner as stated above, plating liquid columns bridging the plating liquid impregnated material 2-22 and the surface, to be plated, of the substrate W are formed at positions approximately corresponding to the plating liquid pouring holes 2-20a of the anode. As the supply of the plating liquid continues, the plating liquid columns gradually grow. Then, a flow of the plating liquid Q, which spreads radially in quadrants defined by the plating liquid introduction pipe 2-28, is generated and the plating liquid Q spreads over the entire surface of the surface, to be plated, of the substrate W.

Figure 21B:
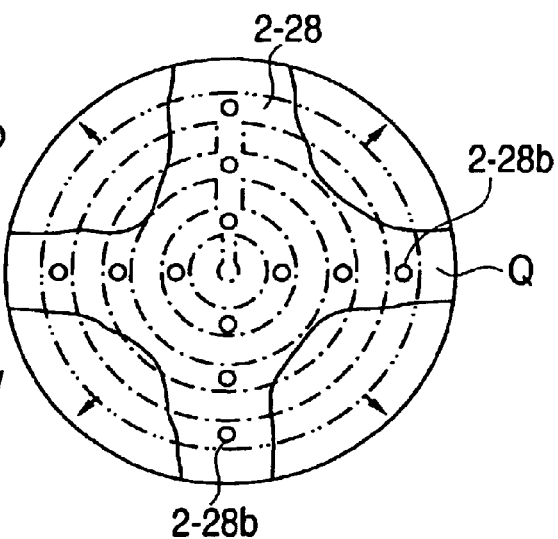

As shown in FIG. 21B, a similar flow of the plating liquid Q is generated, when the plating liquid introduction pipe 2-28 is placed in a circumferential manner and plating liquid introduction holes 2-28b are provided at predetermined positions. The plating liquid introduction holes 2-28b of the plating liquid introduction pipe 2-28 are often provided at equal pitch and with equal diameter, but discharge of the liquid may be controlled by adjusting the pitch of the holes and the diameter of the holes.

According to the embodiment shown in FIGS. 17 through 20, at positions approximately corresponding to the plating liquid pouring holes 2-20a of the anode 2-20, the plating liquid reaches the upper surface (surface to be plated) of the substrate W from the lower surface of the plating liquid impregnated material 2-22, thereby forming the plating liquid columns 2-30 which bridge the plating liquid impregnated material 2-22 and the surface, to be plated, of the substrate W. At this time, when the plating liquid flows inside the plating liquid impregnated material 2-22, the plating liquid is slightly diffused along its flow direction, thereby alleviating damage to the seed layer 107 (see FIG. 1A) upon arrival of the plating liquid at the substrate W, namely, alleviating the phenomenon of the seed layer 107 due to local application of a jet, and thus contributing to the uniformity of the film thickness during a subsequent plating step. By providing the distribution of the passage holes 2-20b over the surface so as to be dense in the central portion and sparse in the peripheral portion, the plating liquid spreads uniformly.

As indicated by imaginary lines in FIG. 18, after the plating liquid reaches the upper surface (surface to be plated) of the substrate W from the lower surface of the plating liquid impregnated material 2-22 to form the plating liquid columns 2-30, the substrate W, for example, may be instantaneously raised to bring the plating liquid impregnated material 2-22 and the substrate W close to each other instantaneously. Further, it is possible to form the plating liquid columns 2-30 similarly while bending the substrate in a concave form under slight pressure on the edge of the substrate, and then to release the pressure, thereby restoring the substrate to the original shape. With this measure, the plating liquid impregnated material 2-22 and the substrate W may be instantaneously brought close to each other.

When the plating liquid impregnated material 2-22 has a large thickness and a high density (low porosity), for example, resistance becomes large when the plating liquid flows inside the plating liquid impregnated material 2-22. As a result, a predetermined amount of the plating liquid does not flow out of the plating liquid impregnated material 2-22, and binding of the plating liquid columns 2-30 is disturbed. Even if air is dragged at this time, a rapid outward flow of the plating liquid can be generated to drive out air bubbles together with the plating liquid, and the supply of the plating liquid between the plating liquid impregnated material 2-22 and the substrate W can be performed in a short time by being brought the plating liquid impregnated material 2-22 and the substrate W instantaneously close to each other.

Contact between the plating liquid and the seed layer 107 (see FIG. 1A) in a non-energized state induces a decrease in the seed layer 107. Even in an energized state, the failure of the plating liquid to spread on the surface of the substrate W in a short time causes variations in the film thickness at the initial stage of plating, and impairs the uniformity of subsequent plated film thickness. However, these troubles can be prevented by supplying the plating liquid between the plating liquid impregnated material 2-22 and the substrate W in a short time.

Further, as shown in FIG. 17, the plating liquid may be supplied from the plating liquid pouring holes 2-20a to the plating liquid impregnated material 2-22 during plating treatment to supply the plating liquid between the plating liquid impregnated material 2-22 and the surface, to be plated, of the substrate W. Simultaneously, the plating liquid in the same amount as the amount of the poured plating liquid can be sucked and discharged via the passage holes 2-20b through a plating liquid discharge pipe (not shown) connected to the passage holes 2-20b.

The plating liquid is stirred in this manner during plating treatment, whereby it becomes possible to remove air bubbles which have not been withdrawn during liquid filling, and air bubbles which have occurred during plating treatment after liquid filling.

In the present plating apparatus, the spacing between the surface, to be plated, of the substrate W and the anode 2-20 is small, so that a small amount of the plating liquid to be used is sufficient. However, since the additives and ions in the plating liquid become in limited amounts, in order to perform efficient plating in a short time, it is necessary to distribute the additives and the like uniformly in the plating liquid. In this respect, according to the present embodiment, because the plating liquid is stirred during plating treatment, it is possible to perform plating in such a state that the additives and ions are distributed uniformly. In the present plating apparatus, plating is applied onto the semiconductor substrate W by connecting the semiconductor substrate W to the cathode and connecting the anode to the positive electrode. By applying a reverse voltage, on the other hand, etching of the plated film formed on the semiconductor substrate W can be carried out. After plating for filling the hole is substantially completed (40 to 400 seconds), a feed voltage is applied for a short time (e.g., 1 to 60 seconds), and then a forward voltage is applied again (50 seconds, 0.5 $\mu$). By applying feed voltage, the action of the additives is suppressed, and formation of a protuberance only on the hole is prevented, so that uniformity of the plated film can be achieved.

FIG. 19 shows another embodiment, and in this embodiment, a plating liquid introduction pipe 2-28 is provided with pipes 2-32 communicating with the plating liquid introduction pipe 2-28 per se, the pipes 2-32 are inserted into plating liquid introduction holes 2-28b of the anode 2-20, and the front ends of the pipes 2-32 are brought into contact with the surface of the plating liquid impregnated material 2-22. That is, in this embodiment, the plating liquid can be supplied to the surface of the plating liquid impregnated material 2-22 without causing the plating liquid to contact the anode 2-20 at all. The plating liquid introduction pipe 2-28 and the pipes 2-32 are integrally formed by a synthetic resin of a material which is not affected at all by the plating liquid. The reference numeral 2-31 denotes a holding member for holding the substrate W.

The plating liquid, which has been directly supplied to the surface of the plating liquid impregnated material 2-22 from the plating liquid introduction pipe 2-28 through the pipes 2-32, reaches the face of the substrate W while the plating liquid is slightly diffusing in the plating liquid impregnated material 2-22, and the plating liquid forms a plurality of circular plating liquid columns 2-30 between the substrate W and the surface of the plating liquid impregnated material 2-22, and the plural plating liquid columns 2-30 bind to each other on the substrate W, thus filling on the face of the substrate W with the plating liquid.

Even when this plating step is repeated, the inner diameter of the front end of the pipe 2-32 does not increase with the passage of time, and hence the ideal plating liquid columns 2-30 do not collapse with the passage of time. Consequently, engulfinent of air due to disturbance of binding of the plating liquid columns 2-30 does not take place. Air bubbles are not accumulated between the plating liquid impregnated material 2-22 and the substrate W, and the plated film thickness does not become nonuniform.

FIG. 23 is a view showing a schematic constitution of an electroplating apparatus according to another embodiment of the present invention. This electroplating apparatus differs from that in the embodiment shown in FIG. 22 in that instead of forming pipes 2-32 integrally with a plating liquid introduction pipe 2-28, separately prepared pipes 2-33 are inserted into plating liquid introduction holes 2-28b of the anode 2-20. In this case also, the pipes 2-33 are composed of a material which is not affected at all by the plating liquid, and the front ends (lower ends) of the pipes 2-33 are brought into contact with the upper surface of the plating liquid impregnated material 2-22.

Even with this constitution, the plating liquid does not directly contact the anode 2-20 in the same manner as the embodiment shown in FIG. 22. Even when the plating step is performed repeatedly, the inner diameter of the front end of the pipe 2-33 does not increase with the passage of time. Thus, the plating liquid columns 2-30 supplied from the plating liquid impregnated material 2-22 do not collapse with the passage of time, but can be always kept in the ideal state, and engulfinent of air does not occur.

FIG. 24 is a view showing a schematic constitution of an electroplating apparatus according to another embodiment of the present invention. This electroplating apparatus differs from that in the embodiment shown in FIG. 22 in that instead of forming pipes 2-32 integrally with a plating liquid introduction pipe 2-28, separately prepared pipes 2-33 are inserted into plating liquid introduction holes 2-28b of the anode 2-20 and electrolytic solution passage portions 2-34 provided in the plating liquid impregnated material 2-22. In this case also, the pipes 2-33 are composed of a material which is not affected at all by the plating liquid.

With this constitution, even when the plating step is performed repeatedly, the inner diameter of the front end of the pipe 2-33 does not increase with the passage of time, and hence the ideal plating liquid columns 2-30 do not collapse with the passage of time. Consequently, engulfment of air due to disturbance of binding of the plating liquid columns 2-30 does not take place, and air bubbles are not accumulated between the plating liquid impregnated material 2-22 and the substrate W, and the plated film thickness does not become nonuniform. At the same time, the pipes 2-33 protrude into the plating liquid impregnated material 2-22, and hence there is a decrease in the resistance when the plating liquid passes through the plating liquid impregnated material 2-22. Even if the plating liquid impregnated material 2-22 having a large thickness or a high density (low porosity) is used, an appropriate amount of the plating liquid is supplied from predetermined positions of the plating liquid impregnated material 2-22. As a result, engulfinent of air due to disturbance of binding of the plating liquid columns 2-30 does not take place, and air bubbles are not accumulated between the plating liquid impregnated material 2-22 and the substrate W, and thus the plated film thickness does not become nonuniform.

FIG. 25 is a modified example of the embodiment shown in FIG. 22.

In the plating apparatus shown in FIG. 22, the electric field on the surface, to be processed, of the substrate can be controlled by at least one of adjustment of the external form of the plating liquid impregnated material 2-22, adjustment of the internal structure of the plating liquid impregnated material 2-22, and adjustment by mounting of a member with different electric conductivity. In this manner, if the state of the electric field on the surface, to be processed, of the substrate is positively controlled to the desired state, a processed state by electrolytic treatment of the substrate to be processed can be made a processed state with desired distribution on the surface. In case electrolytic treatment is plating treatment, the thickness of a plated film formed on the substrate to be processed can be uniformized, or an arbitrary distribution can be imparted to the thickness of the plated film formed on the substrate to be processed.

The adjustment of the external form shape can be made by adjustment of the thickness of the plating liquid impregnated material 2-22, adjustment of the shape of the plating liquid impregnated material 2-22 on the plane, or the like.

The plating liquid impregnated material 2-22 is composed of a porous substance. Adjustment of the internal structure of the porous substance is performed by adjustment of the pore diameter distribution of the porous substance, adjustment of porosity distribution, adjustment of flexing rate distribution, or adjustment of a combination of materials.

The adjustment by mounting of a member with different electric conductivity is performed by adjusting the shielding area of the plating liquid impregnated material 2-22 with the use of a member with different electric conductivity.

In the embodiment shown in FIG. 25, a band-like insulating member 2-35 is wound around an outer peripheral side surface of a porous ceramic plate (porous substance) 2-22 so as to surround the outer peripheral side surface. As the material of the insulating member 2-35, an extensible material such as fluororubber is used.

A plating liquid, which has been supplied under pressure from a plating liquid introduction pipe 2-28 to the porous ceramic plate (plating liquid impregnated material) 2-22 through plating liquid introduction holes 2-28b of an anode 2-20, permeates the interior of the porous ceramic plate 2-22 to fill the interior of the porous ceramic plate 2-22 with the plating liquid. Then, the plating liquid is discharged from the lower surface of the porous ceramic plate 2-22 to fill a space between the substrate W and the porous ceramic plate 2-22 with the plating liquid. Introduction of the plating liquid may be performed from a gap between a lip seal 2-16 and an end surface of the porous ceramic plate 2-22. In this case, neither the plating liquid introduction pipe 2-28 nor the plating liquid introduction holes 2-28b of the anode 2-20 are necessary.

When a predetermined voltage is applied between the anode 2-20 and the substrate W to flow a direct current, plating (e.g. copper plating) is applied on the entire surface of the conductive layer of the substrate W. According to the present embodiment, the porous ceramic plate 2-22 is interposed between the anode 2-20 and the substrate W, and hence there is minimal influence due to the difference among the resistance values of the respective portions according to the difference in the distance from contacts 2-17 on the surface of the substrate W as stated above. Consequently, substantially uniform plating (e.g. copper plating) is applied on the entire surface of the conductive layer of the substrate W.

However, portions in the vicinity of the outer peripheral portion close to the contacts 2-17 are still high in current density, and tend to be thicker in plated film thickness than other portions.

In the present embodiment, therefore, an insulating member 2-35 is wound around the outer peripheral side surface of the porous ceramic plate 2-22 to prevent an electric current from concentrating at an area near the outer peripheral portion of the substrate W, as shown by dotted lines in FIG. 25, thereby decreasing the current density at such area and making it nearly equal to the current density directed toward the other portions of the substrate W.

Here, the following constitution may be adopted in an electrolytic treatment apparatus in which an electrolytic solution is filled between a substrate, to be treated, having contacts which are brought in contact with one of an anode and a cathode, and the other electrode opposite to the substrate to perform electrolytic treatment of the substrate: A high resistance structure having electric conductivity smaller than the electric conductivity of the electrolytic solution is provided in at least part of the electrolytic solution, the high resistance structure has an outer periphery held by a holding member, and a seal member is provided between the high resistance structure and the holding member for preventing the electrolytic solution from leaking from this area and preventing an electric current from flowing.

[Embodiment using Seal Member]

Figure 26:
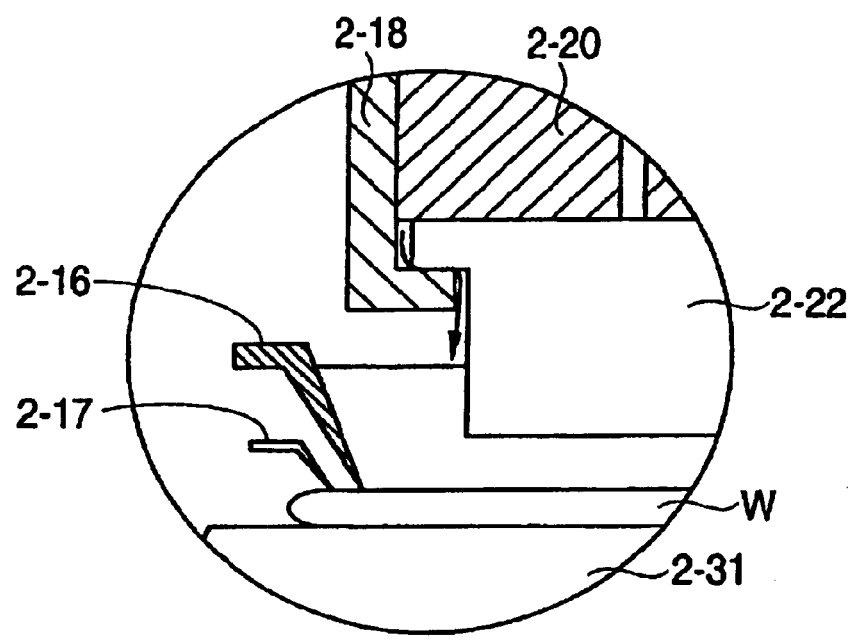
FIG. 26 is a schematic view of an essential part showing a portion close to an outer peripheral portion of a plating liquid impregnated material in the electroplating apparatus.

FIG. 26 is a schematic view of an essential part showing portions in the vicinity of the outer peripheral portion of a porous ceramic plate 2-22 of an electroplating apparatus having the same structure as that shown in FIG. 25. However, the insulating member 2-35 shown in FIG. 25 is not shown in this electroplating apparatus. In this electroplating apparatus, since a gap between a holding member 2-18 and the porous ceramic plate 2-22 is not sealed, a plating liquid flows out of the anode 2-20 through this gap to thus form a passage for an electric current as shown by an arrow. Since this current passage is such a passage that current does not pass through the interior of the porous ceramic plate 2-22, its resistance value is small. Thus, the current density becomes so high that control for decreasing the plated film thickness in the vicinity of the outer peripheral portion of the substrate W may be impossible.

In this embodiment, therefore, a seal member 2-36 is provided between the porous ceramic plate 2-22 and the holding member 2-18, as shown in FIGS. 27A and 27B.

With this arrangement, leakage of the plating liquid from this portion is prevented so that the plated film thickness in the vicinity of the outer peripheral portion of the substrate W can be controlled so as to be small.

The seal member 2-36 in this embodiment has an inverted L-shaped cross section, and is composed of an insulating material, and thus the seal member 2-36 also serves as the insulating member shown in FIG. 25. The seal member 2-36, as its cross section is shown in FIG. 27B, may be constructed by attaching, as separate parts, an annular seal member portion 2-36a for sealing the portion at which the holding member 2-18 and the lower surface of the porous ceramic plate 2-22 are in contact with each other, and an insulating member portion 2-36b exhibiting the same function as the band-like insulating member 2-35 shown in FIG. 25.

The seal member 2-36, needless to say, can be applied to the respective embodiments other than the embodiment in FIG. 25. Specifically, more effective electric field control can be performed by jointly using the seal member 2-36 for preventing leakage of the plating liquid from a portion between the outer peripheral side surface of the high resistance structure 4 and the holding member 2-18, and electric field control means according to other various embodiments.

FIG. 28 is a view showing another plan layout constitution of the substrate processing apparatus according to the present invention. In FIG. 28, portions denoted by the same reference numerals as those in FIG. 7 show the same or corresponding portions. The same is true of FIGS. 29 and 30. In the present substrate polishing apparatus, a pusher indexer 25 is disposed close to a first polishing apparatus 10 and a second polishing apparatus 11, substrate placing tables 21, 22 are disposed close to a third cleaning unit 4 and a plated Cu film forming unit 2, respectively, and a robot 23 (hereinafter referred to as second robot 23) is disposed close to a first cleaning unit 9 and the third cleaning unit 4. Further, a robot 24 (hereinafter referred to as third robot 24) is disposed close to a second cleaning unit 7 and the plated Cu film forming unit 2, and a dry state film thickness measuring instrument 13 is disposed close to a loading and unloading section 1 and a first robot 2.

In the substrate processing apparatus of the above constitution, the first robot 3 takes out a semiconductor substrate W from a cassette 1-1 placed on the load port of the loading and unloading section 1. After the film thicknesses of a barrier layer 105 and a seed layer 107 are measured with the dry state film thickness measuring instrument 13, the first robot 3 places the semiconductor substrate W on the substrate placing table 21. In the case where the dry state film thickness measuring instrument 13 is provided on the hand 3-1 of the first robot 3 as shown in FIGS. 11B and 11C, the film thicknesses are measured thereon, and the substrate is placed on the substrate placing table 21. The second robot 23 transfers the semiconductor substrate W on the substrate placing table 21 to the plated Cu film forming unit 2 in which a plated Cu film 106 is formed. After formation of the plated Cu film 106, the film thickness of the plated Cu film 106 is measured with a before-plating and after-plating film thickness measuring instrument 12. Then, the second robot 23 transfers the semiconductor substrate W to the pusher indexer 25 and loads it thereon.

[Serial Mode]

In the serial mode, a top ring head 10-2 holds the semiconductor substrate W on the pusher indexer 25 by suction, transfers it to a polishing table 10-1, and presses the semiconductor substrate W against a polishing surface on the polishing table 10-1 to perform polishing. Detection of the end point of polishing is performed by the same method as described above. The semiconductor substrate W after completion of polishing is transferred to the pusher indexer 25 by the top ring head 10-2, and loaded thereon. The second robot 23 takes out the semiconductor substrate W, and carries it into the first cleaning unit 9 for cleaning. Then, the semiconductor substrate W is transferred to the pusher indexer 25, and loaded thereon.

A top ring head 11-2 holds the semiconductor substrate W on the pusher indexer 25 by suction, transfers it to a polishing table 11-1, and presses the semiconductor substrate W against a polishing surface on the polishing table 11-1 to perform polishing. Detection of the end point of polishing is performed by the same method as described above. The semiconductor substrate W after completion of polishing is transferred to the pusher indexer 25 by the top ring head 11-2, and loaded thereon. The third robot 24 picks up the semiconductor substrate W, and its film thickness is measured with a film thickness measuring instrument 26. Then, the semiconductor substrate W is carried into the second cleaning unit 7 for cleaning. Thereafter, the semiconductor substrate W is carried into the third cleaning unit 4, where it is cleaned and then dried by spin-drying. Then, the semiconductor substrate W is picked up by the third robot 24, and placed on the substrate placing table 22.

[Parallel Mode]

In the parallel mode, the top ring head 10-2 or 11-2 holds the semiconductor substrate W on the pusher indexer 25 by suction, transfers it to the polishing table 10-1 or 11-1, and presses the semiconductor substrate W against the polishing surface on the polishing table 10-1 or 11-1 to perform polishing. After measurement of the film thickness, the third robot 24 picks up the semiconductor substrate W, and places it on the substrate placing table 22.

The first robot 3 transfers the semiconductor substrate W on the substrate placing table 22 to the dry state film thickness measuring instrument 13. After the film thickness is measured, the semiconductor substrate W is returned to the cassette 1-1 of the loading and unloading section 1.

Figure 2:
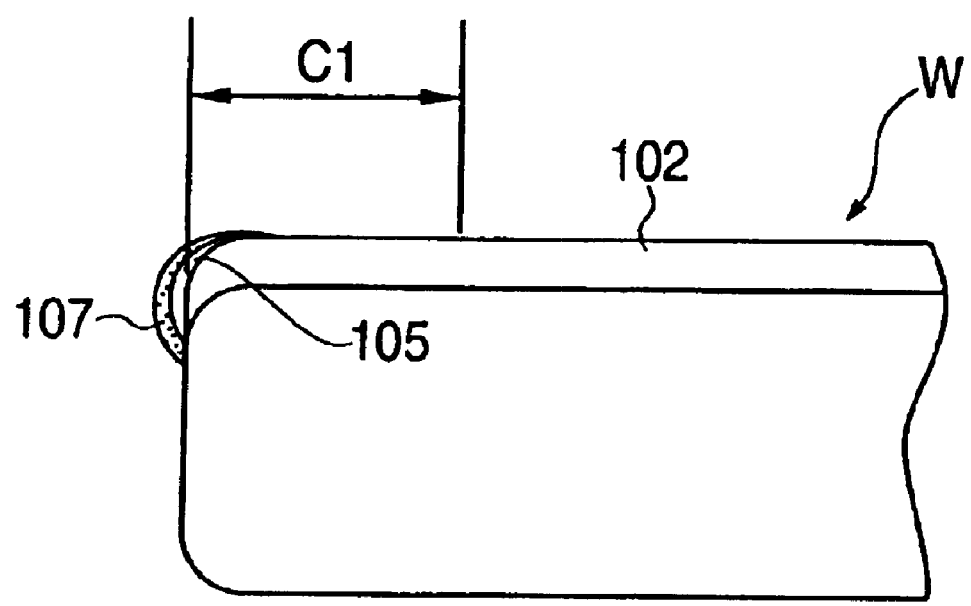
FIG. 2 is a view showing a state in which a seed layer and a barrier layer have remained in a bevel portion as a result of CMP performed without bevel etching process of a semiconductor substrate.
Figure 29:
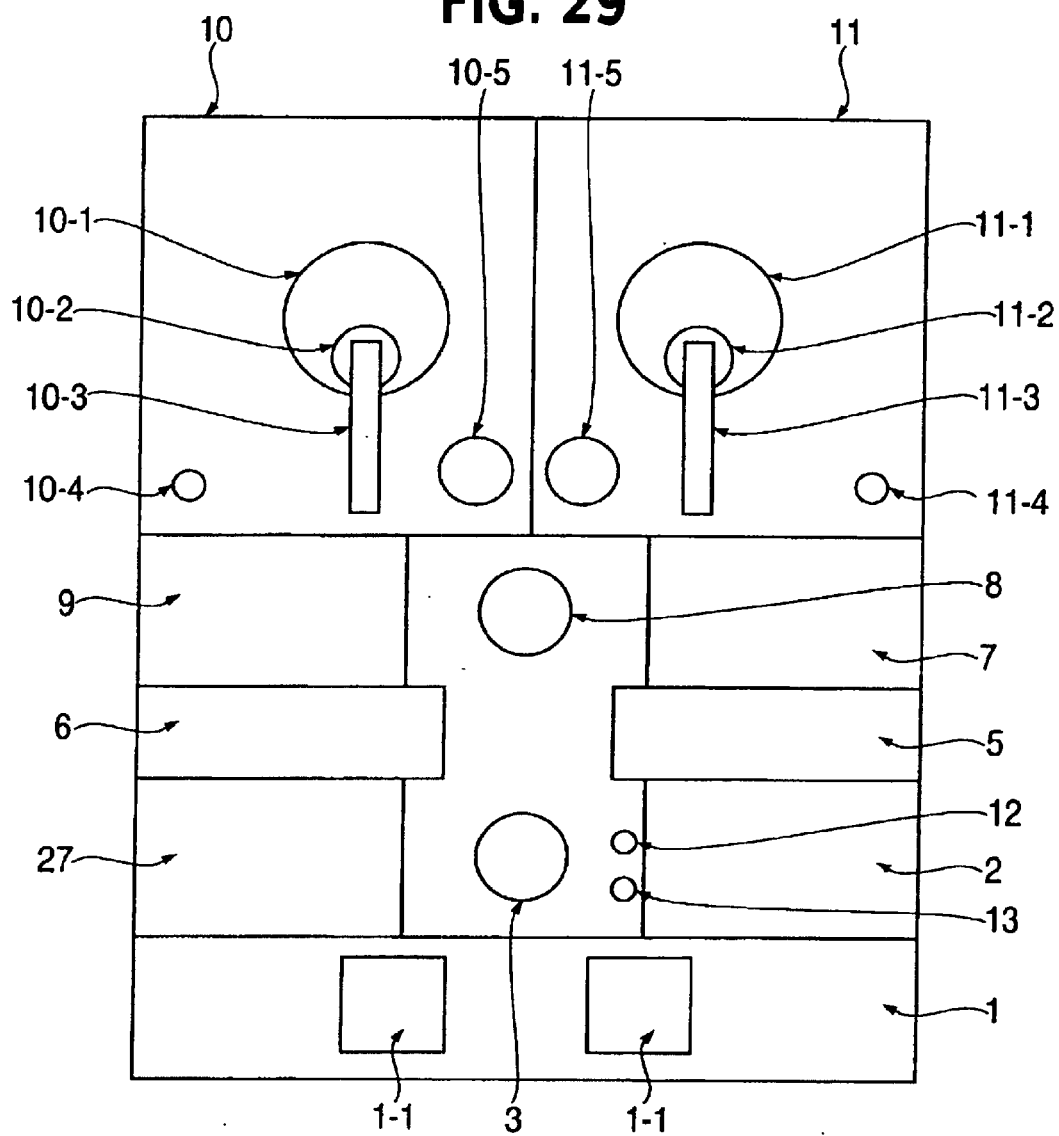
FIG. 29 is a view showing a plan constitution example of the semiconductor substrate processing apparatus according to the present invention.

FIG. 29 is a view showing another plan layout constitution of the substrate processing apparatus according to the present invention. The present substrate processing apparatus is such a substrate processing apparatus which forms a seed layer 107 and a plated Cu film 106 on a semiconductor substrate W having no seed layer 107 formed thereon, and polishes and removes these films to form interconnects. The present substrate processing apparatus differs from the substrate processing apparatus shown in FIG. 7 in that a seed layer forming unit 27 is provided instead of the third cleaning unit 4 shown in FIG. 2.

A cassette 1-1 accommodating the semiconductor substrates W before formation of the seed layer 107 is placed on a load port of a loading and unloading section 1. The semiconductor substrate W before formation of the seed layer 107 is taken out from the cassette 1-1 by a first robot 3, and the seed layer (Cu seed layer) 107 is formed by the seed layer forming unit 27. The seed layer 107 is formed by electroless plating, and after its formation, heat is applied to make the adhesion of the seed layer 107 higher. The film thickness of the seed layer 107 is measured with a before-plating and after-plating film thickness measuring instrument 12.

The semiconductor substrate is taken out by the first robot 3, and the plated Cu film 106 is formed by a plated Cu film forming unit 2. Formation of the plated Cu film 106 is performed by carrying out hydrophilic treatment of the face of the semiconductor substrate W, and then Cu plating. Then, rinsing or cleaning is carried out. If there is some time to spare, drying may be performed. When the semiconductor substrate W is taken out by the first robot 3, the film thickness of the plated Cu film 106 is measured with the before-plating and after-plating film thickness measuring instrument 12. The method of measurement is the same as that of the film thickness measurement of the seed layer 107, and the results of its measurement are recorded as record data on the semiconductor substrate W and are also used for judgment of an abnormality of the plated Cu film forming unit 2. After measurement of the film thickness, the first robot 3 transfers the semiconductor substrate W to a reversing machine 5 in which the semiconductor substrate W is turned over.

Then, a second robot 8 picks up the semiconductor substrate W from the reversing machine 5, and places it on a pusher 10-5 or 11-5. Then, the top ring 10-2 or 11-2 holds the semiconductor substrate W by suction, transfers it onto a polishing table 10-1 or 11-1, and presses it against a polishing surface on the polishing table 10-1 or 11-1 to perform polishing. This polishing is substantially the same as the treatment in the steps 1 to 3 in the parallel mode polishing by the substrate processing apparatus shown in FIG. 2, and thus its explanations are omitted.

After completion of polishing, the top ring 10-2 or 11-2 returns the semiconductor substrate W to the pusher 10-5 or 11-5. The second robot 8 picks up the semiconductor substrate W, and carries it into a first cleaning unit 9. At this time, a chemical liquid may be ejected toward the face and backside of the semiconductor substrate W on the pusher 10-5 or 11-5 to remove particles therefrom or cause particles to be difficult to adhere thereto.

In the first cleaning unit 9, the face and the backside of the semiconductor substrate W are scrubbed and cleaned. The face of the semiconductor substrate W is scrubbed and cleaned mainly for removal of particles with a PVA roll sponge using cleaning water comprising pure water to which a surface active agent, a chelating agent, or a pH regulator is added. A strong chemical liquid such as DHF is ejected toward the backside of the semiconductor substrate W to etch diffused Cu. If there is no problem of Cu diffusion, the backside of the semiconductor substrate W is scrubbed and cleaned with a PVA roll sponge using the same chemical liquid as that for the face.

After cleaning, the second robot 8 picks up the semiconductor substrate W, and transfers it to a reversing machine 6 where the semiconductor substrate W is reversed. The semiconductor substrate W is picked up again by the second robot 8, and carried into a second cleaning unit 7 by the second robot 8. In the second cleaning unit 7, megasonic water to which ultrasonic vibrations are applied is ejected toward the face of the semiconductor substrate W to clean the face. At this time, the face may be cleaned with a pencil type sponge using a cleaning liquid to which pure water, a surface active agent, a chelating agent, or a pH regulator is added. Thereafter, the semiconductor substrate W is dried by spin-drying.

Then, the second robot 8 picks up the semiconductor substrate W, and transfers it to the reversing machine 6 as it is. The first robot 3 picks up the semiconductor substrate W on the reversing machine 6. In the case where the film thickness has been measured with a film thickness measuring instrument 10-4 or 11-4 provided near the polishing table 10-1 or 11-1, the semiconductor substrate W is received by the cassette 1-1 placed in the unload port of the loading and unloading section 1. In the case where the film thicknesses of multilayer films are to be measured, measurement in a dry state needs to be performed. Thus, the film thickness is measured once with a dry state film thickness measuring instrument 13. In this case, if the dry state film thickness measuring instrument 13 is provided on the hand 3-1 of the first robot 3 as shown in FIGS. 11B and 11C, the film thickness can be measured on the robot hand. The results of the film thickness measurement are retained as processing records of the semiconductor substrate W, or a judgment as to whether the semiconductor substrate W can be delivered to a next step or not is made.

Figure 30:
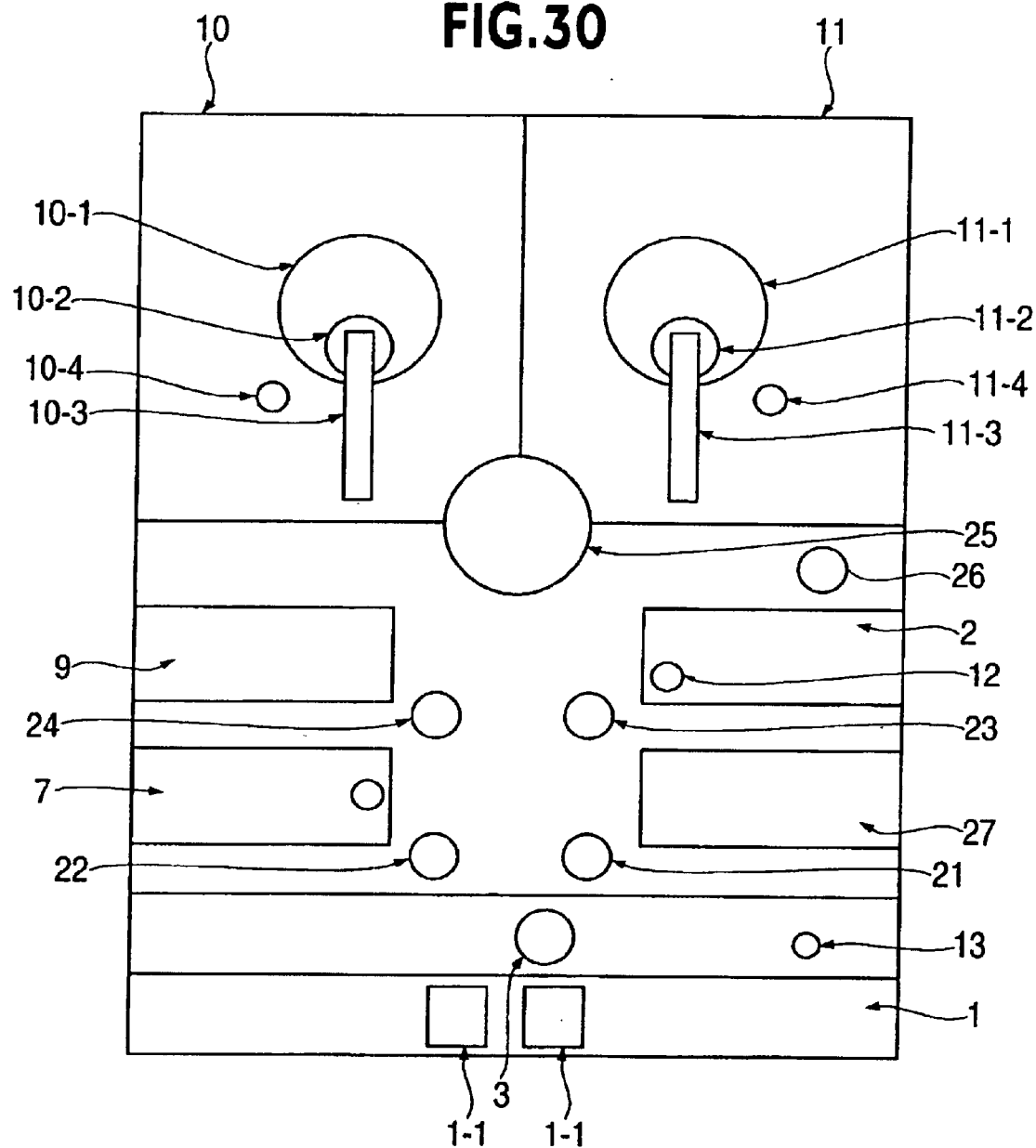
FIG. 30 is a view showing a plan constitution example of the semiconductor substrate processing apparatus according to the present invention.

FIG. 30 is a view showing another plan layout constitution of the substrate processing apparatus according to the present invention. The present substrate processing apparatus, as is the case with the substrate processing apparatus shown in FIG. 29, is such a substrate processing apparatus which forms a seed layer 107 and a plated Cu film 106 on a semiconductor substrate W having no seed layer 107 formed thereon, and polishes these films to form interconnects.

In the present substrate processing apparatus, a pusher indexer 25 is disposed close to a first polishing apparatus 10 and a second polishing apparatus 11, substrate placing tables 21, 22 are disposed close to a second cleaning unit 7 and a seed layer forming unit 27, respectively, and a robot 23 (hereinafter referred to as second robot 23) is disposed close to the seed layer forming unit 27 and a plated Cu film forming unit 2. Further, a robot 24 (hereinafter referred to as third robot 24) is disposed close to a first cleaning unit 9 and the second cleaning unit 7, and a dry state film thickness measuring instrument 13 is disposed close to a loading and unloading section 1 and a first robot 3.

The first robot 3 takes out a semiconductor substrate W having a barrier layer 105 thereon from a cassette 1-1 placed on the load port of the loading and unloading section 1, and places it on the substrate placing table 21. Then, the second robot 23 transports the semiconductor substrate W to the seed layer forming unit 27 where a seed layer 107 is formed. The seed layer 107 is formed by electroless plating. The second robot 23 enables the semiconductor substrate having the seed layer 107 formed thereon to be measured in thickness of the seed layer 107 by the before-plating and after-plating film thickness measuring instrument 12. After measurement of the film thickness, the semiconductor substrate is carried into the plated Cu film forming unit 2 where a plated Cu film 106 is formed.

After formation of the plated Cu film 106, its film thickness is measured, and the semiconductor substrate is transferred to a pusher indexer 25. A top ring 10-2 or 11-2 holds the semiconductor substrate W on the pusher indexer 25 by suction, and transfers it to a polishing table 10-1 or 11-1 to perform polishing. After polishing, the top ring 10-2 or 11-2 transfers the semiconductor substrate W to a film thickness measuring instrument 10-4 or 11-4 to measure the film thickness. Then, the top ring 10-2 or 11-2 transfers the semiconductor substrate W to the pusher indexer 25, and places it thereon.

Then, the third robot 24 picks up the semiconductor substrate W from the pusher indexer 25, and carries it into the first cleaning unit 9. The third robot 24 picks up the cleaned semiconductor substrate W from the first cleaning unit 9, carries it into the second cleaning unit 7, and places the cleaned and dried semiconductor substrate on the substrate placing table 22. Then, the first robot 3 picks up the semiconductor substrate W, and transfers it to the dry state film thickness measuring instrument 13 in which the film thickness is measured, and the first robot 3 carrys it into the cassette 1-1 placed on the unload port of the loading and unloading section 1.

In the above embodiment, an example in which the seed layer 107 and the plated Cu film 106 have been formed by the substrate processing apparatus having the constitution shown in FIG. 29 is shown. According to the substrate processing apparatus having the constitution shown in FIG. 29, a barrier layer 105, a seed layer 107 and a plated Cu film 106 can be formed on a semiconductor substrate W having a contact hole 103 or a trench 104 of a circuit pattern formed therein, and then polished to form interconnects.

The cassette 1-1 accommodating the semiconductor substrates W before formation of the barrier layer 105 is placed on the load port of the loading and unloading section 1. The first robot 3 takes out the semiconductor substrate W from the cassette 1-1, and carries it into the seed layer forming unit 27 to form a barrier layer 105 and a seed layer 107. The barrier layer 105 and the seed layer 107 are formed by an electroless plating method. After plating, the substrate is heated to make the adhesion of the barrier layer 105 and the seed layer 107 higher. Then, a plated Cu film 106 is formed by the plated Cu film forming unit 2. At this time, the film thicknesses of the barrier layer 105 and the seed layer 107 are measured with the before-plating and after-plating film thickness measuring instrument 12. Treatment after formation of the plated Cu film 106 is the same as that described in the treatment by the substrate processing apparatus shown in FIG. 29, and its explanations are omitted.

In the substrate processing apparatus shown in FIG. 30 also, interconnects are formed by forming a barrier layer 105, a seed layer 107 and a plated Cu film 106 on a semiconductor substrate W having a contact hole 103 or a trench 104 of a circuit pattern formed therein, and polishing them.

The cassette 1-1 accommodating the semiconductor substrates W before formation of the barrier layer 105 is placed on the load port of the loading and unloading section 1. The first robot 3 takes out the semiconductor substrate W from the cassette 1-1 placed on the load port of the loading and unloading section 1, and places it on the substrate placing table 21. Then, the second robot 23 transports the semiconductor substrate W to the seed layer forming uni t 27 where a barrier layer 105 and a seed layer 107 are formed. The barrier layer 105 and the seed layer 107 are formed by electroless plating. The second robot 23 brings the semiconductor substrate W having the barrier layer and the seed layer 107 formed thereon to the before-plating and after-plating film thickness measuring instrument 12 which measures the film thicknesses of the barrier layer 105 and the seed layer 107. After measurement of the film thicknesses, the semiconductor substrate W is carried into the plated Cu film forming unit 2 where a plated Cu film 106 is formed. Treatment after formation of the plated Cu film 106 is the same as that described in the treatment by the substrate processing apparatus shown in FIG. 29, and its explanations are omitted.

In the above embodiment, although an example in which the plated Cu film 106 is formed to form interconnects has been shown. However, plating is not limited to Cu plating, and may be Cu alloy or other metal plating.

Figure 31:
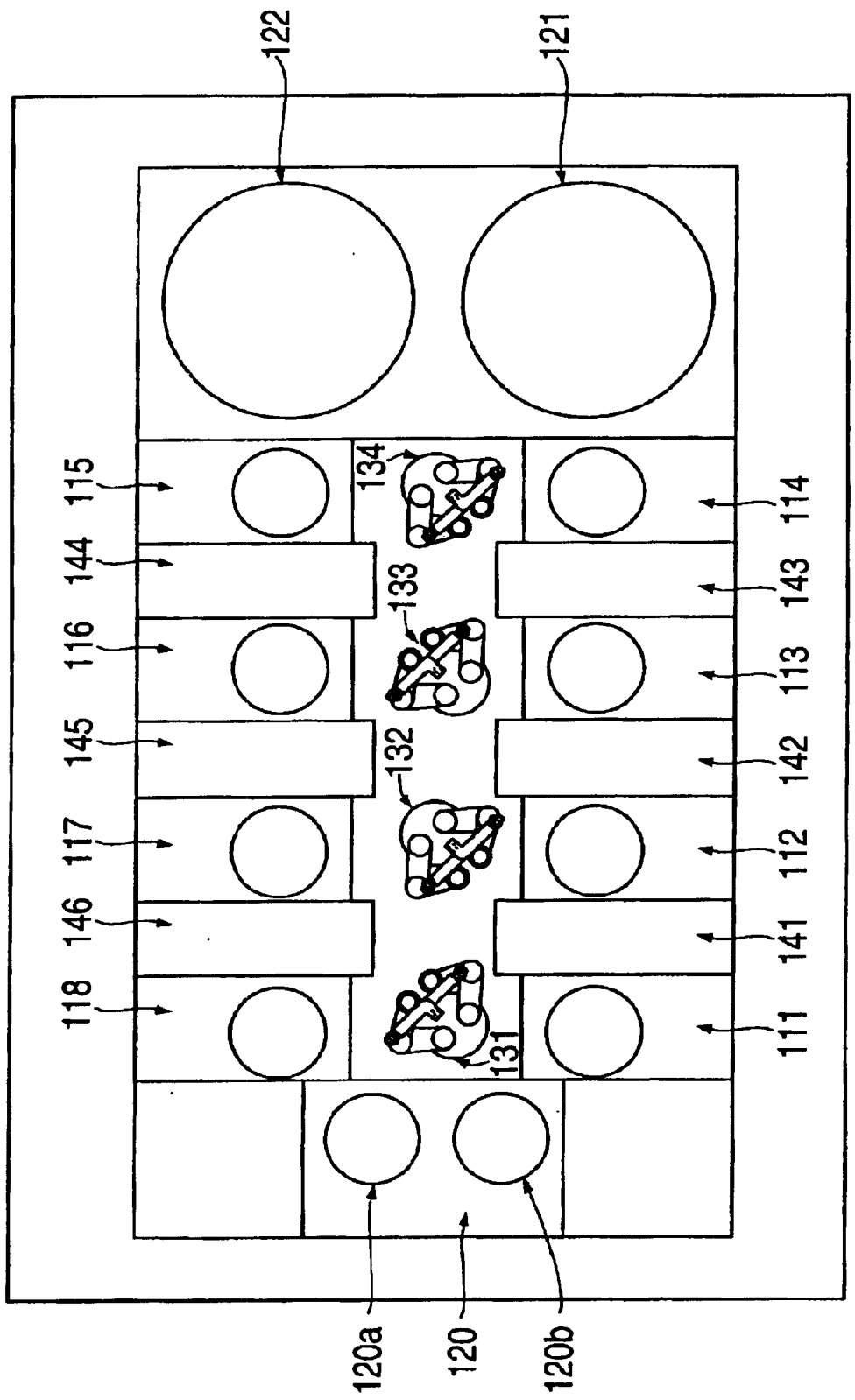
FIG. 31 is a view showing a plan constitution example of the semiconductor substrate processing apparatus according to the present invention.

FIG. 31 is a view showing plan layout constitution of another embodiment of the substrate processing apparatus according to the present invention. In the present substrate processing apparatus, there are provided a barrier layer forming unit 111, a seed layer forming unit 112, a plating unit 113, an annealing unit 114, a first cleaning unit 115, a bevel and backside cleaning unit 116, a cap plating unit 117, a second cleaning unit 118, a first aligner and film thickness measuring instrument 141, a second aligner and film thickness measuring instrument 142, a first substrate reversing machine 143, a second substrate reversing machine 144, a substrate temporary placing table 145, a third film thickness measuring instrument 146, a loading and unloading section 120, a first polishing apparatus 121, a second polishing apparatus 122, a first robot 131, a second robot 132, a third robot 133, and a fourth robot 134. The film thickness measuring instruments 141, 142, and 146 are units, have the same size as the frontage dimension of other units (plating, cleaning, annealing units, and the like), and are thus interchangeable.

In this embodiment, an electroless Ru plating apparatus can be used as the barrier layer forming unit 111, an electroless Cu plating apparatus as the seed layer forming unit 112, and an electroplating apparatus as the plating unit 113.

Figure 32:
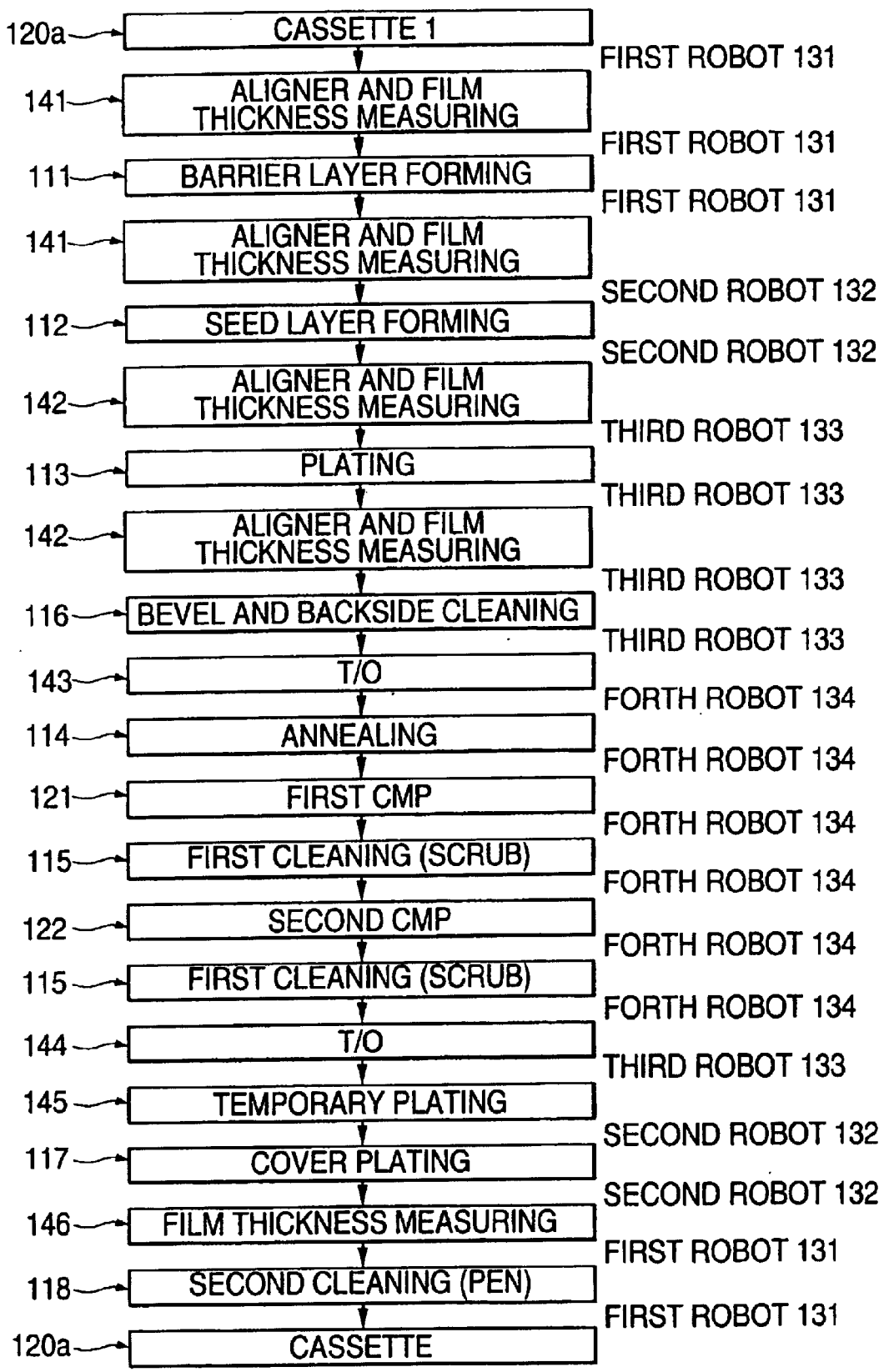
FIG. 32 is a view showing a flow of the respective steps in the semiconductor substrate processing apparatus illustrated in FIG. 31.

FIG. 32 is a flow chart showing the flow of the respective steps in the present substrate processing apparatus. The respective steps in the apparatus will be described according to this flow chart. First, a semiconductor substrate taken out by the first robot 131 from a cassette 120a placed on the load and unload unit 120 is placed in the first aligner and film thickness measuring unit 141, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transported to the barrier layer forming unit 111 by the first robot 131. The barrier layer forming unit 111 is such an apparatus for forming a barrier layer on the semiconductor substrate by electroless Ru plating, and the forming unit 111 forms an Ru film as a film for preventing Cu from diffusing into an interlayer insulator film (e.g. $SiO_2$) of a semiconductor device. The semiconductor substrate discharged after cleaning and drying steps is transported by the first robot 131 to the first aligner and film thickness measuring unit 141, where the film thickness of the semiconductor substrate, i.e., the film thickness of the barrier layer is measured.

The semiconductor substrate after film thickness measurement is carried into the seed layer forming unit 112 by the second robot 132, and a seed layer is formed on the barrier layer by electroless Cu plating. The semiconductor substrate discharged after cleaning and drying steps is transported by the second robot 132 to the second aligner and film thickness measuring instrument 142 for determination of a notch position, before the semiconductor substrate is transported to the plating unit 113, which is an impregnation plating unit, and then notch alignment for Cu plating is performed by the film thickness measuring instrument 142. If necessary, the film thickness of the semiconductor substrate before formation of a Cu film may be measured again in the film thickness measuring instrument 142.

The semiconductor substrate which has completed notch alignment is transported by the third robot 133 to the plating unit 113 where Cu plating is applied to the semiconductor substrate. The semiconductor substrate discharged after cleaning and drying steps is transported by the third robot 133 to the bevel and backside cleaning unit 116 where an unnecessary Cu film (seed layer) at a peripheral portion of the semiconductor substrate is removed. In the bevel and backside cleaning unit 116, the bevel is etched in a preset time, and Cu adhering to the backside of the semiconductor substrate is cleaned with a chemical liquid such as hydrofluoric acid. At this time, before transporting the semiconductor substrate to the bevel and backside cleaning unit 116, film thickness measurement of the semiconductor substrate may be made by the second aligner and film thickness measuring instrument 142 to obtain the thickness value of the Cu film formed by plating, and based on the obtained results, the bevel etching time may be changed arbitrarily to carry out etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps in the bevel and backside cleaning unit 116 is transported by the third robot 133 to the substrate reversing machine 143. After the semiconductor substrate is turned over by the substrate reversing machine 143 to cause the plated surface to be directed downward, the semiconductor substrate is introduced into the annealing unit 114 by the fourth robot 134 for thereby stabilizing a wiring portion. Before and/or after annealing treatment, the semiconductor substrate is carried into the second aligner and film thickness measuring unit 142 where the film thickness of a copper film formed on the semiconductor substrate is measured. Then, the semiconductor substrate is carried by the fourth robot 134 into the first polishing apparatus 121 in which the Cu layer and the seed layer of the semiconductor substrate are polished.

At this time, desired abrasive grains or the like are used, but fixed abrasive may be used in order to prevent dishing and enhance flatness of the face. After completion of primary polishing, the semiconductor substrate is transported by the fourth robot to the first cleaning unit 115 where it is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of the primary cleaning, the semiconductor substrate is transported by the fourth robot 134 to the second polishing apparatus 122 where the barrier layer on the semiconductor substrate is polished. At this time, desired abrasive grains or the like are used, but fixed abrasive may be used in order to prevent dishing and enhance flatness of the face. After completion of secondary polishing, the semiconductor substrate is transported by the fourth robot 134 again to the first cleaning unit 115 where scrub-cleaning is performed. After completion of cleaning, the semiconductor substrate is transported by the fourth robot 134 to the second substrate reversing machine 144 where the semiconductor substrate is reversed to cause the plated surface to be directed upward, and then the semiconductor substrate is placed on the substrate temporary placing table 145 by the third robot.

The semiconductor substrate is transported by the second robot 132 from the substrate temporary placing table 145 to the cap plating unit 117 where nickel-boron plating is applied onto the Cu surface with the aim of preventing oxidation of Cu due to the atmosphere. The semiconductor substrate to which cap plating has been applied is carried by the second robot 132 from the cap plating unit 117 to the third film thickness measuring instrument 146 where the thickness of the copper film is measured. Thereafter, the semiconductor substrate is carried by the first robot 131 into the second cleaning unit 118 where it is cleaned with pure water or deionized water. The semiconductor substrate after completion of cleaning is returned into the cassette 120a placed on the loading and unloading section 120.

Figure 33:
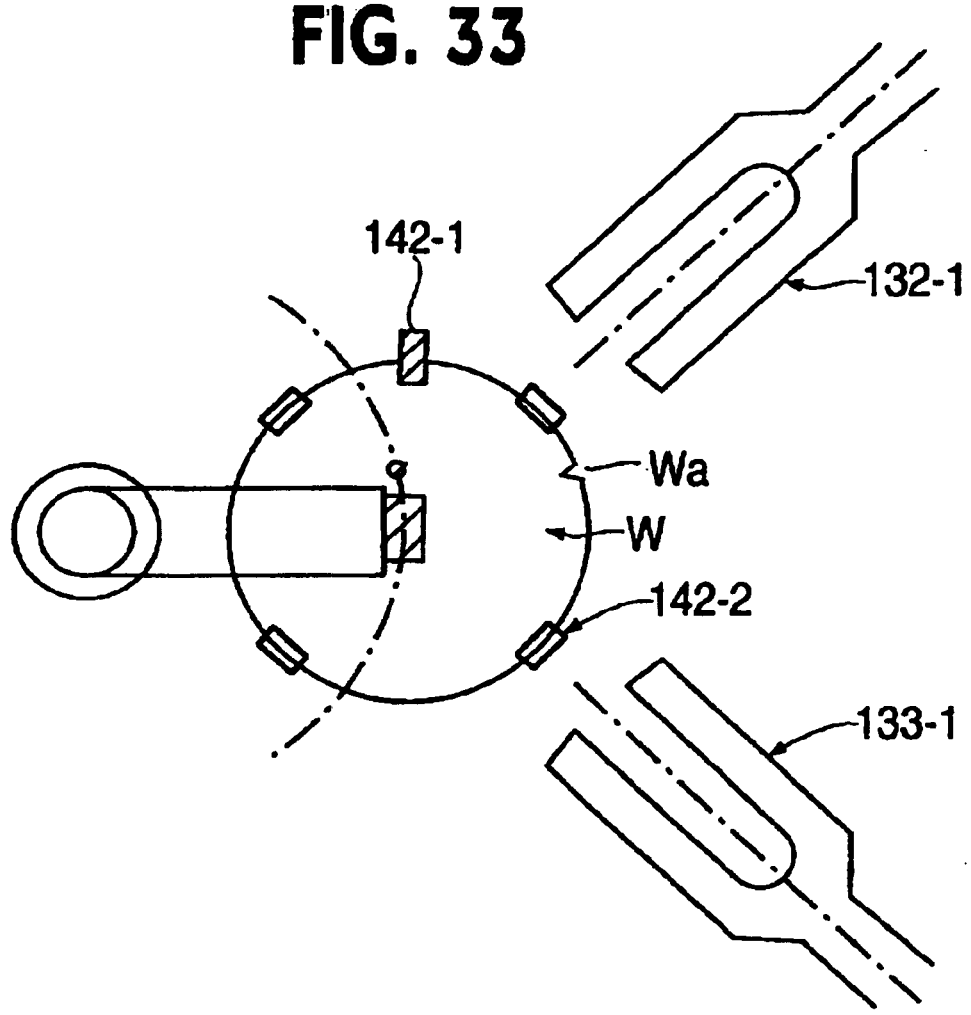
FIG. 33 is a view showing a schematic plan constitution example of an aligner and film thickness measuring instrument in the semiconductor substrate processing apparatus according to the present invention.
Figure 34:
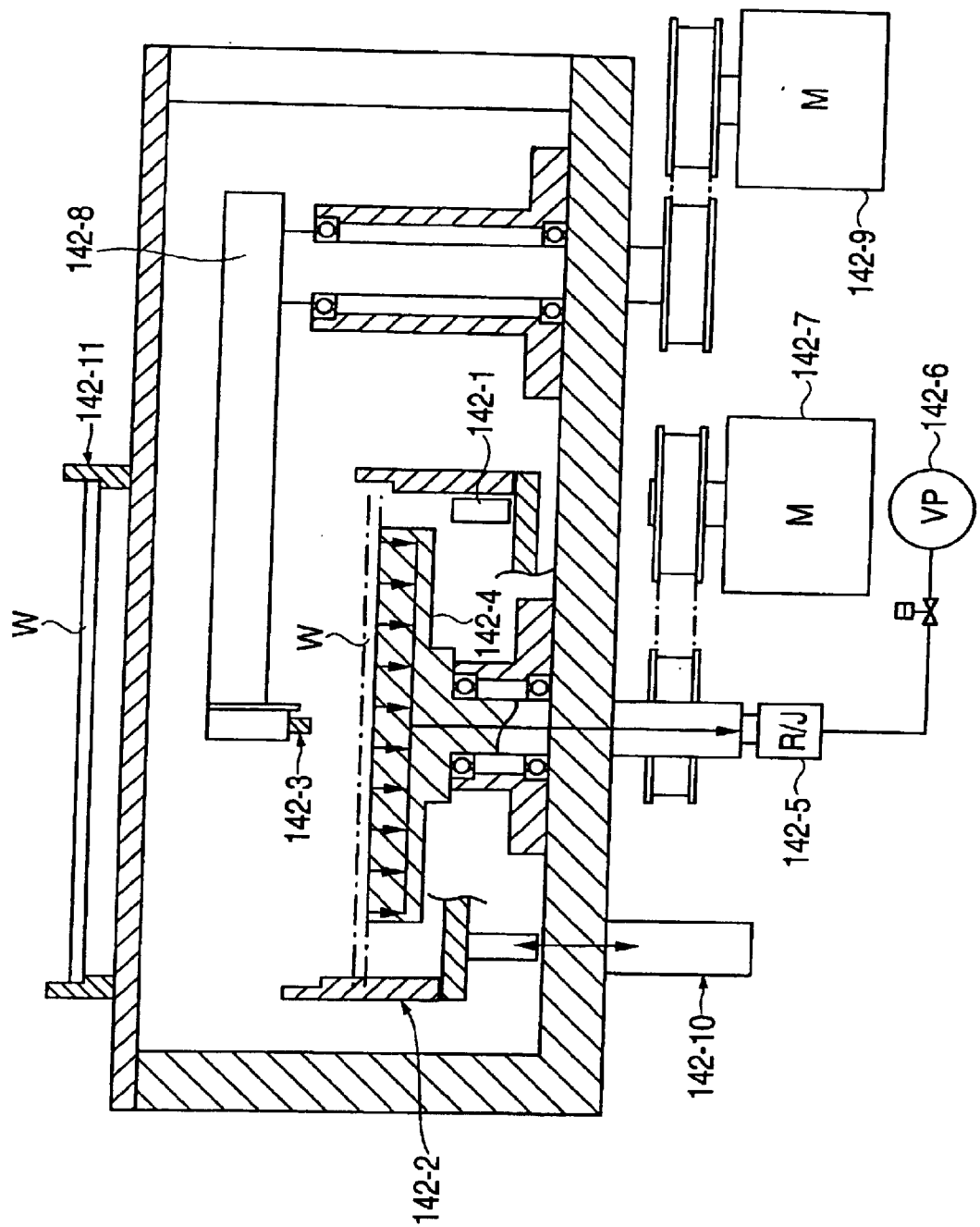
FIG. 34 is a view showing a side constitution example of the aligner and film thickness measuring instrument of the semiconductor substrate processing apparatus according to the present invention.
Figure 35:
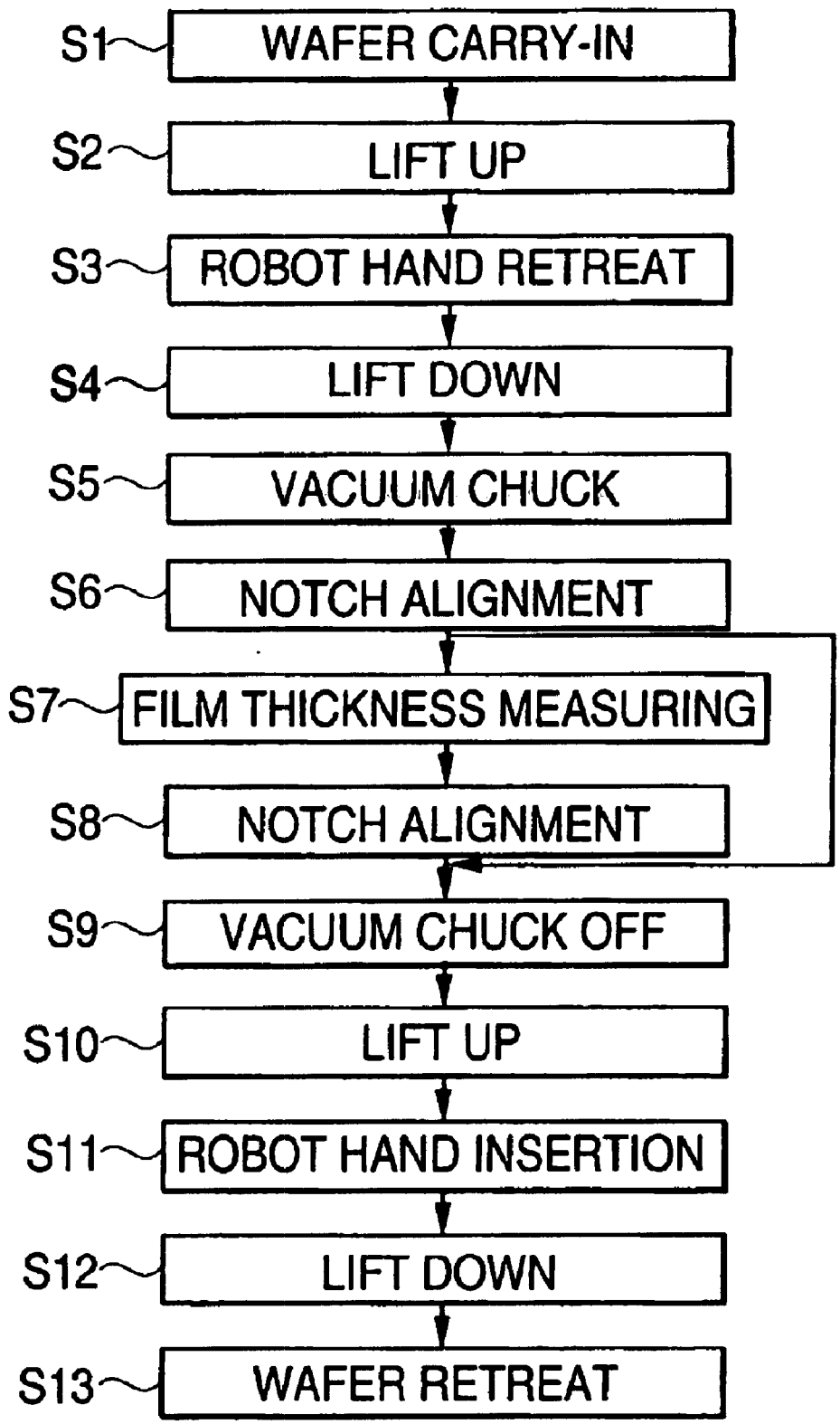
FIG. 35 is a view showing movement of a semiconductor substrate in the aligner and film thickness measuring instrument illustrated in FIGS. 33 and 34.

The aligner and film thickness measuring instrument 141 and the aligner and film thickness measuring instrument 142 perform positioning of the notch portion of the substrate and measurement of the film thickness. Schematic views of the aligner and film thickness measuring instrument 142 are shown in FIGS. 33 and 34. A flow chart showing the movement of the semiconductor substrate in the aligner and film thickness measuring instrument 142 is shown in FIG. 35.

In the aligner and film thickness measuring instrument 142, a notch Wa is detected by a photomicrosensor 142-1, while a semiconductor substrate W is rotated, and positioning of the notch Wa is carried out at an arbitrary position. For example, the position of the notch Wa is detected to set a reference position for the film thickness measurement point, whereby the measurement points before treatment and after treatment will not be displaced from each other, and the direction of placement of the semiconductor substrate when the semiconductor substrate is introduced into the plating apparatus can be consistent.

The apparatus is configured to have a rotatable vacuum chuck 142-4, a lift 142-2, a photomicrosensor 142-1 for notch detection, an eddy current sensor 142-3 for film thickness measurement, and the like. In FIGS. 33 through 35, a semiconductor substrate W is carried in by a hand 132-1 of the second robot hand 132 (Step S1). The aligner and film thickness measuring instrument 142 raises the lift 142-2 and transfers the semiconductor substrate onto the lift 142-2 (Step S2). The hand 132-1 of the second robot 132 is retreated (Step S3), and the lift is lowered (Step S4). Thus, the semiconductor substrate W is loaded onto the vacuum chuck 142-4 (Step S5).

Then, while the vacuum chuck 142-4 is rotating, the photomicrosensor 142-1 detects the notch Wa, and the vacuum chuck 142-4 positions the notch Wa at an arbitrary position in accordance with a subsequent treatment (Step S6). If necessary, the eddy current sensor 142-3 measures the film thickness of the semiconductor substrate W at an arbitrary point (Step S7). Then, when the semiconductor substrate is introduced into the plating apparatus, the semiconductor substrate W is positioned so that the position of the notch Wa of the semiconductor substrate W in the plating unit 113 is fixed (Step S8). Thereafter, the vacuum chuck is brought into the OFF state (Step S9), and the lift 142-2 is raised to transfer the semiconductor substrate W (Step S10). A hand 133-1 of the third robot 133 is inserted (Step S11), and the lift 142-2 is lowered (Step S12) to transfer the semiconductor substrate W to the hand 133-1. Thus, the semiconductor substrate W is taken out (Step S13).

In FIGS. 33 and 34, the reference numeral 142-6 denotes a vacuum pump, and the vacuum pump 142-6 is connected to suction holes of the vacuum chuck 142-4 via a rotary joint 142-5. The reference numeral 142-7 denotes a motor for rotating the vacuum chuck 142-4, the reference numeral 142-9 denotes a motor for rotating an arm 142-8 having the eddy current sensor 142-3 attached thereto, and the reference numeral 142-10 denotes an actuator for moving the lifter 142-2 up and down. The reference numeral 142-11 denotes a temporary placing table for the semiconductor substrate W. The constitution and operation of the aligner and film thickness measuring instrument 141 are the same as those of the aligner and film thickness measuring instrument 142, and their explanations are omitted.

The semiconductor substrate W transferred to the barrier layer forming unit 111 which is an electroless Ru plating apparatus is first given Pd as a catalyst. Pd is applied to the semiconductor substrate W in an amount of about 30 ml, and the treatment time is about 1 minute. After the semiconductor substrate W is washed with water, the semiconductor substrate W is treated with hydrochloric acid for activation treatment. At this time, hydrochloric acid is applied in such a state that hydrochloric acid is a 36% solution in a concentration of about 100 ml/L and in an amount of about 30 ml, with the treatment time being about 1 minute. After the semiconductor substrate W is washed with water again, electroless Ru plating is performed. $RuCl_3.xH_2O$ is used as a ruthenium plating liquid. Treatment is performed for about 10 minutes at a substrate surface temperature of about 85° C. The film formation rate at that time is about 2 nm/min. A barrier layer is formed in this manner, and the substrate is subjected to a water washing step and a spin-drying step, thus completing treatment. According to these steps, about 20 nm of Ru is obtained on $SiO_2$ by electroless plating.

Formation of the barrier layer 105 is not limited to electroless plating, and this barrier layer may be formed by using CVD, sputtering or electroplating. The barrier layer is not limited to Ru, and any material may be used as long as it can achieve the prevention of Cu diffusion into an interlayer insulator film such as TiN.

Figure 36:
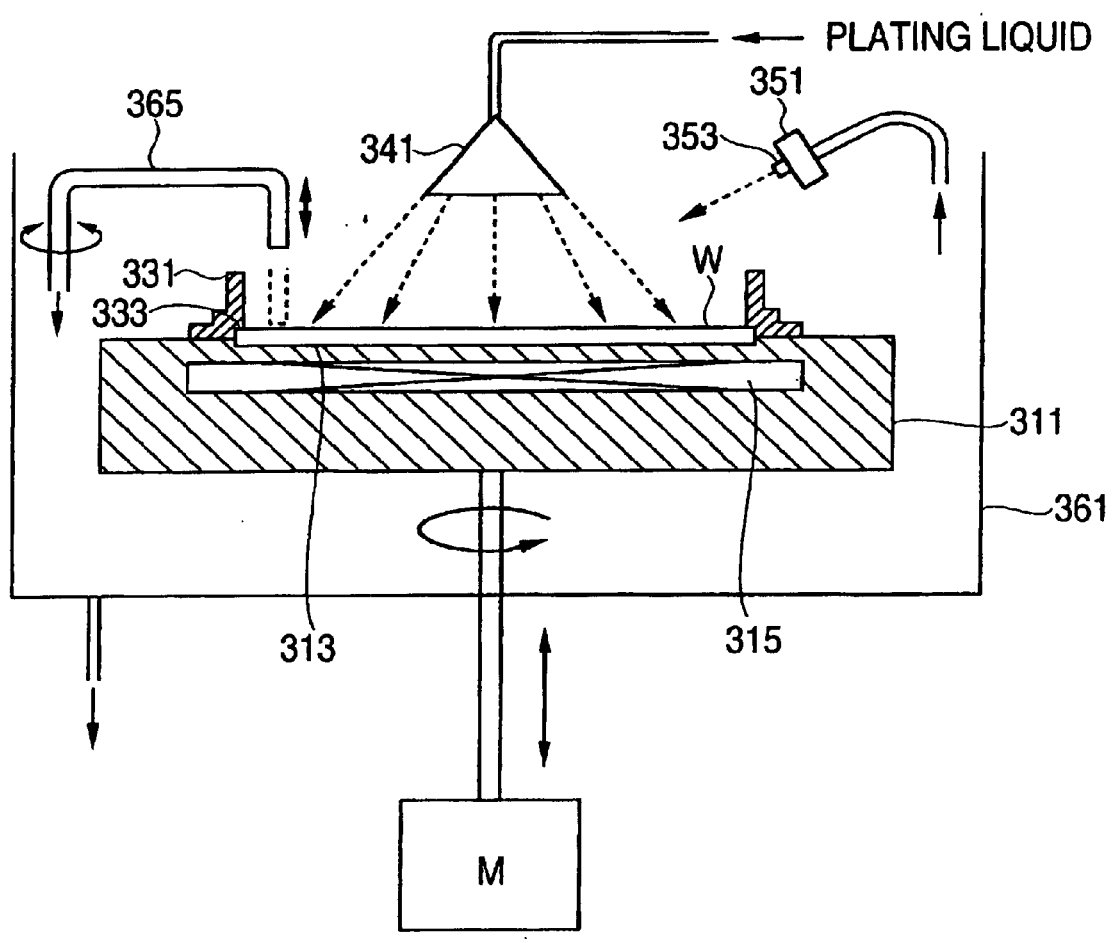
FIG. 36 is a view showing a schematic constitution of an electroless plating apparatus using an embodiment of the present invention.

Electroless Cu plating, which is the seed layer forming unit 112, can employ the same apparatus as the electroless Ru plating unit. FIG. 36 is a view showing a constitution example of an electroless Cu plating unit. The structure of the electroless plating apparatus shown in FIG. 36 will be described in detail in an explanation for the second aspect of the present invention.

In the seed layer forming unit 112, a semiconductor substrate W per se is directly heated by a backside heater 315, and kept at a temperature of 70° C., for example. A plating liquid heated, for example, to 50° C. is ejected from a shower head 341, and the plating liquid is poured over substantially the entire surface of the semiconductor substrate W. The amount of the supplied plating liquid is such that the thickness of the plating liquid on the surface of the semiconductor substrate W is about 1 mm. The semiconductor substrate W is instantaneously rotated by a motor M to perform uniform liquid wetting on the surface to be plated, and then a plated film is formed on the surface of the substrate in such a state that the semiconductor substrate W is in a stationary state.

After seed layer formation treatment is completed, the front end of a plating recovery nozzle 365 is lowered to an area near the inside of a dam member 331 located at a face peripheral edge portion of the semiconductor substrate W to suck in the plating liquid. At this time, the semiconductor substrate W is rotated, for example, at a rotational speed of 100 rpm or less, and hence the liquid remaining on the upper surface of the semiconductor substrate W can be gathered in the portion of the dam member 331 by centrifugal force. Thus, the plating liquid can be recovered with good efficiency and at a high recovery rate.

Then, holding means 311 is lowered to separate the semiconductor substrate W from the dam member 331, and the rotation of the semiconductor substrate W is started and a cleaning liquid (ultrapure water) is ejected toward the plated surface of the semiconductor substrate W from a nozzle 353 of cleaning liquid supply means 351 to cool the plated surface and perform dilution and cleaning, thereby terminating the electroless plating reaction. Next, the semiconductor substrate W is rotated at a high speed by the motor M for thereby spin-drying, and then the semiconductor substrate W is taken out from the holding means 311.

The above electroless plating liquid contains $CuSO_4.5H_2O$, EDTA.4Na as a complexing agent, HCHO as a reducing agent, and NaOH as an alkali for pH adjustment so that the pH becomes 12.5, and further contains α, α'-dipyridyl. The plating temperature is about 40 to 80° C. Formation of the seed layer is not limited to electroless plating, and this seed layer can be formed by using CVD, sputtering or electroplating.

The bevel and backside cleaning unit 116 can perform an edge (bevel) Cu etching and a backside cleaning at the same time, and can suppress growth of a natural oxide film of copper at the circuit formation portion on the surface of the substrate. FIG. 37 shows a schematic view of the bevel and backside cleaning unit 116. As shown in FIG. 37, the bevel and backside cleaning unit 116 has a substrate holding portion 222 positioned inside a bottomed cylindrical waterproof cover 220 and adapted to rotate a substrate W at a high speed, in such a state that the face of the substrate W faces upwardly, while holding the substrate W horizontally by spin chucks 221 at a plurality of locations along a circumferential direction of a peripheral edge portion of the substrate; a center nozzle 224 placed above a nearly central portion of the face of the substrate W held by the substrate holding portion 222; and an edge nozzle 226 placed above the peripheral edge portion of the substrate W. The center nozzle 224 and the edge nozzle 226 are directed downward. A back nozzle 228 is positioned below a nearly central portion of the backside of the substrate W, and directed upward. The edge nozzle 226 is adapted to be movable in a diametrical direction and a height direction of the substrate W.

The width of movement L of the edge nozzle 226 is set such that the edge nozzle 226 can be arbitrarily positioned in a direction toward the center from the outer peripheral end surface of the substrate, and a set value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper film within the edge cut width C can be removed.

Next, the method of cleaning with this cleaning apparatus will be described. First, the semiconductor substrate W is horizontally rotated integrally with the substrate holding portion 222, with the substrate being held horizontally by the spin chucks 221 of the substrate holding portion 222. In this state, an acid solution is supplied from the center nozzle 224 to the central portion of the face of the substrate W. The acid solution may be a non-oxidizing acid such as hydrofluoric acid, hydrochloric acid, sulfuric acid, citric acid, oxalic acid, or the like is used. On the other hand, an oxidizing agent solution is supplied continuously or intermittently from the edge nozzle 226 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the peripheral edge portion C of the semiconductor substrate W is rapidly oxidized with the oxidizing agent solution, and is simultaneously etched with the acid solution supplied from the center nozzle 224 and spreaded on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. That is, the oxide film of copper, which was formed on the surface of the substrate in the plating, can thus be removed by flowing HF over the substrate surface. Further, an oxide film of copper is not newly formed during the etching. It is to be noted in this connection that when an oxide film of copper remains on the surface of the substrate, only the oxide portion of copper is preferentially polished away in a later CMP processing, which adversely affects the flatness of the processed surface. This can be avoided by the removal of the oxide film of copper in the above manner.

After the supply of the acid solution from the center nozzle 224 is stopped, the supply of the oxidizing agent solution from the edge nozzle 226 is stopped. As a result, silicon exposed on the surface is oxidized, and deposition of copper can be suppressed. Thus, the activated surface of Si exposed on the surface of the substrate, for example, can be oxidized and thereby inactivated by later stopping the supply of $H_2O_2$. This prevents adsorption of large particles onto the surface of the substrate which can cause scratching in a later CMP processing.

The oxidation of copper by $H_2O_2$ and the removal of the oxidized copper by HF, carried out repeatedly in the above manner, can enhance the rate of copper removal as compared with the case where the oxidation of copper and its removal are simultaneously effected by using a mixture of $H_2O_2$ and HF.

On the other hand, an oxidizing agent solution and a silicon oxide film etching agent are supplied simultaneously or alternately from the back nozzle 228 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acid solution, i.e., etching solution is supplied to the substrate to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (to 2 mm to 5 mm), but the time required for etching does not depend on the cut width.

The revolution member supporting apparatus shown in FIG. 5 is used for holding the semiconductor substrate in the bevel and backside cleaning unit 116.

Annealing treatment performed before the CMP process and after plating has a favorable effect on the subsequent CMP treatment and on the electrical characteristics of wiring. Observation of the surface of broad wiring (unit of several micrometers) after the CMP treatment without annealing showed many defects such as microvoids, which resulted in an increase in the electrical resistance of the entire wiring. Execution of annealing ameliorated the increase in the electrical resistance. In the absence of annealing, thin wiring showed no voids. Thus, the degree of grain growth is presumed to be involved in these phenomena. That is, the following mechanism can be speculated: Grain growth is difficult to occur in thin wiring. In broad wiring, on the other hand, grain growth proceeds in accordance with annealing treatment. During the process of grain growth, ultrafine pores in the plated film, which are too small to be seen by the SEM (scanning electron microscope), gather and move upward, thus forming microvoid-like depressions in the upper part of the wiring. The annealing conditions in the annealing unit 114 are such that hydrogen (2% or less) is added in a gas atmosphere, the temperature is in the range of 300° C. to 400° C., and the time is in the range of 1 to 5 minutes. Under these conditions, the above effects were obtained.

FIGS. 77 and 78 show the annealing unit 114. The annealing unit 114 comprises a chamber 1002 having a gate 1000 for taking in and taking out the semiconductor substrate W, a hot plate 1004 disposed at an upper position in the chamber 1002 for heating the semiconductor substrate W to e.g. 400° C., and a cool plate 1006 disposed at a lower position in the chamber 1002 for cooling the semiconductor substrate W by, for example, flowing a cooling water inside the plate. The annealing unit 1002 also has a plurality of vertically movable elevating pins 1008 penetrating the cool plate 1006 and extending upward and downward therethrough for placing and holding the semiconductor substrate W on them. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the semiconductor substrate W, which has been carried in the chamber 1002 through the gate 1000, is held on the elevating pins 1008 and the elevating pins 1008 are raised up to a position at which the distance between the semiconductor substrate W held on the lifting pins 1008 and the hot plate 1004 becomes e.g. 0.1–1.0 mm. In this state, the semiconductor substrate W is then heated to e.g. 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. The annealing treatment may be completed in about several tens of seconds to 60 seconds. The heating temperature of the substrate may be selected in the range of 100–600° C.

After the completion of the annealing, the elevating pins 1008 are lowered down to a position at which the distance between the semiconductor substrate W held on the elevating pins 1008 and the cool plate 1006 becomes e.g. 0–0.5 mm. In this state, by introducing a cooling water into the cool plate 1006, the semiconductor substrate W is cooled by the cool plate to a temperature of 100° C. or lower in e.g. 10–60 seconds. The cooled semiconductor substrate is sent to the next step.

A mixed gas of $N_2$ gas with several % of $H_2$ gas is used as the above antioxidant gas. However, $N_2$ gas may be used singly.

The features of the substrate processing apparatus having the above-described constitution are enumerated as follows:

Pretreatment, cleaning and drying can be performed in each film forming unit, and no contaminants are brought into a next step.

In each unit incorporated in the present apparatus, various chemical liquids are used. Even in the same unit, different chemical liquids may be selected depending on differences in the process. If different chemical liquids may be mixed, the treating effects of the chemical liquids may change, or crystals of compounds may be deposited, thus not only affecting the substrate being treated, but also affecting the process treatment of a next semiconductor substrate which will be introduced subsequently. If the transport means is a robot hand, the hand is contaminated. Thus, each time the substrate is transported, various chemical liquids adhere thereto.

Therefore, the present apparatus is characterized in that before transfer to the next unit, i.e., the next step in the semiconductor manufacturing apparatus, the semiconductor substrate is subjected in the unit to treatment which allows no chemical liquid for treatment to remain, and then the treated semiconductor substrate is taken out therefrom. Thus, the chemical liquid is not brought into a separate unit. For example, when the substrate is to be transferred from the electroless plating unit for a barrier layer formation step to the electroplating unit for a plating step for formation of buried wiring, the substrate is subjected to cleaning treatment and drying treatment in the electroless plating unit. Thus, an alkaline electroless plating liquid is prevented from being brought into the electroplating unit in which an acidic plating liquid is used.

At the time of transfer of the substrate from the plating step to the CMP step, cleaning treatment and drying treatment, as well as plating treatment, are carried out in the electroplating unit so that the acidic plating liquid is not brought into the CMP step.

The plating unit 113 for performing a plating step for embedded wiring is characterized in that treatment with a surface active agent, precoating treatment, and the like are possible. Because of this characteristic, pretreatment can be performed in the plating unit 113 (in the single unit) immediately before electroplating, and hence filling of liquid into fine recesses is improved. Moreover, a cleaning mechanism and a spin-drying mechanism are present in the plating unit 113 (in the single unit), and hence the semiconductor substrate W for intercellular movement can be put into a desired wet state such as liquid removal or drying. The cleaning mechanism and the spin-drying mechanism, in particular, can clean and dry not only the semiconductor substrate, but also the seal material and the cathode contacts, and thus have the effects of remarkably decreasing the replacement frequency of these expendable members and increasing the continuous operating time of the entire apparatus.

Figure 38A:
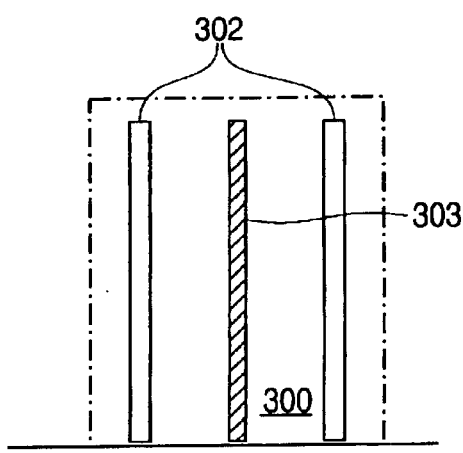
FIGS. 38A through 38D are views showing base plate constitution examples for placing respective units in the semiconductor substrate processing apparatus according to the present invention.
Figure 38B:
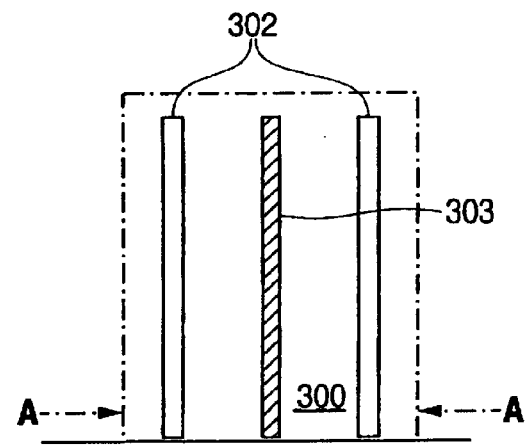
Figure 38C:
Figure 38D:
Figure 39A:
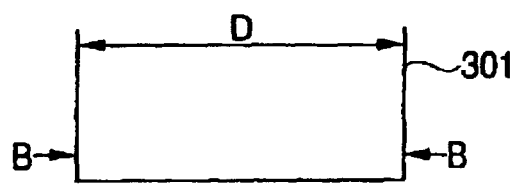
FIGS. 39A and 39B are views showing schematic front constitution examples of the respective units in the semiconductor substrate processing apparatus according to the present invention.
Figure 39B:
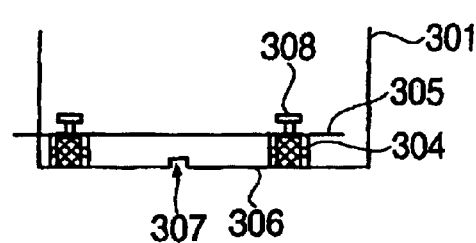
Figure 40A:
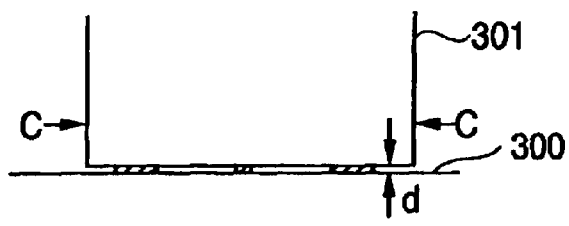
FIGS. 40A and 40B are views showing schematic front constitution examples of the respective units in the semiconductor substrate processing apparatus according to the present invention.
Figure 40B:
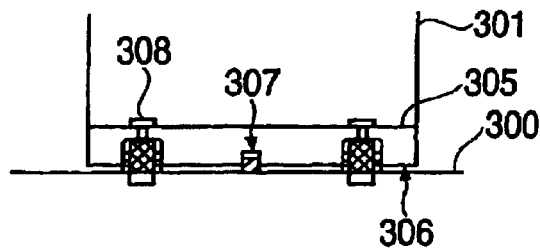

Flexible incorporation of the units and flexible construction of the process can be performed in a short period of time. FIGS. 38A through 38D, 39A, 39B, and 40A and 40B are views showing constitution examples in which the respective units in the substrate processing apparatus are interchangeable. FIGS. 38A and 38B are plan views of bed plates for supporting respective units constituting the present substrate processing apparatus, FIG. 38C is a front view of the base plate, and FIG. 39D is a sectional view taken along line A—A of FIG. 38B. FIG. 39A is a front view of each unit of the present substrate processing apparatus, and FIG. 39B is a sectional view taken along line B—B of FIG. 39A. FIG. 40A is a front view showing a state in which each unit of the present substrate processing apparatus is placed on the base plate, and FIG. 40B is a sectional view taken along line C—C of FIG. 40A.

As shown in the drawings, two rails (comprising, for example, SUS material) 302, 302 are placed on an upper surface of a bed plate 300 for placing thereon each unit 301 of the present substrate processing apparatus, in parallel and with narrower spacing than the frontage dimension D of each unit 301 so as to be placed in the bed plate 300 (the upper surface of the bed plate 300 is substantially flush with the upper surfaces of the rails 302, 302). At an intermediate position between the rails, one guide bar (comprising, for example, nylon resin material) 303 is placed so as to protrude from the upper surface of the bed plate 300. The bottom of each unit 301 is double-bottomed, and four rollers 304 are attached to an upper bottom portion 305 by screws 308, while a groove 307 to be engaged with the guide bar 303 is provided in a lower bottom portion 306. The height of each roller 304 can be adjusted by the screw 308.

The screw 308 is adjusted to adjust a bottom portion of each roller 304 so as to protrude slightly (e.g. by about 1 mm) from the lower bottom portion 306. In this state, when the unit 301 is inserted such that the guide bar 303 is engaged with the groove 307 of the lower bottom portion 306 of the unit 301, the unit 301 is guided by the guide bar and settles at a predetermined position. In this state, a gap d corresponding to a protrusion of the roller 304 exists between the lower bottom portion 306 and the upper surface of the bed plate 300, as shown in FIG. 40A. Each screw 308 is loosened in such a state that each unit 301 is settled at the predetermined position for thereby retracting each roller 304, and thus the lower bottom portion 306 of the unit 301 contacts the upper surface of the bed plate 300 (not shown). In this state, each unit 301 is fixed to the bed plate 300 by fixing screws (not shown).

Each unit is loaded such that its carry-in and carry-out opening is directed in the direction of the transfer robots 131 to 134 (see FIG. 31). The width of each unit 300 facing the robot, i.e., the frontage dimension D, is of the same size. During loading, the unit is inserted along the rails 302, 302 onto the unit loading surface of the bed plate 300 of the present apparatus as described above, and thus the unit can be easily loaded. The loaded unit 301 may be pulled in the reverse direction when it is removed from the body of the apparatus.

In the field of semiconductor manufacturing, innovations in techniques are making rapid progress. By imparting an easily replaceable structure to each unit 301 constituting the apparatus as described above, some of the units 301 can be easily replaced with new units, without the need to replace the entire apparatus. Thus, renewal of the functions of the entire apparatus can be achieved at a low cost in a short period of time. Also, on the precondition that the unit 301 will be replaced in the above manner, the apparatus is designed such that the control system can easily cope with the replacement. The present apparatus can freely set whether a process treatment is performed or not in the loaded unit 301 (skip function for the unit), and can freely set a treatment route of the semiconductor substrate W (sequence of use of the units). Thus, not only in case the unit has been replaced, but also in case treatment should be performed by a different process, the functions of the apparatus can be flexibly modified. Particularly, in order to meet demands for manufacturing of a wide variety of products, and low volume production in recent years, it has become important to possess many kinds of small scale lines. Thus, the above structure which enables necessary units to be easily and freely combined is particularly useful.

Figure 41:
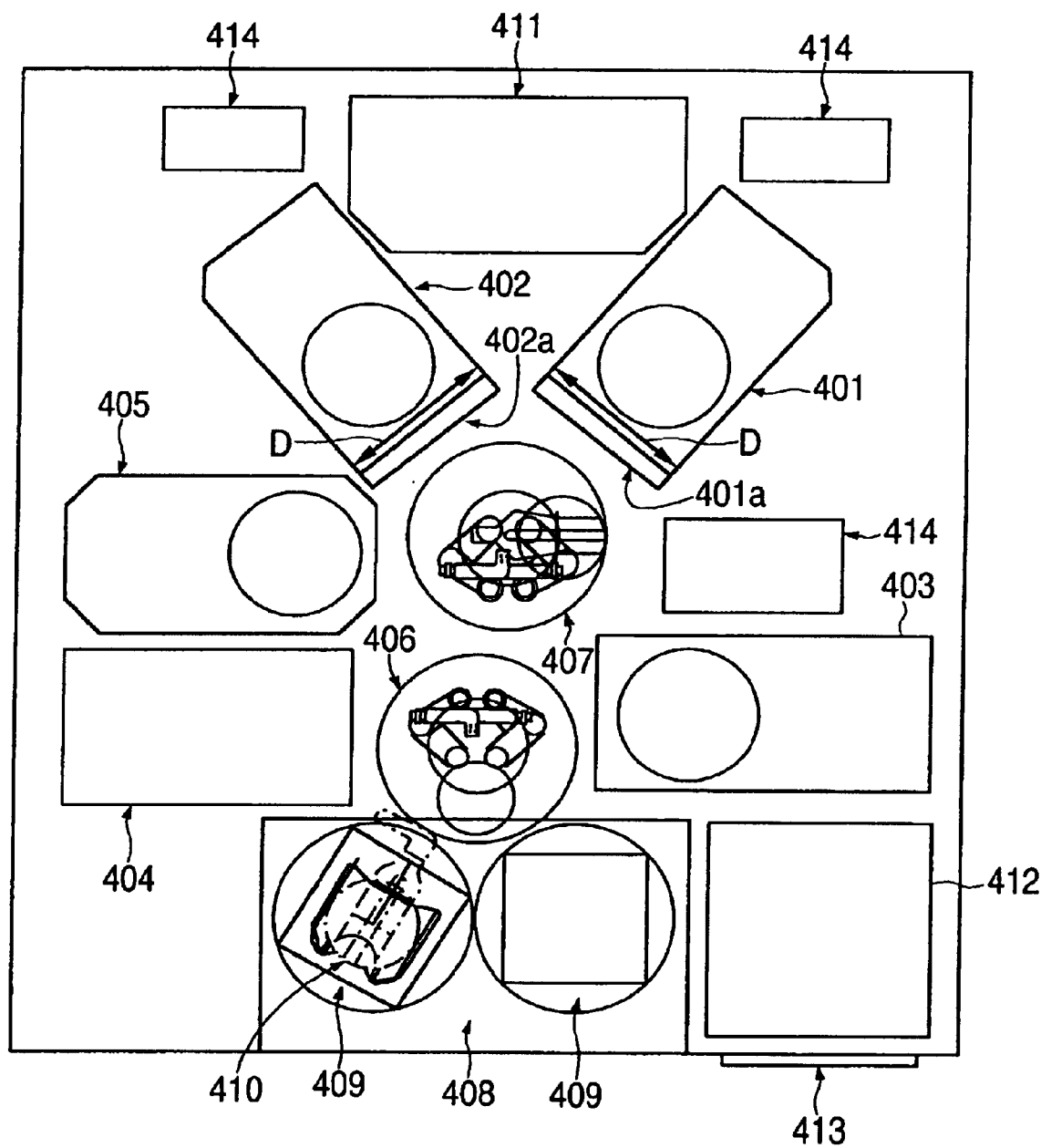
FIG. 41 is a view showing a plan constitution example of the semiconductor substrate processing apparatus according to the present invention.

FIG. 41 is a view showing plan layout constitution of another embodiment of the substrate processing apparatus according to the present invention. The present substrate processing apparatus is such a substrate processing apparatus applicable to small-scale, low volume production of a wide variety of products, like manufacturing of system LSIs required for digital information household electrical appliances. In the substrate processing apparatus, there are provided a first plating unit 401, a second plating unit 402, a bevel and backside cleaning unit 403, an annealing unit 404, an aligner and film thickness measuring unit 405, and a loading and unloading section 408 such that they surround a first robot 406 and a second robot 407. Two indexers 409, 409 are placed on the loading and unloading section 408, and a cassette 410 can be placed on each of the indexers. In FIG. 41, the reference numeral 411 denotes a chemical liquid supply unit, the reference numeral 412 an electrical component unit, the reference numeral 413 a touch panel, and the reference numeral 414 a duct for air intake or exhaust.

The indexer 409 is such a mechanism which can raise and lower a cassette placed thereon to position the cassette in a height direction in alignment with a substrate taken out by the first robot 406. The first robot 406 accesses the same height position. In the present substrate processing apparatus, the first robot 406 takes out the substrate, which has a barrier layer and a seed layer formed by another apparatus, from the cassette 410 on the indexer 409, and transports it to the aligner and film thickness measuring unit 405. After alignment of the notch and film thickness measurement before film formation are performed by the aligner and film thickness measuring unit 405, the second robot 407 takes out the substrate from the aligner and film thickness measuring unit 405, and transports it to the first plating unit 401 or the second plating unit 402 where copper plating is applied.

The substrate to which copper plating has been applied, is transported by the second robot 407 to the aligner and film thickness measuring unit 405, and the film thickness of the substrate after plating is measured with the aligner and film thickness measuring unit 405. The first robot 406 takes out the substrate from the aligner and film thickness measuring unit 405, and transports it to the bevel and backside cleaning unit 403. After the substrate is cleaned in the bevel and backside cleaning unit 403, it is transported to the annealing unit 404. After the substrate is annealed in the annealing unit 404, the first robot 406 returns the substrate which has been cleaning to the cassette 410 on the indexer 409.

The first plating unit 401 and the second plating unit 402 may be set for the same process, and plating treatment of a plurality of substrates may be performed in parallel. Alternatively, different processes may be used in the first plating unit 401 and the second plating unit 402, and during one of the processes, one of the units may be kept at rest, while only the other unit may be used. Also, the annealing unit 404 and the bevel and backside cleaning unit 403 can be replaced with plating units for performing different processes.

In the present substrate processing apparatus, the width of sides 401a, 402a of the first plating unit 401 and the second plating unit 402 facing the second robot 407, namely the frontage dimension D is of the same size as the frontage dimension of the annealing unit 404, the bevel and backside cleaning unit 403, the aligner and film thickness measuring unit 405, the cleaning units 115, 118 shown in FIG. 16, the seed layer forming unit 112, the barrier layer forming unit 111, the cap plating unit 117, the aligner and film thickness measuring units 141, 142, the film thickness measuring unit 146, the substrate reversing machines 143, 144, and the temporary placing table 145 (although the frontage dimension in some parts is not shown to be of the same size in the drawing). Thus, when a new process is to be introduced, these units can be easily replaced by other units, and hence renewal of the apparatus can be performed at a low cost in a short time. The aligner and film thickness measuring unit 405 is also of the same size as the frontage dimension of other units, and they are interchangeable.

Figure 42:
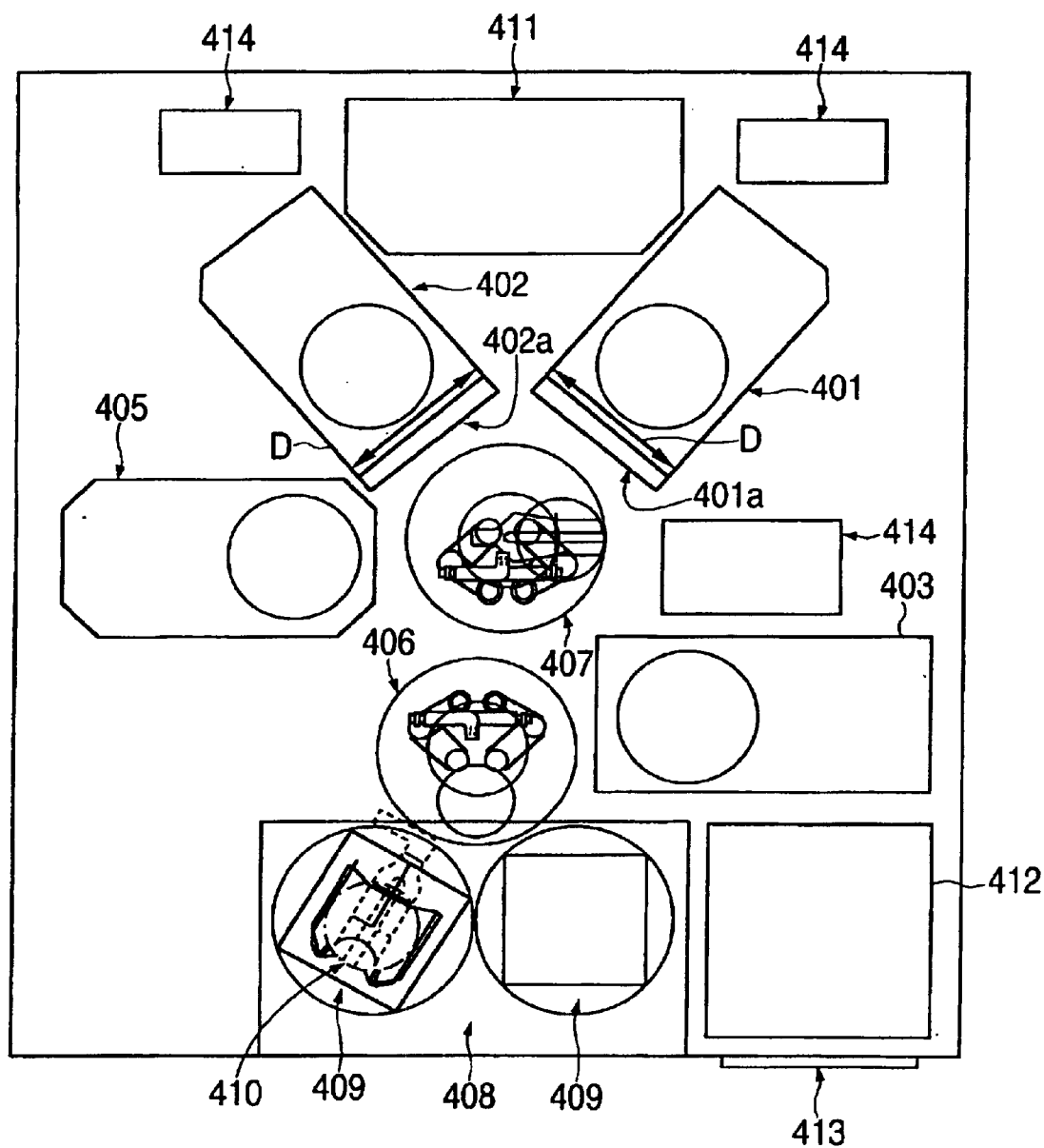
FIG. 42 is a view showing a plan constitution example of the semiconductor substrate processing apparatus according to the present invention.

FIG. 42 is a view showing plan layout constitution of another embodiment of the substrate processing apparatus according to the present invention. The present substrate processing apparatus differ from the substrate processing apparatus shown in FIG. 41 is that a annealing nuit 404 shown in FIG. 38 is not provided. The other constitution of the substrate processing apparatus is the same as that of the substrate processing apparatus shown in FIG. 41, and its explanation is omitted.

With the above-described layout of the substrate processing apparatus which is mainly adopted, a plurality of the substrate processing apparatuses are installed in the plant, and the constitutions of the units to be loaded thereon are changed, whereby the apparatuses can be used in different wiring processes. In case that high volume production is required temporarily, the apparatuses can be rapidly modified into substrate processing apparatuses composed of the same units to meet the requirement.

Though the two robots, viz. the first robot 406 and the second robot 407, are used in the semiconductor substrate processing device shown in FIG. 41 or FIG. 42, use of one robot only may also be possible.

Further, in consideration of the throughput of semiconductor wafers, for example, a plurality of plating units and cleaning units (spin-rinsing/drying units) may suitably be provided around one robot. For example, three plating units and three cleaning units may be provided around one robot. The cleaning unit (spin-rinsing/drying unit) may be substituted by a bevel-etching unit. The plating unit may either be of the so-called face-up type as shown in FIGS. 12 through 16, or of the so-called face-down type as shown in FIGS. 59 through 66.

Figure 43:
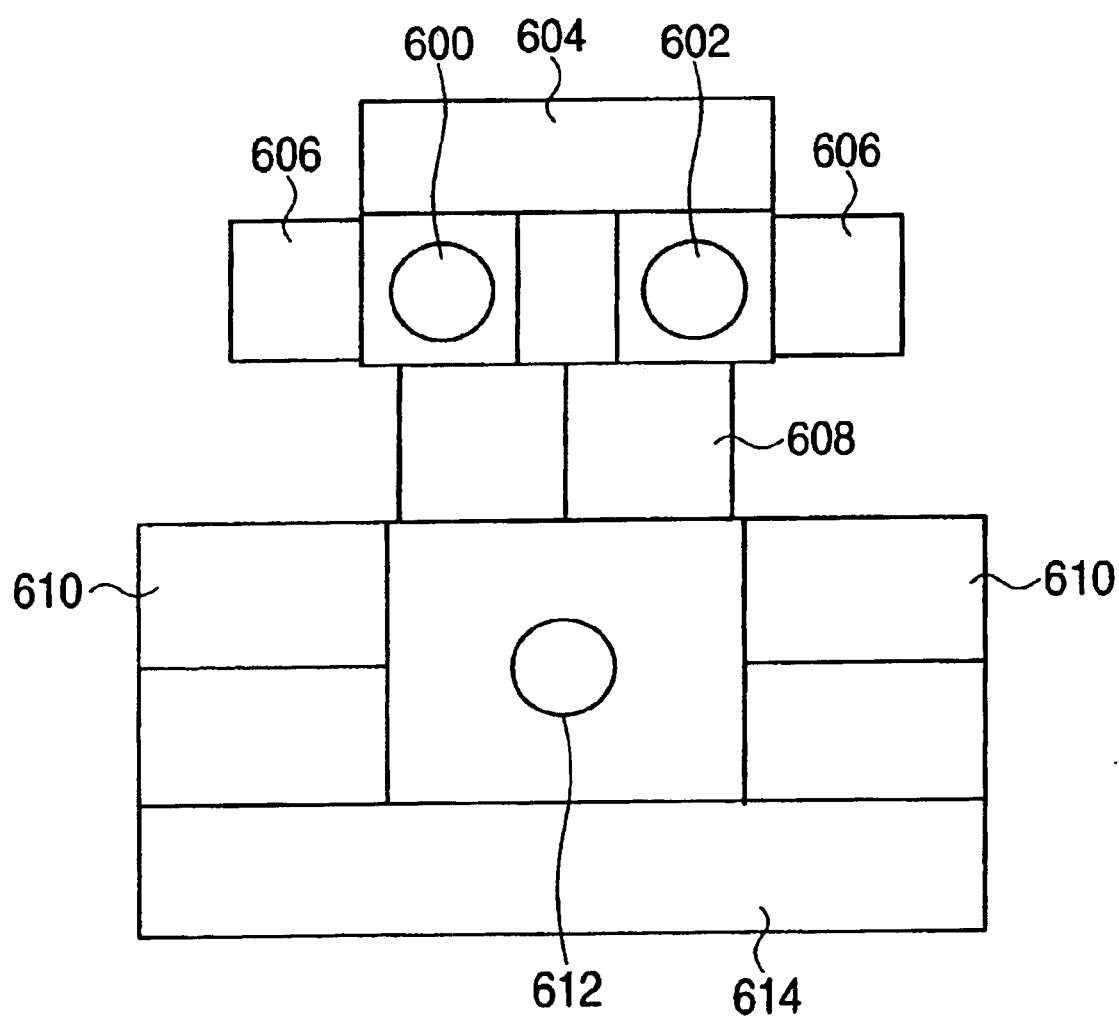
FIG. 43 is a view showing a plan constitution example of the semiconductor substrate processing apparatus according to the present invention.

FIG. 43 is a view showing plan layout constitution of another embodiment of the substrate processing apparatus according to the present invention. In the substrate processing apparatus, there are provided a loading and unloading section 604, two annealing units 606 and cleaning units 608 such that they surround a first robot 600 and a second robot 602. Further, third robot is disposed at the position surrounded by cleaning units 608 and four plated film forming units 610. The substrate processing apparatus provided with a chemical liquid supplying system 614 for supplying the plating liquid to the plated film forming units 610. Each of the cleaning units 608 provided with a revolution member supporting apparatus shown in FIGS. 3 through 6.

In the foregoing explanations of the embodiments, an example for forming the plated Cu film 106 by electroplating has been described, but the plated Cu film 106 can be formed by electroless plating.

According to the first aspect of the present invention as described above, the following excellent effects can be obtained.

(1) Processing in which metal plating is applied onto a semiconductor substrate having a trench and/or a hole for an interconnection pattern formed on a surface thereof, and having a barrier layer and a power supply seed layer formed thereon, the barrier layer, the power supply seed layer and a plated metal film are polished and removed, and the substrate is cleaned and dried to form interconnects, can be performed continuously by one apparatus. Thus, compared with a case in which respective processing steps are performed by separate apparatuses, the entire apparatus can be compact, a wide installation space is not needed, the initial cost and running cost for the apparatus can be decreased, and interconnects can be formed in a short processing time.

(2) Processing in which a power supply seed layer and a plated metal film are applied onto a semiconductor substrate having a trench and/or a hole for an interconnection pattern formed on a surface thereof, and having a barrier layer formed thereon, the power supply seed layer and the plated metal film are polished and removed, and the substrate is cleaned and dried to form interconnects, can be performed continuously by one apparatus. Thus, compared with a case in which respective processing steps are performed by separate apparatuses, the entire apparatus can be compact, a wide installation space is not needed, the initial cost and running cost for the apparatus can be decreased, and interconnects can be formed in a short processing time.

(3) Processing in which a barrier layer, a power supply seed layer and a plated metal film are applied onto a semiconductor substrate having a trench and/or a hole for an interconnection pattern formed on a surface thereof, the barrier layer, the power supply seed layer and the plated metal film are polished and removed, and the substrate is cleaned and dried to form interconnects, can be performed continuously by one apparatus. Thus, compared with a case in which respective processing steps are performed by separate apparatuses, the entire apparatus can be compact, a wide installation space is not needed, the initial cost and running cost for the apparatus can be decreased, and interconnects can be formed in a short processing time.

(4) By recording the results of measurement of the film thicknesses, the remaining film, and the initial film thicknesses of the respective layers measured with the film thickness measuring section and the remaining film measuring section, it is possible to utilize the records as data for controlling the treatment time of a subsequent step, and as data for judging the good or poor state of each treatment step, or judging whether the semiconductor substrate after completion of the interconnect formation treatment is good or poor.

(5) It is possible to provide a substrate processing apparatus which can easily cope with a change in the substrate treatment process, and can achieve renewal of the function of the entire substrate processing apparatus at a low cost in a short time.

(6) While a substrate holding portion is holding a semiconductor substrate faceup, a plating liquid is filled between a surface to be plated and an anode of an electrode arm portion to perform plating treatment. After plating treatment, the plating liquid between the surface to be plated and the anode of the electrode arm portion is discharged, and the electrode arm portion is raised to release the plated surface. Thus, other treatments associated with plating treatment, such aspretreatment and cleaning and drying treatment, can be performed before and after plating treatment, while the semiconductor substrate is being held by the substrate holding portion.

(7) The precoating treatment, plating treatment and water washing treatment can be performed by a plating unit, thus improving time efficiency.

(8) Since the respective units are adapted to be interchangeable, the apparatus can freely and easily deal with changes in the substrate treatment process, and renewal of the functions of the entire substrate processing apparatus can be achieved at a low cost in a short time.

(9) Processing in which metal plating is applied onto a semiconductor substrate having a trench and/or a hole for an interconnection pattern formed on a surface thereof, and having a barrier layer and a power supply seed layer formed thereon, the barrier layer, the power supply seed layer, and a plated metal film are polished and removed, and the substrate is cleaned and dried to form interconnects, can be performed continuously by one apparatus. Thus, compared with a case in which respective treatment steps are performed by separate apparatuses, the entire apparatus can be compact, a wide installation space is not needed, the initial cost and running cost for the apparatus can be decreased, and interconnects can be formed in a short processing time.

(10) Processing in which a power supply seed layer and a plated metal film are applied onto a semiconductor substrate having a trench and/or a hole for an interconnection pattern formed on a surface thereof, and having a barrier layer formed thereon, the power supply seed layer and the plated metal film are polished and removed, and the substrate is cleaned and dried to form interconnects, can be performed continuously. Thus, interconnects can be formed in a short processing time.

(11) Processing in which a barrier layer, a power supply seed layer and a plated metal film are applied onto a semiconductor substrate having a trench and/or a hole for an interconnection pattern formed on a surface thereof, the power supply seed layer and the plated metal film are polished and removed, and the substrate is cleaned and dried to form interconnects, can be performed continuously. Thus, interconnects can be formed in a short procesing time.

Next, a second aspect of the present invention will be described in detail with reference to FIGS. 36, 44A through 44C and 45. An electroless plating apparatus according to this embodiment is used, for example, to form a seed layer or interconnect comprising a copper layer by applying electroless copper plating onto the surface of a semiconductor substrate W. An example of this plating process will be described with reference to FIGS. 44A through 44C.

Figure 44A:
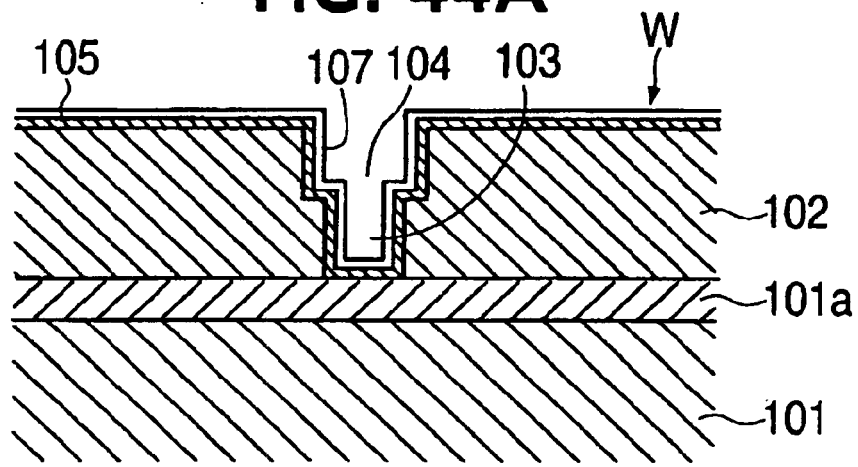
FIGS. 44A through 44C are schematic views showing an example of a plating step.
Figure 44B:
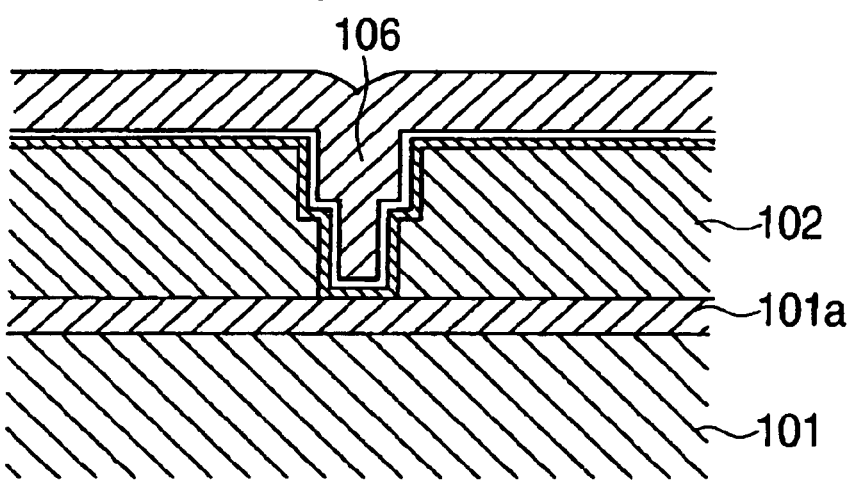
Figure 44C:
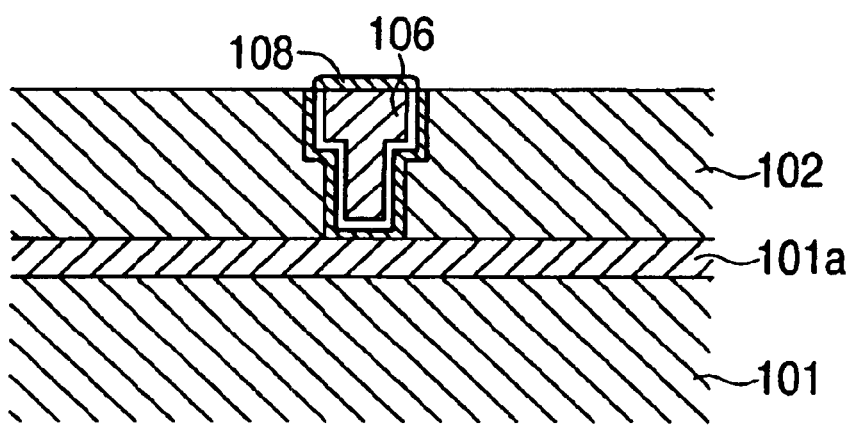

In the semiconductor substrate W, as shown in FIG. 44A, an insulating film 102 comprising $SiO_2$ is deposited on a conductive layer 110a of a substrate 100 on which semiconductor devices are formed, a contact hole 103 and a trench 104 for an interconnect are formed by lithography and etching technology, a barrier layer 105 comprising TiN or the like is formed thereon, and a seed layer 107 is further formed thereon by electroless copper plating. The seed layer 107 may be formed beforehand by sputtering, and a reinforcing seed layer for reinforcing the seed layer 107 may be formed thereon by electroless copper plating. As shown in FIG. 44B, copper plating is applied onto the surface of the semiconductor substrate W to fill copper into the contact hole 103 and the trench 104 of the semiconductor substrate W and deposit a copper layer 106 on the insulating film 102. Thereafter, the copper layer 106 on the insulating film 102 is removed by chemical mechanical polishing (CMP) to make the surface of the copper layer 106, filled into the contact hole 103 and the trench 104 for an interconnect, flush with the surface of the insulating film 102, as shown in FIG. 44C. An interconnect protective film 108 is formed on the exposed metal surface. The reinforcing seed layer can be formed by electroless plating as described above, but can also be formed by electroplating. When the reinforcing seed layer is to be formed by electroplating, it can be formed by the plated metal film forming unit of the present invention, but can also be formed by a socalled cup-type electroplating unit which performs electroplating while holding a surface, to be plated, of the substrate so as to face downward.

FIG. 36 is a schematic constitution drawing of the electroless plating apparatus of the present invention. As shown in FIG. 36, this electroless plating apparatus comprises holding means 311 for holding a semiconductor substrate W to be plated on its upper surface, a dam member (plating liquid holding mechanism) 331 for contacting a peripheral edge portion of a surface to be plated (upper surface) of the semiconductor substrate W held by the holding means 311 to seal the peripheral edge portion, and a shower head (an electroless plating treatment liquid (scattering) supply means) 341 for supplying a plating liquid (an electroless plating treatment liquid) to the surface, to be plated, of the semiconductor substrate W having the peripheral edge portion sealed with the dam member 331. The electroless plating apparatus further comprises cleaning liquid supply means 351 disposed near an upper outer periphery of the holding means 311 for supplying a cleaning liquid to the surface, to be plated, of the semiconductor substrate W, a recovery vessel 361 for recovering a cleaning liquid or the like (plating waste liquid) discharged, a plating liquid recovery nozzle 365 for sucking in and recovering the plating liquid held on the semiconductor substrate W, and a motor (rotational drive means) M for rotationally driving the holding means 311. The respective members will be described below.

The holding means 311 has a substrate placing portion 313 on its upper surface for placing and holding the semiconductor substrate W. The substrate placing portion 313 is adapted to place and fix the semiconductor substrate W. Specifically, the substrate placing portion 313 has a vacuum attracting mechanism (not shown) for attracting the semiconductor substrate W to a backside thereof by vacuum suction. A backside heater (heating means) 315, which is planar and heats the surface, to be plated, of the semiconductor substrate W from underside to keep it warm, is provided at the backside of the substrate placing portion 313. The backside heater 315 is composed of, for example, a rubber heater. This holding means 311 is adapted to be rotated by the motor M and is movable vertically by raising and lowering means (not shown).

The dam member 331 is tubular, has a seal portion 333 provided in a lower portion thereof for sealing the outer peripheral edge of the semiconductor substrate W, and is installed so as not to move vertically from the illustrated position.

The shower head 341 is of a structure having many nozzles provided at the front end for scattering the supplied plating liquid in a shower form and supplying it substantially uniformly to the surface, to be plated, of the semiconductor substrate W. The cleaning liquid supply means 351 has a structure for ejecting a cleaning liquid from a nozzle 353.

The plating liquid recovery nozzle 365 is adapted to be movable upward and downward and swingable, and the front end of the plating liquid recovery nozzle 365 is adapted to be lowered inwardly of the dam member 331 located on the upper surface peripheral edge portion of the semiconductor substrate W and to suck in the plating liquid on the semiconductor substrate W.

Next, the operation of the electroless plating apparatus will be described. First, the holding means 311 is lowered from the illustrated state to provide a gap of a predetermined dimension between the holding means 311 and the dam member 331, and the semiconductor substrate W is placed on and fixed to the substrate placing portion 313. An 8 inch wafer, for example, is used as the semiconductor substrate W.

Then, the holding means 311 is raised to bring its upper surface into contact with the lower surface of the dam member 331 as illustrated, and the outer periphery of the semiconductor substrate W is sealed with the seal portion 333 of the dam member 331. At this time, the surface of the semiconductor substrate W is in an open state.

Then, the semiconductor substrate W itself is directly heated by the backside heater 315 to render the temperature of the semiconductor substrate W, for example, 70° C. (maintained until termination of plating). Then, the plating liquid heated, for example, to 50° C. is ejected from the shower head 341 to pour the plating liquid over substantially the entire surface of the semiconductor substrate W. Since the surface of the semiconductor substrate W is surrounded by the dame member 331, the poured plating liquid is all held on the surface of the semiconductor substrate W. The amount of the supplied plating liquid may be a small amount which will become a 1 mm thickness (about 30 ml) on the surface of the semiconductor substrate W. The depth of the plating liquid held on the surface to be plated may be 10 mm or less, and may be even 1 mm as in this embodiment. If a small amount of the supplied plating liquid is sufficient as in the present embodiment, the heating apparatus for heating the plating liquid may be of a small size. In this embodiment, the temperature of the semiconductor substrate W is raised to 70° C., and the temperature of the plating liquid is raised to 50° C. by heating. Thus, the surface, to be plated, of the semiconductor substrate W becomes, for example, 60° C., and hence a temperature optimal for a plating reaction in this embodiment can be achieved. If the semiconductor substrate W itself is adapted to be heated as described above, the temperature of the plating liquid requiring a great electric power consumption for heating need not be raised so high. This is preferred, because the electric power consumption can be decreased, and a change in the property of the plating liquid can be prevented. The electric power consumption for heating of the semiconductor substrate W itself may be small, and the amount of the plating liquid stored on the semiconductor substrate W is also small. Thus, heat retention of the semiconductor substrate W by the backside heater 315 can be performed easily, and the capacity of the backside heater 315 may be small, and the apparatus can be made compact. If means for directly cooling the semiconductor substrate W itself is used, switching between heating and cooling may be performed during plating to change the plating conditions. Since the plating liquid held on the semiconductor substrate is in a small amount, temperature control can be performed with good sensitivity.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm or less for only 1 second to uniformly wet the surface, to be plated, of the semiconductor substrate W with the plating liquid. Then, the semiconductor substrate W is kept stationary, and electroless plating is performed for 1 minute. The instantaneous rotating time is 10 seconds or less at the longest.

After completion of the plating treatment, the front end of the plating liquid recovery nozzle 365 is lowered to an area near the inside of the dam member 331 on the peripheral edge portion of the semiconductor substrate W to suck in the plating liquid. At this time, if the semiconductor substrate W is rotated at a rotational speed of, for example, 100 rpm or less, the plating liquid remaining on the semiconductor substrate W can be gathered in the portion of the dam member 331 on the peripheral edge portion of the semiconductor substrate W under centrifugal force, so that recovery of the plating liquid can be performed with a good efficiency and a high recovery rate. The holding means 311 is lowered to separate the semiconductor substrate W from the dam member 331. The semiconductor substrate W is started to be rotated, and the cleaning liquid (ultrapure water) is jetted at the plated surface of the semiconductor substrate W from the nozzle 353 of the cleaning liquid supply means 351 to cool the plated surface, and simultaneously perform dilution and cleaning, thereby stopping the electroless plating reaction. At this time, the cleaning liquid jetted from the nozzle 353 may be supplied to the dam member 331 to perform cleaning of the dam member 331 at the same time. The plating waste liquid at this time is recovered into the recovery vessel 361 and discarded.

The plating liquid once used is not reused, but thrown away. As described above, the amount of the plating liquid used in this apparatus can be made very small, compared with that in the prior art. Thus, the amount of the plating liquid which is discarded is small, even without reuse. In some cases, the plating liquid recovery nozzle 365 may not be installed, and the plating liquid which has been used may be recovered as a plating waste liquid into the recovery vessel 361, together with the cleaning liquid.

Then, the semiconductor substrate W is rotated at a high speed by the motor M for spin-drying, and then the semiconductor substrate W is removed from the holding means 311.

Figure 45:
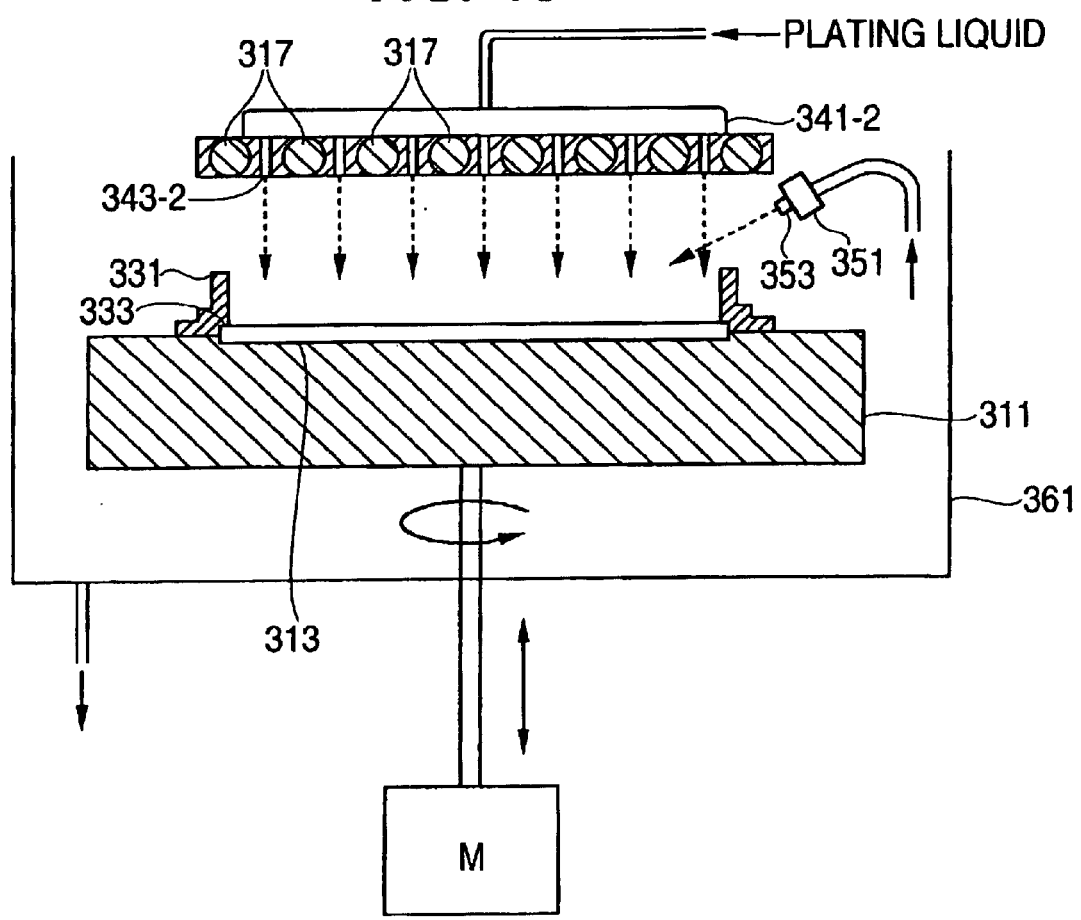
FIG. 45 is a view showing a schematic constitution of an electroless plating apparatus using another embodiment of the present invention.

FIG. 45 is a schematic constitution drawing of an electroless plating apparatus constituted using another embodiment of the present invention. The embodiment of FIG. 45 is different from the aforementioned embodiment in that instead of providing the backside heater 315 in the holding means 311, lamp heaters (heating means) 317 are disposed above the holding means 311, and the lamp heaters 317 and a shower head 341-2 are integrated. For example, a plurality of ring-shaped lamp heaters 317 having different radii are provided concentrically, and many nozzles 343-2 of the shower head 341-2 are open in a ring form from the gaps between the lamp heaters 317. The lamp heaters 317 may be composed of a single spiral lamp heater, or may be composed of other lamp heaters of various structures and arrangements.

Even with this constitution, the plating liquid can be supplied from each nozzle 343-2 to the surface, to be plated, of the semiconductor substrate W substantially uniformly in a shower form. Further, heating and heat retention of the semiconductor substrate W can be performed by the lamp heaters 317 directly uniformly. The lamp heaters 317 heat not only the semiconductor substrate W and the plating liquid, but also ambient air, thus exhibiting a heat retention effect on the semiconductor substrate W.

Direct heating of the semiconductor substrate W by the lamp heaters 317 requires the lamp heaters 317 with a relatively large electric power consumption. In place of such lamp heaters 317, lamp heaters 317 with a relatively small electric power consumption and the backside heater 315 shown in FIG. 36 may be used in combination to heat the semiconductor substrate W mainly with the backside heater 315 and to perform heat retention of the plating liquid and ambient air mainly by the lamp heaters 317. In the same manner as in the aforementioned embodiment, means for directly or indirectly cooling the semiconductor substrate W may be provided to perform temperature control.

Plating was actually performed using the electroless plating apparatus shown in FIG. 36 and the conventional electroless plating apparatus shown in FIG. 45, and the results were compared. The conditions for and the results of the experiments are shown below.

[Electroless Cu Plating Sample]

An 8 inch semiconductor substrate has a barrier layer of TaN (30 nm) and a seed layer (film applied all over) of Cu (50 nm) formed on silicon.

[Plating Specifications]

(1) Plating method according to the present invention Process: A semiconductor substrate W is set on the holding means 311 heated by the backside heater 315 (70° C.), and the dam member 331 is set on the semiconductor substrate W. Then, the plating liquid (50° C.) is supplied for 5 seconds in an amount of only 30 ml from the shower head 341 in such a state that the semiconductor substrate W is in a stationary state. Thereafter, the semiconductor substrate W is rotated at 100 rpm for only 1 second to wet the surface of the semiconductor substrate W uniformly with the plating liquid, and the semiconductor substrate W is held in a stationary state for 1 minute. Then, the plating liquid is recovered by the plating liquid recovery nozzle 365, and then the dam member 331 is separated from the surface of the semiconductor substrate W. While the semiconductor substrate W is being rotated (800 rpm), the cleaning liquid (ultrapure water) is supplied onto the surface of the semiconductor substrate W for 30 seconds for water washing, thereby stopping a plating reaction. Supply of the cleaning liquid is stopped, and the semiconductor substrate W is spin-dried (1000 rpm, 30 sec) and then taken out.

(2) Plating method according to a conventional example Process: A semiconductor substrate W is set on the holding means 81, and a plating liquid of 70° C. is dripped onto the center of the semiconductor substrate W for 1 minute (600 ml/min) in such a state that the semiconductor substrate W is rotated at 40 rpm. After dripping of the plating liquid is finished, a cleaning liquid (ultrapure water) is supplied onto the surface of the semiconductor substrate W for 30 seconds, while the semiconductor substrate W is continued to be rotated, thus performing water washing and stopping the plating reaction. Then, the semiconductor substrate W is withdrawn from the holding means 81, and dried separately with a dryer.

Figure 46A:
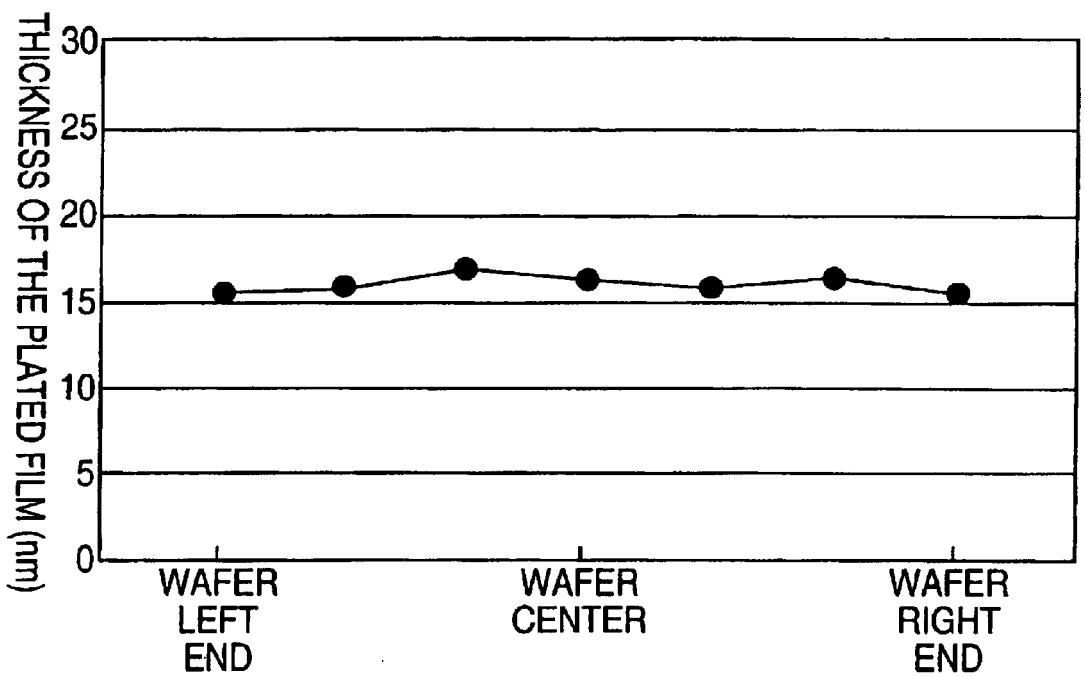
FIGS. 46A and 46B are views showing the results of measurement of the film thicknesses of semiconductor substrates which are electroless-plated by the methods of the present invention and a conventional example.
Figure 46B:
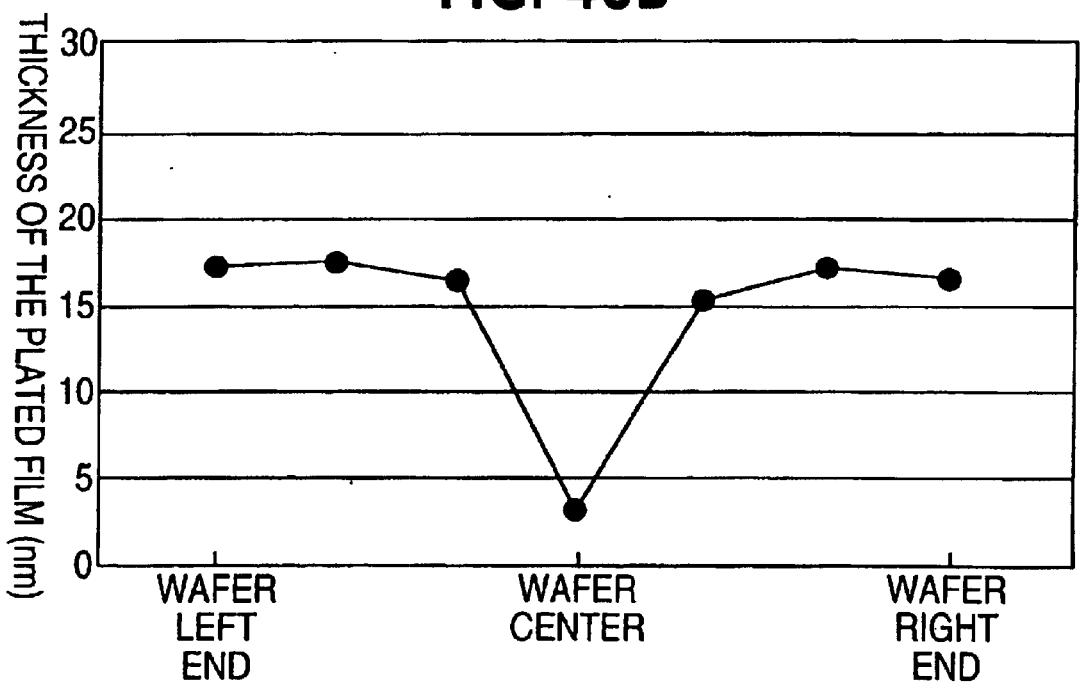

FIGS. 46A and 46B are views showing the results of measurement of the film thicknesses, on the X axis, of semiconductor substrates W subjected to the electroless plating according to the above respective methods. FIG. 46A is a view showing electroless Cu film thickness inplane distribution according to the present plating method, and FIG. 46B is a view showing electroless Cu film thickness inplane distribution according to the conventional plating method. In FIGS. 46A and 46B, the horizontal axis represents locations of the wafer (substrate), while the vertical axis represents the thickness of the plated film. As shown in FIGS. 46A and 46B, in the plating method according to the present invention, the film thickness is uniform throughout the semiconductor substrate W. Whereas in the plating method according to the conventional example, the film thickness is extremely smaller at the center of the semiconductor substrate W. The plating method according to the present invention was verified to improve the inplane uniformity of the plated film thickness remarkably.

The embodiment of the present invention has been described above, but the present invention is not limited to the above embodiment, and various modifications are possible within the scope of the claims and the scope of the technical ideas described in the specification and drawings. For example, the electroless plating apparatus according to the present invention is not limited to the formation of a seed layer and a copper layer for interconnects, but can be used in the formation of a wiring protective film.

Further, the electroless plating apparatus according to the present invention can also be used in the pretreatment step and the catalyst treatment step for electroless plating. That is, in the above embodiment, for example, electroless plating was performed by supplying an electroless plating liquid from the shower head 341 to the surface, to be plated, of the semiconductor substrate W. However, other electroless plating treatment liquid for use in thepretreatment step or the catalyst treatment step for electroless plating may be supplied from the shower head 341 before the electroless plating liquid supply step. Thus, these treatment steps can also be performed by this electroless plating apparatus, together with the electroless plating step.

In the above embodiment, plating was carried out in such a state that the plating liquid is held on the surface to be plated, and the substrate is kept stationary. However, the substrate may be rotated slowly to such a degree that uneven plating does not occur.

Furthermore, the shower head is not restrictive, if the plating liquid can be supplied in a scattered manner to the surface to be plated. For example, there may be provided a nozzle which supplies the plating liquid while performing a swinging motion or a translational motion.

In the above embodiment, cleaning was performed in the cleaning step after plating by supplying the cleaning liquid while the holding means 311 is kept to be separated from the dam member 331. However, the cleaning may be performed by supplying the cleaning liquid while the holding means 311 is not separated from the dam member 331, and by causing the cleaning liquid to overflow from the upper edge of the dam member 331. When the plating liquid remaining inside is diluted by supplying the cleaning liquid, the liquid temperature is simultaneously lowered, whereupon the electroless plating reaction comes to an end. Incidentally, the holding means 311 and the dam member 331 may be separated by raising the dam member 331, instead of lowering the holding means 311.

During heating of the semiconductor substrate W by the backside heater 315 (especially during the period from start of heating to contact of the plating liquid with the surface), it is desirable to blow an inert gas such as an argon (Ar) gas onto the surface, to be plated, of the semiconductor substrate W in order to prevent oxidation. If a seed layer formed by sputtering or the like is exposed at the surface of the semiconductor substrate W, heating of the seed layer may result in the oxidation of the surface of the seed layer. Thus, the use of such a gas is particularly effective when it is attempted to prevent the oxidation and form a plated layer of more uniform film thickness on the seed layer.

In the above embodiment, the backside heater 315 or the lamp heater 317 was used as the heating means for the semiconductor substrate W, but a heater may be further provided at other position close to the substrate. Moreover, instead of using the heater, or in addition to the use of the heater, the temperature of surroundings for performing electroless plating may be made substantially equal to the electroless plating treatment temperature (the temperature preferred for plating of the surface, to be plated which is the reaction surface), whereby heat dissipation can be prevented to keep the treatment temperature constant. In this case, a heated gas may be supplied in the surroundings of the substrate, for example.

In the above embodiment, the step of instantaneously rotating the substrate was used as the step of bringing the electroless plating treatment liquid supplied onto the surface, to be plated, of the substrate in contact with the surface to be plated. Other steps may be used as the step of spreading the electroless plating treatment liquid all over the surface to be plated, by moving the substrate, or moving the supplied electroless plating treatment liquid. That is, the step of moving the substrate is, for example, to vibrate or swing (shakingly move) the substrate to which the electroless plating treatment liquid is supplied. The step of moving the supplied electroless plating treatment liquid is, for example, to rake the supplied electroless plating treatment liquid by using a raking member, or to blow air onto the liquid surface.

As described in detail above, the second aspect of the present invention offers the following excellent effects:

(1) The electroless plating treatment liquid is stored and held on the surface to be plated for a predetermined time to treat the surface to be plated. Thus, treatment of the surface can be performed using a small amount of the electroless plating treatment liquid, so that a cost reduction can be achieved. Further, a pump of a small size can be used as a pump for supplying the electroless plating treatment liquid, the electroless plating apparatus can be made compact, and the cost for a clean room housing the apparatus can be reduced. Since a small amount of the electroless plating treatment liquid is used, heating and warmth retention of the electroless plating treatment liquid can be easily and promptly performed. Furthermore, there is no need to constantly heat a large amount of the electroless plating treatment liquid, and hence deterioration of the electroless plating treatment liquid is not promoted.

(2) Since the amount of the electroless plating treatment liquid used may be small, discarding this liquid as it is does not lead to a cost increase. A fresh electroless plating treatment liquid can be always used, and the composition of the treatment liquid can be made constant. By-products generated when the liquid is used in a circulated manner are not deposited in the system, and stable treatment such as plating can be carried out easily. A liquid analyzer or a liquid adjustor for the plating liquid becomes unnecessary, and a decrease in the equipment cost and a decrease in the clean room cost can be achieved. Since a large amount of the electroless plating treatment liquid is not used in a circulated manner, particles are difficult to be generated from the constituent members of the apparatus, thus obviating the need for a filter.

(3) Because treatment is performed in such a state that the electroless plating treatment liquid is held on the surface to be plated, the treatment conditions for the respective parts of the surface to be plated can be equalized, in comparison with a case in which treatment is performed in such a state that the electroless plating treatment liquid is dripped onto the surface to be plated. Consequently, the inplane uniformity of the thickness of the resulting plated film can be achieved. Particularly, when treatment is performed in such a state that the substrate is in a stationary state, heat dissipation due to the peripheral speed of the substrate does not take place, the reaction temperature can be uniformized without a fall in the temperature, and a stable process can be obtained, in comparison with a case in which the treatment is performed in such a state that the substrate is rotated.

(4) The electroless plating treatment liquid is brought into contact with the surface, to be plated, of the substrate in such a state that the substrate is heated to a temperature higher than the temperature of the electroless plating treatment liquid. Thus, the temperature of the plating liquid requiring a great electric power consumption for heating need not be raised so much, and the electric power consumption can be decreased, and change of the composition of the plating liquid can be prevented.

(5) In the case where electroless plating treatment liquid supply means is provided above the surface to be plated, and adapted to supply the electroless plating treatment liquid in a scattered state, the electroless plating treatment liquid can be simultaneously supplied to the entire surface, to be plated, of the substrate substantially uniformly, and temperature control of the electroless plating treatment liquid can be performed stably.

(6) The electroless plating apparatus comprises holding means for holding a substrate; a plating liquid holding mechanism for sealing the periphery of the surface to be plated; and electroless plating treatment liquid supply means for supplying an electroless plating treatment liquid to, and storing the electroless plating treatment liquid on, the surface, to be plated, of the substrate sealed with the plating liquid holding mechanism. Thus, apretreatment liquid, a catalytic treatment liquid, an electroless plating liquid or the like can be used as the electroless plating treatment liquid while switching any of these liquids, and hence a series of electroless plating steps can be carried out in a single cell, and the apparatus can be made compact.

Next, a third aspect of the present invention will be described with reference to FIGS. 47 through 56. The third aspect of the present invention relates to various substrate processing apparatuses such as a substrate plating apparatus and a substrate polishing apparatus, and more particularly to a substrate processing apparatus preferred for detecting a substrate surface state of a substrate to be treated, such as film thickness. The present invention is applicable to all substrate processing apparatuses that perform transportation and treatment of the substrate. Here, an explanation will be made, particularly, for cases in which the substrate processing apparatus is applied for measurement of film thickness in a copper plating apparatus and a CMP apparatus for use in the formation of interconnection of a semiconductor substrate.

Figure 47:
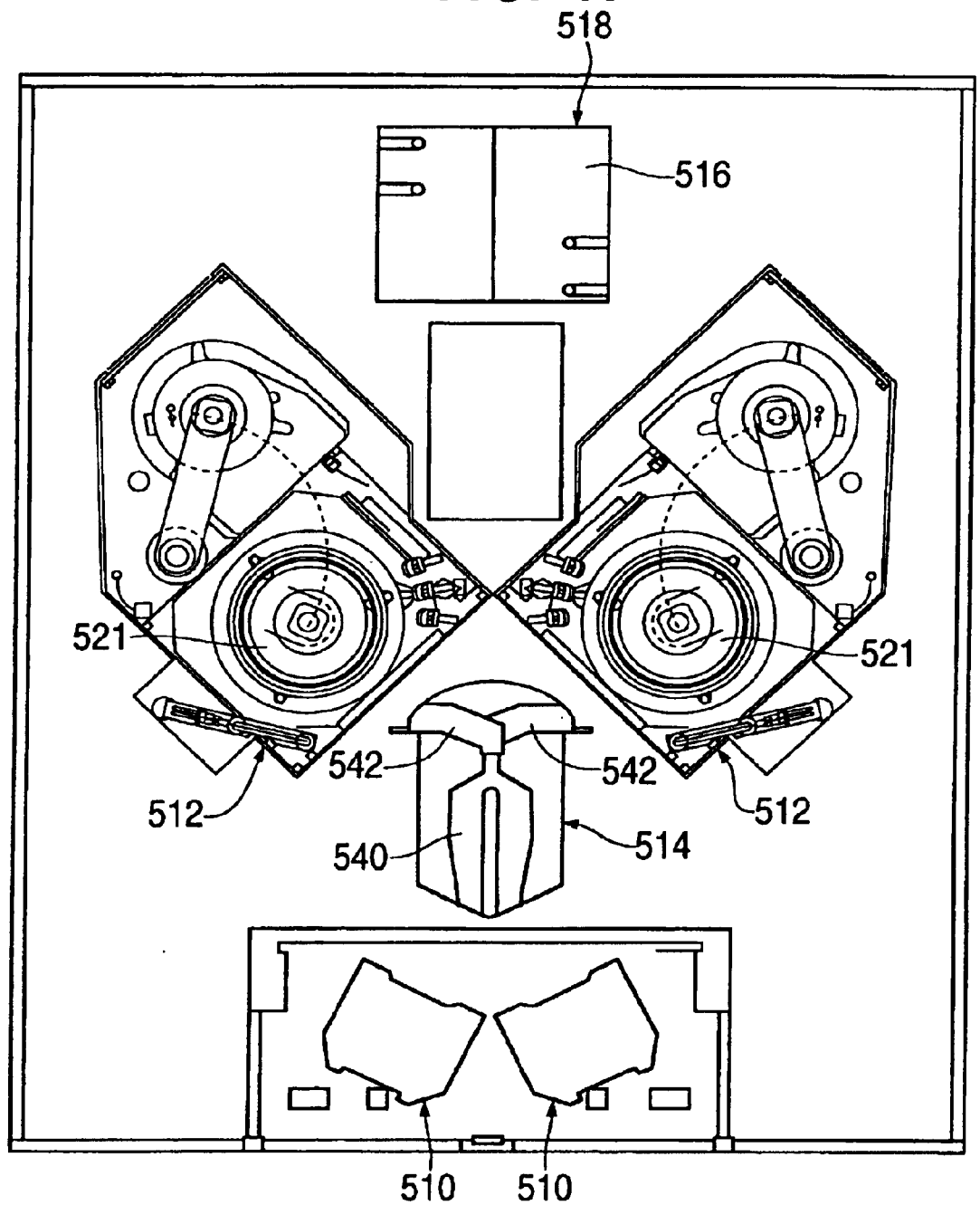
FIG. 47 is a plan view showing an example of a plating apparatus to which the present invention is applied.

FIG. 47 is a plan view showing an example of a plating apparatus to which the present invention is applied. This plating apparatus comprises two wafer cassettes 510, 510 for accommodating a plurality of substrates therein, a transfer robot 514 for withdrawing the substrate from the wafer cassettes 510, 510 and transporting the substrate, and two plating modules (substrate processing modules) 512, 512, each of which performs a series of plating treatment steps consisting of plating, cleaning and drying of the substrate by one module. The reference numeral 518 denotes liquid supply equipment with a plating liquid tank 516.

The constitution of the plating module 512 is the same as the constitution shown in FIG. 14, and hence the module 512 will be described with reference to FIG. 14. This plating module 512 can perform a series of treatments consisting of plating, cleaning and drying. That is, a substrate W is held with a surface thereof to be treated facing upward at three positions A, B and C by a substrate holding portion 2-9. After the substrate W is carried in and placed at the position A, a plating liquid is supplied at the position B onto the surface to be treated in such a state that a cathode electrode 2-17 is connected to an area close to the outer periphery of the substrate W. An anode electrode (not shown) is brought into contact with the plating liquid from above, and a voltage is applied to perform electroplating. After completion of plating, the plating liquid on the substrate W is sucked in by a nozzle (not shown). Instead, cleaning water is supplied at the position C, and the substrate holding portion 2-9 is rotated to spread cleaning water on the entire surface of the substrate W, thereby performing cleaning. After cleaning, supply of the cleaning water is stopped, and the rotational speed of the substrate W is increased to remove the cleaning water and perform spin-drying. If necessary, a precoating treatment for applying, for example, a surface active agent may be performed before plating, or cleaning in multiple stages may be performed using different kinds of cleaning liquids. The present invention is not limited to the plating module 512 of the above structure. That is, the plating tank may be of other type such as a cup type or a closed type. In this case, a cleaning tank and a dryer may be provided separately.

On the other hand, as shown in FIG. 47, the transfer robot 514 has arms 542 having forward ends on which respective robot hands 540 are provided.

Next, the operation of the whole of this plating apparatus will be described. First, the robot hand 540 withdraws the substrate W before treatment from one of the wafer cassettes 510, and places it on a substrate holding portion 521 of one of the plating modules 512. Then, the plating module 512 performs a series of plating treatments as described above, and dries the substrate W. The dried substrate W is returned again to one of the wafer cassettes 510 by the robot hand 540.

The substrate W before treatment and the substrate W after treatment pass through around the transfer robot 514. In order to measure the film thicknesses of both substrates W, in the following embodiments, film thickness sensors S are provided at the transfer robot 514 itself or in its surroundings, or at a position, such as the interior of the plating module 512, where the substrate W before treatment and the substrate W after treatment will pass through. Examples of the location and state of installation of the film thickness sensor S will be explained later in summary, and detailed explanations are omitted here.

That is, if the film thickness sensor S is provided at these positions, the film thicknesses of the substrate W (the film thicknesses of all multi-layer metal films formed on the substrate W) before treatment and after treatment can be measured, without wasteful operations during a series of treatment actions. Specifically, when the substrate W passes through the film thickness sensor S for the first time, for example, the film thickness of the substrate W with the seed layer on its surface before plating is measured. When the substrate W passes through the film thickness sensor S for the second time, the film thickness of the substrate W with a metal film plated on the seed layer is measured. If a difference between the two film thicknesses is found, the plated metal film thickness can be measured. Generally, the film thickness of the seed layer is in the range of about several tens of nanometers to 100 and tens of nanometers, while the thickness of the plated metal film is about several micrometers.

Signals from the film thickness sensor S are sent to an arithmetic unit where an arithmetic operation, such as calculation of a difference or calculation of a moving average, is performed for thereby measuring the film thickness. The arithmetic unit and the arithmetic method may be arbitrarily selected ones which are preferred for the location of the film thickness sensor S, its detection method, and the like.

Figure 48:
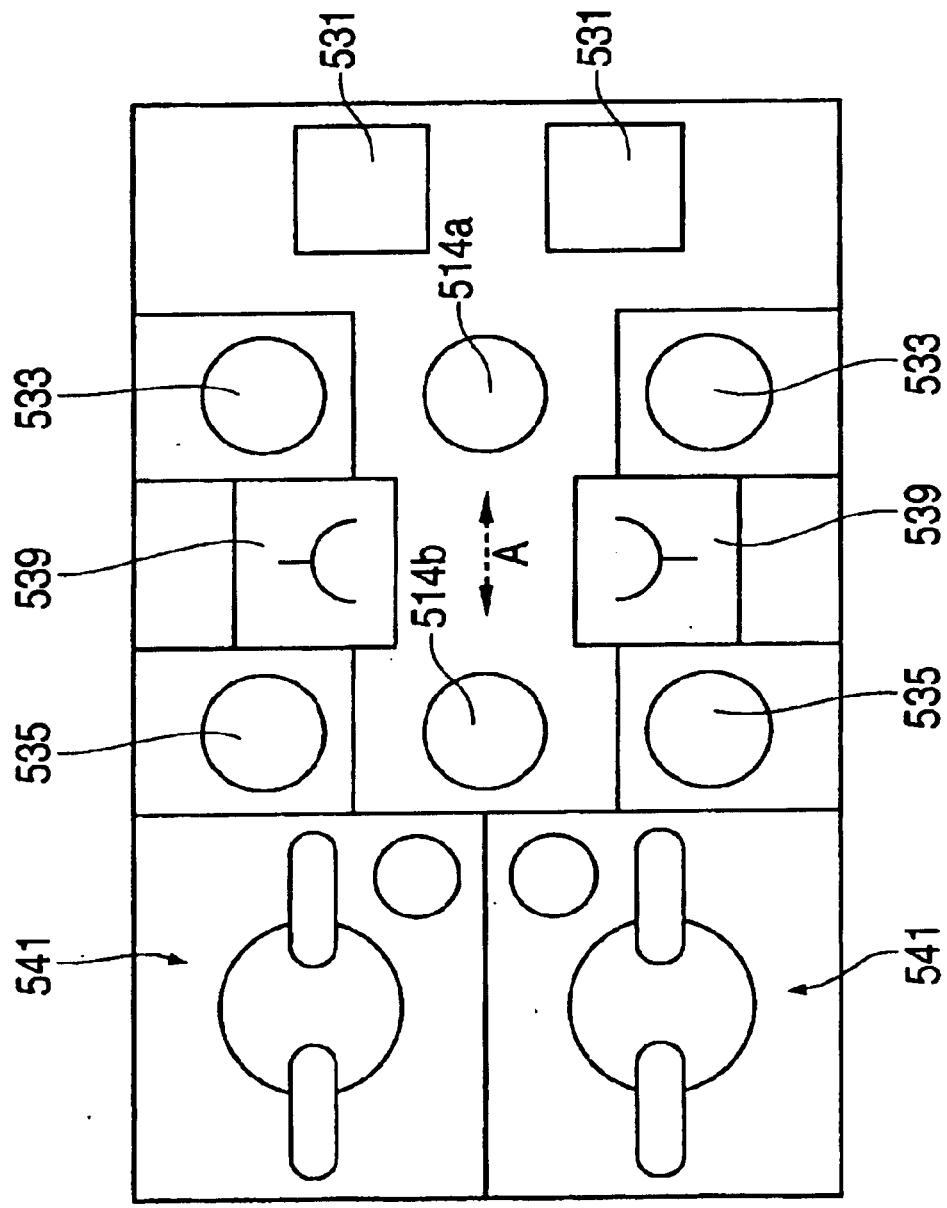
FIG. 48 is a plan view showing an example of a CMP apparatus to which the present invention is applied.

FIG. 48 is a plan view showing an example of a CMP apparatus to which the present invention is applied. This CMP apparatus comprises wafer cassettes 531, 531 for loading and unloading, cleaning machines 533, 533, 535, and 535 for cleaning substrates, two transfer robots 514a, 514b, reversing machines 539, 539, and polishing units (substrate processing modules) 541, 541.

There are various flows of substrates W, and an example is as follows: First, the transfer robot 514a withdraws the substrate W before treatment from one of the wafer cassettes 531 for loading, and transfers it to one of the reversing machines 539. The transfer robot 514a only rotates without moving from the illustrated position, and is disposed at a position where it can transport the substrate W from the wafer cassette 531 to the reversing machine 539. The substrate W has its surface, to be treated, changed by the reversing machine 539 from an upwardly facing state to a downwardly facing state, and is then transferred to another transfer robot 514b. The transfer robot 514b transfers the substrate W to one of the polishing units 541 where a predetermined polishing is performed. The substrate W after polishing is transported by the transfer robot 514b to one of the cleaning machines 535 where primary cleaning is conducted. The substrate W after primary cleaning is transported by the transfer robot 514b to one of the reversing machines 539 where its treated surface is turned over to face upward. Then, the substrate W is transported by the transfer robot 514a to one of the secondary cleaning machines 533. After secondary cleaning is finished, the substrate W is accommodated again by the transfer robot 514a in the wafer cassette 531 for unloading.

Therefore, in case of this CMP apparatus, the substrate W before treatment and the substrate W after treatment pass through near the transfer robots 514a, 514b and the reversing machines 539, 539. In order to measure the film thicknesses of both substrates W, in the following embodiments, the film thickness sensor S is disposed at a position where the substrate W before treatment and the substrate W after treatment will pass, such as at the transfer robots 514a, 514b per se or the surroundings thereof.

That is, if the film thickness sensors S are installed at these positions, the film thicknesses of the substrate W before treatment and after treatment can be measured, without wasteful operations during a series of treatment operations. Specifically, for example, the film thickness of the substrate W before polishing is measured for the first time, and the film thickness of the substrate W after polishing is measured for the second time. If a difference between the two film thicknesses is found, the amount of polishing can be measured. Further, if an optical sensor is used, the film thickness of a metal film or an insulating film can be directly measured, without calculating the difference.

In some CMP apparatuses, the transfer robots 514a, 514b are movable in a direction of an arrow A shown in FIG. 48. The present invention is applicable to the CMP apparatus having the transfer robots unmovable or movable.

Figure 49:
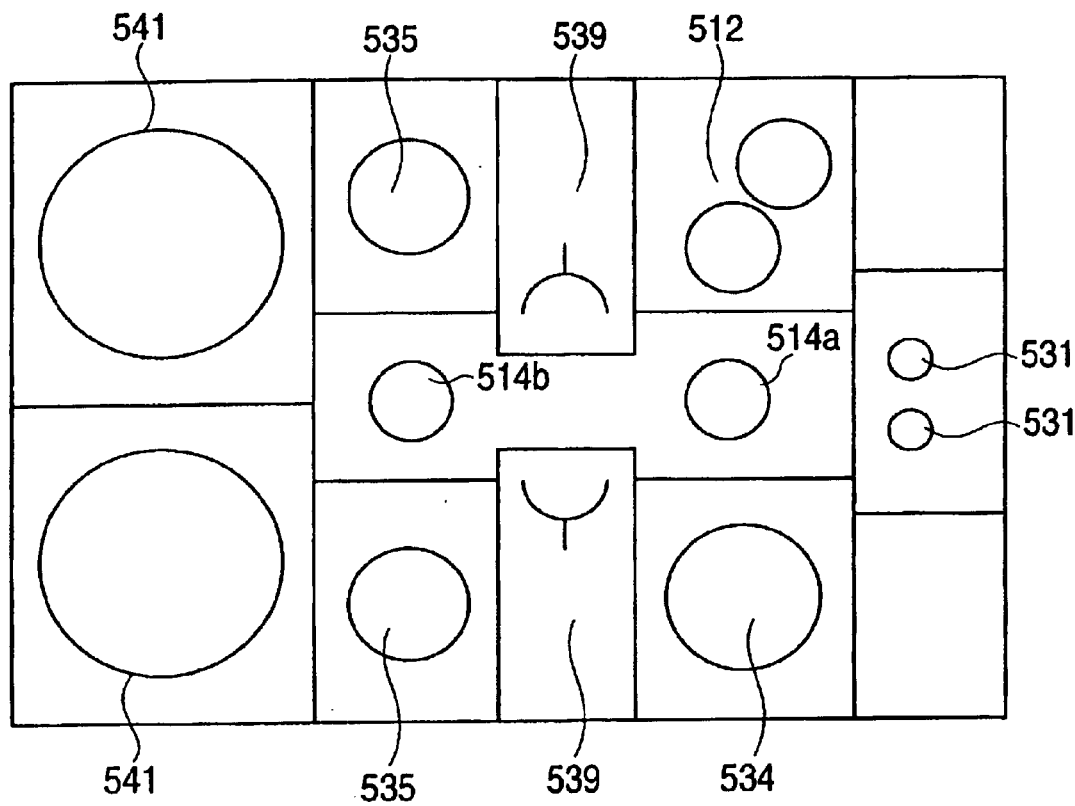
FIG. 49 is a view showing an example of a plating and CMP apparatus to which the present invention is applied.

FIG. 49 is a view showing a plating and CMP apparatus to which the present invention is applied. This plating and CMP apparatus is different from the CMP apparatus shown in FIG. 48 in that the plating module 512 shown in FIG. 14 is provided in place of one of the cleaning machines 533, and a spin dryer 534 is provided in place of another cleaning machine 533.

The flow of a substrate W is, for example, as follows: First, the transfer robot 514a withdraws the substrate W before treatment from one of the wafer cassettes 531 for loading. After plating treatment is performed by the plating module 512, the transfer robot 514a transfers the substrate W to one of the reversing machines 539, which directs its treated surface downward. Then, the substrate W is transferred to the other transfer robot 514b. The transfer robot 514b transfers the substrate W to one of the polishing units 541 in which predetermined polishing is performed. The substrate W after polishing is withdrawn by the transfer robot 514b, and cleaned by one of the cleaning machines 535. Then, the substrate W is transferred to the other polishing unit 541 where it is polished again, and the substrate W is transported by the transfer robot 514b to the other cleaning machine 535 where it is cleaned. The substrate W after cleaning is transported by the transfer robot 514b to the other reversing machine 539 where its treated surface is turned over to face upward. Then, the substrate W is transported by the transfer robot 514a to the spin dryer 534 in which spin-drying is carried out, and the substrate W is accommodated again by the transfer robot 514a in the wafer cassette 531 for unloading.

With this plating and CMP apparatus, therefore, a film thickness sensor S is installed at a position where the substrate W before treatment and the substrate W after treatment will pass, such as at the transfer robots 514a, 514b per se or the surroundings thereof, or the interior of the module 512.

Next, a concrete example of the sensor S for film thickness measurement to be installed in the above-mentioned plating apparatus or the CMP apparatus will be described.

Figure 50:
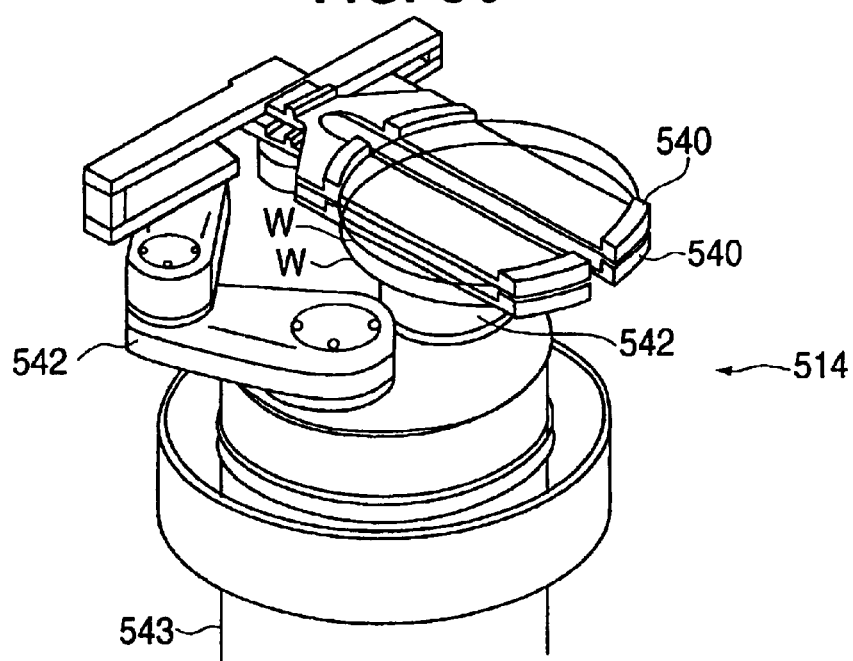
FIG. 50 is a perspective view showing a transfer robot.
Figure 51A:
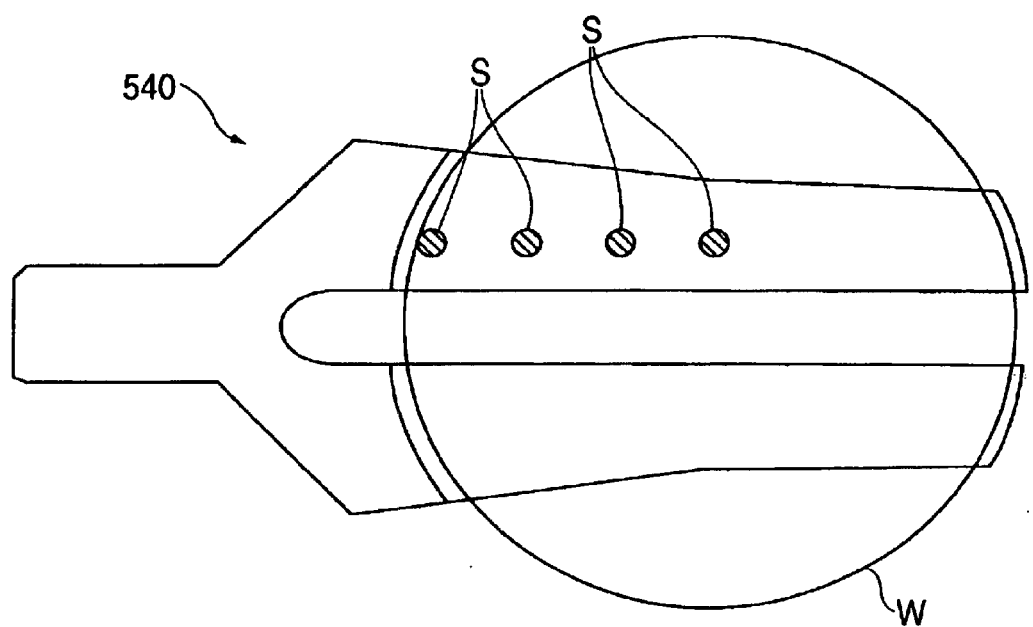
FIGS. 51A and 51B are views showing a robot hand attached to the transfer robot.
Figure 51B:
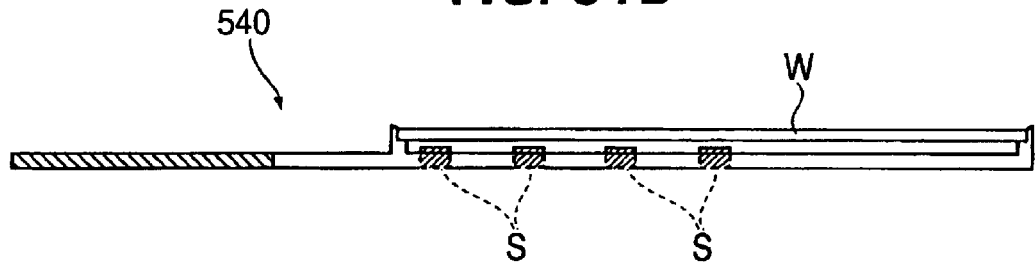

FIG. 50 is a perspective view showing the transfer robot 514 illustrated in FIG. 47, and the transfer robots 514a, 514b illustrated in FIGS. 48 and 49. FIGS. 51A and 51B are views showing a robot hand 540 attached to the transfer robot 514 (514a, 514b), and FIG. 51A is a plan view and FIG. 51B is a side sectional view.

The transfer robot 514 (514a, 514b) is constituted by attaching the robot hands 540, 540 to the respective front ends of two arms 542, 542 attached to an upper portion of a robot body 543. The two robot hands 540, 540 are arranged so as to be placed vertically one above the other via a predetermined gap. The arms 542 extend and contract to enable a substrate W placed on the robot hand 540 to be transported in a fore-and-aft direction. Also, the robot body 543 rotates and/or moves to permit transportation of the substrate W in an arbitrary direction.

As shown in FIGS. 51A and 51B, four film thickness sensors S are directly attached, in a buried state, to the robot hand 540. Any film thickness sensor S may be used, if it can measure the film thickness. Preferably, an eddy current sensor is used. The eddy current sensor generates eddy currents, and detects the frequencies and losses of electric currents which have passed through the substrate W and returned, thereby measuring the film thickness. The eddy current sensor is used in a non-contact manner. An optical sensor is also preferred as the film thickness sensor S. The optical sensor irradiates a sample with light, and can directly measure film thickness based on information on reflected light. The optical sensor is capable of measuring film thickness of not only a metal film, but also an insulating film such as an oxide film. The positions of installation of the film thickness sensors S are not limited to the illustrated positions, and the film thickness sensor S is attached in an arbitrary number at a location where measurement is to be made. The robot hand 540 is available as a dry hand handling a dry substrate W, or as a wet hand handling a wet substrate W. The film thickness sensor S can be attached to either hand. When the transfer robot 514 is used in a plating apparatus as shown in FIG. 47, however, there is need to measure the film thickness of the substrate W in such a state that only the seed layer is initially formed. Thus, it is necessary to measure the film thickness of the substrate W, initially in a dry state, which is placed in the wafer cassettes 510, 510. Hence, it is desirable to attach the film thickness sensor S to the dry hand.

Signals detected by the film thickness sensors S are sent to an arithmetic unit where an arithmetic operation, such as calculation of a difference between the film thickness of the substrate W before treatment and the film thickness of the substrate W after treatment, is performed and the film thickness is outputted onto a predetermined display or the like. Any arithmetic method may be used, if it can measure the film thickness appropriately.

According to the present embodiment, since the film thickness can be measured while the robot hand 540 is transporting the substrate W, there is no need to provide a film thickness measuring step separately during the substrate treatment process, and the throughput is not decreased. Since the film thickness sensors S are attached to the robot hand 540, a space saving can be actualized.

Figure 52A:
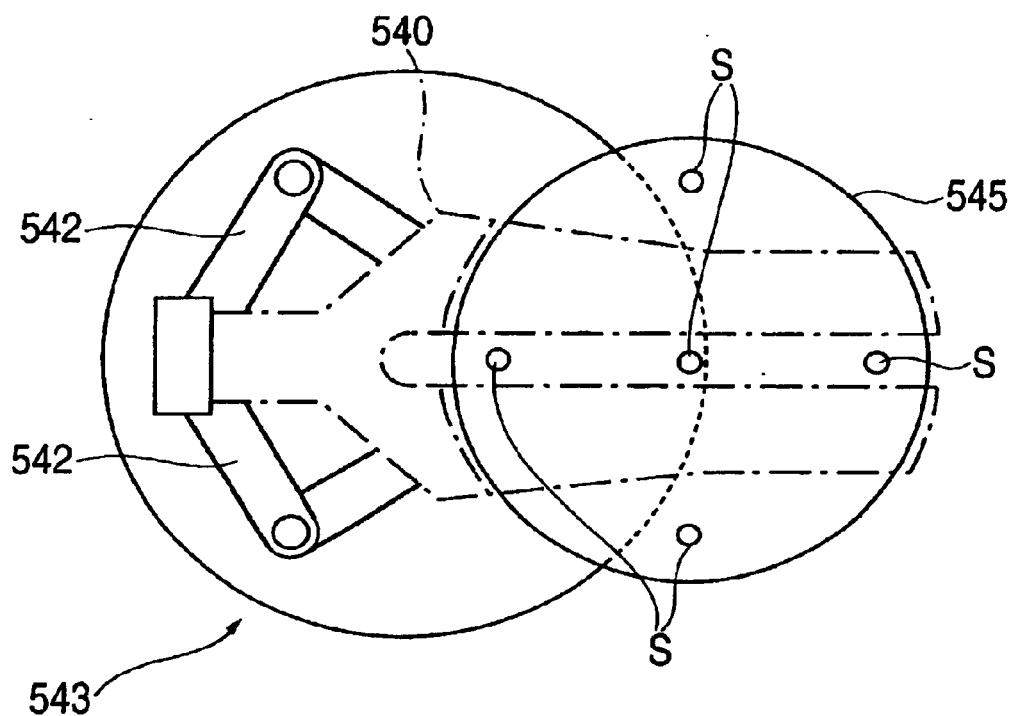
FIGS. 52A and 52B are views showing a transfer robot to which the present invention is applied.
Figure 52B:
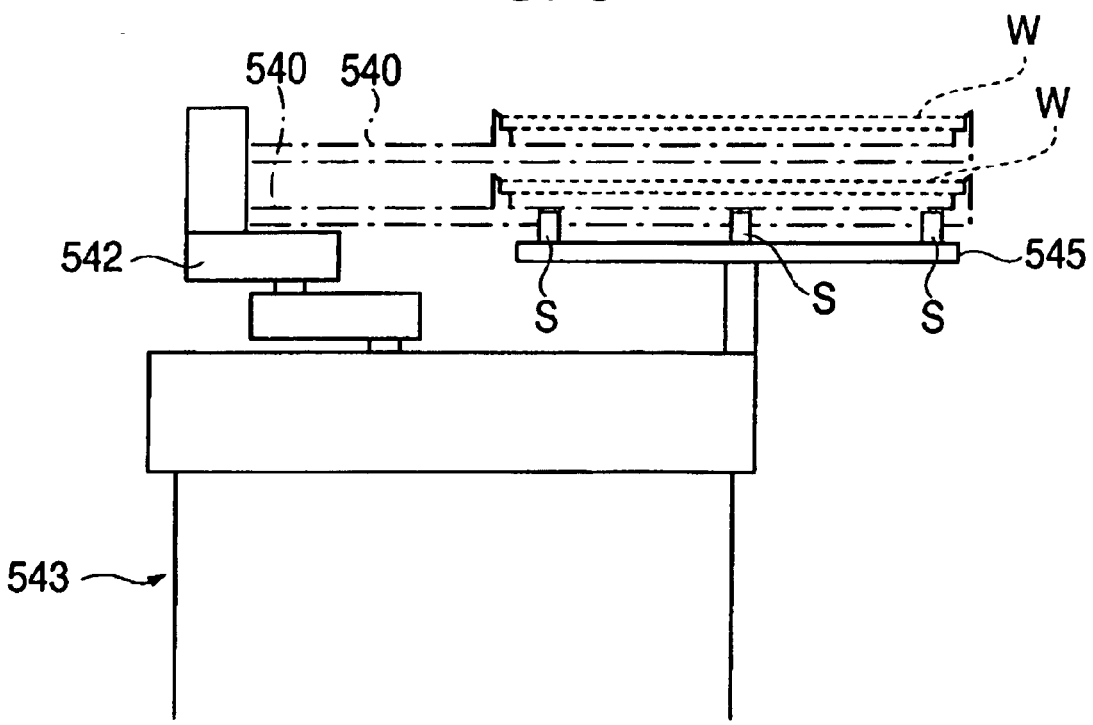

FIGS. 52A and 52B are views showing the transfer robots 514, 514a and 514b illustrated in FIGS. 47 and 48 to which the second example of the present invention has been applied. FIG. 52A is a schematic plan view, while FIG. 52B is a schematic side view. As shown in FIGS. 52A and 52B, according to this embodiment, five film thickness sensors S are disposed at a lower portion of the robot hand 540 of the robot body 543. That is, a disk-shaped mounting plate 545 of substantially the same size as the substrate W is disposed at the lower portion of the robot hand 540, and the five film thickness sensors S are attached onto the mounting plate 545. The mounting plate 545 is fixed to the robot body 543, but may be fixed to other members.

The film thickness sensors S are attached at positions where the film thickness sensors S do not overlap with the robot hand 540 as illustrated, whereby the film thickness can be measured in a wide area of the entire substrate W. The present embodiment can also achieve a space saving, and can perform measurement in a very short time. By stopping the substrate W above the mounting plate 545, measurement of the film thickness at fixed points of the substrate W can be made. If the substrate W on the robot hand 540 is caused to pass over the mounting plate 545 without stopping, measurement during scanning becomes possible. Since the film thickness sensors S are integral with the robot body 543, stable detection can be performed. If the mounting plate 545 is fixed to other members, in place of the robot body 543, it becomes possible to adjust the distance between the substrate W and the sensors by arbitrarily varying the height of the robot hand.

The construction in which signals after detection are sent to the arithmetic unit to measure the film thickness is the same as in the embodiment shown in FIGS. 51A and 51B. However, in the case of measurement simultaneous with scanning, the points of measurement change with the passage of time, so that it is preferred to perform computations by the method of moving averages and calculate the film thickness.

Figure 53A:
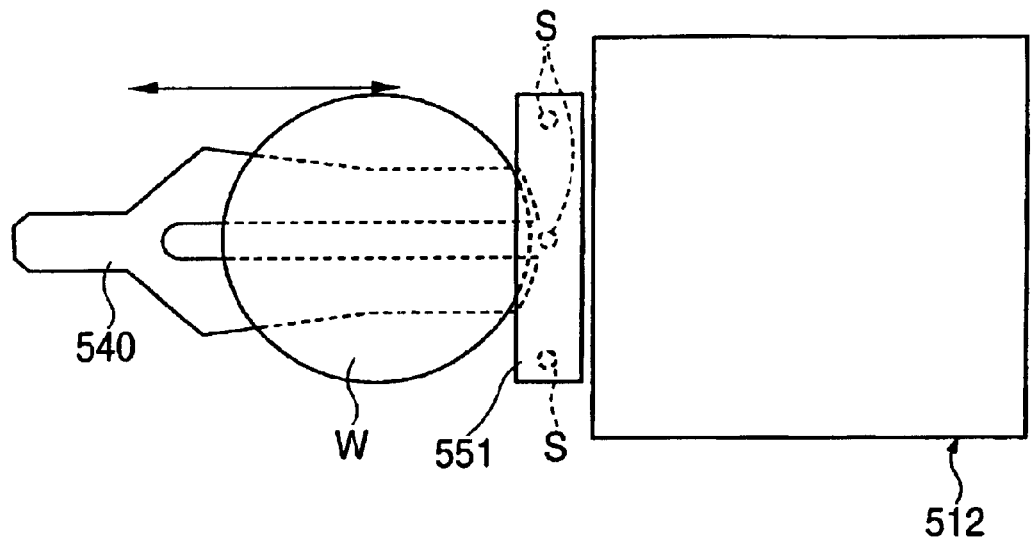
FIGS. 53A and 53B are views showing an example to which the present invention is applied.
Figure 53B:
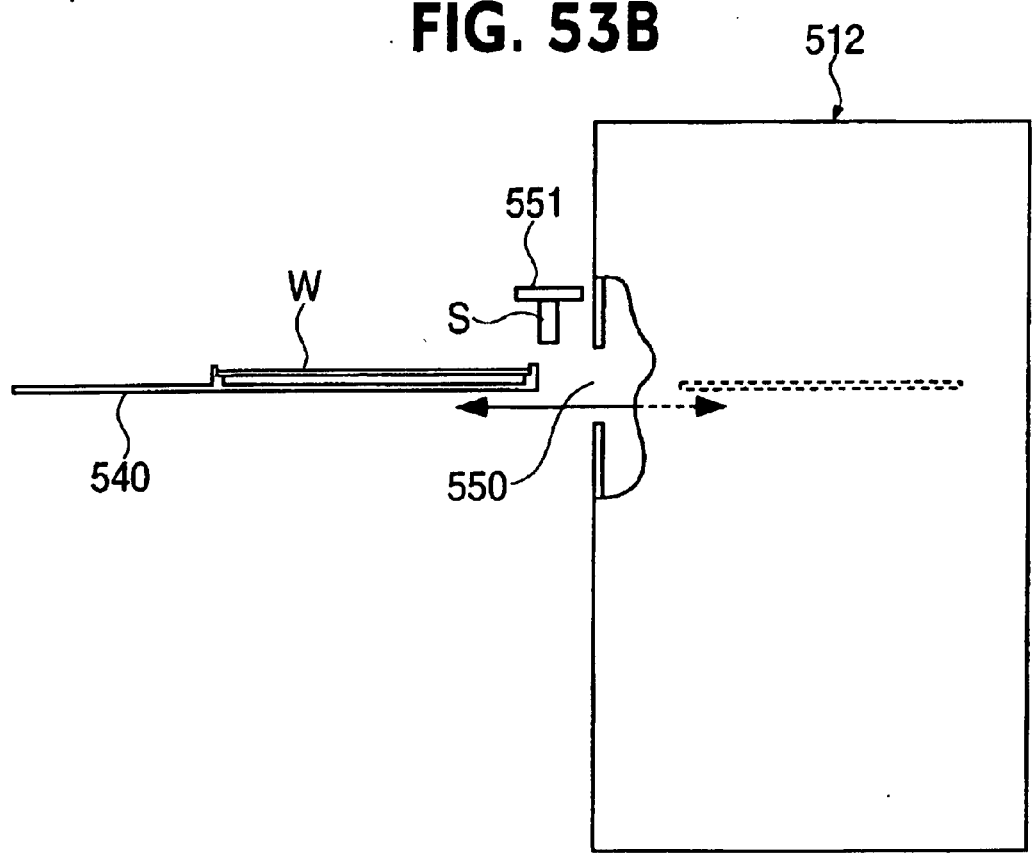

FIGS. 53A and 53B are views showing a third example of the present invention. FIG. 53A is a schematic plan view, and FIG. 53B is a schematic side view. In the embodiment shown in FIGS. 53A and 53B, three film thickness sensors S are provided on an upper portion of an exit and entrance portion 550, for a substrate W, of the plating module 512 shown in FIGS. 14 and 47. That is, a rectangular mounting plate 551 is disposed above the exit and entrance portion 550, and the three film thickness sensors S are attached in series to a lower surface of the mounting plate 551. The mounting plate 551 may be fixed to the plating module 512, or may be fixed to the robot body 543 of the transfer robot 514 (not shown), or may be fixed to other members.

According to such a constitution, the film thickness sensors S scan the substrate W when the substrate W is placed into and withdrawn from the plating module 512. This is suitable for scan measurement. By providing some rows of the film thickness sensors S as in this embodiment, moreover, arbitrary points on the substrate W can be measured by scanning. By arbitrarily varying the height of the robot hand, furthermore, it becomes possible to adjust the distance between the substrate W and the sensors.

Signals detected by the film thickness sensors S are computed by an arithmetic unit. In the case of scan measurement, it is desirable to perform computation by the method of moving averages as in the second example.

When this embodiment is applied to the CMP apparatus, the film thickness sensors S may be disposed near the exit and entrance, where the substrate W is introduced and withdrawn, of the polishing unit (substrate treatment module) 541 shown in FIGS. 48 and 49. When the substrate W is carried into the polishing unit 541, the surface, to be treated, of the substrate W faces downward. Thus, it is preferred to dispose the film thickness sensors S on a lower side of the location of the polishing unit 541 where the substrate W is carried in (of course, even when the film thickness sensors S are installed on the upper side of such location, measurement of the film thickness is possible, but installation on the lower side results in a higher accuracy). After polishing is completed, the treated surface of the substrate W is in a wet state. The use of film thickness sensors capable of measurement even in a wet condition makes it possible to measure the film thickness by the same method as in the plating module 512.

Figure 54:
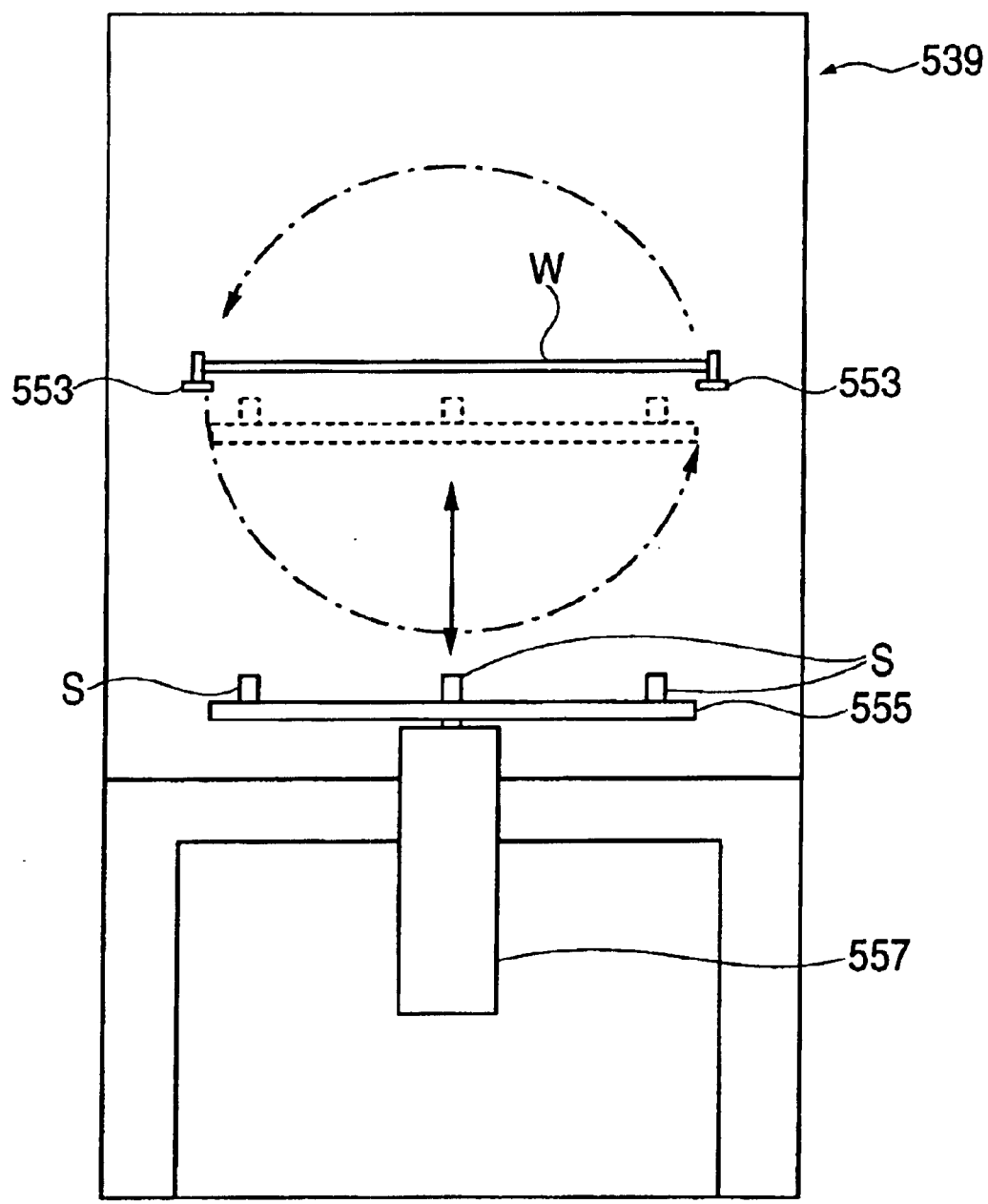
FIG. 54 is a schematic front view of the neighborhood of a reversing machine to which the present invention is applied.
Figure 55:
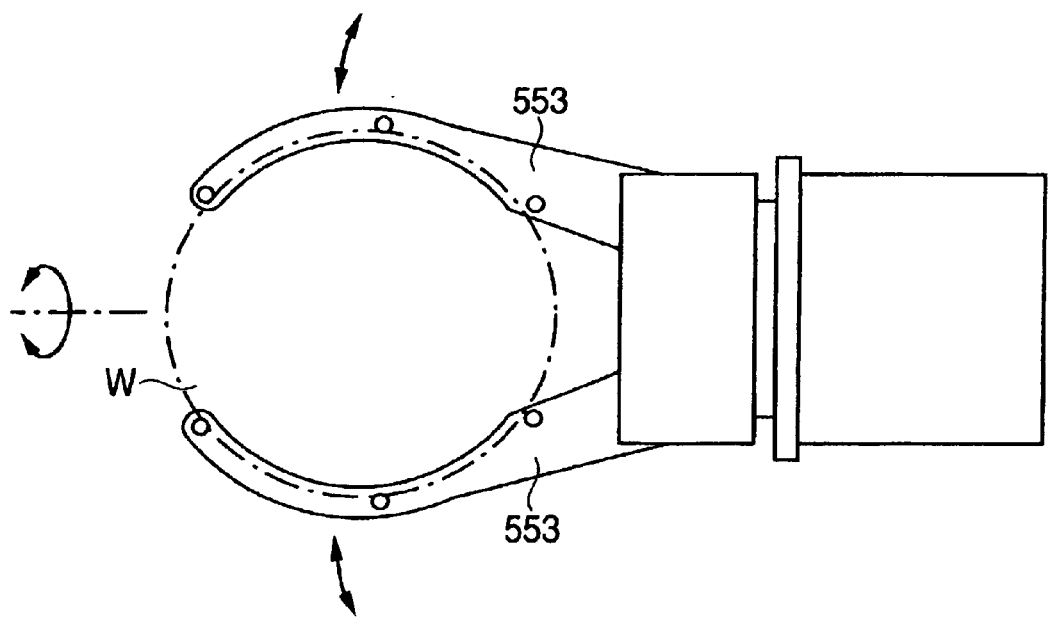
FIG. 55 is a plan view of a reversing arm portion.

FIG. 54 is a schematic front view of a reversing machine 539 and its surroundings to which a fourth example of the present invention has been applied. FIG. 55 is a plan view of reversing arm 553, 553 portions. As shown in FIGS. 54 and 55, the reversing arms 553, 553 put a substrate W therebetween and hold its outer periphery from right and left sides, and rotate the substrate W through 180°, thereby turning the substrate over. A circular mounting base 555 is disposed immediately below the reversing arms 553, 553 (reversing stage), and a plurality of film thickness sensors S are provided on the mounting base 555. The mounting base 555 is adapted to be movable upward and downward by a drive mechanism 557.

During reversing of the substrate W, the mounting base 555 waits at a position, indicated by solid lines, below the substrate W. Before or after reversing, the mounting base 555 is raised to a position indicated by dotted lines to bring the film thickness sensors S close to the substrate W gripped by the reversing arms 553, 553, thereby measuring the film thickness.

According to the present embodiment, since there is no restriction such as the arms 542 of the transfer robot 514, the film thickness sensors S can be installed at arbitrary positions on the mounting base 555. Further, the mounting base 555 is adapted to be movable upward and downward, so that the distance between the substrate W and the sensors can be adjusted at the time of measurement. It is also possible to mount plural types of sensors suitable for the purpose of detection, and change the distance between the substrate W and the sensors each time measurements are made by the respective sensors. However, the mounting base 555 moves upward and downward, thus requiring certain measuring time.

Figure 56:
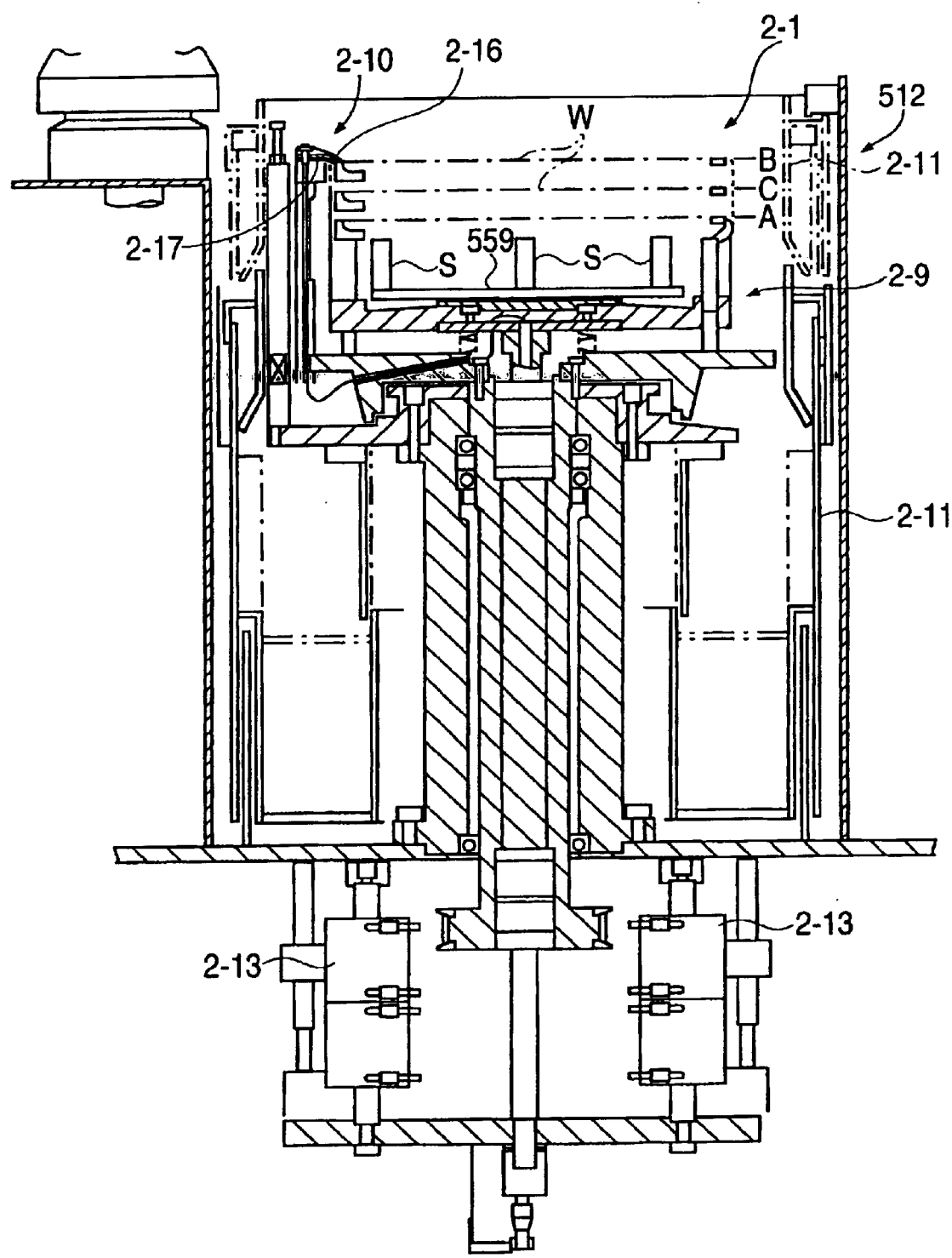
FIG. 56 is a sectional view of an essential part of a plating module to which the present invention is applied.

FIG. 56 is a sectional view of an essential part of a plating module 512 to which a fifth example of the present invention has been applied. This plating module 512 is different from the plating module 512 shown in FIG. 14 in only that a mounting base 559 having film thickness sensors S mounted thereon is disposed immediately below a location of a substrate holding portion 29 where a substrate W is held (i.e. a plating stage). The film thickness sensors S may be installed at arbitrary locations on the mounting base 559.

In the present embodiment, the film thickness sensors S are disposed immediately below the plating stage, so that the film thickness measurement can be made on a real-time basis while plating is being performed. Thus, if the results of the measurement are fed back in real time and reflected in plating, it is possible to perform plating with an extremely high accuracy.

The embodiments of the present invention have been described above, but the present invention is not limited to these embodiments, and various modifications are possible within the scope of the claims and within the scope of the technical ideas described in the specification and drawings. That is, the above embodiments have been shown as embodiments in which sensors for detection of film thickness (film thickness of a metal film or an insulating film) are used as the sensors. However, the present invention is not limited to these sensors. By selecting sensors and computation means according to various purposes, it is permissible to constitute and use other various sensors for substrate surface state detection, such as a sensor for detection of presence or absence of a metallic thin film, a sensor for detection of presence or absence of particles on a substrate, and a sensor for recognition of a pattern formed on a substrate. Furthermore, any shapes or materials, which are not directly described in the specification and drawings, fall within the scope of the technical ideas of the present invention, if they exhibit the operations and effects of the present invention.

As described in detail above, according to the third aspect of the present invention, various substrate surface states such as the metal film thickness of the substrate can be detected without stopping or interrupting the substrate treatment process. Thus, the surface state of the substrate can be detected, with high throughput being actualized, and the reliability and rapidity of substrate treatment such as plating or polishing can be increased.

Further, feedback of the measurement results for adjustment of the substrate treatment conditions can be performed promptly, and hence it becomes possible to perform substrate treatment, such as plating or polishing, rapidly under optimal treatment conditions.

Furthermore, if a lightweight, and small-sized detection sensor is used, such sensor can be easily attached to a robot hand or the like of a plating apparatus, and the above-mentioned effects can be achieved with a space-saving.

The present invention relates to a semiconductor substrate processing apparatus and method for use in applying various treatments to a semiconductor substrate. The present invention can be utilized in a Cu plating step for forming interconnects on a semiconductor substrate, and in the step of polishing a plated Cu film on a semiconductor substrate in the manufacture of semiconductor devices.

Figure 57:
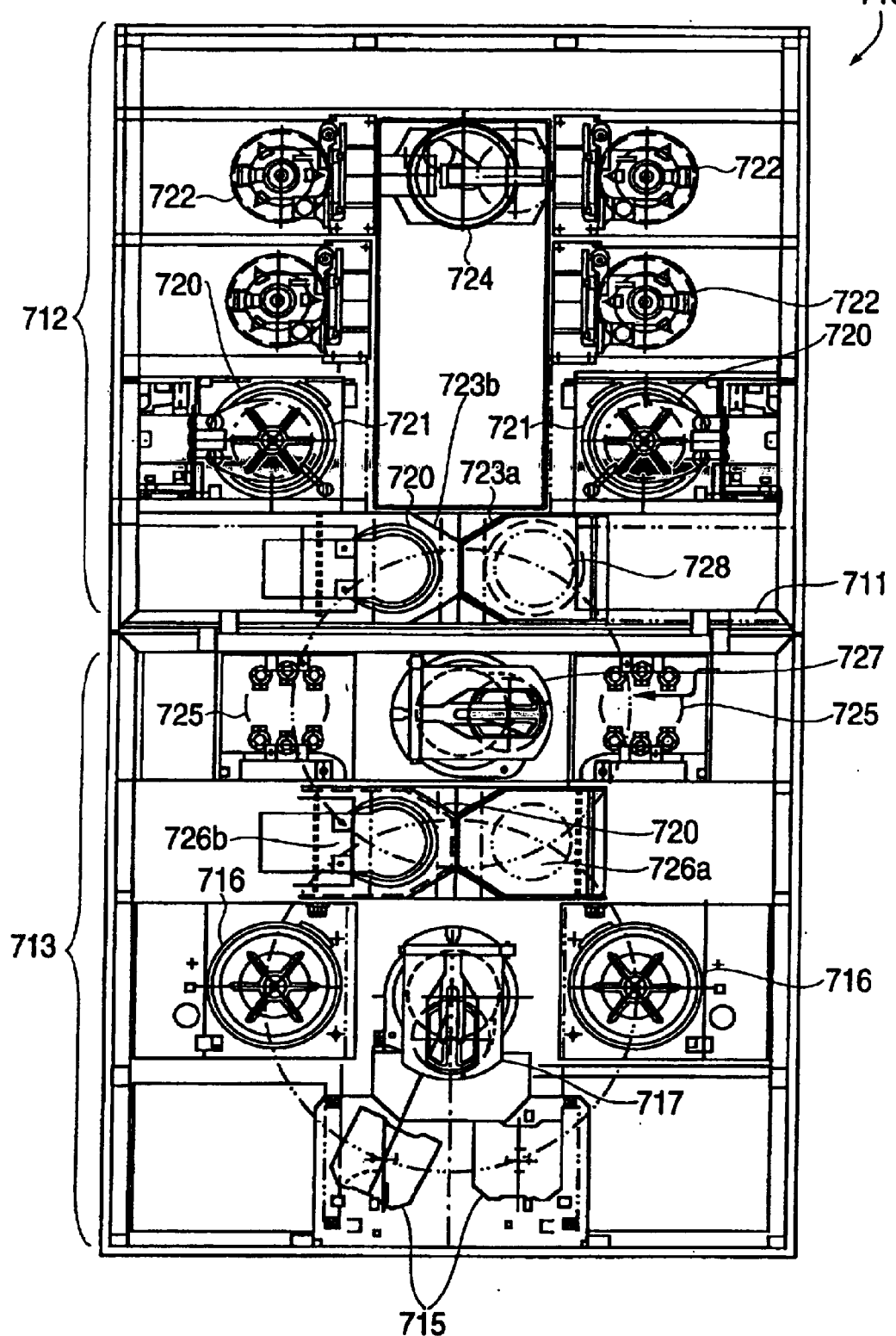
FIG. 57 is a view showing a plan constitution example of the semiconductor substrate processing apparatus according to the present invention.

FIG. 57 is a view showing plan layout constitution of another embodiment of the semiconductor substrate processing apparatus according to the present invention. The plating apparatus is disposed in rectangular facilities 710, and is constituted so as to plate a semiconductor substrate with copper continuously. The facilities 710 have a partition wall 711 for dividing the facilities 710 into a plating section 712 and a clean section 713. Air can individually be supplied into and exhausted from each of the plating section 712 and the clean section 713. The partition wall 711 has a shutter (not shown) capable of opening and closing. The pressure of the clean section 713 is lower than the atmospheric pressure and higher than the pressure of the plating section 712. This can prevent the air in the clean section 713 from flowing out of the facilities 710 and can prevent the air in the plating section 712 from flowing into the clean section 713.

In the clean section 713, there are provided two loading and unloading sections 715 for placing a substrate cassette thereon, and two cleaning units 716 for cleaning (rinsing) a plated substrate with pure water and drying. Further, a rotatable fixed-type first transfer robot 717 for transferring a substrate is provided in the clean section 713. For example, the cleaning unit 716 has cleaning liquid supply nozzles for supplying ultrapure water to both surfaces of a substrate, and spins the substrate at a high speed to dewater and dry the substrate. The cleaning unit 716 is provided with a revolution member supporting apparatus shown in FIG. 3 through 6.

On the other hand, in the plating section 712, there are provided two pretreatment units 721 for pretreating a surface of a substrate for plating, and inverting thepretreated substrate by a inverter 720, four plated film forming units 722 for plating a surface of a substrate with copper in such a state that the front surface of the substrate faces downwardly, and two first substrate stages 723*a*, 723*b* for holding a substrate placed thereon. Further, a rotatable mobile-type second transfer robot 724 for transferring a substrate is provided in the plating section 712.

In the present embodiment, in the clean section 713, there are provided two chemical liquid cleaning units 725 for cleaning a plated substrate with chemical liquid, and second substrate stages 726*a*, 726*b* disposed between the chemical liquid cleaning units 725 and the cleaning units 716. A rotatable fixed-type third transfer robot 727 for transferring a substrate is provided between the two chemical liquid cleaning units 725.

One of the first substrate stages and one of the second substrate stages, i.e., the first substrate stage 723*b* and the second substrate stage 726*b* are constituted so as to clean the substrate with water. Each of the first substrate stage 723*b* and the second substrate stage 726*b* has an inverter 720 for inverting a substrate.

Thus, the first transfer robot 717 transfers a substrate between the substrate cassettes placed on the loading and unloading sections 715, the cleaning units 716, and the second substrate stages 726*a*, 726*b*. The second transfer robot 724 transfers a substrate between the first substrate stages 723*a*, 723*b*, the pretreatment units 721, and the plated film forming units 722. The third transfer robot 727 transfers a substrate between the first substrate stages 723*a*, 723*b*, the chemical liquid cleaning units 725, and the second substrate stages 726*a*, 726*b*.

A container 728 for accommodating substrates for trial operation is disposed in the facilities 710, and located below the first substrate stage 723*a*. The second transfer robot 724 takes out a substrate for trial operation from the container 728, and returns it to the container 728 after trial operation. Thus, the container 728 provided in the facilities 710 for accommodating the substrates for trial operation can eliminate contamination or lowering of the throughput caused by introduction of substrates for trial operation from the outside when trial operation is conducted.

As long as the substrates for trial operation can be taken out from the container 728 and returned to the container 728 by any of the transfer robots, the container 728 may be placed anywhere in the facilities 710. However, when thecontainer 728 is disposed in the vicinity of the first substrate stage 723*a*, the trial operation can be conducted in such a manner that a substrate for trial operation is pretreated, plated, cleaned and dried, and then returned to the container 728.

The transfer robot 717 has two recess-type hands, respectively for supporting a peripheral edge of a substrate by a recess. The upper hand is used for handling a dry substrate and the lower hand is used for handling a wet substrate. Each of the transfer robots 724 and 727 has two recess-type hands, which are used for handling a wet substrate. The hands of the transfer robots are not limited to those types described above.

In the present embodiment, the plating apparatus comprises the chemical liquid cleaning units 725 for cleaning a surface of a substrate with chemical liquid such as dilute hydrofluoric acid or hydrogen peroxide. If it is not necessary to clean a plated substrate with chemical liquid, the chemical liquid cleaning units 725 are not required. In this case, the first transfer robot 717 transfers a substrate between the substrate cassettes placed on the loading and unloading sections 715, the cleaning units 716, and the first substrate stages 723*a*, 723*b* to thus dispense with the third transfer robot 727 and the second substrate stages 726*a*, 726*b*.

Next, the processing flow of the substrate in the plating apparatus according to the present embodiment will be described below. The substrates are accommodated in the cassette in such a state that the front surface of the substrate (surface on which semiconductor devices are formed, i.e., surface to be processed) faces upwardly, and the cassette is placed on the loading and unloading section 715. The first transfer robot 717 takes out a substrate from the cassette, moves to the second substrate stage 726*a*, and places the substrate on the second substrate stage 726*a*. Then, the third transfer robot 727 transfers the substrate from the second substrate stage 726*a* to the first substrate stage 723*a*. Thereafter, the second transfer robot 724 receives the substrate from the first substrate stage 723*a* and transfers the substrate to the pretreatment unit 721. After the pretreatment of the substrate is completed in the pretreatment unit 721, the substrate is inverted by the inverter 720 so that the front surface of the substrate faces downwardly, and then transferred to the second transfer robot 724. The second transfer robot 724 transfers the substrate to a head of the plated film forming unit 22.

After the substrate is plated and liquid on the substrate is removed in the plated film forming unit 722, the substrate is received by the second transfer robot 724, which transfers the substrate to the first substrate stage 723*b*. The substrate is inverted by the inverter 720 provided at the first substrate stage 723*b* so that the front surface faces upwardly, and then transferred to the chemical liquid cleaning unit 725 by the third transfer robot 727. In the chemical liquid cleaning unit 725, the substrate is cleaned with chemical liquid and rinsed with pure water, and then the liquid on the substrate is removed by spinning. Thereafter, the substrate is transferred to the second substrate stage 726*b* by the third transfer robot 727. Next, the first transfer robot 717 receives the substrate from the second substrate stage 726*b*, and transfers the substrate to the cleaning unit 716. In the cleaning unit 716, the substrate is rinsed with pure water (includes deionized water) and then spin-dried. The dried substrate is returned to the substrate cassette placed on the loading and unloading section 715 by the first transfer robot 717.

Figure 58:
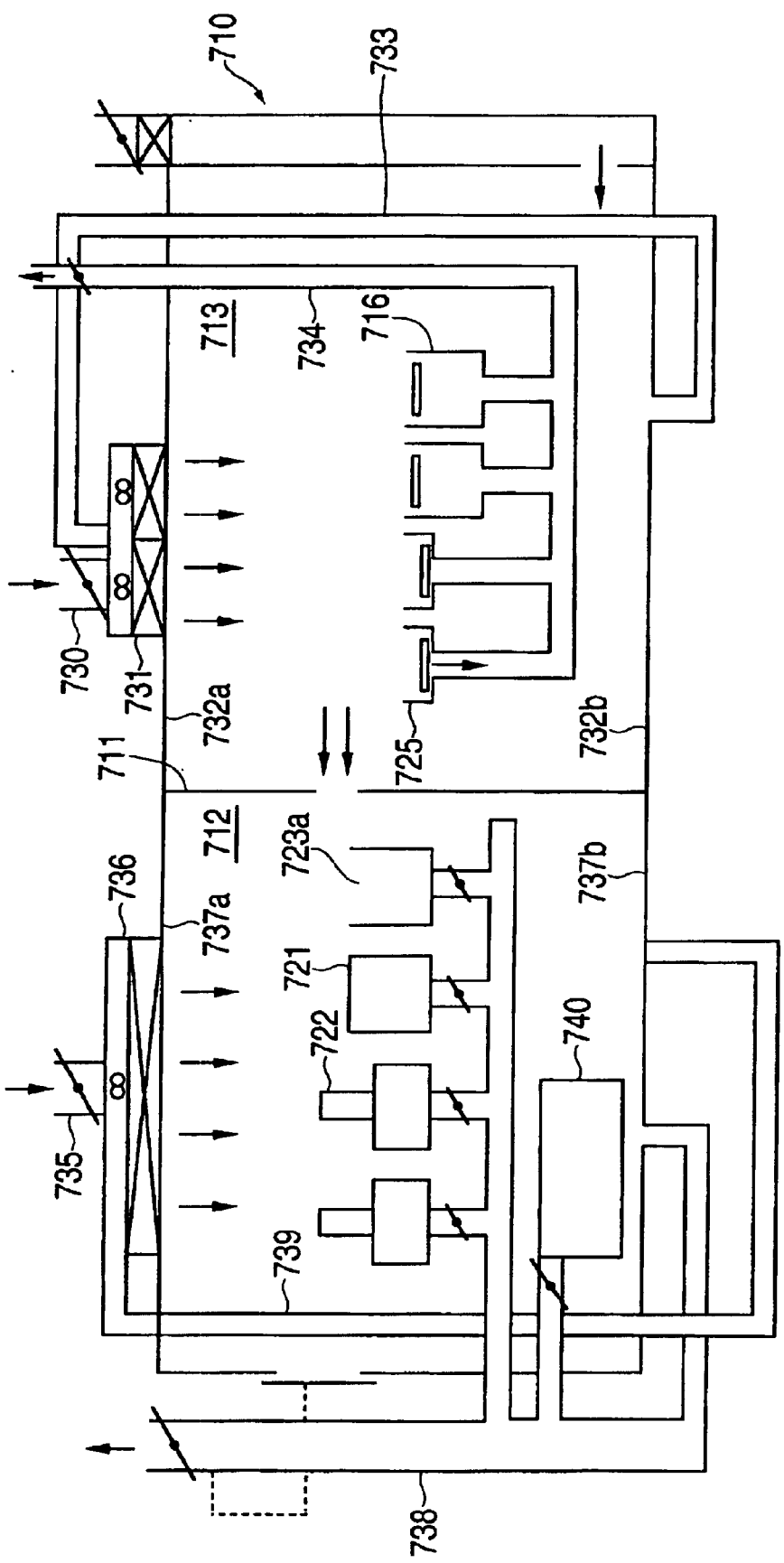
FIG. 58 is an explanatory view showing an air current in the plating apparatus shown in FIG. 57.

FIG. 58 shows an air current in the facilities 710. In the clean section 713, a fresh external air is introduced through a pipe 730 and pushed into the clean section 713 through a high-performance filter 731 by a fan. Hence, a downflow clean air is supplied from a ceiling 732*a* to positions around the cleaning units 716 and the chemical liquid cleaning units 725. A large part of the supplied clean air is returned from a floor 732*b* through a circulation pipe 733 to the ceiling 732*a*, and pushed again into the clean section 713 through the high-performance filter 731 by the fan, to thus circulate in the clean section 713. A part of the air is discharged from the cleaning units 716 and the chemical liquid units 725 through a pipe 734 to the exterior, so that the pressure of the clean section 713 is set to be lower than the atmospheric pressure.

The plating section 712 having the pretreatment units 721 and the plated film forming units 722 therein is not a clean section (but a contamination zone). However, it is not acceptable to attach particles to the surface of the substrate. Therefore, in the plating section 712, a fresh external air is introduced through a pipe 735, and a downflow clean air is pushed into the plating section 712 from a ceiling 737*a* side through a high-performance filter 736 by a fan, for thereby preventing particles from being attached to the surface of the substrate. However, if the whole flow rate of the downflow clean air is supplied by only an external air supply and exhaust, then enormous air supply and exhaust are required. Therefore, the air is discharged through a pipe 738 to the exterior, and a large part of the downflow is supplied by a circulating air through a circulation pipe 739 extended from a floor 737*b*, in such a state that the pressure of the plating section 712 is maintained to be lower than the pressure of the clean section 713.

Thus, the air returned to the ceiling 737*a* through the circulation pipe 739 is pushed again into the plating section 712 through the high-performance filter 736 by the fan. Hence, a clean air is supplied into the plating section 712 to thus circulate in the plating section 712. In this case, air containing chemical mist or gas emitted from the pretreatment units 721, the plated film forming units 722, the second transfer robot 724, and a plating liquid regulating tank 740 is discharged through the pipe 738 to the exterior. Thus, the pressure of the plating section 712 is controlled so as to be lower than the pressure of the clean section 713.

Figure 59:
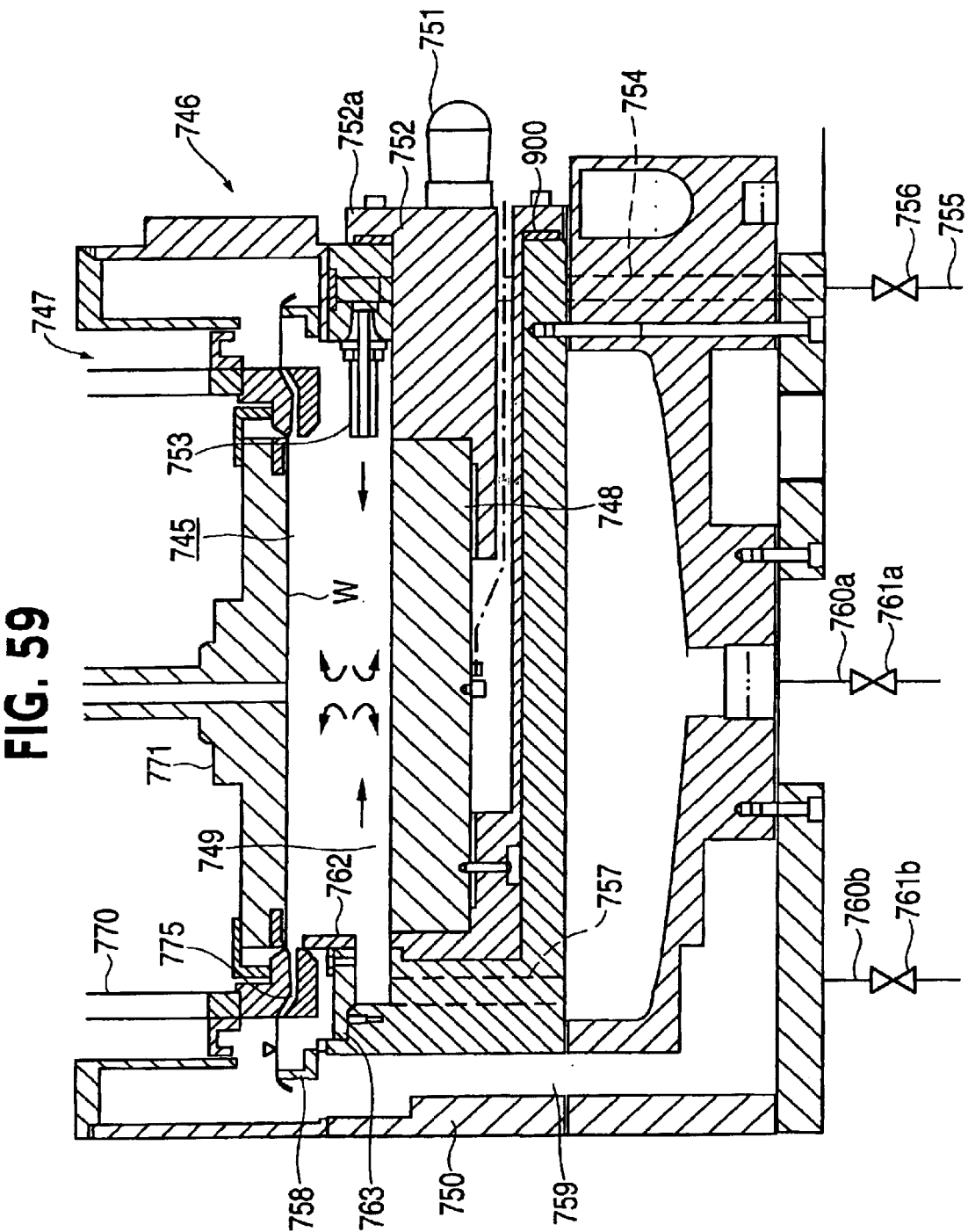
FIG. 59 is an enlarged cross-sectional view showing a main part of a plating unit.

FIG. 59 shows a main part of the plated film forming unit 722. The plated film forming unit 722 mainly comprises a plating process container 746 in the substantially cylindrical form for holding a plating liquid 745 therein, and a head 747 disposed above the plating process container 746 for holding a substrate. In FIG. 59, the head 747 is located in a plating position in which a substrate W held by the head 747 is lowered.

The plating process container 746 is provided with a plating container 50 having a plating chamber 49, which is upwardly opened, for holding a plating liquid therein. An anode 748 made of residual-phosphorus copper, for example, is provided at the bottom of the plating chamber 749. The anode 748 is held by an anode support 752, which is detachably mounted on the plating container 750, i.e., which is drawably mounted via a knob 751 provided on the anode support 752. The anode 748 is connected to an anode of a power supply for plating provided in an external control unit. A sealing member 900 for preventing the plating liquid from being leaked is interposed between the front surface of the plating container 750 and the backside surface of a flange 752*a* of the anode support 752. Thus, the anode 748 is held by the anode support 752 detachably mounted on the plating container 750, causing the anode 748 to be easily attached to and detached from the plating container 750 via the anode support 752. Accordingly, this construction facilitates maintenance and replacement of the anode 748, and the like.

The anode 748 is made of copper containing 0.03% to 0.05% phosphorus (residual-phosphorus copper), and hence a black film is formed on the upper surface of the anode 748 as plating proceeds. Such a black film can reduce generation of anode slime.

Plating liquid supply nozzles 753 horizontally projecting toward the center of the plating chamber 749 are provided on the inner circumferential wall of the plating container 750 at equal intervals along the circumferential direction. Each of the plating liquid supply nozzles 753 is communicated with a plating liquid supply passage 754 extended vertically through the interior of the plating container 750. In the present embodiment, four circumferentially divided plating liquid reservoirs in an arc-shaped form are provided in the inner circumferential wall of the plating container 750. Each of the plating liquid reservoirs is communicated with the plating liquid supply passage 754 located at the central portion along the circumferential direction of the plating liquid reservoir. Each of the plating liquid reservoirs has two plating liquid supply nozzles 753 provided on both ends of the plating liquid reservoir. The plating liquid of the same flow rate is respectively supplied to each of the plating liquid reservoirs via control valves 756 described later. Therefore, the plating liquid is homogeneously ejected from each of the plating liquid supply nozzles 753 into the plating chamber 749.

Each of the plating liquid supply passages 754 is connected to the plating liquid regulating tank 740 (see FIGS. 58 and 67) via a plating liquid supply pipe 755. Control valves 756 for controlling the back pressure so as to be constant are disposed on each of the plating liquid supply pipes 755.

Figure 67:
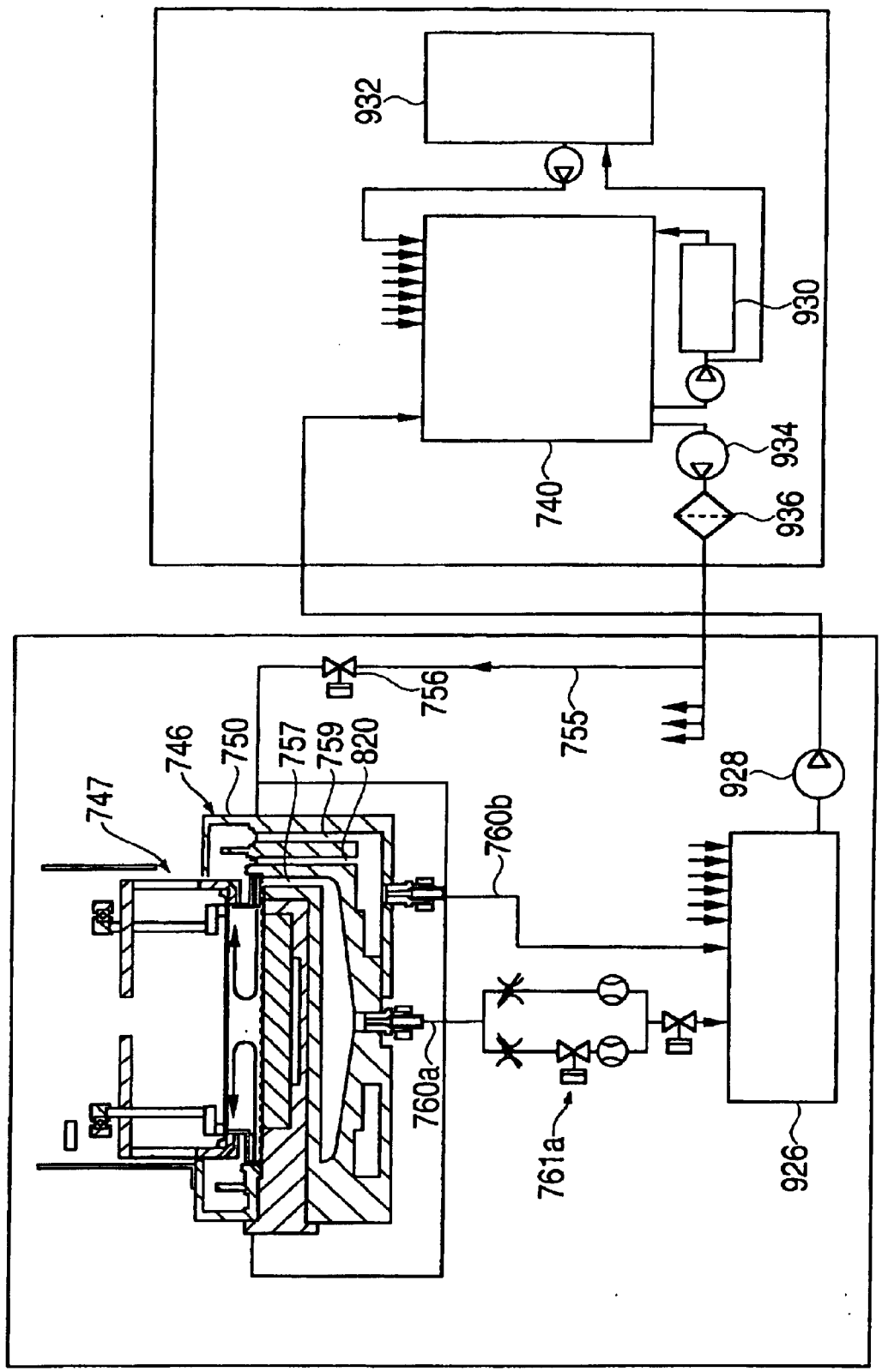
FIG. 67 is a schematic diagram showing a flow of a plating liquid in a plating apparatus provided with a plurality of the plating process units shown in FIG. 66.

Further, the plating container 750 is provided with first plating liquid discharge ports 757 for withdrawing the plating liquid 745 in the plating chamber 749 from the peripheral portion of the bottom of the plating chamber 749, and second plating liquid discharge ports 759 for discharging the plating liquid 745 overflowing a weir member 758 provided at the upper end of the plating container 750. Each of the first plating liquid discharge ports 757 is connected to a reservoir 926 (see FIG. 67) via a plating liquid discharge pipe 760*a*. A flow controller 761*a* is provided on the plating liquid discharge pipe 760*a*. On the other hand, each of the second plating liquid discharge ports 759 is connected to the reservoir 926 via a plating liquid discharge pipe 760*b*. A flow controller 761*b* is provided on the plating liquid discharge pipe 760*b*. The flow controller 761*b* may not be provided (FIG. 67 shows an example that omits the flow controller). The plating liquid fed into the reservoir 926 is supplied to the plating liquid regulating tank 740 (see FIG. 58) from the reservoir 926 by a pump 928. In the plating liquid regulating tank 740, the temperature of the plating liquid is adjusted, and the concentration of various components in the plating liquid is measured and adjusted. Thereafter, the plating liquid is respectively supplied to the plated film forming unit 722 (see FIG. 67).

The first plating liquid discharge ports 757 (16 ports in the drawing), which are in circular form having a diameter of 16 mm to 20 mm, for example, are disposed at equal intervals along the circumferential direction. The second plating liquid discharge ports (3 ports in the drawing) 59 are in arc-shaped form having a central angle of about 25°.

The plating liquid 745 ejected from the plating liquid supply nozzles 753 is discharged to the reservoir 726 (see FIG. 67) from one or both of the first plating liquid discharge ports 757 and the second liquid discharge ports 759, for thereby keeping the liquid level of the plating liquid 745 in the plating chamber 749 at a constant value.

A vertical stream regulating ring 762 for damming off a flow of the plating liquid 745 directed outwardly along the horizontal direction is provided in the plating chamber 749. A horizontal stream regulating ring 763 having an outer circumferential end fixed to the plating container 750 is provided in the plating chamber 749. The vertical stream regulating ring 762 is connected to the inner circumferential end of the horizontal stream regulating ring 763.

The plating liquid horizontally ejected from each of the plating liquid supply nozzles 753 collides with each other at the central portion of the plating chamber 749 to form an upward flow and a downward flow. When no substrate is held by the head 747, the upward flow pushes up the liquid surface of the plating liquid 745 at the central portion inside the vertical stream regulating ring 762. When the substrate is lowered, the substrate is firstly brought into contact with the plating liquid 745 at the central portion pushed up by the upward flow, and hence air bubbles on the lower surface of the substrate are pushed outwardly. On the other hand, the downward flow is changed to a horizontal flow flowing from the central portion of the anode 748 to the peripheral portion of the anode 748 to push away peeled fine pieces of a black film formed on the surface of the anode 748. The peeled pieces of the black film is passed from the peripheral portion of the anode 748 through the lower portion of the horizontal stream regulating ring 763 to the first plating liquid discharge ports 757, so that the peeled pieces of the black film can be prevented from approaching and being attached to the surface of the substrate to be processed.

In the electroplating, the current density in the plating liquid governs the thickness of the plated film. Therefore, in order to uniform the thickness of the plated film, it is necessary to uniform the distribution of the current density in the plating liquid. In the present embodiment, as described below, since the peripheral portion of the substrate has electrical contacts, the current density of the plating liquid present on the peripheral portion of the substrate tends to be increased. Therefore, the vertical stream regulating ring 762 extended vertically is disposed in the vicinity of the peripheral portion of the substrate, and the horizontal stream regulating ring 763 extended horizontally outwardly is disposed below the vertical stream regulating ring 762, for thereby regulating the electric current flowing in the vicinity of the peripheral portion of the substrate. Thus, these stream regulating rings can reduce local concentration of the electric current and can uniform the current density of the plating liquid to thus prevent the plated film from being thick at the peripheral portion of the substrate.

In the present embodiment, the vertical stream regulating ring and the horizontal stream regulating ring are used for regulating the electric current around the peripheral portion of the substrate. However, the present invention is of course not limited to this example.

On the other hand, the head 747 is provided with a rotatable housing 770 in a hollow cylindrical form and a disk-shaped substrate table 771 for holding a substrate W on its lower surface and is rotated together with the housing 770. A ring-shaped substrate holding member 772 projecting radially inwardly is provided at the lower end of the housing 770. For example, the substrate holding member 772 is formed of a packing material and has a tapered surface on a part of its inner circumferential surface for guiding the substrate W. The peripheral portion of the substrate W is held between the substrate holding member 772 and the substrate table 771. The substrate table 771 is constituted as a pressing member for pressing the substrate W against the substrate holding member 772.

Figure 60:
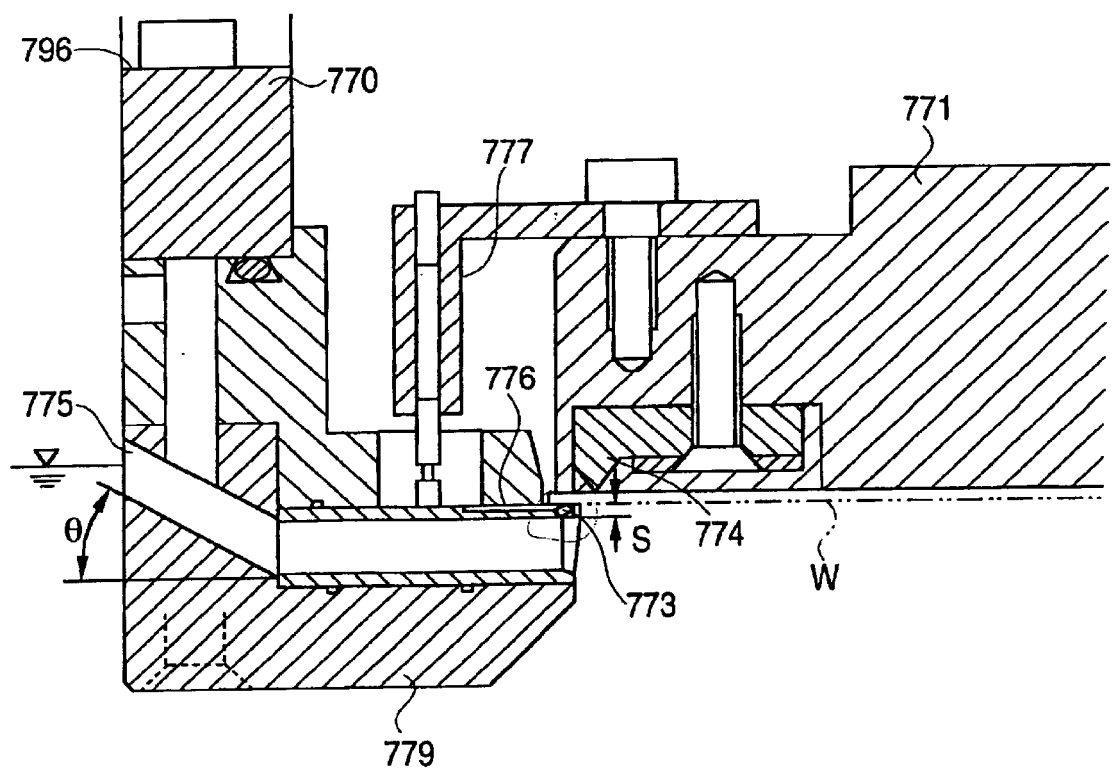
FIG. 60 is an enlarged view showing a part of the plating unit shown in FIG. 59.

FIG. 60 is an enlarged view showing a part of the head 747. As shown in FIG. 60, a ring-shaped lower sealing member 773 is mounted on the substrate holding member 772. The lower sealing member 773 projects inwardly, and the front end of its upper surface projects upwardly in an annular tapered form. An upper sealing member 774 is mounted on the peripheral portion of the lower surface of the substrate table 771. The upper sealing member 774 has a spired portion projecting downwardly from the lower surface of the substrate table 771. Thus, when the substrate W is held by the substrate holding member 772, the lower surface of the substrate W is brought into pressure contact with the lower sealing member 773, and the upper surface of the substrate W is brought into pressure contact with the upper sealing member 774, for thereby sealing the peripheral portion of the substrate W reliably.

In the present embodiment, eighty air vent holes 775 having a diameter of 3 mm are formed in the substrate holding member 772 at equal intervals along the circumferential direction. Each of the air vent holes 775 is extended horizontally outwardly and further extended outwardly in an upwardly inclined state. The air vent holes 775 are provided in such a state that, when the head 747 is located in the plating position as shown in FIG. 59, about half of the peripheral opening end of the air vent hole 775 is exposed to the exterior from the liquid surface of the plating liquid 745 in the plating chamber 749. As described above, the upward flow of the plating liquid 745 in the plating chamber 749 is brought into contact with the substrate W to sweep away air bubbles to the exterior from the central portion of the substrate W. Accordingly, the air bubbles swept by the upward flow are successively discharged to the exterior through the air vent holes 775. Thus, air bubbles can be prevented from remaining between the substrate W and the surface of the plating liquid 745.

For example, the angle of inclination of the air vent holes 775 is set to be 30°. When the venting of air is taken into consideration, the air vent holes 775 should preferably have a diameter of 2 mm to 5 mm, and more preferably about 3 mm. Further, the air vent holes 775 should preferably be inclined upwardly in the outward direction at an angle of not less than 200, and more preferably about 30°.

Further, the peripheral opening end of the air vent holes 775 may be located fully above the liquid surface of the plating liquid at the time of plating. The air vent holes 775 may be branched into two holes, one of which is opened in the vicinity of the liquid surface, and the other of which is opened at a position fully above the liquid surface. It has been confirmed that, when a gap S between the lower surface of the substrate W held on the lower surface of the substrate table 771 and the upper end of the air vent holes 775 is not more than about 1.5 mm, air can be vented in a short time.

Each of the air vent holes 775 may be provided in any form, e.g., in a linear form, or each of the air vent holes 775 may be branched outwardly into two holes.

Further, plate-spring-like contacts 776 for a cathode electrode are disposed on the substrate holding member 772 of the housing 770. When the substrate W is held on the lower surface of the substrate table 771, the contacts 776 for a cathode electrode energize the substrate W. Feeding contacts (probes) 777 are vertically downwardly provided at the outer circumferential side of the substrate table 771. When the substrate table 771 is lowered, each of the feeding contacts 777 feeds power to each of the contacts 776 for a cathode electrode. Since the plating liquid 745 is sealed with a lower sealing member 773 disposed between the substrate W and the substrate holding member 772, the contacts 776 for a cathode electrode and the feeding contacts 777 can be prevented from bringing into contact with the plating liquid 745.

Openings 96 are provided on both sides of the cylindrical surface of the housing 70 for allowing the substrate W and the robot hand to pass therethrough (see FIG. 60).

Next, a series of plating processes using the plating apparatus according to this embodiment will be described.

A cassette housing a plurality of substrates whose surfaces (surface on which semiconductor devices are formed, i.e., surface to be processed) face upward is placed on a loading and unloading sections 715 within the facilities 710. The recess-type hand of the first transfer robot 717 is inserted into the cassette and holds the substrate, and then takes out the substrate from the cassette. The first transfer robot 717 which holds the substrate by the hand rotates about its own axis and places the substrate onto the second substrate stage 726a. Next, the third transfer robot 727 holds the substrate placed on the second substrate stage 726a by the recess-type hand, rotates about its own axis, and then places the substrate onto the first substrate stage 723a.

The second transfer robot 724 moves to a position close to the first substrate stage 723a, and holds the substrate placed on the first substrate stage 723a by the recess-type hand. Thereafter, the second transfer robot 724 holding the substrate rotates toward the pretreatment unit 721, and transfers the substrate to the substrate chuck of the pretreatment unit 721 through a slit formed in the splash preventive cover for allowing the substrate to pass therethrough.

In the substrate chuck of the pretreatment unit 721, fingers are opened, and the substrate is positioned between the fingers, and then the fingers are closed to hold the substrate. Next, a pretreatment liquid nozzle, which has been in the stand-by position so as not to hinder the movement of the hands of the inverter 720, is rotated to a position above and near the center of the substrate. While the substrate chuck holding the substrate is rotated at a medium speed of, for example, about 300 min$^{-1}$, the pretreatment liquid is supplied through the pretreatment liquid nozzle onto the substrate. When the liquid has been speedily spreaded over the entire surface of the substrate, the rotational speed of the substrate is increased to remove excessive pretreatment liquid on the substrate under a centrifugal force.

After the removal of the liquid from the substrate is completed and the substrate chuck is stopped, the hands of the inverter 720 are lowered. The hands hold the substrate, and the fingers of the substrate chuck in the pretreatment unit 721 are opened to transfer the substrate to the inverter 720. The inverter 720 is raised to a position where the hands of the inverter 720 do not contact the substrate chuck while an inverting operation is performed. Thereafter, the hands of the inverter 720 and the substrate are rotated by an angle of 180 degrees about the horizontal inverting axis, and the surface of the substrate faces downwardly. The inverter 720 is lowered to a position where the substrate is transferred to the second transfer robot 724, and then stopped.

The hands of the inverter 720 are located at a position below the inverting axis when the hands receive the substrate from the third transfer robot 727 and receives the substrate from the substrate chuck after the pretreatment. On the other hand, when the hands are inverted about the inventing axis to transfer the substrate to the second transfer robot 724, the hands are located at a position above the inverting axis.

The second transfer robot 724 inserts the recess-type hand into the splash preventive cover through the slit formed in the cover. The substrate is held by the hands of the inverter 720. The recess-type hand is positioned so as to allow the hand to contact the lower peripheral edge portion of the substrate. The hands of the inverter 720 release the substrate, and the recess-type hand of the second transfer robot 724 holds the substrate with its surface facing downwardly. The second transfer robot 724 takes out the substrate from the pretreatment unit 721, and moves to one predetermined plated film forming unit 722.

The housing 770 and the substrate table 771 in the plated film forming unit 722 are raised to a position where the substrate is attached or detached. The substrate table 771 is further lifted to the upper end of the housing 770.

The second transfer robot 724 inserts the hand and the substrate into the housing 770 through the opening 796 formed in the housing 770, and lifts the hand to a position immediately below the substrate table 771. In this state, the hooks are closed by the urging forces of the compression coil springs (not shown) to thus hold the substrate. After the substrate is held by the hooks, the hand of the second transfer robot 724 is slightly lowered and withdrawn through the opening 796 of the housing 770.

Next, the substrate table 771 is lowered, and the substrate is centered by the tapered portion on the inner side of the substrate holding member 772 of the housing 770, placed on the lower sealing member 773 of the substrate holding member 772, and further pressed against the upper sealing member 774 near the peripheral portion of the substrate table 771 to form a seal for preventing the plating liquid from entering the electrode contact side. At the same time, the substrate table 771 is lowered to press the feeding contacts 777 against the contacts 776 for a cathode electrode, thereby achieving reliable contacts.

In this state, when the plating liquid is ejected through the plating liquid supply nozzles 753 in the plating process container 746, the liquid surface in its center portion rises. At the same time, while the substrate W and the substrate table 71 are rotated at a medium speed of, for example, 150 $min^{-1}$, and then lowered by a ball screw or the like. The rotational speed of the substrate is preferably about 100 to 250 $min^{-1}$ from the viewpoint of the removal of air. In this case, after the central portion of the substrate comes into contact with the surface of the plating liquid 745, the area of contact between the substrate and the raised liquid surface increases gradually, and then the plating liquid 745 reaches the periphery of the substrate. In the periphery of the lower surface of the substrate, the lower sealing member 773 projects from the substrate surface, and hence air is likely to be left on the periphery of the lower surface of the substrate. However, by allowing the plating liquid containing air bubbles to flow to the exterior through air vent holes 775 by the rotation of the housing 770, air bubbles present on the lower surface of the substrate can be removed. Thus, air bubbles on the lower surface of the substrate can be completely removed, and uniform plating can be realized. The predetermined position where the substrate is plated is such that the substrate is immersed in the plating liquid 745 within the plating chamber 749 and the plating liquid does not enter the housing 770 through the openings 796 of the housing 770.

When the substrate is lowered to a predetermined position, the housing 770 is rotated at a medium speed for several seconds to remove air. The rotational speed of the housing 770 is then changed to a low rotational speed of, for example, 100 $min^{-1}$, and plating current is flowed for electroplating by utilizing the above anode and the treating face of the substrate as the cathode. In this case, the rotational speed is in the range of, for example, 0 to 225 $min^{-1}$. During the plating process, the plating liquid is continuously fed at a predetermined flow rate through the plating liquid supply nozzles 753, is discharged through the first plating liquid discharge ports 757 and the second plating liquid discharge ports 759, and is circulated through the plating liquid regulating tank 740. In this case, since the plating thickness is determined by the current density and the current feed time, the current feed time (plating time) is set according to a desired amount of deposition.

This plating time is, for example, 120 to 150 seconds. The plating process is carried out, for example, at about 1 A for about 40 seconds, and then, for example, at about 7.4 A for remaining time. Accordingly, a plated film with uniformity can be obtained.

After the completion of the feed of current, the housing 770, the substrate W and the substrate table 771 is lifted to a position above the surface of the plating liquid 745 within the plating chamber 749 and below the upper end of the plating process container cover. Then, the substrate is rotated at a high speed of, for example, 500 to 800 $min^{-1}$ to remove the plating liquid from the substrate under a centrifugal force. After the completion of the removal of the liquid from the substrate, the rotation of the housing 770 is stopped so that the housing 770 faces a predetermined direction. After the housing 770 is lifted to the position where the substrate is attachable or detachable, the substrate table 771 is further raised to a position where the substrate is attachable or detachable.

When the surface of the plating liquid is raised, the feed rate of the plating liquid is about 10 to 30 liters/min (preferably 20 liters/min), and the plating liquid is discharged through the first plating liquid discharge ports 757 at a rate of about 3 to 6 liters/min (preferably 5 liters/min). During plating, the feed rate of the plating liquid is about 8 to 20 liters/min (preferably 10 liters/min), and the plating liquid is discharged through the first plating liquid discharge ports 757 at a rate of about 3 to 6 liters/min (preferably 5 liters/min), and through the second plating liquid discharge ports 759 at a rate of about 3 to 6 liters/min (preferably 5 liters/min). When the liquid level is lowered after plating, the feed rate of the plating liquid is about 15 to 30 liters/min (preferably 20 liters/min), and the plating liquid is discharged through the first plating liquid discharge ports 757 at a rate of about 20 to 30 liters/min (preferably 25 liters/min). During stopping of the plating process for a long period of time, the plating liquid is fed at a rate of about 2 to 4 liters/min (preferably 3 liters/min), and is entirely flowed and circulated through the second plating liquid discharge ports 759.

Next, the hand of the second transfer robot 724 is inserted into the housing 770 through the opening 796 of the housing 770, and is raised to a position where the hand receives the substrate. Then the hooks are opened, whereby the substrate held by the hooks is dropped on the recess-type hand. In this state, the hand is slightly lowered, and the hand and the substrate held by the hand are taken out through the opening 796 of the housing 770. The substrate is held in such a manner that the surface of the substrate faces downwardly and only the peripheral edge of the substrate is brought into contact with the hand, as with mounting the substrate with the hand.

The substrate held by the second transfer robot 724 is transferred to the inverter 720 in the first substrate stage 723b in such a state that the surface of the substrate faces downwardly. The inverter 720 hold the periphery of the substrate by the two hands, and ultrapure water is supplied to both surfaces of the substrate to rinse the substrate. And then substrate is rotated by 180 degrees around the horizontal inverting axis so that the surface of the substrate faces upwardly. Next, the third transfer robot 727 holds the substrate placed on the inverter 720 in the first substrate stage 723b by the hand, and transfers the substrate to the chemical liquid cleaning unit 725.

In the chemical liquid cleaning unit 725, the substrate is held by six fingers, and the substrate is rotated so that the surface of the substrate faces upwardly, and then the surface, edge and backside of the substrate are cleaned with a chemical liquid. After the completion of cleaning of the substrate with the chemical liquid, the substrate is rinsed with ultrapure water, and then the substrate held by the fingers is rotated at a high speed to remove the liquid from the substrate.

After the completion of the removal of the liquid from the substrate, the third transfer robot 727 takes out the substrate by the hand in such a state that the surface of the substrate faces upwardly. The substrate is then placed on the second substrate stage 726b. In the second substrate stage 726b, the substrate is further rinsed with ultrapure water.

Next, the first transfer robot 717 receives the substrate from the second substrate stage 726b by the hand, and transfers the substrate to the cleaning unit 716. In the cleaning unit 716, the surface and backside of the substrate are cleaned with ultrapure water (includes deionized water), and then the substrate is rotated at a high speed to remove the liquid from the substrate and then to be dried. The first transfer robot 717 holds the substrate by the hand in such a manner that the surface of the substrate faces upwardly, and transfers the substrate at a predetermined position in the cassette on the loading and unloading section 715.

Figure 61:
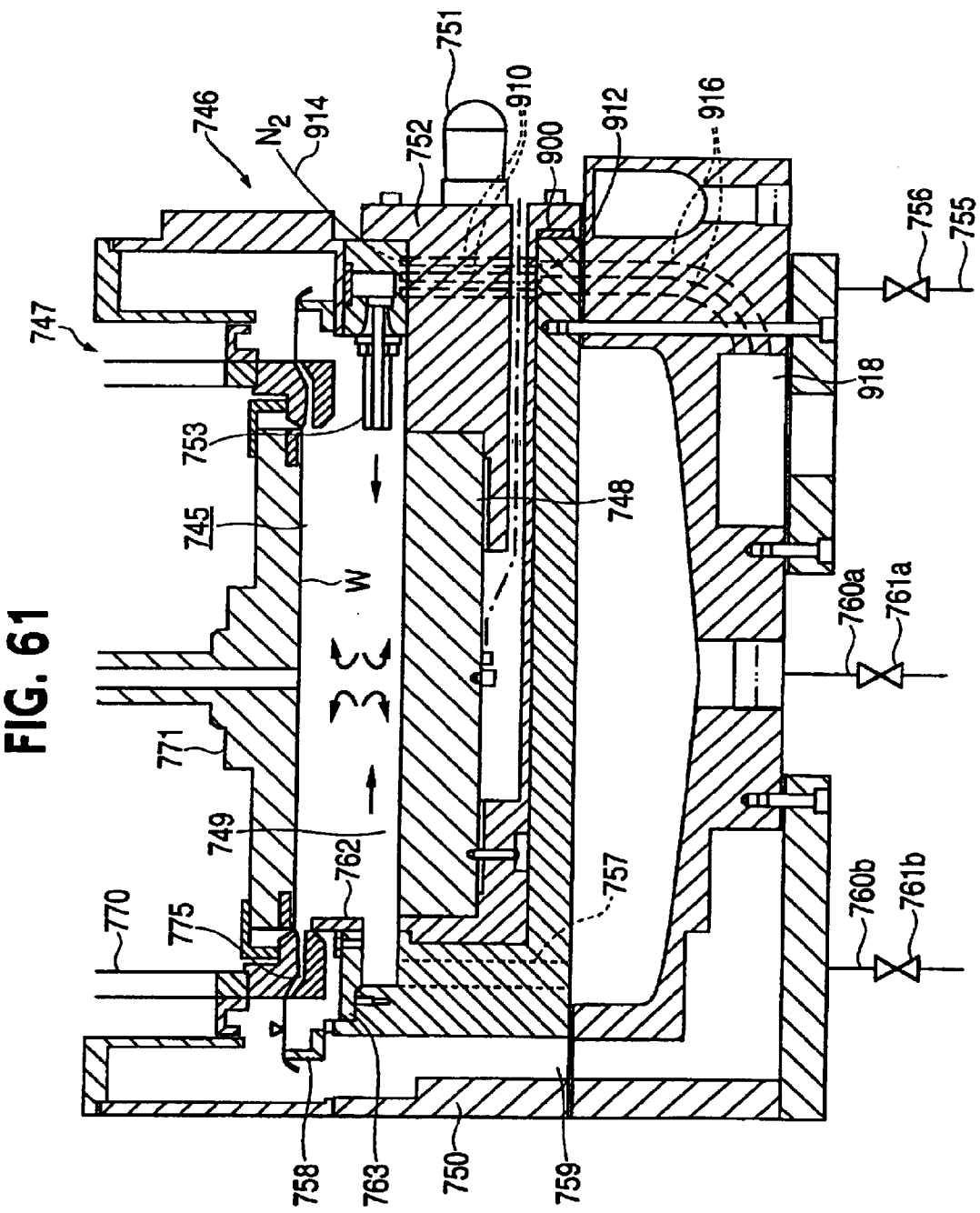
FIG. 61 is a cross-sectional view schematically showing a plating process unit in a plating apparatus.

FIG. 61 shows another embodiment of a plated film forming unit 722. This embodiment is different from the above-mentioned embodiment in the following: A labyrinth seal 912 comprising a large number of grooves 910 arranged in parallel is provided around the inlet of the anode support 752 which is removably mounted in the plating container 750 through a knob 751 and holds an anode 748. An inert gas introduction passage 914 for introducing inert gas such as nitrogen gas is connected to one of the grooves 910, one ends of plating liquid return passages 916 are connected to the bottoms of all the grooves 910, and the other ends of the plating liquid return passages 916 are connected to a plating liquid reservoir 918 which stores an overflowed plating liquid and is open to the air. The other construction is the same as that of the first embodiment.

Thus, the provision of the labyrinth seal 912 comprising a plurality of grooves 910 around the inlet of the anode support 752 in the plating container 750 can eliminate the need to tighten the sealing member 900 by large force, and can ensure reliable sealing of the gap between the plating container 750 and the anode support 752 to prevent the plating liquid from leaking out. The inert gas introduction passage 914 is connected to one of the grooves 910, the plating liquid return passages 916 are connected to the bottoms of all the grooves 910, and inert gas, such as nitrogen gas, having a pressure high enough to discharge the plating liquid remaining within the grooves 910 is introduced to the groove 910 through the inert gas introduction passage 914. Thus, the plating liquid remaining within the grooves 910 can be discharged to the exterior, and a deterioration in the effect of the labyrinth seal 912 by the plating liquid remaining within the groove 910 can be prevented.

In this embodiment, the labyrinth seal 912 comprising a plurality of grooves 910 is provided on the plating container side. Alternatively, the labyrinth seal may be provided on the anode support side or on both the plating container side and the anode support side.

Figure 62:
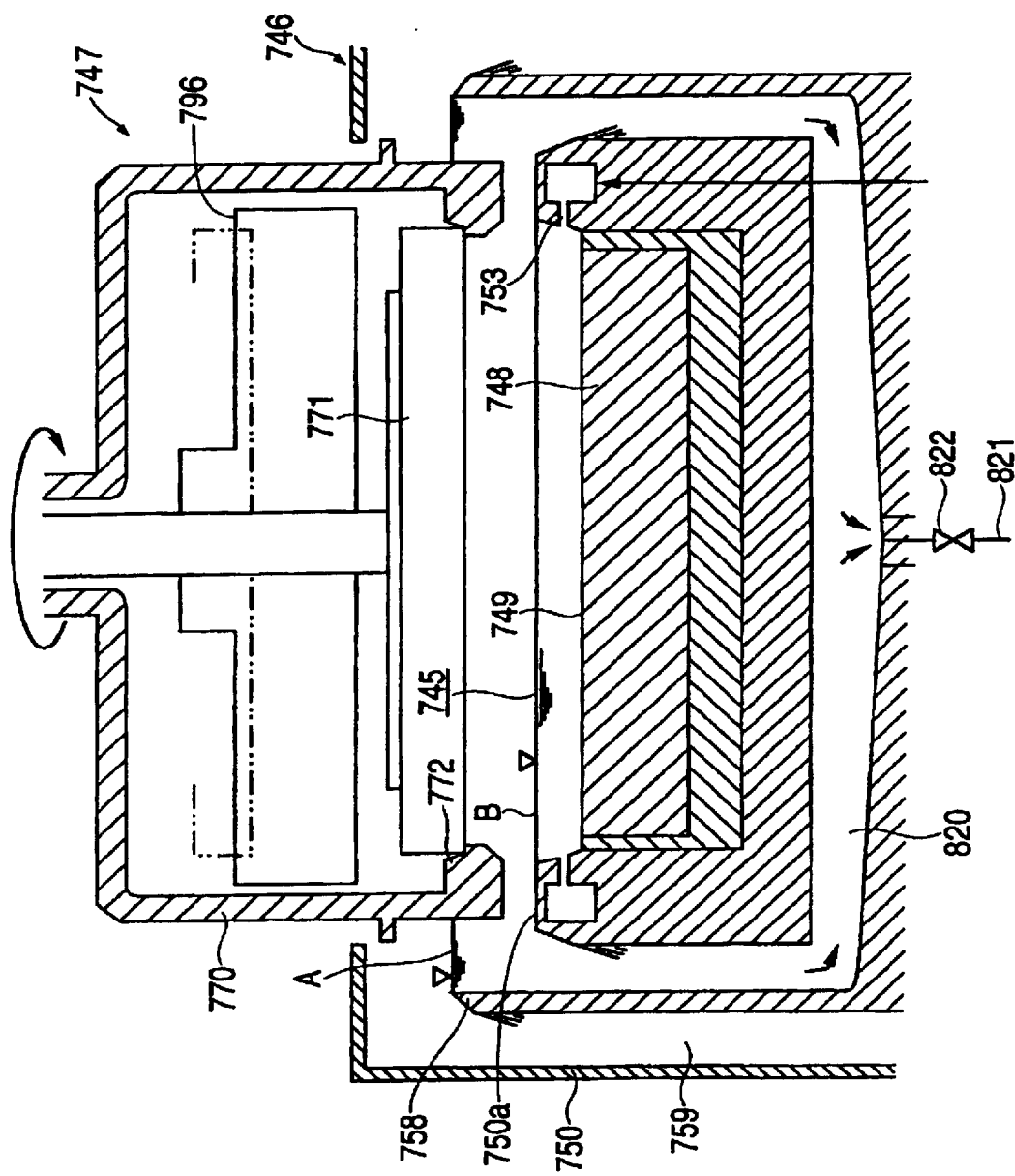
FIG. 62 is a cross-sectional view schematically showing a plating process unit in a plating apparatus.

FIG. 62 schematically shows another embodiment of a plated film forming unit 722. In the plated film forming unit 722 shown in FIGS. 59 and 60, the transfer of the substrate is performed by moving the housing 770 up and down. In the a plated film forming unit 722 of this embodiment, the liquid level of the plating liquid within the plating process container is raised or lowered to transfer the substrate without the vertical movement of the housing 770.

When this plated film forming unit 722 is provided, the second transfer robot 24 shown in FIG. 57 which is mobile type and rotatable may have a suction-type hand which holds the substrate by suction and is rotatable to change the suction surface of the suction-type hand to face upwardly or downwardly.

The plated film forming unit 722 according to this embodiment will be described below. The parts or components identical to or corresponding to the parts or components in the plated film forming unit 722 shown in FIGS. 59 and 60 are denoted by the same reference numerals, and a part of the explanation thereof will be omitted.

The plated film forming unit 722 comprises a plating process container 746 and a head 747. The plating container 750 of the plating process container 746 has first plating liquid discharge ports (not shown) which are located around the anode 748 and are opened at the bottom of the plating container 50, and second plating liquid discharge ports 759 for discharging the plating liquid 745 which have overflowed a weir member 758 in the plating container 750. Further, the plating container 750 has third plating liquid discharge ports 820 which are open at a step portion 750a provided at the halfway along the height direction of the circumferential wall of the weir member 758. A shut-off valve 822 is provided in a plating liquid discharge pipe 821 extending from the third plating liquid discharge ports 820 to the reservoir 926 (see FIG. 67).

With this construction, a plane defined by the upper end of the weir member 758 in the plating container 750 constitutes a liquid level A for plating, while a plane defined by the step portion 50a constitutes a liquid level B for transferring the substrate. Specifically, at the time of plating process, the shut-off valve 822 is closed, and the plating liquid is ejected through the plating liquid supply nozzles 753 to raise the liquid level of the plating liquid 745 within the plating chamber 749, and overflows the upper end of the weir member 758 in the plating container 750, thereby maintaining the liquid level at the liquid level A for plating. After the completion of the plating process, the shut-off valve 822 is opened to discharge the plating liquid 745 within the plating chamber 749 through the third plating liquid discharge ports 820, thereby bringing the liquid level to the liquid level B for transferring the substrate.

Thus, by immersing the anode 748 in the plating liquid 745 in a period other than during the plating process, a black film formed on the surface of the anode 748 can be prevented from being dried and oxidized, and the plating process can be stably carried out.

When the substrate W is held by the substrate holding member 772 provided at the lower end of the housing 770, the housing 770 of the head 747 is not vertically movable, but is rotatable about its own axis, and the substrate W is located at a position between the liquid level A for plating and the liquid level B for transferring the substrate. The substrate table 771 is not provided with any means for holding the substrate, and the substrate W is placed on the substrate holding member 772 of the housing 770, and then the substrate table 771 is lowered to sandwich the peripheral portion of the substrate W between the substrate holding member 772 and the lower peripheral portion of the substrate table 771, thereby holding the substrate W.

Next, a substrate processing performed by the substrate processing apparatus provided with the substrate holding member 722 will be described below. This embodiment is substantially the same as the above-mentioned embodiments, except for transfer of the substrate through the second transfer robot 724 and the process in the plated film forming unit 722. Therefore, only the different construction and operation will be described.

First, the substrate placed on the first substrate stage 723a in such a manner that the surface of the substrate faces upwardly, is transferred to the pretreatment unit 721 in the following manner: The second transfer robot 724 holds the substrate in such a manner that the suction-type hand with the suction surface facing upward attracts the backside of the substrate by suction, and rotates toward the pretreatment unit 721. The substrate and the suction-type hand are inserted into the pretreatment unit 721 through a slit formed in the splash preventive cover in the pretreatment unit 721, and the substrate is positioned between two opened hands of the inverter 720 in the pretreatment unit 721.

Further, the second transfer robot 724 receives the substrate from the pretreatment unit 721 in the following manner: The suction-type hand of the second transfer robot 724 with the suction surface facing downward is inserted into the pretreatment unit 721 through the slit of the splash preventive cover in the pretreatment unit 721. The suction-type hand is then positioned immediately above the substrate held by the hands of the inverter 720 in the pretreatment unit 721. The suction-type hand attracts the backside of the substrate by vacuum suction, and the hands of the inverter 720 are opened. Thus, the substrate with the surface facing downward is held completely by the suction-type hand of the second transfer robot 724.

The substrate is transferred to the plated film forming unit 722 in the following manner: The suction-type hand of the second transfer robot 724 and the substrate W held by the suction-type hand in such a manner the surface of the substrate faces downwardly, are inserted into the housing 770 through the opening 796 of the housing 770. The suction-type hand is then moved downwardly, and the vacuum suction is released to place the substrate W on the substrate holding member 772 of the housing 770. Thereafter, the suction-type hand is raised and withdrawn from the housing 770. Next, the substrate table 771 is lowered to sandwich the peripheral portion of the substrate W between the substrate holding member 772 and the lower peripheral portion of the substrate table 771, thereby holding the substrate W.

Thereafter, the plating liquid discharge pipe 821 connected to the third plating liquid discharge ports 820 are closed by the shut-off valve 822, and the plating liquid is ejected through the plating liquid supply nozzles 753. At the same time, the housing 770 and the substrate W held by the housing 770 are rotated at a medium speed. After the plating liquid reaches a predetermined level and several seconds have elapsed, the rotational speed of the housing 770 is changed to a low rotational speed of, for example, 100 min$^{-1}$, and a plating current is flowed, thereby performing electroplating by utilizing the anode 48 as the anode and the processing face of the substrate as the cathode.

After the completion of the supply of current, the shutoff valve 822 is opened to discharge, through the third plating liquid discharge ports 820, the plating liquid 745 present at a position above the step portion 750a to the reservoir 926. Thus, the housing 770 and the substrate held by the housing 770 are located above the liquid level of the plating liquid and exposed to the atmosphere. In the state that the housing 770 and the substrate W held by the housing 770 are located above the liquid level of the plating liquid, the housing 770 and the substrate W are rotated at a high speed of, for example, 500 to 800 min$^{-1}$ to remove the plating liquid from the substrate under a centrifugal force. After the completion of the removal of the plating liquid from the substrate, the rotation of the housing 770 is stopped at a position where the housing 770 faces a predetermined direction.

After the rotation of the housing 770 is completely stopped, the substrate table 771 is raised to a position where the substrate is detached or attached. Next, the suction-type hand of the second transfer robot 724 with the suction surface facing downwardly is inserted into the housing 770 through the opening 796 of the housing 770, and is lowered to a position where the suction-type hand can hold the substrate by suction. The substrate is then held by vacuum suction by the suction-type hand, and the suction-type hand is then moved to a position above the opening 796 of the housing 770. Thereafter, the suction-type hand and the substrate held by the suction-type hand are withdrawn from the housing 770 through the opening 796 of the housing 770.

According to this embodiment, the mechanism of the head 747 can be simplified and compact. In addition, the plating process is carried out when the surface of the plating liquid within the plating process container 746 is on a liquid level A for plating, while the substrate is dewatered and transferred when the surface of the plating liquid is on a liquid level B for transferring the substrate. Further, it is possible to prevent a black film formed on the surface of the anode 748 from being dried and oxidized. Further, since the position of the substrate which is plated is the same as the position of the substrate from which an excessive plating liquid is removed by rotation of the substrate, the position for performing mist-splash prevention can be lowered.

Furthermore, in this embodiment, the following process may be performed: When the surface of the plating liquid is on the liquid level B for transferring the substrate, the substrate W is inserted into the housing 770 and held by the housing 770, and then the liquid level of the plating liquid is raised to the liquid level A for plating. At the same time, the housing 770 is raised by a certain distance. After the surface of the plating liquid is raised to the liquid level A for plating, the housing 770 is rotated at a medium speed of, for example, 150 min$^{-1}$ and lowered, whereby the substrate W is brought into contact with the surface of the plating liquid which rises at its central portion. Thus, air bubbles on the surface of the substrate can be positively removed therefrom.

Figure 63:
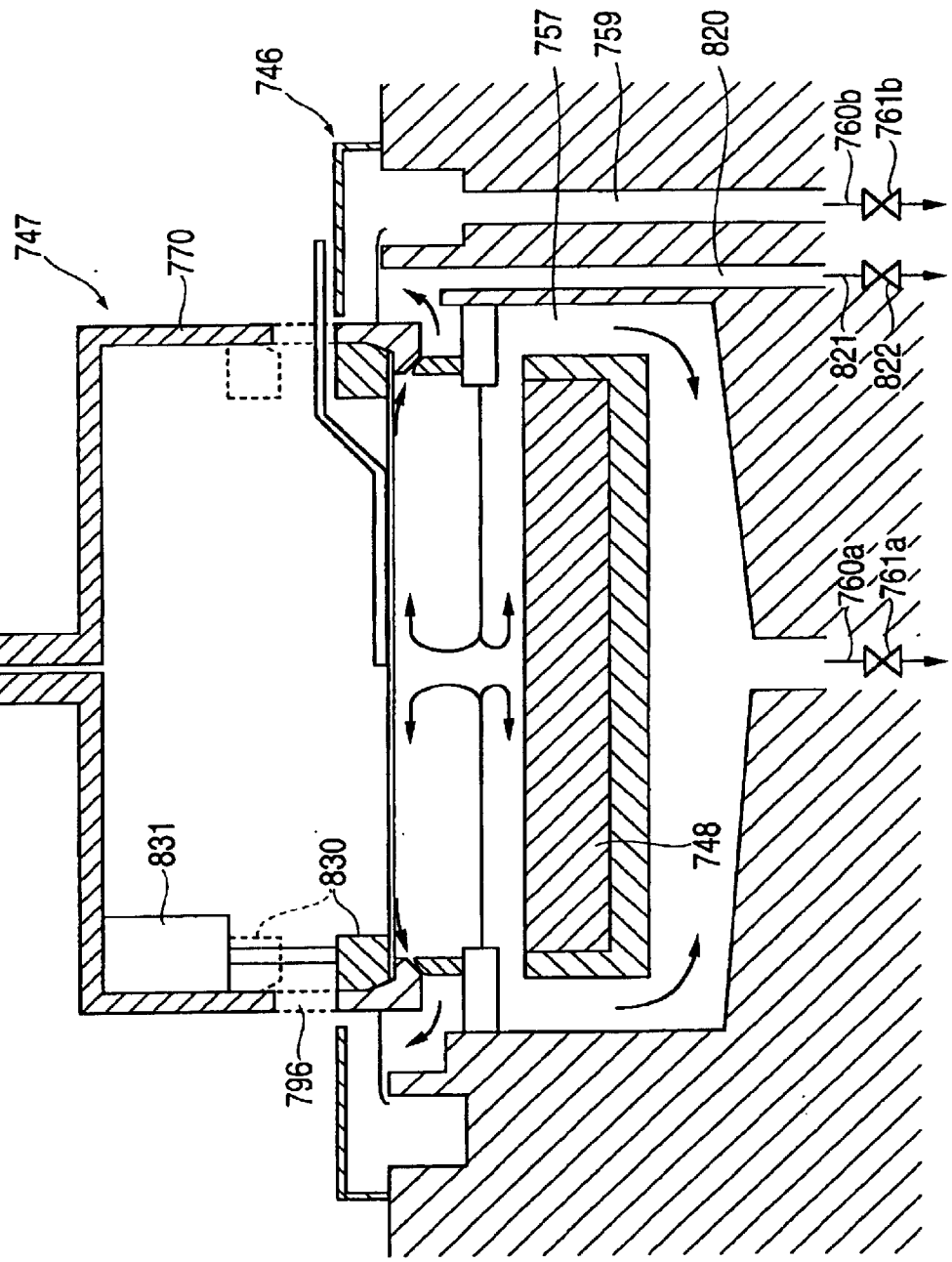
FIG. 63 is a cross-sectional view schematically showing a plating process unit in a plating apparatus.

FIG. 63 shows another embodiment of a plated film forming unit 722. The plated film forming unit 722 is different from the plated film forming unit 722 shown in FIG. 62 is that a pressing ring 830 is used, instead of the substrate table 71 constituting a pressing member for pressing the substrate of the plated film forming unit 722 shown in FIG. 62, and actuators 831 such as a cylinder for vertically moving the pressing ring 830 are housed in the housing 770.

According to this embodiment, when the actuators 831 are actuated to lower the pressing ring 830, the peripheral portion of the substrate is sandwiched between the substrate holding member 772 of the housing 770 and the lower surface of the pressing ring 830, and hence the substrate W is held. The substrate can be released by raising the pressing ring 830.

Figure 64:
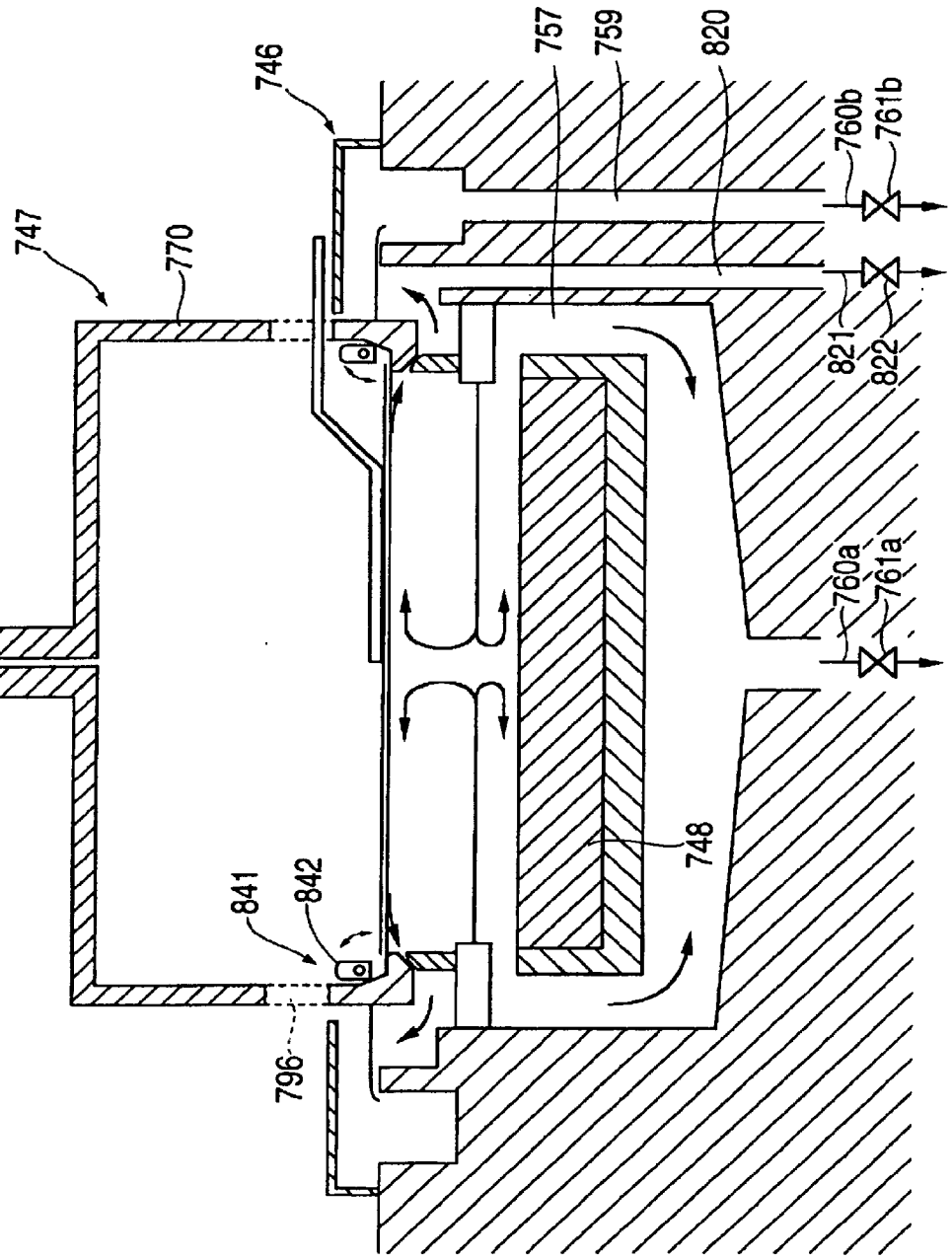
FIG. 64 is a cross-sectional view schematically showing a plating process unit in a plating apparatus.

FIG. 64 shows another embodiment of a plated film forming unit 722. The plated film forming unit 722 is different from the plated film forming unit 722 shown in FIG. 62 is that a clamp mechanism 841 having swing links 842 is used, instead of the substrate table 771 constituting a pressing member for pressing the substrate of the plated film forming unit 722 shown in FIG. 62, and the clamp mechanism 841 is housed within the housing 770 in its lower part.

According to this embodiment, when the swing links 842 are swung inward through the clamp mechanism 841 so as to be located in the horizontal direction, the peripheral portion of the substrate is sandwiched between the substrate holding member 772 of the housing 770 and the swing links 842, and hence the substrate W is held. When the swing links 842 are swung outward so as to be located in the vertical direction, the substrate is released. At the same time, it is possible to prevent the swing links 842 from hindering the withdrawal of the substrate W.

Figure 65:
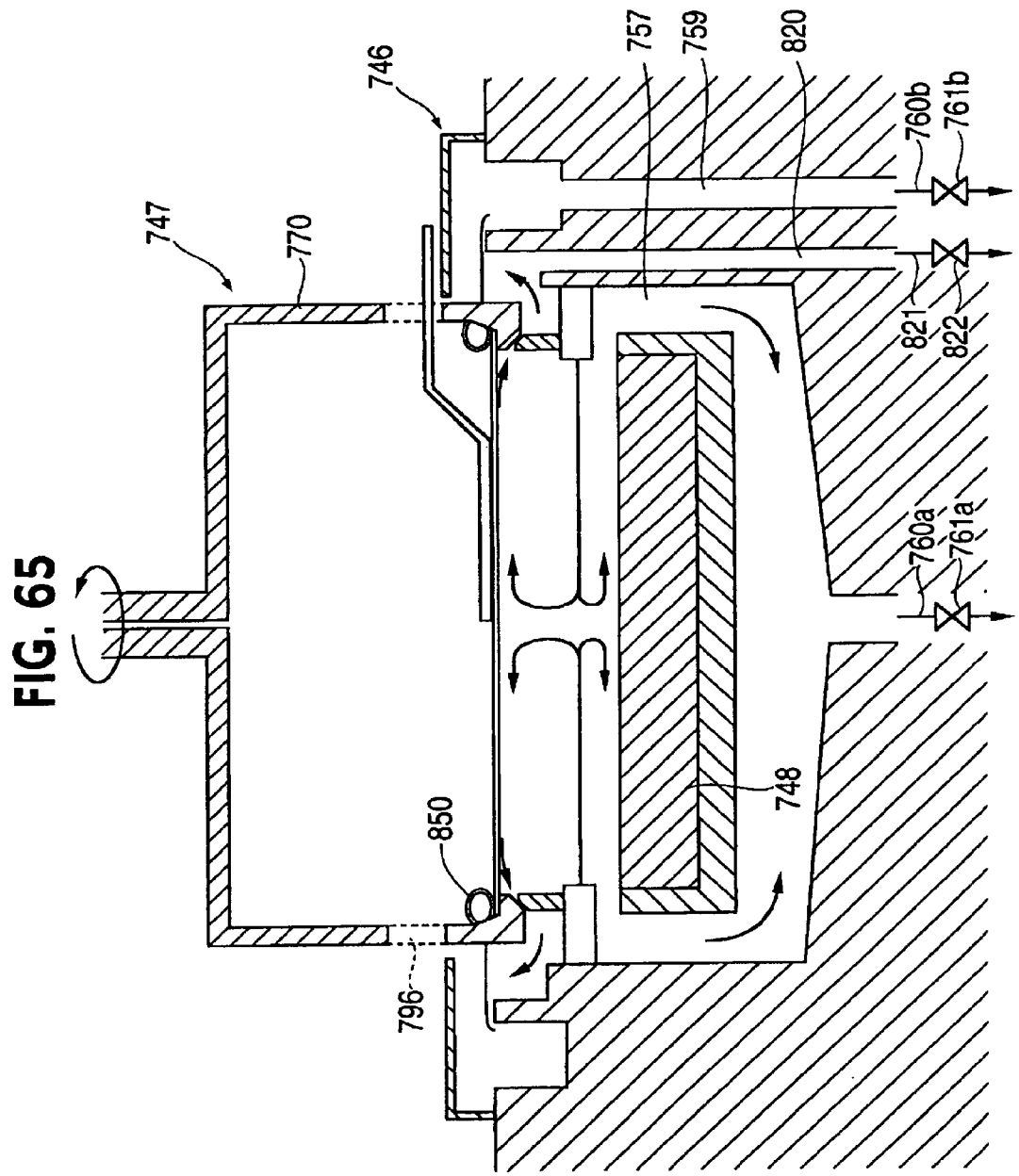
FIG. 65 is a cross-sectional view schematically showing a plating process unit in a plating apparatus.

FIG. 65 shows another embodiment of a plated film forming unit 722. The plated film forming unit 722 is different from the plated film forming unit 722 shown in FIG. 62 is that an elastic member 850 which is elastically deformable, i.e., expandable or contractable by pneumatic pressure is used, instead of the substrate table 71 constituting a pressing member for pressing the substrate of the plated film forming unit 722 shonw in FIG. 62, and this elastic member 850 is housed within the housing 770 in its lower part.

According to this embodiment, by expanding the elastic member 850 by pneumatic pressure, the peripheral portion of the substrate is sandwiched between the substrate holding member 772 of the housing 770 and the elastic member 850, and hence the substrate W is held. The substrate can be released by discharging air from the elastic member 850. At the same time, it is possible to prevent the elastic member 850 from hindering the withdrawal of the substrate W.

Figure 66:
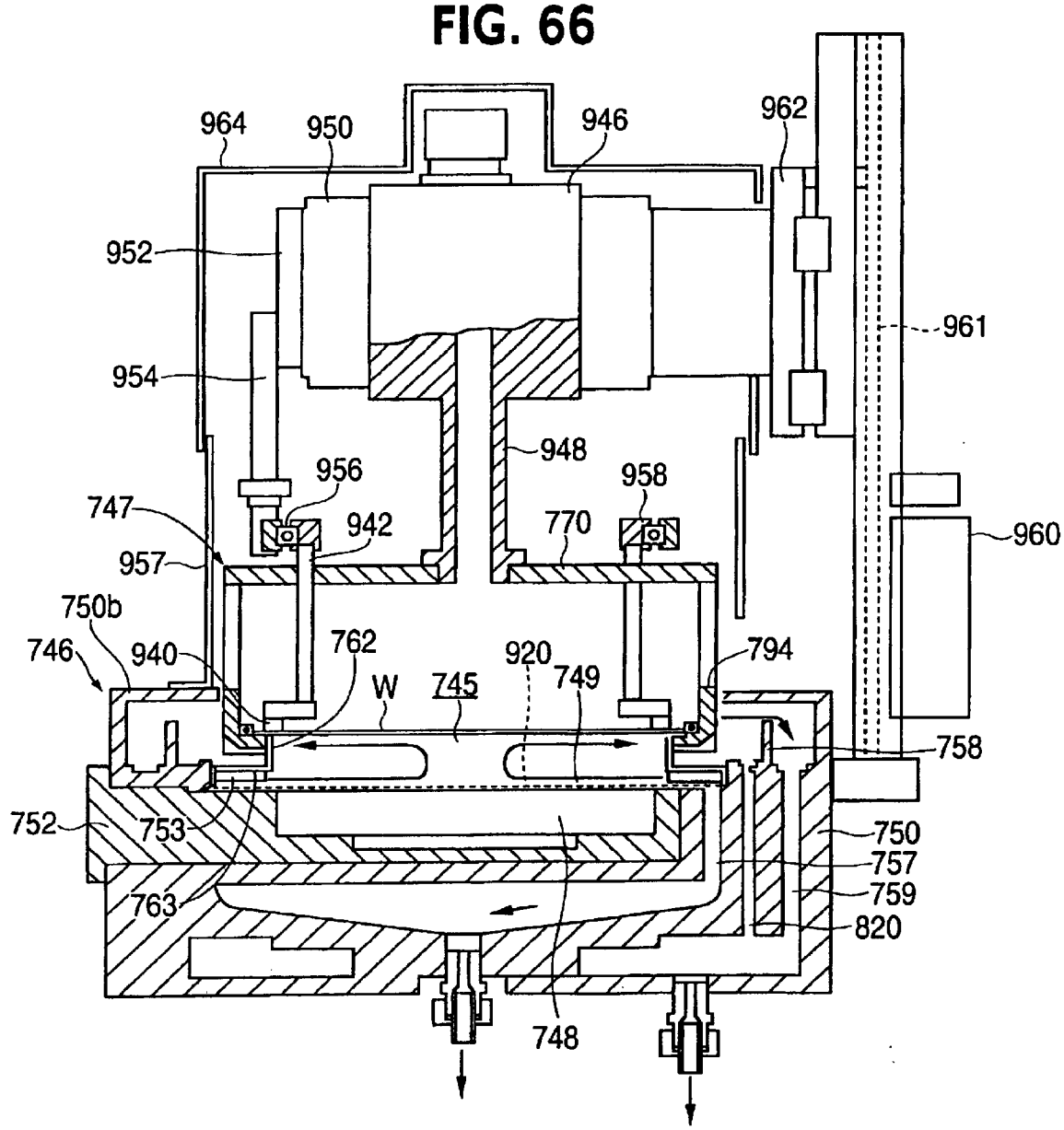
FIG. 66 is a cross-sectional view showing a whole structure of a plating process unit at the time of plating process in a plating apparatus.

FIG. 66 shows the whole construction of another embodiment of a plated film forming unit 722. FIG. 67 shows a flow diagram of a plating liquid in a plating apparatus having the plated film forming unit 722. The parts or components identical to or corresponding to the parts or components in the plated film forming units according to the above embodiments are denoted by the same reference numerals, and a part of the explanation thereof will be omitted.

As shown in FIG. 66, the plated film forming unit is composed mainly of a plating process container 746 which is substantially cylindrical and contains a plating liquid 745 therein, and a head 747 disposed above the plating process container 746 for holding the substrate W. In FIG. 66, the plated film forming unit is in such a state that the substrate W is held by the head 747 and the surface of the plating liquid 745 is on the liquid level for plating.

The plating process container 746 has a plating chamber 749 which is open upward and has an anode 748 at the bottom thereof. A plating container 750 containing the plating liquid 745 is provided within the plating chamber 749. Plating liquid supply nozzles 753, which project horizontally toward the center of the plating chamber 749, are disposed at circumferentially equal intervals on the inner circumferential wall of the plating container 750. The plating liquid supply nozzles 753 communicate with plating liquid supply passages 754 (see FIG. 59) extending vertically within the plating container 750.

As shown in FIG. 67, the plating liquid supply passages 754 are connected to the plating liquid regulating tank 740 (see FIG. 58) through the plating liquid supply pipes 755. A control valves 756 for controlling the back pressure so as to be constant are disposed on each of the plating liquid supply pipes 755.

Further, according to this embodiment, a punch plate 920 having a large number of holes with a size of, for example, about 3 mm is disposed at a position above the anode 748 within the plating chamber 749. The punch plate 920 prevents a black film formed on the surface of the anode 748 from curling up by the plating liquid 745 and consequently being flowed out.

The plating container 750 has first plating liquid discharge ports 757 for withdrawing the plating liquid 745 contained in the plating chamber 749 from the peripheral portion of the bottom in the plating chamber 749, and second plating liquid discharge ports 759 for discharging the plating liquid 745 which has overflowed a weir member 758 provided at the upper end of the plating container 750. Further, the plating container 750 has third plating liquid discharge ports 820 for discharging the plating liquid before overflowing the weir member 758. The plating liquid which has flowed through the second plating liquid discharge ports 759 and the third plating liquid discharge ports 820 join at the lower end of the plating container 750, and then is discharged from the plating container 750. Instead of providing the third plating liquid discharge ports 820, as shown in FIGS. 72A through 72D, the weir member 758 may have, in its lower part, openings 922 having a predetermined width at predetermined intervals so that the plating liquid 745 passes through the openings 922 and is then discharged to the second plating liquid discharge ports 759.

Figure 72C:
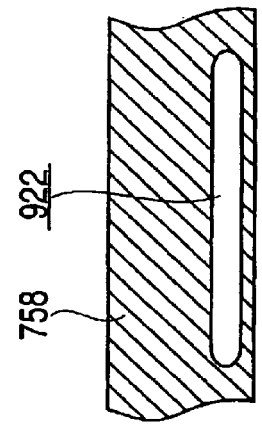
FIGS. 72A through 72D are schematic views explanatory of the flow of a plating liquid at the time of plating process and at the time of non-plating process.
Figure 72D:
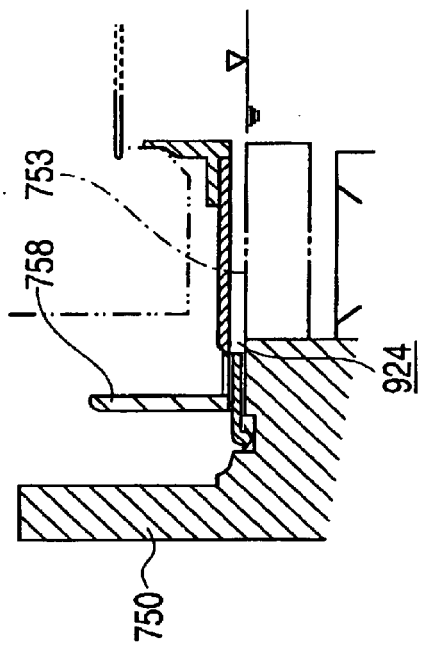
Figure 72A:
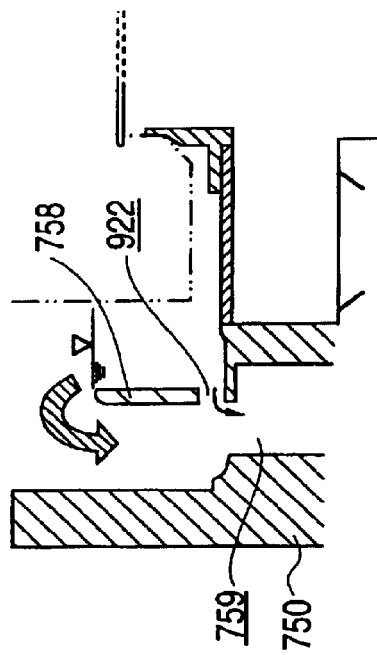
Figure 72B:
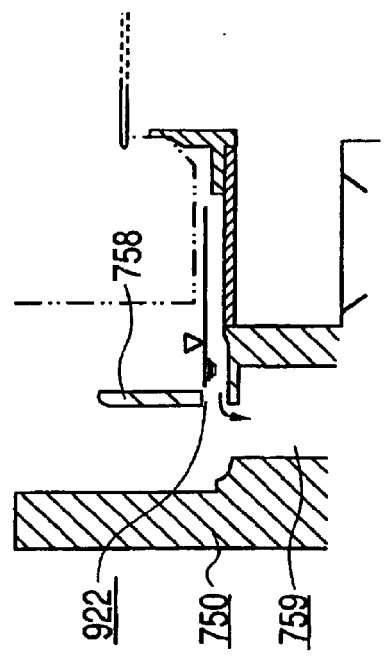

With this arrangement, when the amount of plating liquid supplied is large during plating, the plating liquid is discharged to the exterior through the third plating liquid discharge ports 820 or is passed through the openings 922 and discharged to the exterior through the second plating liquid discharge ports 759 and, in addition, as shown in FIG. 72A, the plating liquid overflows the weir member 758 is discharged to the exterior through the second plating liquid discharge ports 759. On the other hand, during plating, when the amount of plating liquid supplied is small, the plating liquid is discharged to the exterior through the third plating liquid discharge ports 820, or alternatively as shown in FIG. 72B, the plating liquid is passed through the openings 922 and discharged to the exterior through the second plating liquid discharge ports 759. In this manner, this construction can easily cope with the case where the amount of plating liquid supplied is large or small.

Further, as shown in FIG. 72D, through holes 924 for controlling the liquid level, which are located above the plating liquid supply nozzles 753 and communicate with the plating chamber 749 and the second plating liquid discharge ports 759, are provided at circumferentially predetermined pitches. Thus, when plating is not performed, the plating liquid is passed through the through holes 924, and is discharged to the exterior through the second plating liquid discharge ports 759, thereby controlling the liquid level of the plating liquid. During plating, the through holes 924 serve as an orifice for restricting the amount of the plating liquid flowing therethrough.

As shown in FIG. 67, the first plating liquid discharge ports 757 are connected to the reservoir 926 through the plating liquid discharge pipe 760a, and a flow controller 761a is provided in the plating liquid discharge pipe 760a. The second plating liquid discharge ports 759 and the third plating liquid discharge ports 820 join with each other within the plating container 750, and the joined passage is then connected directly to the reservoir 926 through the plating liquid discharge pipe 760b.

The reservoir 926 is constructed so that the plating liquid from all the other plated film forming units flows into the reservoir 926. The plating liquid which has flowed into the reservoir 926 is introduced by a pump 928 into the plating liquid regulating tank 740 (see FIG. 58). This plating liquid regulating tank 740 is provided with a temperature controller 930, and a plating liquid analyzing unit 932 for sampling the plating liquid and analyzing the sample liquid. When a single pump 934 is operated, the plating liquid is supplied from the plating liquid regulating tank 740 through the filter 936 to the plating liquid supply nozzles 753 in each of the plated film forming units. A control valve 756 is provided in the plating liquid supply pipe 755 extending from the plating liquid regulating tank 740 to each of the plated film forming units. This control valve 56 serves to make the pressure on the secondary side constant, and, even when one plated film forming unit is stopped, the control valve 56 can make the supply pressure of the plating liquid in the other plated film forming units constant.

Thus, a plating liquid prepared in a plating liquid regulating tank 740 in a single plating process system is fed to a plurality of plated film forming units through a single pump 934. The plating liquid preparation tank 740 having a large capacity is used in the plating process system to prepare a plating liquid. With this arrangement, the plating liquid is fed to each of the plated film forming units while controlling the flow rate in each of the plated film forming units through control valves 756, and a variation of the plating liquid in quality can be suppressed.

A vertical stream regulating ring 762 and a horizontal stream regulating ring 763 are disposed within the plating chamber 749 at a position near the internal circumference of the plating chamber 749, and the central portion of the liquid surface is pushed up by an upward stream out of two divided upward and downward streams of the plating liquid 745 within the plating chamber 749, whereby the downward flow is smoothened and the distribution of the current density is further uniformized. The horizontal stream regulating ring 763 has a peripheral portion which is fixed to the plating container 750, and the vertical stream regulating ring 762 is connected to the horizontal stream regulating ring 763.

Figure 71:
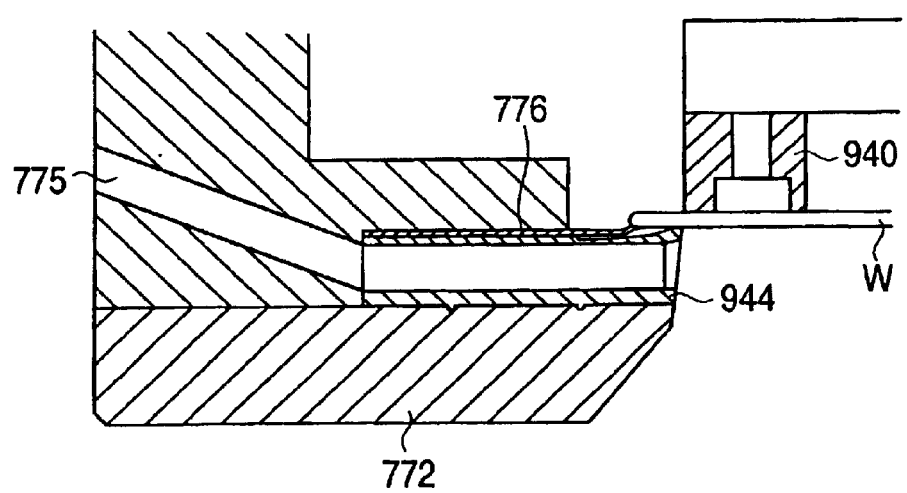
FIG. 71 is an enlarged view showing a part of FIG. 66.

On the other hand, the head 747 comprises a housing 770 which is a rotatable and cylindrical receptacle having a downwardly open end and has openings 796 on the circumferential wall, and vertically movable pressing rods 942 having, in its lower end, a pressing ring 940. As shown in FIG. 71, an inwardly projecting ring-shaped substrate holding member 772 is provided at the lower end of the housing 770. A ring-shaped sealing member 944 is mounted on the substrate holding member 772. The ring-shaped sealing member 944 projects inward, and the front end of the top surface in the ring-shaped sealing member 944 projects upward in an annular tapered form. Further, contacts 776 for a cathode electrode are disposed above the sealing member 944. Air vent holes 775, which extend outwardly in the horizontal direction and further extend outwardly in an upwardly inclined state, are provided in the substrate holding member 772 at circumferentially equal intervals. The contacts 776 for a cathode electrode and the air vent holes 775 are the same as those shown in FIGS. 59 and 60.

Figure 68:
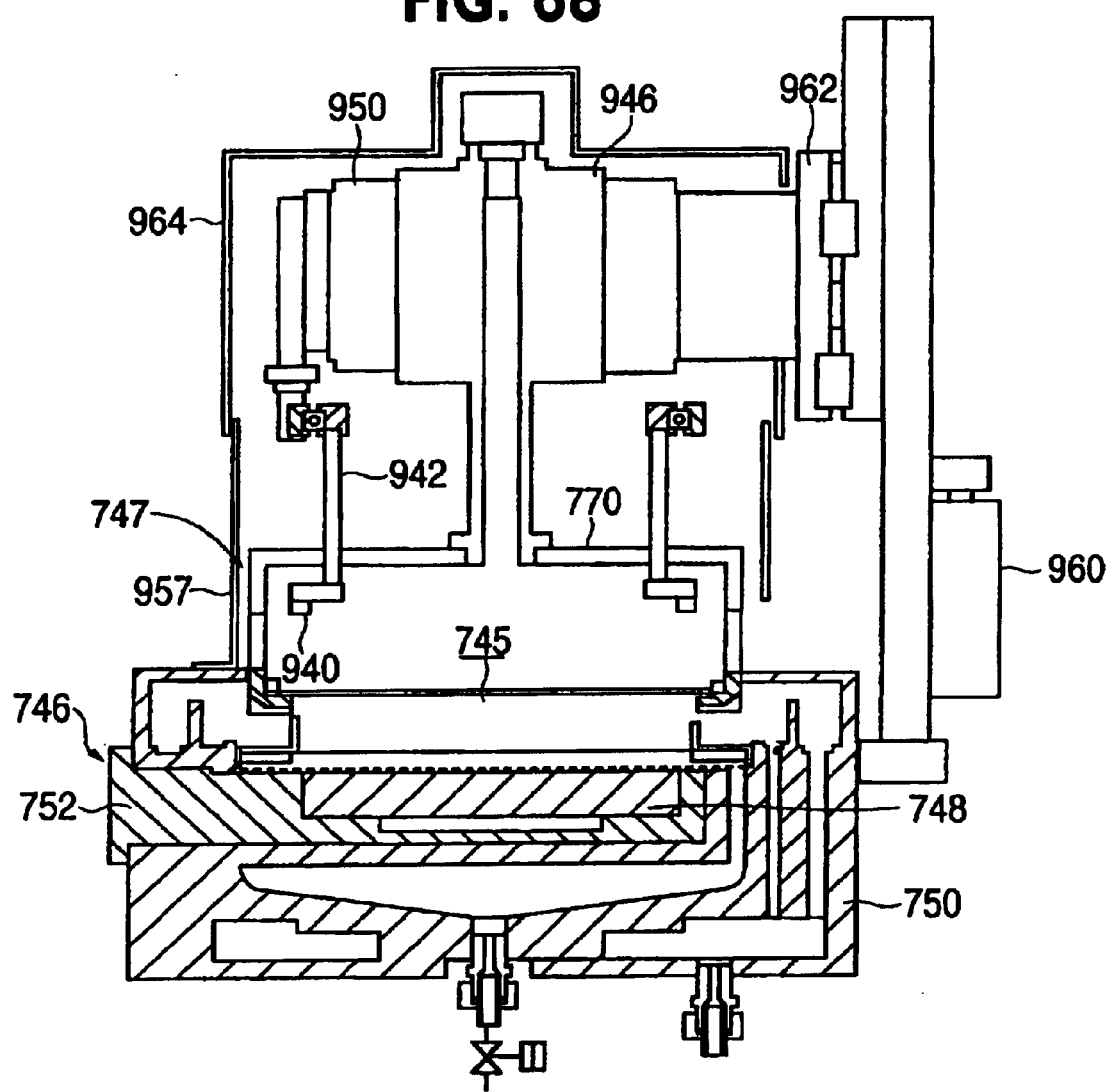
FIG. 68 is a cross-sectional view showing a whole structure of the plating process unit at the time of non-plating process (at the time of transfer of a substrate)
Figure 69:
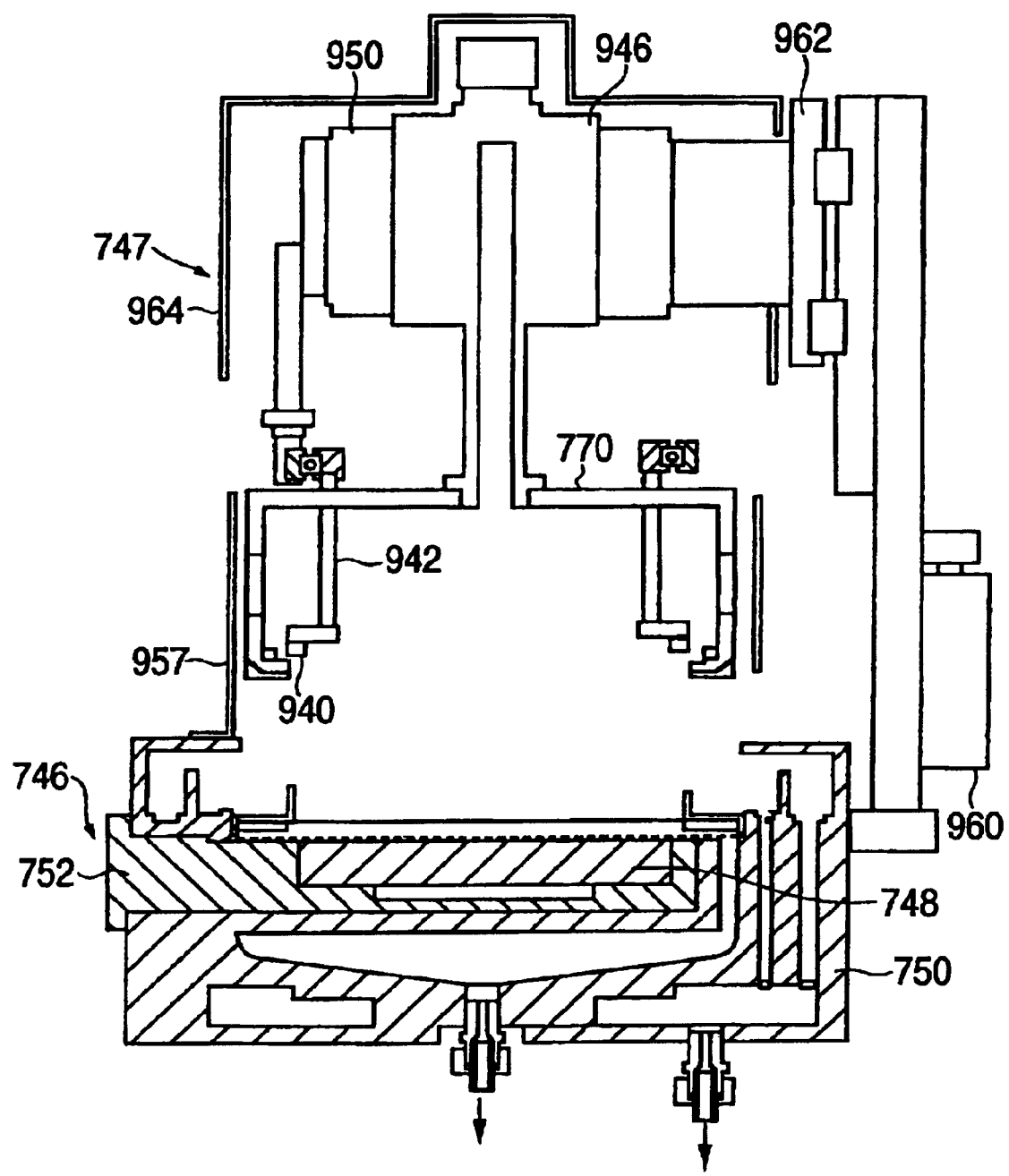
FIG. 69 is a cross-sectional view showing a whole structure of the plating unit at the time of maintenance.
Figure 70:
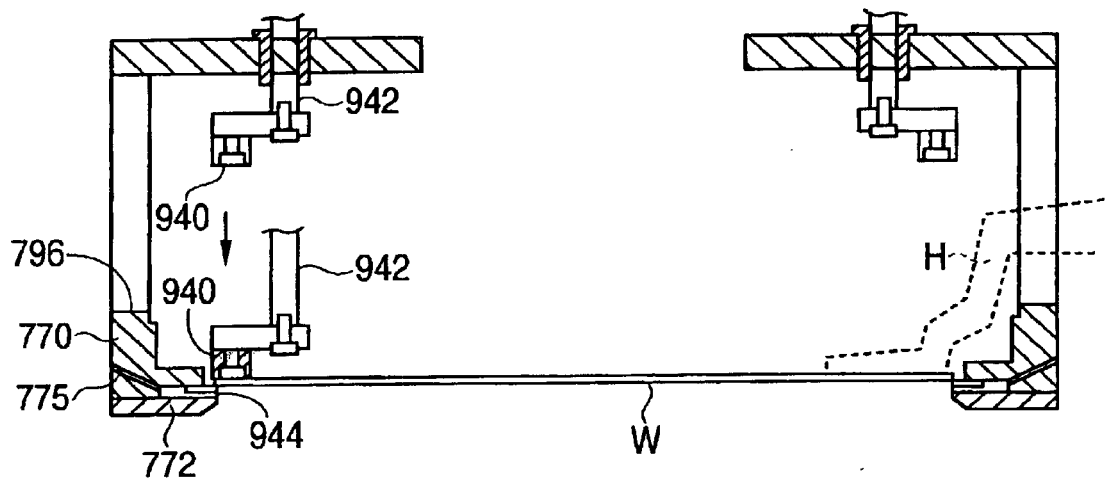
FIG. 70 is a cross-sectional view explanatory of a relationship among a housing, a pressing ring, and a substrate at the time of transfer of a substrate.

With this arrangement, as shown in FIG. 68, the liquid level of the plating liquid is lowered, and as shown in FIGS. 70 and 71, the substrate W is held by a robot hand H or the like, and inserted into the housing 770 where the substrate W is placed on the upper surface of the sealing member 944 of the substrate holding member 772. Thereafter, the robot hand H is withdrawn from the housing 770, and the pressing ring 940 is then lowered to sandwich the peripheral portion of the substrate W between the sealing member 944 and the lower surface of the pressing ring 940, thereby holding the substrate W. In addition, upon holding of the substrate W, the lower surface of the substrate W is brought into pressure contact with the sealing member 944 to seal this contact portion positively. At the same time, current flows between the substrate W and the contacts 776 for a cathode electrode.

Returning to FIG. 66, the housing 770 is connected to an output shaft 948 of a motor 946, and rotated by energization of the motor 946. The pressing rods 942 are vertically provided at predetermined positions along the circumferential direction of a ring-shaped support frame 958 rotatably mounted through a bearing 956 on the lower end of a slider 954. The slider 954 is vertically movable by actuation of a cylinder 952, with a guide, fixed to a support 950 surrounding the motor 946. With this construction, the pressing rods 942 are vertically movable by the actuation of the cylinder 952, and, in addition, upon the holding of the substrate W, the pressing rods 942 are rotated integrally with the housing 770.

The support 950 is mounted on a slide base 962 which is engaged with a ball screw 961 and vertically movable by the ball screw 961 rotated by energization of the motor 960. The support 950 is surrounded by an upper housing 964, and is vertically movable together with the upper housing 964 by energization of the motor 960. Further, a lower housing 957 for surrounding the housing 770 during plating is mounted on the upper surface of the plating container 750.

With this construction, as shown in FIG. 68, maintenance can be performed in such a state that the support 950 and the upper housing 964 are raised. A crystal of the plating liquid is likely to deposit on the inner circumferential surface of the weir member 758. However, the support 950 and the upper housing 964 are raised, a large amount of the plating liquid is flowed and overflows the weir member 758, and hence the crystal of the plating liquid is prevented from being deposited on the inner circumferential surface of the weir member 758. A cover 750b for preventing the splash of the plating liquid is integrally provided in the plating container 750 to cover a portion above the plating liquid which overflows during plating process. By coating an ultra-water-repellent material such as HIREC (manufactured by NTT Advance Technology) on the lower surface of the cover 750b for preventing the splash of the plating liquid, the crystal of the plating liquid can be prevented from being deposited on the lower surface of the cover 750b.

Substrate centering mechanisms 970 located above the substrate holding member 772 of the housing 770 for performing centering of the substrate W, are provided at four places along the circumferential direction in this embodiment.

Figure 73:
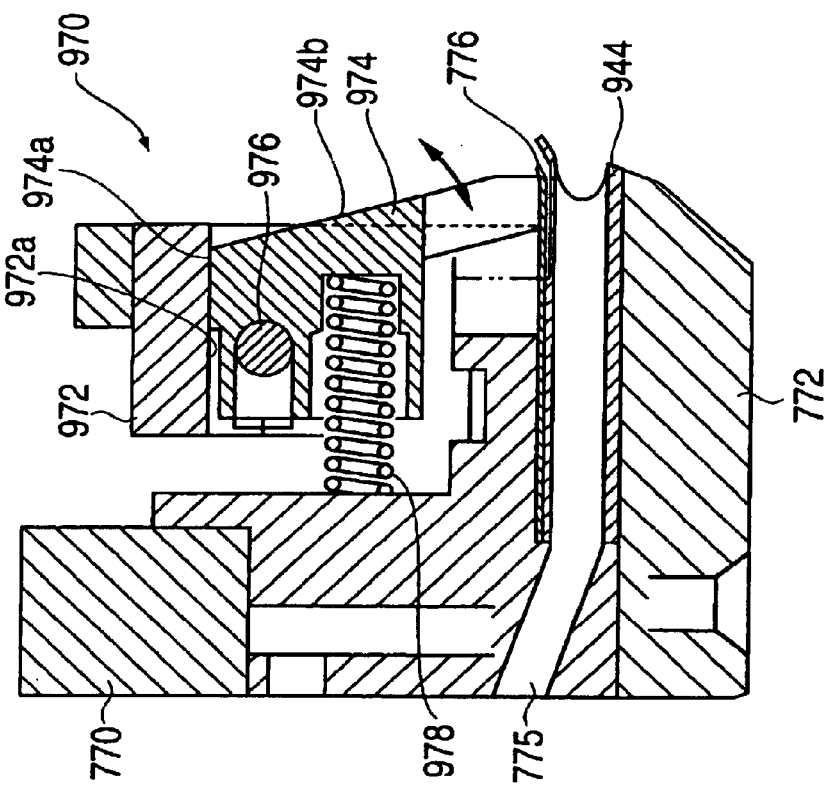
FIG. 73 is an enlarged cross-sectional view showing a centering mechanism.

FIG. 73 shows the substrate centering mechanism 970 in detail. The substrate centering mechanism 970 comprises a gate-like bracket 972 fixed to the housing 770, and a positioning block 974 disposed within the bracket 972. This positioning block 974 is swingably mounted through a support shaft 976 horizontally fixed to the bracket 972. Further, a compression coil spring 978 is interposed between the housing 770 and the positioning block 974. Thus, the positioning block 974 is urged by the compression coil spring 978 so that the positioning block 974 rotates about the support shaft 976 and the lower portion of the positioning block 974 projects inwardly. The upper surface 974a of the positioning block 974 serves as a stopper, and is brought into connect with the lower surface 972a of the bracket 972 to restrict the movement of the positioning block 974. Further, the positioning block 974 has a tapered inner surface 974b which is widened outward in the upward direction.

With this construction, a substrate is held by the hand of a transfer robot or the like, is carried into the housing 770, and is placed on the substrate holding member 772. In this case, when the center of the substrate deviates from the center of the substrate holding member 772, the positioning block 974 is rotated outwardly against the urging force of the compression coil spring 978 and, upon the release of holding of the substrate from the hand of the transfer robot or the like, the positioning block 974 is returned to the original position by the urging force of the compression coil spring 978. Thus, the centering of the substrate can be carried out.

Figure 74:
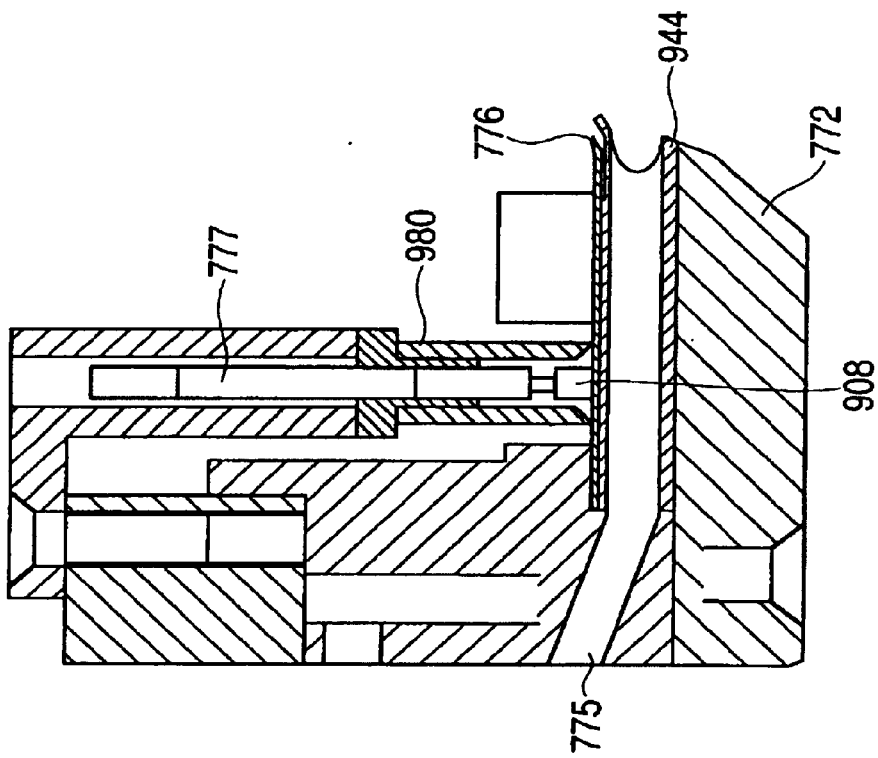
FIG. 74 is a cross-sectional view showing a feeding contact (probe)

FIG. 74 shows a feeding contact (a probe) 777 for feeding power to a cathode electrode plate 908 of a contact 776 for a cathode electrode. This feeding contact 777 is composed of a plunger and is surrounded by a cylindrical protective member 980 extending to the cathode electrode plate 908, whereby the feeding contact 777 is protected against the plating liquid.

In the substrate processing apparatus employs the plated film forming unit, as described above, when the surface of the plating liquid is on a low level for transferring the substrate as shown in FIG. 68, the substrate is inserted into and held within the housing 770. In this state, the liquid level of the plating liquid is raised and the substrate is plated. Thereafter, the liquid level of the plating liquid is lowered, and the plated substrate is withdrawn from the housing 770. Further, maintenance is carried out in such a state that the support 950 and the upper housing 964 are raised. In this state, if necessary, a large amount of the plating liquid is flowed and overflow the weir member 758, thereby preventing a crystal of the plating liquid from being deposited on the inner circumferential surface of the weir member 758.

Further, in this embodiment, the following process may be performed: When the surface of the plating liquid is on the liquid level B for transferring the substrate, the substrate W is inserted into the housing 770 and held by the housing 770, and then the liquid level of the plating liquid is raised to the liquid level A for plating. At the same time, the housing 770 is raised by a certain distance. After the liquid level of the polishing solution reaches the liquid level A for plating, the housing 770 is rotated at a medium speed of, for example, 150 min$^{-1}$ and lowered, whereby the substrate W is brought into contact with the surface of the plating liquid which rises at its central portion. Thus, air bubbles on the surface of the substrate can be positively removed therefrom.

In the above embodiments, a pre-dipping process is employed in the pretreatment unit, and a pretreatment liquid (a pre-dipping liquid) which is one component of the plating liquid is uniformly coated to improve adhesive property of plating on the surface, to be plated, of the substrate on which a barrier layer and a seed layer are successively provided. Alternatively, a pre-plating method in which a pre-plating is applied to reinforce an incomplete seed layer onto the surface, to be plated, of the substrate on which a barrier layer and a seed layer are successively provided may be used.

Figure 75:
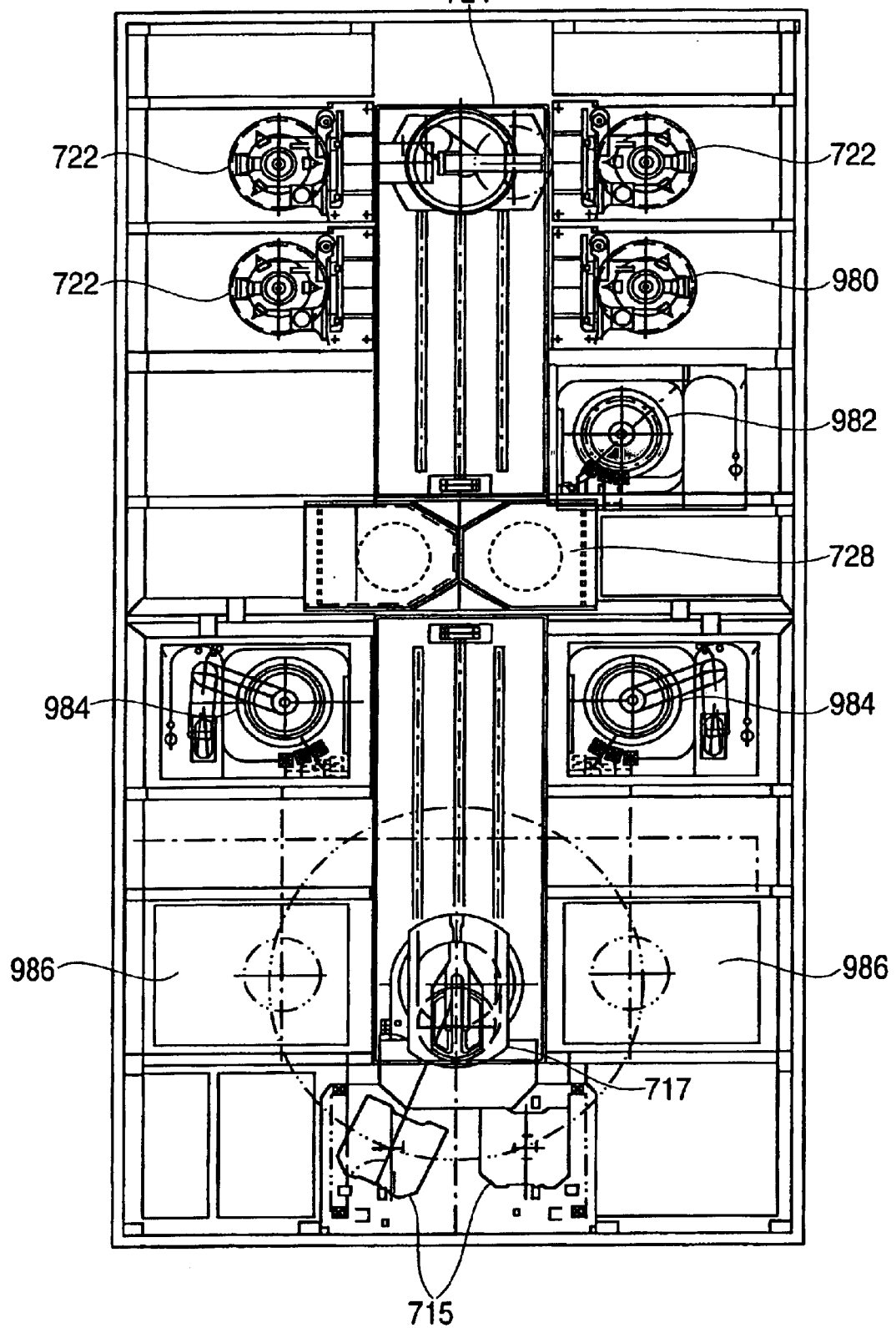
FIG. 75 is a view showing a plan constitution example of the semiconductor substrate processing apparatus according to the present invention.

FIG. 75 shows another embodiment of a substrate processing apparatus in accordance with the present invention which employs the pre-plating method and is provided with a pre-plating unit 980. The pre-plating unit 980 has a similar structure to the plated film forming unit 722, and uses a weak alkaline high-polarization liquid of copper pyrophosphate as a plating liquid, and pure copper (oxygen-free copper) as an anode. According to this embodiment, one of the plated film forming units 722 shown in FIG. 57 is replaced with the pre-plating unit 980 for performing pre-plating of a substrate to reinforce the incomplete seed layer. The pre-plated substrate is then subjected to the plating treatment in the plated film forming unit 722.

While the plating liquid for use in the pre-plating unit 980 is alkaline, the plating liquid for use in the plated film forming unit 722 is acidic. It is therefore necessary to take a measure not to bring the alkaline plating liquid, which has adhered to the substrate in the pre-plating unit 980, to the plated film forming unit 722. In this regard, according to this embodiment, a cleaning unit 982 is provided in the plating section 712 (see FIG. 57) for washing by water the substrate which has undergone the pre-plating in the pre-plating unit 982. The cleaned substrate is then transferred to the plated film forming unit 722 for plating of the substrate.

Further in this embodiment, a bevel-backside cleaning unit 984 and an annealing unit 986 are provided. In the bevel-backside cleaning unit 984, the unnecessary Cu film (seed layer) in the edge portion of the semiconductor substrate is removed, and the substrate is rinsed with water and then spin-dried by rotating the substrate at a high speed. Thereafter, the dried substrate is transferred to the annealing unit 986 for annealing the substrate.

Figure 76:
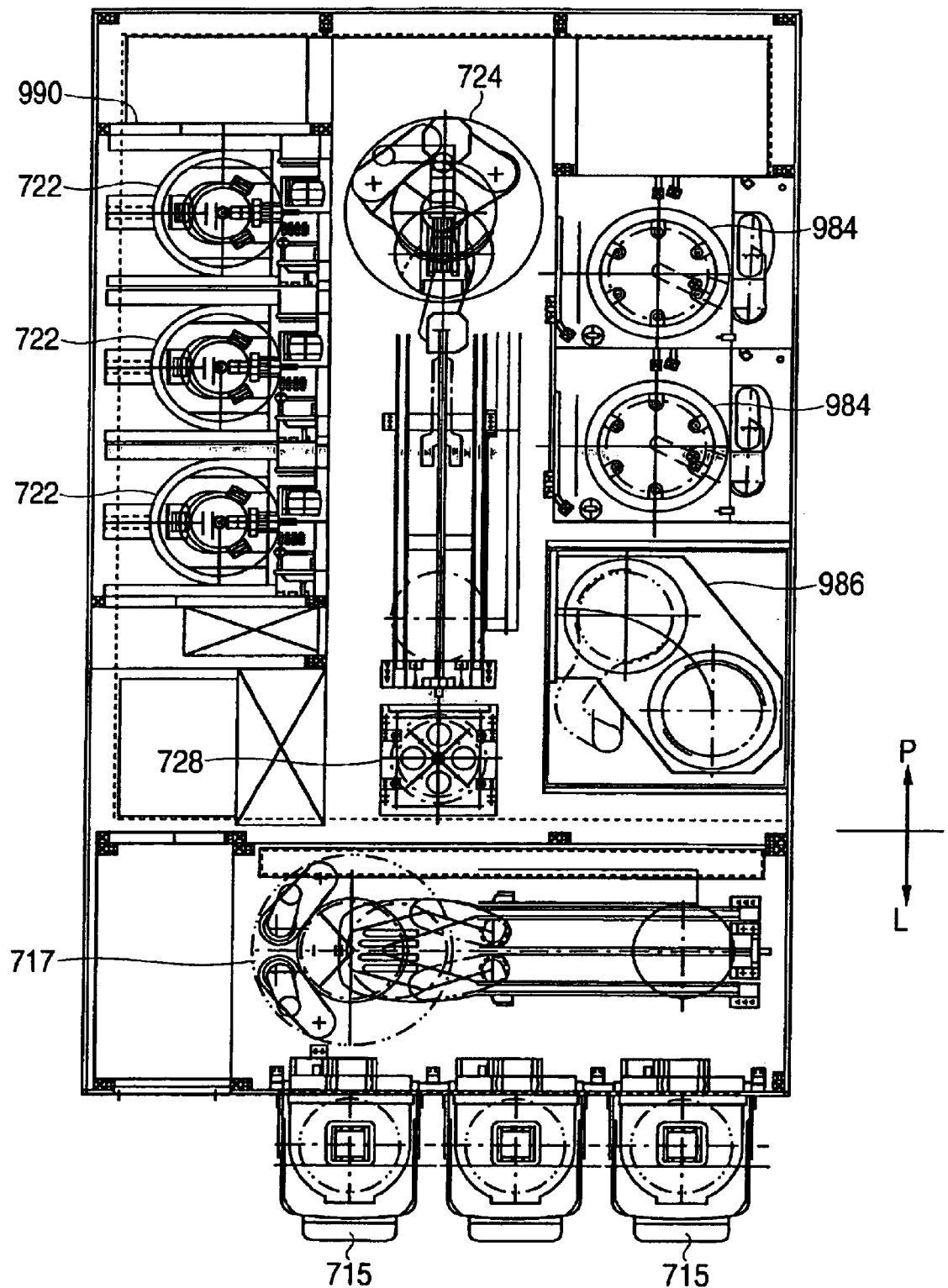
FIG. 76 is a view showing a plan constitution example of the semiconductor substrate processing apparatus according to the present invention.

FIG. 76 shows yet another embodiment of a semiconductor substrate processing apparatus in accordance with the present invention. The apparatus is provided with three loading and unloading sections 715. A movable first robot 717, for exclusive use for the loading and unloading sections, is provided between the loading and unloading sections 715 and a temporary storage 728 for transferring a substrate therebetween. Three plated film forming units 722 are disposed in series in a plating area 990 on one side of a movable second robot 724. On the opposite side of the second robot 724 are disposed, in series, two bevel-backside cleaning units 984 and one annealing unit 986. The second robot 724 transfers the substrate between the plated film forming units 722, the bevel-backside cleaning units 984, the annealing unit 986 and the temporary storage 728.

According to this embodiment, loading and unloading of the substrate between the loading and unloading sections 715 and the temporary storage 728 are conducted by the first robot 717. Separately, loading from the temporary storage 728, transportation between the treatment units and unloading to the temporary storage 728 of the substrate are conducted by the second robot 724. The provision of such two robots makes it possible to divide the interior of facilities into a loading and unloading area L which includes the first robot 717 and the loading and unloading sections 715, and a treatment unit area P which includes the second robot 724, the temporary storage 728 and the various treatment units including the annealing unit 986.

Such division in the interior of facilities has the following advantages. Since the amount of contaminants is small in the loading and unloading area L compared to the treatment unit area (treatment section) P, air-conditioning facilities for the loading and unloading area L can be simplified. Further, the loading and unloading area L can be made detachable. This enables replacement of the treatment unit with another new treatment unit for combination with the loading and unloading area L so as to meet the rapid advance in the semiconductor industry. Alternatively, in order to meet a new model cassette and facilitate transportation of the substrate, the loading and unloading area L can be replaced with another new one.

What is claimed is:

1. An apparatus for processing a substrate, said apparatus comprising:
   a plating unit having a plating chamber for electroplating a substrate having fine grooves in a surface of the substrate and a seed layer on a surface of the fine grooves; and
   an annealing unit having a chamber for annealing the substrate,
   wherein said plating unit is structured to form a plated film on the seed layer by electroplating with supplying a first current by a voltage to the seed layer and then supplying a second current to the seed layer.

2. An apparatus according to claim 1, wherein the second current is larger than the first current.

3. An apparatus according to claim 1, wherein said plating unit is structured to apply a reverse voltage to the seed layer for thereby etching the plated film formed on the substrate.

* * * * *